US011718634B2

(12) United States Patent
Ji et al.

(10) Patent No.: US 11,718,634 B2
(45) Date of Patent: Aug. 8, 2023

(54) ORGANIC ELECTROLUMINESCENT MATERIALS AND DEVICES

(71) Applicant: UNIVERSAL DISPLAY CORPORATION, Ewing, NJ (US)

(72) Inventors: Zhiqiang Ji, Chalfont, PA (US); Alexey Borisovich Dyatkin, Ambler, PA (US); Jui-Yi Tsai, Newtown, PA (US); Pierre-Luc T. Boudreault, Pennington, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 812 days.

(21) Appl. No.: 16/550,376

(22) Filed: Aug. 26, 2019

(65) Prior Publication Data

US 2020/0087334 A1 Mar. 19, 2020

Related U.S. Application Data

(60) Provisional application No. 62/731,331, filed on Sep. 14, 2018.

(51) Int. Cl.

| | |
|---|---|
| ***C07F 15/00*** | (2006.01) |
| ***H10K 85/30*** | (2023.01) |
| ***H10K 50/11*** | (2023.01) |
| ***H10K 50/12*** | (2023.01) |
| ***H10K 101/10*** | (2023.01) |

(Continued)

(52) U.S. Cl.
CPC .......... *C07F 15/0033* (2013.01); *H10K 50/11* (2023.02); *H10K 85/342* (2023.02); *H10K 85/40* (2023.02); *H10K 85/622* (2023.02); *H10K 85/654* (2023.02); *H10K 85/655* (2023.02); *H10K 85/6572* (2023.02); *H10K 85/6576* (2023.02); *H10K 50/12* (2023.02); *H10K 50/81* (2023.02); *H10K 50/82* (2023.02); *H10K 2101/10* (2023.02)

(58) Field of Classification Search
CPC ............ C07F 15/0033; H01L 51/5016; H01L 51/0085; H10K 85/342; H10K 50/11; H10K 2101/10
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Dylan C Kershner
(74) *Attorney, Agent, or Firm* — Duane Morris LLP

(57) ABSTRACT

Cyclometallated iridium complexes having triphenylene or aza triphenylene and bulky alkyl substitution that can be used as emitters in OLEDs to improve the external quantum efficiency (EQE) and lifetime of OLEDs are disclosed.

17 Claims, 2 Drawing Sheets

(51) Int. Cl.

| | |
|---|---|
| ***H10K 85/40*** | (2023.01) |
| ***H10K 85/60*** | (2023.01) |
| *H10K 50/81* | (2023.01) |
| *H10K 50/82* | (2023.01) |

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
2002/0034656 A1 3/2002 Thompson et al.
2002/0134984 A1 9/2002 Igarashi
2002/0158242 A1 10/2002 Son et al.
2002/0182441 A1* 12/2002 Lamansky ............ C09K 11/06 428/917
2003/0091862 A1* 5/2003 Tokito .................. C09K 11/06 428/917
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0145483 A1* 6/2009 Kim ...................... H05B 33/14 546/10
2009/0165846 A1 7/2009 Johannes et al.
2009/0167162 A1 7/2009 Lin et al.
2009/0179554 A1 7/2009 Kuma et al.
2010/0127215 A1* 5/2010 Boerner ............... C07D 277/66 252/301.16
2010/0237334 A1* 9/2010 Ma ...................... C07D 307/91 546/281.1
2010/0270916 A1* 10/2010 Xia ...................... H05B 33/14 546/10
2011/0049496 A1* 3/2011 Fukuzaki ............ H01L 51/0085 546/4
2014/0077172 A1* 3/2014 So ...................... H01L 51/5016 438/46
2016/0164012 A1* 6/2016 Lee .................... H01L 51/0085 546/4

FOREIGN PATENT DOCUMENTS

EP 2034538 3/2009
JP 200511610 1/2005
JP 2007123392 5/2007
JP 2007254297 10/2007
JP 2008074939 4/2008
WO 01/39234 5/2001
WO 02/02714 1/2002
WO 02015654 2/2002
WO 03040257 5/2003
WO 03060956 7/2003
WO 2004093207 10/2004
WO 2004107822 12/2004
WO 2005014551 2/2005
WO 2005019373 3/2005
WO 2005030900 4/2005
WO 2005089025 9/2005
WO 2005123873 12/2005
WO 2006009024 1/2006
WO 2006056418 6/2006
WO 2006072092 7/2006
WO 2006082742 8/2006
WO 2006093466 9/2006
WO 2006098120 9/2006
WO 2006100298 9/2006
WO 2006103874 10/2006
WO 2006114966 11/2006
WO 2006132173 12/2006
WO 2007002683 1/2007
WO 2007004380 1/2007
WO 2007063754 6/2007
WO 2007063796 6/2007
WO 2008056746 5/2008
WO 2008101842 8/2008
WO 2008122943 10/2008
WO 2008132085 11/2008
WO 2009000673 12/2008
WO 2009003898 1/2009
WO 2009008311 1/2009
WO 2009018009 2/2009
WO 2009021126 2/2009
WO 2009050290 4/2009
WO 2009062578 5/2009
WO 2009063833 5/2009
WO 2009066778 5/2009
WO 2009066779 5/2009

(56) References Cited

FOREIGN PATENT DOCUMENTS

WO 2009086028 7/2009
WO 2009100991 8/2009

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electro phosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 8(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).

(56) References Cited

OTHER PUBLICATIONS

Wong, Wai-Yeung, "Multifunctional Iridium Complexes Based on Carbazole Modules as Highly Efficient Electrophosphors," Angew. Chem. Int. Ed., 45:7800-7803 (2006).
Huang, et al., "High-efficiency solution processable electrophosphorescent iridium complexes bearing polyphenylphenyl dendron ligands", Journal of Organometallic Chemistry 694 (2009) 1317-1324.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/731,331, filed Sep. 14, 2018, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

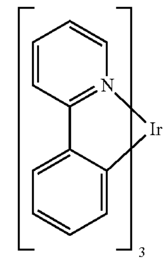

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

The present disclosure is directed to cyclometallated iridium complexes having triphenylene or aza triphenylene and bulky alkyl substitution that can be used as emitters in OLEDs to improve the external quantum efficiency (EQE) and lifetime of OLEDs.

A novel compound of Formula I

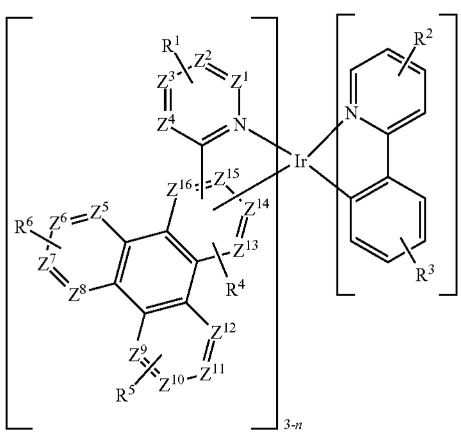

is disclosed. In Formula I, n=0, 1, or 2; $Z^1$ to $Z^{16}$ are each independently C or N; any of $Z^{13}$ to $Z^{16}$ is C when it forms a bond with Ir, or when it forms a bond with the ring having $R^1$; any chelate ring comprising Ir is a 5-membered ring; $R^1$ to $R^6$ each independently represents mono to the maximum allowable substitution, or no substitution; each $R^1$ to $R^6$ is independently hydrogen or a substituent selected from the group consisting of the general substituents defined above; any two substituents may be joined or fused together to form a ring; and at least one of $R^1$ and $R^2$ is an alkyl or cycloalkyl group comprising five or more C atoms.

An OLED comprising the compound of the present disclosure in an organic layer therein is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
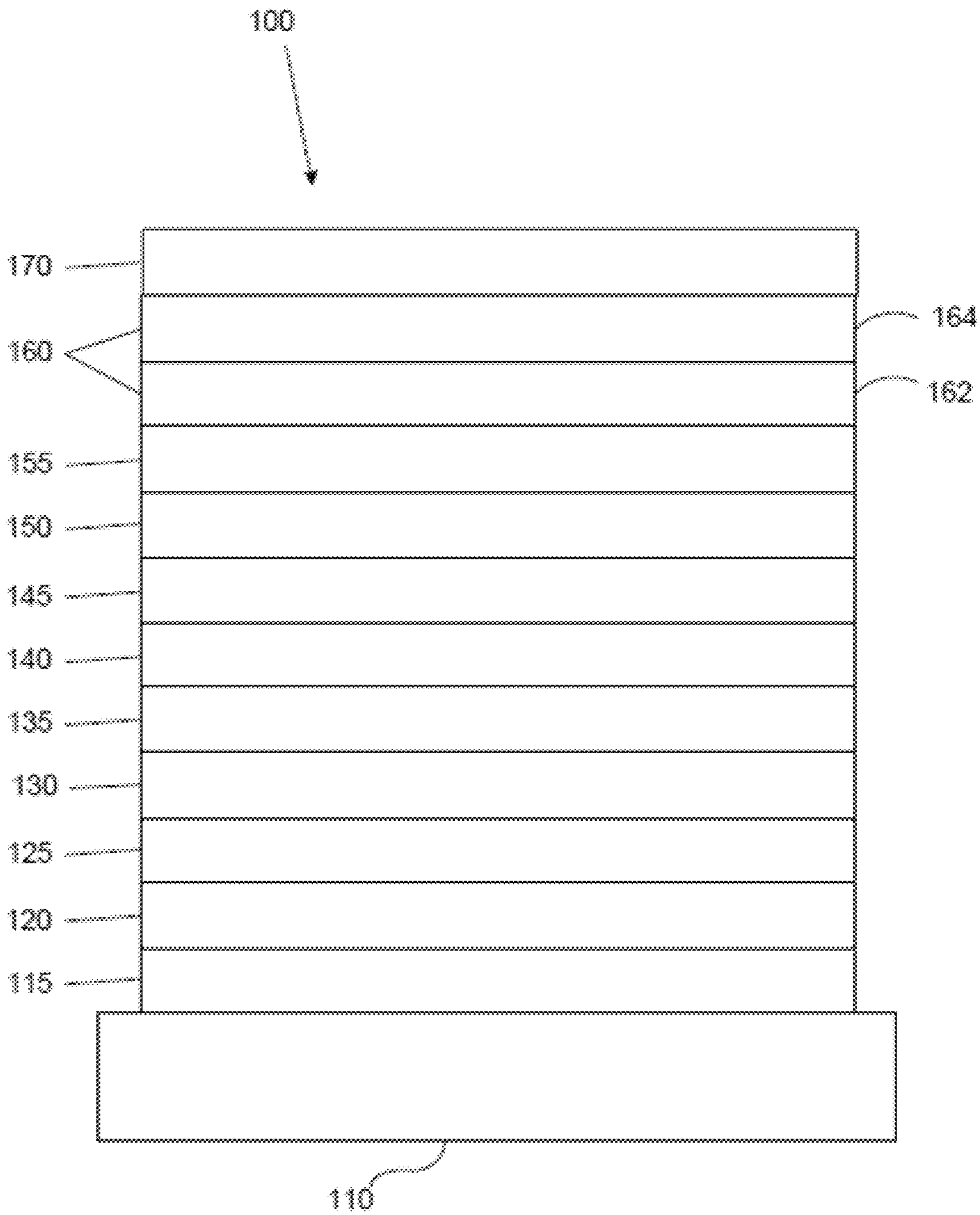
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
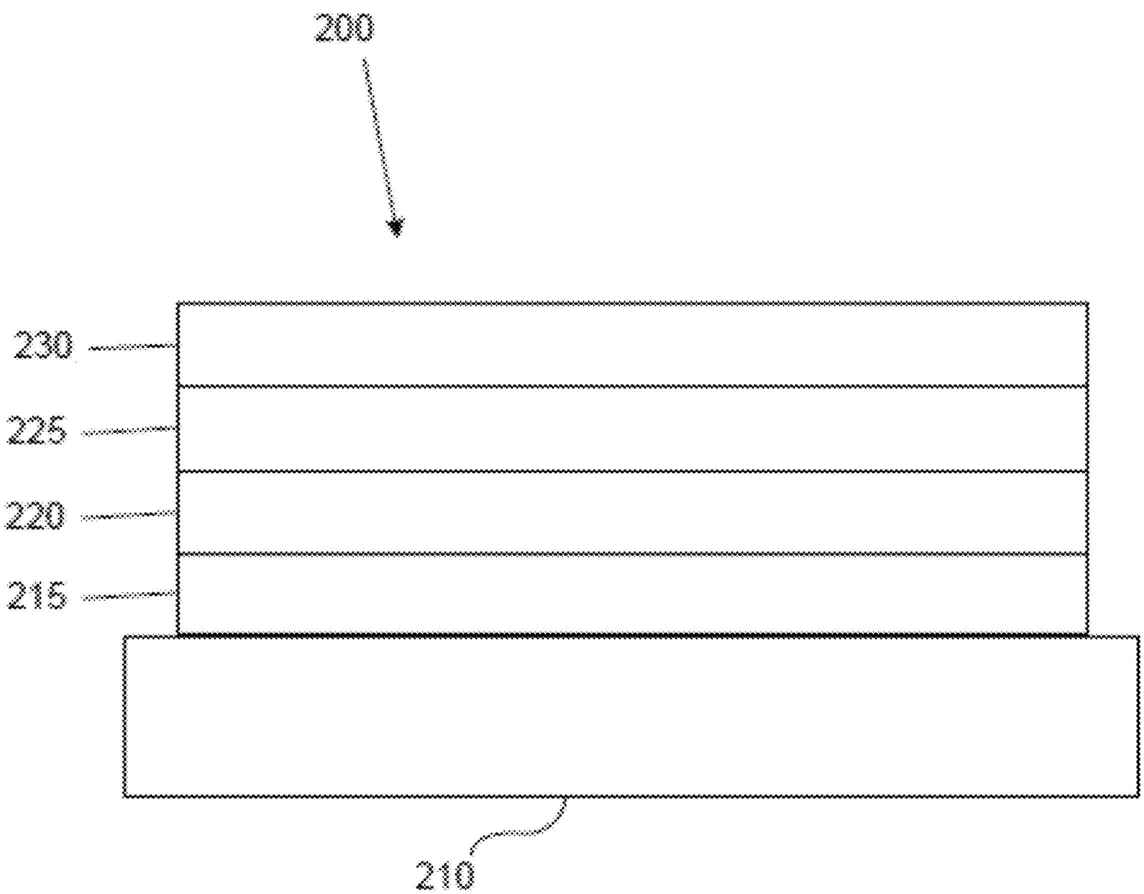
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution) Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h] quinoxaline and dibenzo[f,h] quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, “adjacent” means that the two substituents involved can be on the same ring next to each other, or on two neighboring rings having the two closest available substitutable positions, such as 2,2' positions in a biphenyl, or 1,8 position in a naphthalene, as long as they can form a stable fused ring system.

The present disclosure discloses cyclometallated iridium complexes with (aza)triphenylene and bulky alkyl (no less than four carbon atoms) substitution and their use as emitters in organic electroluminescence devices (OLEDs). The unique fused ring of (aza)triphenylene improves the stability of the complexes and thus extending the operational lifetime of the OLEDs, and the bulky substitution improves the EQE of the emitter complexes by promoting the emitter complexes to align in the emissive layer of the OLEDs.

According to an embodiment of the present disclosure, a compound of $(L_A)_{3-n}Ir(L_B)_n$ of Formula I

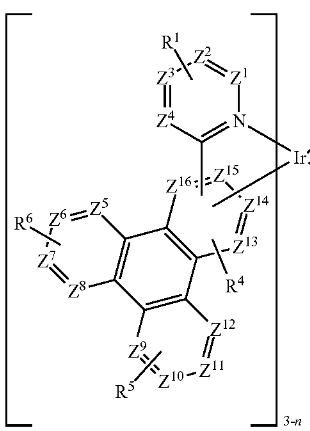

is disclosed. In Formula I, n=0, 1, or 2; $Z^1$ to $Z^{16}$ are each independently C or N; any of $Z^{13}$ to $Z^{16}$ is C when it forms a bond with Ir, or when it forms a bond with the ring having $R^1$; any chelate ring comprising Ir is a 5-membered ring; $R^1$ to $R^6$ each independently represents mono to the maximum allowable substitution, or no substitution; each $R^1$ to $R^6$ is independently hydrogen or a substituent selected from the group consisting of the general substituents defined above; any two substituents may be joined or fused together to form a ring; and at least one of $R^1$ and $R^2$ is an alkyl or cycloalkyl group comprising five or more C atoms.

In some embodiments of the compound of Formula I, each $R^1$ to $R^6$ is independently hydrogen, or a substituent selected from the group consisting of the preferred general substituents defined above.

In some embodiments of the compound, at least one $R^1$ or $R^2$ comprises a cyclic or polycyclic alkyl. In some embodiments, at least one $R^1$ or $R^2$ is a methyl group. In some embodiments, at least one $R^1$ or $R^2$ is fully or partially deuterated.

In some embodiments of the compound, at least one of $R^1$ and $R^2$ is an alkyl or cycloalkyl group comprising six or more C atoms. In some embodiments of the compound, at least one of $R^1$ and $R^2$ is an alkyl or cycloalkyl group comprising seven or more C atoms. In some embodiments of the compound, at least one of $R^1$ and $R^2$ is an alkyl or cycloalkyl group comprising eight or more C atoms.

In some embodiments of the compound, at least one of $R^1$ and at least one of $R^2$ are an alkyl or cycloalkyl group comprising five or more C atoms. In some embodiments of the compound, at least one of $R^1$ and at least one of $R^2$ are an alkyl or cycloalkyl group comprising six or more C atoms. In some embodiments of the compound, at least one of $R^1$ and at least one of $R^2$ are an alkyl or cycloalkyl group comprising seven or more C atoms. In some embodiments of the compound, at least one of $R^1$ and at least one of $R^2$ are an alkyl or cycloalkyl group comprising eight or more C atoms.

In some embodiments of the compound, n=0. In some embodiments, n=1. In some embodiments, n=2.

In some embodiments of the compound, $Z^1$ to $Z^{16}$ are each C. In some embodiments, at least one of $Z^1$ to $Z^{16}$ is N.

In some embodiments, the compound is selected from the group consisting of compounds II-1 to II-1488 that are based on Formula II

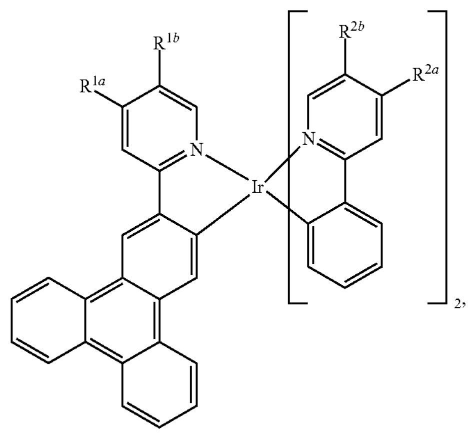

compounds III-1 to III-1488 that are based on

Formula III

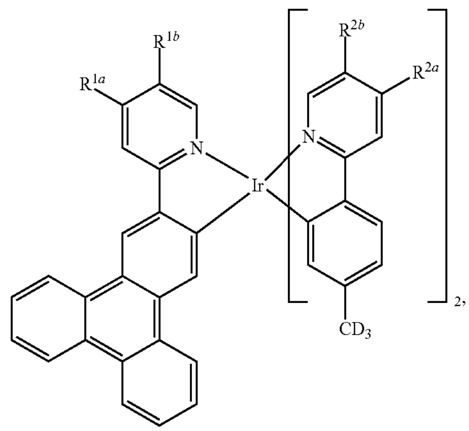

compounds IV-1 to IV-1488 that are based on
Formula IV
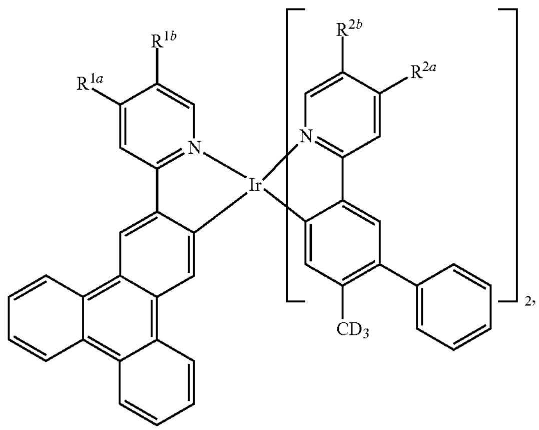
compounds V-1 to V-1488 that are based on
Formula V
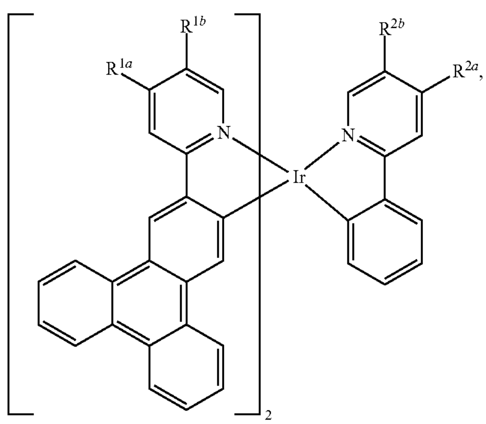
compounds VI-1 to VI-1488 that are based on
Formula VI
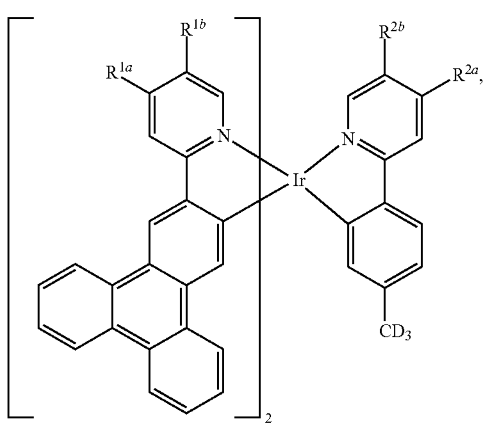
compounds VII-1 VII-1488 that are based on
Formula VII
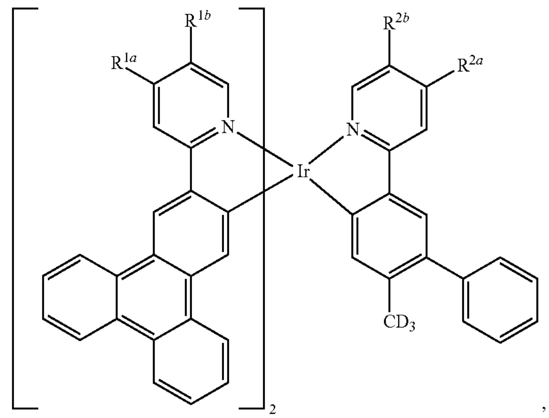
compounds VIII-1 to VIII-1488 that are based on
Formula VIII
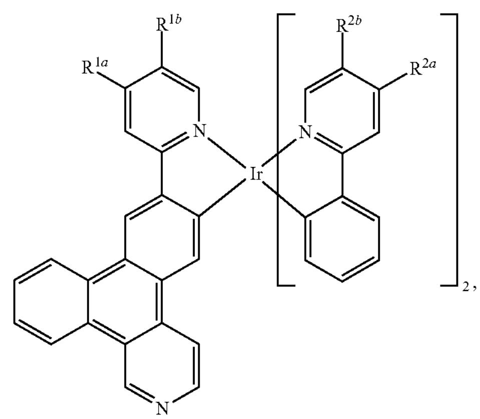
compounds IX-1 to IX-1488 that are based on
Formula IX
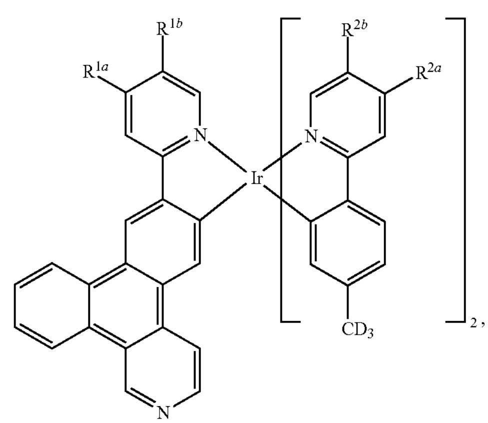

compounds X-1 to X-1488 that are based on
Formula X
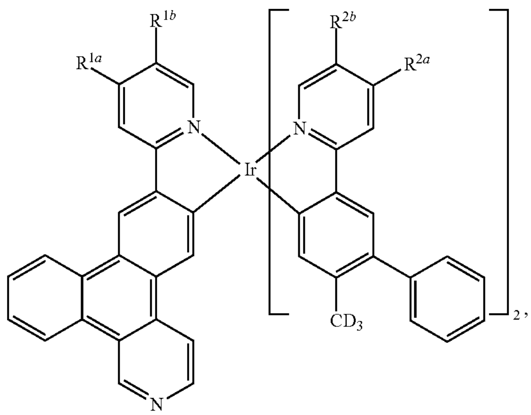
compounds XI-1 to XI-1488 that are based on
Formula XI
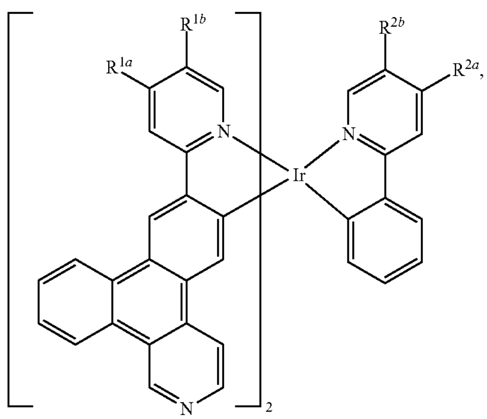
compounds XII-1 to XII-1488 that are based on
Formula XII
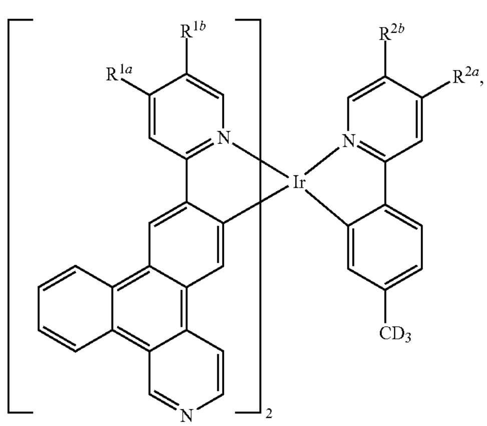
compounds XIII-1 to XIII-1488 that are based on
Formula XIII
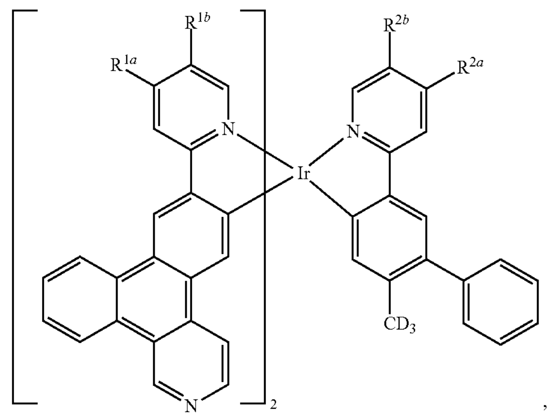
compounds XIV-1 to XIV-1488 that are based on
Formula XIV
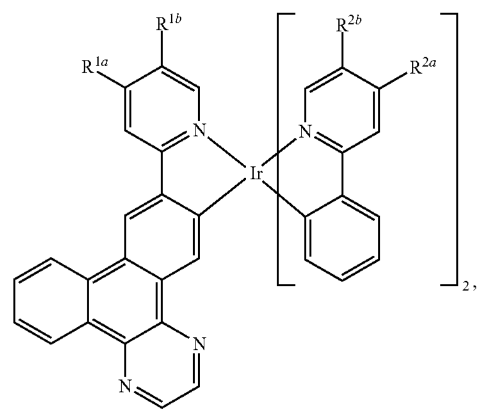
compounds XV-1 to XV-1488 that are based on
Formula XV
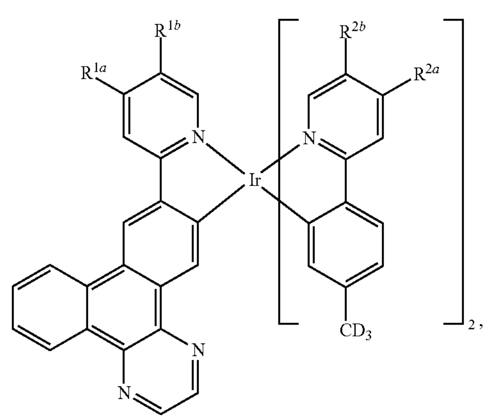

compounds XVI-1 to XVI-1488 that are based on

Formula XVI

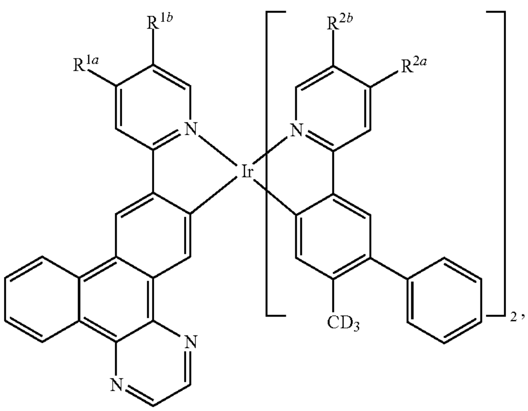

compounds XVII-1 to XVII-1488 that are based on

Formula XVII

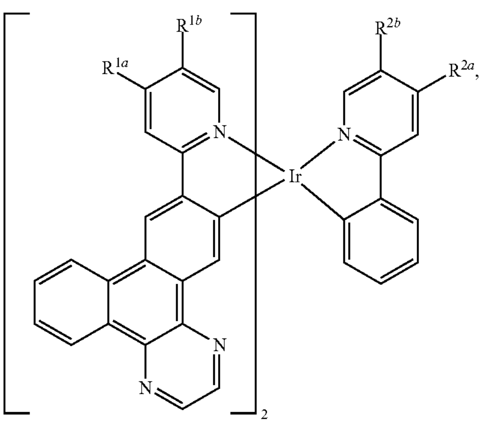

compounds XVIII-1 to XVIII-1488 that are based on

Formula XVIII

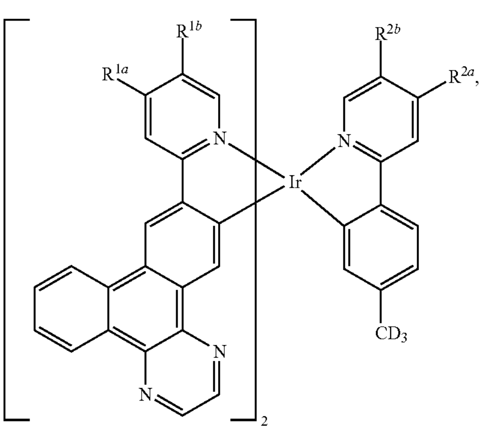

compounds XIX-1 to XIX-1488 that are based on

Formula XIX

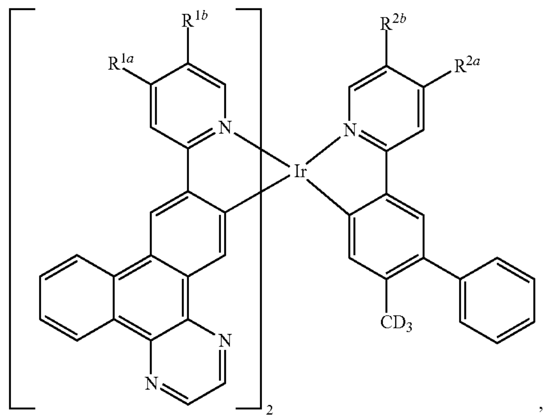

where for each of the compounds II-1 to XIX-1488, $R^{1a}$, $R^{1b}$, $R^{2a}$, and $R^{2b}$ in each compound are defined as provided in the following table in which m is II to XIX:

| Compound # | $R^{1a}$ | $R^{1b}$ | $R^{2a}$ | $R^{2b}$ |
|---|---|---|---|---|
| m-1 | $R^{A1}$ | H | H | H |
| m-2 | $R^{A2}$ | H | H | H |
| m-3 | $R^{A3}$ | H | H | H |
| m-4 | $R^{A4}$ | H | H | H |
| m-5 | $R^{A5}$ | H | H | H |
| m-6 | $R^{A6}$ | H | H | H |
| m-7 | $R^{A7}$ | H | H | H |
| m-8 | $R^{A8}$ | H | H | H |
| m-9 | $R^{A9}$ | H | H | H |
| m-10 | $R^{A10}$ | H | H | H |
| m-11 | $R^{A11}$ | H | H | H |
| m-12 | $R^{A12}$ | H | H | H |
| m-13 | $R^{A13}$ | H | H | H |
| m-14 | $R^{A14}$ | H | H | H |
| m-15 | $R^{A15}$ | H | H | H |
| m-16 | $R^{A16}$ | H | H | H |
| m-17 | $R^{A17}$ | H | H | H |
| m-18 | $R^{A18}$ | H | H | H |
| m-19 | $R^{A19}$ | H | H | H |
| m-20 | $R^{A20}$ | H | H | H |
| m-21 | $R^{A21}$ | H | H | H |
| m-22 | $R^{A22}$ | H | H | H |
| m-23 | $R^{A23}$ | H | H | H |
| m-24 | $R^{A24}$ | H | H | H |
| m-25 | $R^{A25}$ | H | H | H |
| m-26 | $R^{A26}$ | H | H | H |
| m-27 | $R^{A27}$ | H | H | H |
| m-28 | $R^{A28}$ | H | H | H |
| m-29 | $R^{A29}$ | H | H | H |
| m-30 | $R^{A30}$ | H | H | H |
| m-31 | $R^{A31}$ | H | H | H |
| m-32 | $R^{A32}$ | H | H | H |
| m-33 | $R^{A33}$ | H | H | H |
| m-34 | $R^{A34}$ | H | H | H |
| m-35 | $R^{A35}$ | H | H | H |
| m-36 | $R^{A36}$ | H | H | H |
| m-37 | $R^{A37}$ | H | H | H |
| m-38 | $R^{A38}$ | H | H | H |
| m-39 | $R^{A39}$ | H | H | H |
| m-40 | $R^{A40}$ | H | H | H |
| m-41 | $R^{A41}$ | H | H | H |
| m-42 | $R^{A42}$ | H | H | H |
| m-43 | $R^{A43}$ | H | H | H |
| m-44 | $R^{A44}$ | H | H | H |
| m-45 | $R^{A45}$ | H | H | H |
| m-46 | $R^{A46}$ | H | H | H |
| m-47 | $R^{A47}$ | H | H | H |

-continued

| Compound # | $R^{1a}$ | $R^{1b}$ | $R^{2a}$ | $R^{2b}$ |
|---|---|---|---|---|
| m-48 | $R^{A48}$ | H | H | H |
| m-49 | $R^{A49}$ | H | H | H |
| m-50 | $R^{A50}$ | H | H | H |
| m-51 | $R^{A51}$ | H | H | H |
| m-52 | $R^{A52}$ | H | H | H |
| m-53 | $R^{A53}$ | H | H | H |
| m-54 | $R^{A54}$ | H | H | H |
| m-55 | $R^{A55}$ | H | H | H |
| m-56 | $R^{A56}$ | H | H | H |
| m-57 | $R^{A57}$ | H | H | H |
| m-58 | $R^{A58}$ | H | H | H |
| m-59 | $R^{A59}$ | H | H | H |
| m-60 | $R^{A60}$ | H | H | H |
| m-61 | $R^{A61}$ | H | H | H |
| m-62 | $R^{A62}$ | H | H | H |
| m-63 | $R^{A63}$ | H | H | H |
| m-64 | $R^{A64}$ | H | H | H |
| m-65 | $R^{A65}$ | H | H | H |
| m-66 | $R^{A66}$ | H | H | H |
| m-67 | $R^{A67}$ | H | H | H |
| m-68 | $R^{A68}$ | H | H | H |
| m-69 | $R^{A69}$ | H | H | H |
| m-70 | $R^{A70}$ | H | H | H |
| m-71 | $R^{A71}$ | H | H | H |
| m-72 | $R^{A72}$ | H | H | H |
| m-73 | $R^{A73}$ | H | H | H |
| m-74 | $R^{A74}$ | H | H | H |
| m-75 | $R^{A75}$ | H | H | H |
| m-76 | $R^{A76}$ | H | H | H |
| m-77 | $R^{A77}$ | H | H | H |
| m-78 | $R^{A78}$ | H | H | H |
| m-79 | $R^{A79}$ | H | H | H |
| m-80 | $R^{A80}$ | H | H | H |
| m-81 | $R^{A81}$ | H | H | H |
| m-82 | $R^{A82}$ | H | H | H |
| m-83 | $R^{A83}$ | H | H | H |
| m-84 | $R^{A84}$ | H | H | H |
| m-85 | $R^{A85}$ | H | H | H |
| m-86 | $R^{A86}$ | H | H | H |
| m-87 | $R^{A87}$ | H | H | H |
| m-88 | $R^{A88}$ | H | H | H |
| m-89 | $R^{A89}$ | H | H | H |
| m-90 | $R^{A90}$ | H | H | H |
| m-91 | $R^{A91}$ | H | H | H |
| m-92 | $R^{A92}$ | H | H | H |
| m-93 | $R^{A93}$ | H | H | H |
| m-94 | $R^{A1}$ | H | H | $CD_3$ |
| m-95 | $R^{A2}$ | H | H | $CD_3$ |
| m-96 | $R^{A3}$ | H | H | $CD_3$ |
| m-97 | $R^{A4}$ | H | H | $CD_3$ |
| m-98 | $R^{A5}$ | H | H | $CD_3$ |
| m-99 | $R^{A6}$ | H | H | $CD_3$ |
| m-100 | $R^{A7}$ | H | H | $CD_3$ |
| m-101 | $R^{A8}$ | H | H | $CD_3$ |
| m-102 | $R^{A9}$ | H | H | $CD_3$ |
| m-103 | $R^{A10}$ | H | H | $CD_3$ |
| m-104 | $R^{A11}$ | H | H | $CD_3$ |
| m-105 | $R^{A12}$ | H | H | $CD_3$ |
| m-106 | $R^{A13}$ | H | H | $CD_3$ |
| m-107 | $R^{A14}$ | H | H | $CD_3$ |
| m-108 | $R^{A15}$ | H | H | $CD_3$ |
| m-109 | $R^{A16}$ | H | H | $CD_3$ |
| m-110 | $R^{A17}$ | H | H | $CD_3$ |
| m-111 | $R^{A18}$ | H | H | $CD_3$ |
| m-112 | $R^{A19}$ | H | H | $CD_3$ |
| m-113 | $R^{A20}$ | H | H | $CD_3$ |
| m-114 | $R^{A21}$ | H | H | $CD_3$ |
| m-115 | $R^{A22}$ | H | H | $CD_3$ |
| m-116 | $R^{A23}$ | H | H | $CD_3$ |
| m-117 | $R^{A24}$ | H | H | $CD_3$ |
| m-118 | $R^{A25}$ | H | H | $CD_3$ |
| m-119 | $R^{A26}$ | H | H | $CD_3$ |
| m-120 | $R^{A27}$ | H | H | $CD_3$ |
| m-121 | $R^{A28}$ | H | H | $CD_3$ |
| m-122 | $R^{A29}$ | H | H | $CD_3$ |
| m-123 | $R^{A30}$ | H | H | $CD_3$ |
| m-124 | $R^{A31}$ | H | H | $CD_3$ |
| m-125 | $R^{A32}$ | H | H | $CD_3$ |
| m-126 | $R^{A33}$ | H | H | $CD_3$ |
| m-127 | $R^{A34}$ | H | H | $CD_3$ |
| m-128 | $R^{A35}$ | H | H | $CD_3$ |
| m-129 | $R^{A36}$ | H | H | $CD_3$ |
| m-130 | $R^{A37}$ | H | H | $CD_3$ |
| m-131 | $R^{A38}$ | H | H | $CD_3$ |
| m-132 | $R^{A39}$ | H | H | $CD_3$ |
| m-133 | $R^{A40}$ | H | H | $CD_3$ |
| m-134 | $R^{A41}$ | H | H | $CD_3$ |
| m-135 | $R^{A42}$ | H | H | $CD_3$ |
| m-136 | $R^{A43}$ | H | H | $CD_3$ |
| m-137 | $R^{A44}$ | H | H | $CD_3$ |
| m-138 | $R^{A45}$ | H | H | $CD_3$ |
| m-139 | $R^{A46}$ | H | H | $CD_3$ |
| m-140 | $R^{A47}$ | H | H | $CD_3$ |
| m-141 | $R^{A48}$ | H | H | $CD_3$ |
| m-142 | $R^{A49}$ | H | H | $CD_3$ |
| m-143 | $R^{A50}$ | H | H | $CD_3$ |
| m-144 | $R^{A51}$ | H | H | $CD_3$ |
| m-145 | $R^{A52}$ | H | H | $CD_3$ |
| m-146 | $R^{A53}$ | H | H | $CD_3$ |
| m-147 | $R^{A54}$ | H | H | $CD_3$ |
| m-148 | $R^{A55}$ | H | H | $CD_3$ |
| m-149 | $R^{A56}$ | H | H | $CD_3$ |
| m-150 | $R^{A57}$ | H | H | $CD_3$ |
| m-151 | $R^{A58}$ | H | H | $CD_3$ |
| m-152 | $R^{A59}$ | H | H | $CD_3$ |
| m-153 | $R^{A60}$ | H | H | $CD_3$ |
| m-154 | $R^{A61}$ | H | H | $CD_3$ |
| m-155 | $R^{A62}$ | H | H | $CD_3$ |
| m-156 | $R^{A63}$ | H | H | $CD_3$ |
| m-157 | $R^{A64}$ | H | H | $CD_3$ |
| m-158 | $R^{A65}$ | H | H | $CD_3$ |
| m-159 | $R^{A66}$ | H | H | $CD_3$ |
| m-160 | $R^{A67}$ | H | H | $CD_3$ |
| m-161 | $R^{A68}$ | H | H | $CD_3$ |
| m-162 | $R^{A69}$ | H | H | $CD_3$ |
| m-163 | $R^{A70}$ | H | H | $CD_3$ |
| m-164 | $R^{A71}$ | H | H | $CD_3$ |
| m-165 | $R^{A72}$ | H | H | $CD_3$ |
| m-166 | $R^{A73}$ | H | H | $CD_3$ |
| m-167 | $R^{A74}$ | H | H | $CD_3$ |
| m-168 | $R^{A75}$ | H | H | $CD_3$ |
| m-169 | $R^{A76}$ | H | H | $CD_3$ |
| m-170 | $R^{A77}$ | H | H | $CD_3$ |
| m-171 | $R^{A78}$ | H | H | $CD_3$ |
| m-172 | $R^{A79}$ | H | H | $CD_3$ |
| m-173 | $R^{A80}$ | H | H | $CD_3$ |
| m-174 | $R^{A81}$ | H | H | $CD_3$ |
| m-175 | $R^{A82}$ | H | H | $CD_3$ |
| m-176 | $R^{A83}$ | H | H | $CD_3$ |
| m-177 | $R^{A84}$ | H | H | $CD_3$ |
| m-178 | $R^{A85}$ | H | H | $CD_3$ |
| m-179 | $R^{A86}$ | H | H | $CD_3$ |
| m-180 | $R^{A87}$ | H | H | $CD_3$ |
| m-181 | $R^{A88}$ | H | H | $CD_3$ |
| m-182 | $R^{A89}$ | H | H | $CD_3$ |
| m-183 | $R^{A90}$ | H | H | $CD_3$ |
| m-184 | $R^{A91}$ | H | H | $CD_3$ |
| m-185 | $R^{A92}$ | H | H | $CD_3$ |
| m-186 | $R^{A93}$ | H | H | $CD_3$ |
| m-187 | $R^{A1}$ | H | $CD_3$ | $CD_3$ |
| m-188 | $R^{A2}$ | H | $CD_3$ | $CD_3$ |
| m-189 | $R^{A3}$ | H | $CD_3$ | $CD_3$ |
| m-190 | $R^{A4}$ | H | $CD_3$ | $CD_3$ |
| m-191 | $R^{A5}$ | H | $CD_3$ | $CD_3$ |
| m-192 | $R^{A6}$ | H | $CD_3$ | $CD_3$ |
| m-193 | $R^{A7}$ | H | $CD_3$ | $CD_3$ |
| m-194 | $R^{A8}$ | H | $CD_3$ | $CD_3$ |
| m-195 | $R^{A9}$ | H | $CD_3$ | $CD_3$ |
| m-196 | $R^{A10}$ | H | $CD_3$ | $CD_3$ |
| m-197 | $R^{A11}$ | H | $CD_3$ | $CD_3$ |
| m-198 | $R^{A12}$ | H | $CD_3$ | $CD_3$ |
| m-199 | $R^{A13}$ | H | $CD_3$ | $CD_3$ |
| m-200 | $R^{A14}$ | H | $CD_3$ | $CD_3$ |
| m-201 | $R^{A15}$ | H | $CD_3$ | $CD_3$ |

-continued

| Compound # | $R^{1a}$ | $R^{1b}$ | $R^{2a}$ | $R^{2b}$ |
|---|---|---|---|---|
| m-202 | $R^{A16}$ | H | $CD_3$ | $CD_3$ |
| m-203 | $R^{A17}$ | H | $CD_3$ | $CD_3$ |
| m-204 | $R^{A18}$ | H | $CD_3$ | $CD_3$ |
| m-205 | $R^{A19}$ | H | $CD_3$ | $CD_3$ |
| m-206 | $R^{A20}$ | H | $CD_3$ | $CD_3$ |
| m-207 | $R^{A21}$ | H | $CD_3$ | $CD_3$ |
| m-208 | $R^{A22}$ | H | $CD_3$ | $CD_3$ |
| m-209 | $R^{A23}$ | H | $CD_3$ | $CD_3$ |
| m-210 | $R^{A24}$ | H | $CD_3$ | $CD_3$ |
| m-211 | $R^{A25}$ | H | $CD_3$ | $CD_3$ |
| m-212 | $R^{A26}$ | H | $CD_3$ | $CD_3$ |
| m-213 | $R^{A27}$ | H | $CD_3$ | $CD_3$ |
| m-214 | $R^{A28}$ | H | $CD_3$ | $CD_3$ |
| m-215 | $R^{A29}$ | H | $CD_3$ | $CD_3$ |
| m-216 | $R^{A30}$ | H | $CD_3$ | $CD_3$ |
| m-217 | $R^{A31}$ | H | $CD_3$ | $CD_3$ |
| m-218 | $R^{A32}$ | H | $CD_3$ | $CD_3$ |
| m-219 | $R^{A33}$ | H | $CD_3$ | $CD_3$ |
| m-220 | $R^{A34}$ | H | $CD_3$ | $CD_3$ |
| m-221 | $R^{A35}$ | H | $CD_3$ | $CD_3$ |
| m-222 | $R^{A36}$ | H | $CD_3$ | $CD_3$ |
| m-223 | $R^{A37}$ | H | $CD_3$ | $CD_3$ |
| m-224 | $R^{A38}$ | H | $CD_3$ | $CD_3$ |
| m-225 | $R^{A39}$ | H | $CD_3$ | $CD_3$ |
| m-226 | $R^{A40}$ | H | $CD_3$ | $CD_3$ |
| m-227 | $R^{A41}$ | H | $CD_3$ | $CD_3$ |
| m-228 | $R^{A42}$ | H | $CD_3$ | $CD_3$ |
| m-229 | $R^{A43}$ | H | $CD_3$ | $CD_3$ |
| m-230 | $R^{A44}$ | H | $CD_3$ | $CD_3$ |
| m-231 | $R^{A45}$ | H | $CD_3$ | $CD_3$ |
| m-232 | $R^{A46}$ | H | $CD_3$ | $CD_3$ |
| m-233 | $R^{A47}$ | H | $CD_3$ | $CD_3$ |
| m-234 | $R^{A48}$ | H | $CD_3$ | $CD_3$ |
| m-235 | $R^{A49}$ | H | $CD_3$ | $CD_3$ |
| m-236 | $R^{A50}$ | H | $CD_3$ | $CD_3$ |
| m-237 | $R^{A51}$ | H | $CD_3$ | $CD_3$ |
| m-238 | $R^{A52}$ | H | $CD_3$ | $CD_3$ |
| m-239 | $R^{A53}$ | H | $CD_3$ | $CD_3$ |
| m-240 | $R^{A54}$ | H | $CD_3$ | $CD_3$ |
| m-241 | $R^{A55}$ | H | $CD_3$ | $CD_3$ |
| m-242 | $R^{A56}$ | H | $CD_3$ | $CD_3$ |
| m-243 | $R^{A57}$ | H | $CD_3$ | $CD_3$ |
| m-244 | $R^{A58}$ | H | $CD_3$ | $CD_3$ |
| m-245 | $R^{A59}$ | H | $CD_3$ | $CD_3$ |
| m-246 | $R^{A60}$ | H | $CD_3$ | $CD_3$ |
| m-247 | $R^{A61}$ | H | $CD_3$ | $CD_3$ |
| m-248 | $R^{A62}$ | H | $CD_3$ | $CD_3$ |
| m-249 | $R^{A63}$ | H | $CD_3$ | $CD_3$ |
| m-250 | $R^{A64}$ | H | $CD_3$ | $CD_3$ |
| m-251 | $R^{A65}$ | H | $CD_3$ | $CD_3$ |
| m-252 | $R^{A66}$ | H | $CD_3$ | $CD_3$ |
| m-253 | $R^{A67}$ | H | $CD_3$ | $CD_3$ |
| m-254 | $R^{A68}$ | H | $CD_3$ | $CD_3$ |
| m-255 | $R^{A69}$ | H | $CD_3$ | $CD_3$ |
| m-256 | $R^{A70}$ | H | $CD_3$ | $CD_3$ |
| m-257 | $R^{A71}$ | H | $CD_3$ | $CD_3$ |
| m-258 | $R^{A72}$ | H | $CD_3$ | $CD_3$ |
| m-259 | $R^{A73}$ | H | $CD_3$ | $CD_3$ |
| m-260 | $R^{A74}$ | H | $CD_3$ | $CD_3$ |
| m-261 | $R^{A75}$ | H | $CD_3$ | $CD_3$ |
| m-262 | $R^{A76}$ | H | $CD_3$ | $CD_3$ |
| m-263 | $R^{A77}$ | H | $CD_3$ | $CD_3$ |
| m-264 | $R^{A78}$ | H | $CD_3$ | $CD_3$ |
| m-265 | $R^{A79}$ | H | $CD_3$ | $CD_3$ |
| m-266 | $R^{A80}$ | H | $CD_3$ | $CD_3$ |
| m-267 | $R^{A81}$ | H | $CD_3$ | $CD_3$ |
| m-268 | $R^{A82}$ | H | $CD_3$ | $CD_3$ |
| m-269 | $R^{A83}$ | H | $CD_3$ | $CD_3$ |
| m-270 | $R^{A84}$ | H | $CD_3$ | $CD_3$ |
| m-271 | $R^{A85}$ | H | $CD_3$ | $CD_3$ |
| m-272 | $R^{A86}$ | H | $CD_3$ | $CD_3$ |
| m-273 | $R^{A87}$ | H | $CD_3$ | $CD_3$ |
| m-274 | $R^{A88}$ | H | $CD_3$ | $CD_3$ |
| m-275 | $R^{A89}$ | H | $CD_3$ | $CD_3$ |
| m-276 | $R^{A90}$ | H | $CD_3$ | $CD_3$ |
| m-277 | $R^{A91}$ | H | $CD_3$ | $CD_3$ |
| m-278 | $R^{A92}$ | H | $CD_3$ | $CD_3$ |
| m-279 | $R^{A93}$ | H | $CD_3$ | $CD_3$ |
| m-280 | $R^{A1}$ | H | $CD_3$ | $CD_3$ |
| m-281 | $R^{A2}$ | H | $CD_3$ | $CD_3$ |
| m-282 | $R^{A3}$ | H | $CD_3$ | $CD_3$ |
| m-283 | $R^{A4}$ | H | $CD_3$ | $CD_3$ |
| m-284 | $R^{A5}$ | H | $CD_3$ | $CD_3$ |
| m-285 | $R^{A6}$ | H | $CD_3$ | $CD_3$ |
| m-286 | $R^{A7}$ | H | $CD_3$ | $CD_3$ |
| m-287 | $R^{A8}$ | H | $CD_3$ | $CD_3$ |
| m-288 | $R^{A9}$ | H | $CD_3$ | $CD_3$ |
| m-289 | $R^{A10}$ | H | $CD_3$ | $CD_3$ |
| m-290 | $R^{A11}$ | H | $CD_3$ | $CD_3$ |
| m-291 | $R^{A12}$ | H | $CD_3$ | $CD_3$ |
| m-292 | $R^{A13}$ | H | $CD_3$ | $CD_3$ |
| m-293 | $R^{A14}$ | H | $CD_3$ | $CD_3$ |
| m-294 | $R^{A15}$ | H | $CD_3$ | $CD_3$ |
| m-295 | $R^{A16}$ | H | $CD_3$ | $CD_3$ |
| m-296 | $R^{A17}$ | H | $CD_3$ | $CD_3$ |
| m-297 | $R^{A18}$ | H | $CD_3$ | $CD_3$ |
| m-298 | $R^{A19}$ | H | $CD_3$ | $CD_3$ |
| m-299 | $R^{A20}$ | H | $CD_3$ | $CD_3$ |
| m-300 | $R^{A21}$ | H | $CD_3$ | $CD_3$ |
| m-301 | $R^{A22}$ | H | $CD_3$ | $CD_3$ |
| m-302 | $R^{A23}$ | H | $CD_3$ | $CD_3$ |
| m-303 | $R^{A24}$ | H | $CD_3$ | $CD_3$ |
| m-304 | $R^{A25}$ | H | $CD_3$ | $CD_3$ |
| m-305 | $R^{A26}$ | H | $CD_3$ | $CD_3$ |
| m-306 | $R^{A27}$ | H | $CD_3$ | $CD_3$ |
| m-307 | $R^{A28}$ | H | $CD_3$ | $CD_3$ |
| m-308 | $R^{A29}$ | H | $CD_3$ | $CD_3$ |
| m-309 | $R^{A30}$ | H | $CD_3$ | $CD_3$ |
| m-310 | $R^{A31}$ | H | $CD_3$ | $CD_3$ |
| m-311 | $R^{A32}$ | H | $CD_3$ | $CD_3$ |
| m-312 | $R^{A33}$ | H | $CD_3$ | $CD_3$ |
| m-313 | $R^{A34}$ | H | $CD_3$ | $CD_3$ |
| m-314 | $R^{A35}$ | H | $CD_3$ | $CD_3$ |
| m-315 | $R^{A36}$ | H | $CD_3$ | $CD_3$ |
| m-316 | $R^{A37}$ | H | $CD_3$ | $CD_3$ |
| m-317 | $R^{A38}$ | H | $CD_3$ | $CD_3$ |
| m-318 | $R^{A39}$ | H | $CD_3$ | $CD_3$ |
| m-319 | $R^{A40}$ | H | $CD_3$ | $CD_3$ |
| m-320 | $R^{A41}$ | H | $CD_3$ | $CD_3$ |
| m-321 | $R^{A42}$ | H | $CD_3$ | $CD_3$ |
| m-322 | $R^{A43}$ | H | $CD_3$ | $CD_3$ |
| m-323 | $R^{A44}$ | H | $CD_3$ | $CD_3$ |
| m-324 | $R^{A45}$ | H | $CD_3$ | $CD_3$ |
| m-325 | $R^{A46}$ | H | $CD_3$ | $CD_3$ |
| m-326 | $R^{A47}$ | H | $CD_3$ | $CD_3$ |
| m-327 | $R^{A48}$ | H | $CD_3$ | $CD_3$ |
| m-328 | $R^{A49}$ | H | $CD_3$ | $CD_3$ |
| m-329 | $R^{A50}$ | H | $CD_3$ | $CD_3$ |
| m-330 | $R^{A51}$ | H | $CD_3$ | $CD_3$ |
| m-331 | $R^{A52}$ | H | $CD_3$ | $CD_3$ |
| m-332 | $R^{A53}$ | H | $CD_3$ | $CD_3$ |
| m-333 | $R^{A54}$ | H | $CD_3$ | $CD_3$ |
| m-334 | $R^{A55}$ | H | $CD_3$ | $CD_3$ |
| m-335 | $R^{A56}$ | H | $CD_3$ | $CD_3$ |
| m-336 | $R^{A57}$ | H | $CD_3$ | $CD_3$ |
| m-337 | $R^{A58}$ | H | $CD_3$ | $CD_3$ |
| m-338 | $R^{A59}$ | H | $CD_3$ | $CD_3$ |
| m-339 | $R^{A60}$ | H | $CD_3$ | $CD_3$ |
| m-340 | $R^{A61}$ | H | $CD_3$ | $CD_3$ |
| m-341 | $R^{A62}$ | H | $CD_3$ | $CD_3$ |
| m-342 | $R^{A63}$ | H | $CD_3$ | $CD_3$ |
| m-343 | $R^{A64}$ | H | $CD_3$ | $CD_3$ |
| m-344 | $R^{A65}$ | H | $CD_3$ | $CD_3$ |
| m-345 | $R^{A66}$ | H | $CD_3$ | $CD_3$ |
| m-346 | $R^{A67}$ | H | $CD_3$ | $CD_3$ |
| m-347 | $R^{A68}$ | H | $CD_3$ | $CD_3$ |
| m-348 | $R^{A69}$ | H | $CD_3$ | $CD_3$ |
| m-349 | $R^{A70}$ | H | $CD_3$ | $CD_3$ |
| m-350 | $R^{A71}$ | H | $CD_3$ | $CD_3$ |
| m-351 | $R^{A72}$ | H | $CD_3$ | $CD_3$ |
| m-352 | $R^{A73}$ | H | $CD_3$ | $CD_3$ |
| m-353 | $R^{A74}$ | H | $CD_3$ | $CD_3$ |
| m-354 | $R^{A75}$ | H | $CD_3$ | $CD_3$ |
| m-355 | $R^{A76}$ | H | $CD_3$ | $CD_3$ |

-continued

| Compound # | $R^{1a}$ | $R^{1b}$ | $R^{2a}$ | $R^{2b}$ |
|---|---|---|---|---|
| m-356 | $R^{A77}$ | H | $CD_3$ | $CD_3$ |
| m-357 | $R^{A78}$ | H | $CD_3$ | $CD_3$ |
| m-358 | $R^{A79}$ | H | $CD_3$ | $CD_3$ |
| m-359 | $R^{A80}$ | H | $CD_3$ | $CD_3$ |
| m-360 | $R^{A81}$ | H | $CD_3$ | $CD_3$ |
| m-361 | $R^{A82}$ | H | $CD_3$ | $CD_3$ |
| m-362 | $R^{A83}$ | H | $CD_3$ | $CD_3$ |
| m-363 | $R^{A84}$ | H | $CD_3$ | $CD_3$ |
| m-364 | $R^{A85}$ | H | $CD_3$ | $CD_3$ |
| m-365 | $R^{A86}$ | H | $CD_3$ | $CD_3$ |
| m-366 | $R^{A87}$ | H | $CD_3$ | $CD_3$ |
| m-367 | $R^{A88}$ | H | $CD_3$ | $CD_3$ |
| m-368 | $R^{A89}$ | H | $CD_3$ | $CD_3$ |
| m-369 | $R^{A90}$ | H | $CD_3$ | $CD_3$ |
| m-370 | $R^{A91}$ | H | $CD_3$ | $CD_3$ |
| m-371 | $R^{A92}$ | H | $CD_3$ | $CD_3$ |
| m-372 | $R^{A93}$ | H | $CD_3$ | $CD_3$ |
| m-373 | $R^{A1}$ | $CD_3$ | $CD_3$ | $CD_3$ |
| m-374 | $R^{A2}$ | $CD_3$ | $CD_3$ | $CD_3$ |
| m-375 | $R^{A3}$ | $CD_3$ | $CD_3$ | $CD_3$ |
| m-376 | $R^{A4}$ | $CD_3$ | $CD_3$ | $CD_3$ |
| m-377 | $R^{A5}$ | $CD_3$ | $CD_3$ | $CD_3$ |
| m-378 | $R^{A6}$ | $CD_3$ | $CD_3$ | $CD_3$ |
| m-379 | $R^{A7}$ | $CD_3$ | $CD_3$ | $CD_3$ |
| m-380 | $R^{A8}$ | $CD_3$ | $CD_3$ | $CD_3$ |
| m-381 | $R^{A9}$ | $CD_3$ | $CD_3$ | $CD_3$ |
| m-382 | $R^{A10}$ | $CD_3$ | $CD_3$ | $CD_3$ |
| m-383 | $R^{A11}$ | $CD_3$ | $CD_3$ | $CD_3$ |
| m-384 | $R^{A12}$ | $CD_3$ | $CD_3$ | $CD_3$ |
| m-385 | $R^{A13}$ | $CD_3$ | $CD_3$ | $CD_3$ |
| m-386 | $R^{A14}$ | $CD_3$ | $CD_3$ | $CD_3$ |
| m-387 | $R^{A15}$ | $CD_3$ | $CD_3$ | $CD_3$ |
| m-388 | $R^{A16}$ | $CD_3$ | $CD_3$ | $CD_3$ |
| m-389 | $R^{A17}$ | $CD_3$ | $CD_3$ | $CD_3$ |
| m-390 | $R^{A18}$ | $CD_3$ | $CD_3$ | $CD_3$ |
| m-391 | $R^{A19}$ | $CD_3$ | $CD_3$ | $CD_3$ |
| m-392 | $R^{A20}$ | $CD_3$ | $CD_3$ | $CD_3$ |
| m-393 | $R^{A21}$ | $CD_3$ | $CD_3$ | $CD_3$ |
| m-394 | $R^{A22}$ | $CD_3$ | $CD_3$ | $CD_3$ |
| m-395 | $R^{A23}$ | $CD_3$ | $CD_3$ | $CD_3$ |
| m-396 | $R^{A24}$ | $CD_3$ | $CD_3$ | $CD_3$ |
| m-397 | $R^{A25}$ | $CD_3$ | $CD_3$ | $CD_3$ |
| m-398 | $R^{A26}$ | $CD_3$ | $CD_3$ | $CD_3$ |
| m-399 | $R^{A27}$ | $CD_3$ | $CD_3$ | $CD_3$ |
| m-400 | $R^{A28}$ | $CD_3$ | $CD_3$ | $CD_3$ |
| m-401 | $R^{A29}$ | $CD_3$ | $CD_3$ | $CD_3$ |
| m-402 | $R^{A30}$ | $CD_3$ | $CD_3$ | $CD_3$ |
| m-403 | $R^{A31}$ | $CD_3$ | $CD_3$ | $CD_3$ |
| m-404 | $R^{A32}$ | $CD_3$ | $CD_3$ | $CD_3$ |
| m-405 | $R^{A33}$ | $CD_3$ | $CD_3$ | $CD_3$ |
| m-406 | $R^{A34}$ | $CD_3$ | $CD_3$ | $CD_3$ |
| m-407 | $R^{A35}$ | $CD_3$ | $CD_3$ | $CD_3$ |
| m-408 | $R^{A36}$ | $CD_3$ | $CD_3$ | $CD_3$ |
| m-409 | $R^{A37}$ | $CD_3$ | $CD_3$ | $CD_3$ |
| m-410 | $R^{A38}$ | $CD_3$ | $CD_3$ | $CD_3$ |
| m-411 | $R^{A39}$ | $CD_3$ | $CD_3$ | $CD_3$ |
| m-412 | $R^{A40}$ | $CD_3$ | $CD_3$ | $CD_3$ |
| m-413 | $R^{A41}$ | $CD_3$ | $CD_3$ | $CD_3$ |
| m-414 | $R^{A42}$ | $CD_3$ | $CD_3$ | $CD_3$ |
| m-415 | $R^{A43}$ | $CD_3$ | $CD_3$ | $CD_3$ |
| m-416 | $R^{A44}$ | $CD_3$ | $CD_3$ | $CD_3$ |
| m-417 | $R^{A45}$ | $CD_3$ | $CD_3$ | $CD_3$ |
| m-418 | $R^{A46}$ | $CD_3$ | $CD_3$ | $CD_3$ |
| m-419 | $R^{A47}$ | $CD_3$ | $CD_3$ | $CD_3$ |
| m-420 | $R^{A48}$ | $CD_3$ | $CD_3$ | $CD_3$ |
| m-421 | $R^{A49}$ | $CD_3$ | $CD_3$ | $CD_3$ |
| m-422 | $R^{A50}$ | $CD_3$ | $CD_3$ | $CD_3$ |
| m-423 | $R^{A51}$ | $CD_3$ | $CD_3$ | $CD_3$ |
| m-424 | $R^{A52}$ | $CD_3$ | $CD_3$ | $CD_3$ |
| m-425 | $R^{A53}$ | $CD_3$ | $CD_3$ | $CD_3$ |
| m-426 | $R^{A54}$ | $CD_3$ | $CD_3$ | $CD_3$ |
| m-427 | $R^{A55}$ | $CD_3$ | $CD_3$ | $CD_3$ |
| m-428 | $R^{A56}$ | $CD_3$ | $CD_3$ | $CD_3$ |
| m-429 | $R^{A57}$ | $CD_3$ | $CD_3$ | $CD_3$ |
| m-430 | $R^{A58}$ | $CD_3$ | $CD_3$ | $CD_3$ |
| m-431 | $R^{A59}$ | $CD_3$ | $CD_3$ | $CD_3$ |
| m-432 | $R^{A60}$ | $CD_3$ | $CD_3$ | $CD_3$ |

-continued

| Compound # | $R^{1a}$ | $R^{1b}$ | $R^{2a}$ | $R^{2b}$ |
|---|---|---|---|---|
| m-433 | $R^{A61}$ | $CD_3$ | $CD_3$ | $CD_3$ |
| m-434 | $R^{A62}$ | $CD_3$ | $CD_3$ | $CD_3$ |
| m-435 | $R^{A63}$ | $CD_3$ | $CD_3$ | $CD_3$ |
| m-436 | $R^{A64}$ | $CD_3$ | $CD_3$ | $CD_3$ |
| m-437 | $R^{A65}$ | $CD_3$ | $CD_3$ | $CD_3$ |
| m-438 | $R^{A66}$ | $CD_3$ | $CD_3$ | $CD_3$ |
| m-439 | $R^{A67}$ | $CD_3$ | $CD_3$ | $CD_3$ |
| m-440 | $R^{A68}$ | $CD_3$ | $CD_3$ | $CD_3$ |
| m-441 | $R^{A69}$ | $CD_3$ | $CD_3$ | $CD_3$ |
| m-442 | $R^{A70}$ | $CD_3$ | $CD_3$ | $CD_3$ |
| m-443 | $R^{A71}$ | $CD_3$ | $CD_3$ | $CD_3$ |
| m-444 | $R^{A72}$ | $CD_3$ | $CD_3$ | $CD_3$ |
| m-445 | $R^{A73}$ | $CD_3$ | $CD_3$ | $CD_3$ |
| m-446 | $R^{A74}$ | $CD_3$ | $CD_3$ | $CD_3$ |
| m-447 | $R^{A75}$ | $CD_3$ | $CD_3$ | $CD_3$ |
| m-448 | $R^{A76}$ | $CD_3$ | $CD_3$ | $CD_3$ |
| m-449 | $R^{A77}$ | $CD_3$ | $CD_3$ | $CD_3$ |
| m-450 | $R^{A78}$ | $CD_3$ | $CD_3$ | $CD_3$ |
| m-451 | $R^{A79}$ | $CD_3$ | $CD_3$ | $CD_3$ |
| m-452 | $R^{A80}$ | $CD_3$ | $CD_3$ | $CD_3$ |
| m-453 | $R^{A81}$ | $CD_3$ | $CD_3$ | $CD_3$ |
| m-454 | $R^{A82}$ | $CD_3$ | $CD_3$ | $CD_3$ |
| m-455 | $R^{A83}$ | $CD_3$ | $CD_3$ | $CD_3$ |
| m-456 | $R^{A84}$ | $CD_3$ | $CD_3$ | $CD_3$ |
| m-457 | $R^{A85}$ | $CD_3$ | $CD_3$ | $CD_3$ |
| m-458 | $R^{A86}$ | $CD_3$ | $CD_3$ | $CD_3$ |
| m-459 | $R^{A87}$ | $CD_3$ | $CD_3$ | $CD_3$ |
| m-460 | $R^{A88}$ | $CD_3$ | $CD_3$ | $CD_3$ |
| m-461 | $R^{A89}$ | $CD_3$ | $CD_3$ | $CD_3$ |
| m-462 | $R^{A90}$ | $CD_3$ | $CD_3$ | $CD_3$ |
| m-463 | $R^{A91}$ | $CD_3$ | $CD_3$ | $CD_3$ |
| m-464 | $R^{A92}$ | $CD_3$ | $CD_3$ | $CD_3$ |
| m-465 | $R^{A93}$ | $CD_3$ | $CD_3$ | $CD_3$ |
| m-466 | $R^{A1}$ | $CD_3$ | H | H |
| m-467 | $R^{A2}$ | $CD_3$ | H | H |
| m-468 | $R^{A3}$ | $CD_3$ | H | H |
| m-469 | $R^{A4}$ | $CD_3$ | H | H |
| m-470 | $R^{A5}$ | $CD_3$ | H | H |
| m-471 | $R^{A6}$ | $CD_3$ | H | H |
| m-472 | $R^{A7}$ | $CD_3$ | H | H |
| m-473 | $R^{A8}$ | $CD_3$ | H | H |
| m-474 | $R^{A9}$ | $CD_3$ | H | H |
| m-475 | $R^{A10}$ | $CD_3$ | H | H |
| m-476 | $R^{A11}$ | $CD_3$ | H | H |
| m-477 | $R^{A12}$ | $CD_3$ | H | H |
| m-478 | $R^{A13}$ | $CD_3$ | H | H |
| m-479 | $R^{A14}$ | $CD_3$ | H | H |
| m-480 | $R^{A15}$ | $CD_3$ | H | H |
| m-481 | $R^{A16}$ | $CD_3$ | H | H |
| m-482 | $R^{A17}$ | $CD_3$ | H | H |
| m-483 | $R^{A18}$ | $CD_3$ | H | H |
| m-484 | $R^{A19}$ | $CD_3$ | H | H |
| m-485 | $R^{A20}$ | $CD_3$ | H | H |
| m-486 | $R^{A21}$ | $CD_3$ | H | H |
| m-487 | $R^{A22}$ | $CD_3$ | H | H |
| m-488 | $R^{A23}$ | $CD_3$ | H | H |
| m-489 | $R^{A24}$ | $CD_3$ | H | H |
| m-490 | $R^{A25}$ | $CD_3$ | H | H |
| m-491 | $R^{A26}$ | $CD_3$ | H | H |
| m-492 | $R^{A27}$ | $CD_3$ | H | H |
| m-493 | $R^{A28}$ | $CD_3$ | H | H |
| m-494 | $R^{A29}$ | $CD_3$ | H | H |
| m-495 | $R^{A30}$ | $CD_3$ | H | H |
| m-496 | $R^{A31}$ | $CD_3$ | H | H |
| m-497 | $R^{A32}$ | $CD_3$ | H | H |
| m-498 | $R^{A33}$ | $CD_3$ | H | H |
| m-499 | $R^{A34}$ | $CD_3$ | H | H |
| m-500 | $R^{A35}$ | $CD_3$ | H | H |
| m-501 | $R^{A36}$ | $CD_3$ | H | H |
| m-502 | $R^{A37}$ | $CD_3$ | H | H |
| m-503 | $R^{A38}$ | $CD_3$ | H | H |
| m-504 | $R^{A39}$ | $CD_3$ | H | H |
| m-505 | $R^{A40}$ | $CD_3$ | H | H |
| m-506 | $R^{A41}$ | $CD_3$ | H | H |
| m-507 | $R^{A42}$ | $CD_3$ | H | H |
| m-508 | $R^{A43}$ | $CD_3$ | H | H |
| m-509 | $R^{A44}$ | $CD_3$ | H | H |

-continued

| Compound # | $R^{1a}$ | $R^{1b}$ | $R^{2a}$ | $R^{2b}$ |
|---|---|---|---|---|
| m-510 | $R^{A45}$ | $CD_3$ | H | H |
| m-511 | $R^{A46}$ | $CD_3$ | H | H |
| m-512 | $R^{A47}$ | $CD_3$ | H | H |
| m-513 | $R^{A48}$ | $CD_3$ | H | H |
| m-514 | $R^{A49}$ | $CD_3$ | H | H |
| m-515 | $R^{A50}$ | $CD_3$ | H | H |
| m-516 | $R^{A51}$ | $CD_3$ | H | H |
| m-517 | $R^{A52}$ | $CD_3$ | H | H |
| m-518 | $R^{A53}$ | $CD_3$ | H | H |
| m-519 | $R^{A54}$ | $CD_3$ | H | H |
| m-520 | $R^{A55}$ | $CD_3$ | H | H |
| m-521 | $R^{A56}$ | $CD_3$ | H | H |
| m-522 | $R^{A57}$ | $CD_3$ | H | H |
| m-523 | $R^{A58}$ | $CD_3$ | H | H |
| m-524 | $R^{A59}$ | $CD_3$ | H | H |
| m-525 | $R^{A60}$ | $CD_3$ | H | H |
| m-526 | $R^{A61}$ | $CD_3$ | H | H |
| m-527 | $R^{A62}$ | $CD_3$ | H | H |
| m-528 | $R^{A63}$ | $CD_3$ | H | H |
| m-529 | $R^{A64}$ | $CD_3$ | H | H |
| m-530 | $R^{A65}$ | $CD_3$ | H | H |
| m-531 | $R^{A66}$ | $CD_3$ | H | H |
| m-532 | $R^{A67}$ | $CD_3$ | H | H |
| m-533 | $R^{A68}$ | $CD_3$ | H | H |
| m-534 | $R^{A69}$ | $CD_3$ | H | H |
| m-535 | $R^{A70}$ | $CD_3$ | H | H |
| m-536 | $R^{A71}$ | $CD_3$ | H | H |
| m-537 | $R^{A72}$ | $CD_3$ | H | H |
| m-538 | $R^{A73}$ | $CD_3$ | H | H |
| m-539 | $R^{A74}$ | $CD_3$ | H | H |
| m-540 | $R^{A75}$ | $CD_3$ | H | H |
| m-541 | $R^{A76}$ | $CD_3$ | H | H |
| m-542 | $R^{A77}$ | $CD_3$ | H | H |
| m-543 | $R^{A78}$ | $CD_3$ | H | H |
| m-544 | $R^{A79}$ | $CD_3$ | H | H |
| m-545 | $R^{A80}$ | $CD_3$ | H | H |
| m-546 | $R^{A81}$ | $CD_3$ | H | H |
| m-547 | $R^{A82}$ | $CD_3$ | H | H |
| m-548 | $R^{A83}$ | $CD_3$ | H | H |
| m-549 | $R^{A84}$ | $CD_3$ | H | H |
| m-550 | $R^{A85}$ | $CD_3$ | H | H |
| m-551 | $R^{A86}$ | $CD_3$ | H | H |
| m-552 | $R^{A87}$ | $CD_3$ | H | H |
| m-553 | $R^{A88}$ | $CD_3$ | H | H |
| m-554 | $R^{A89}$ | $CD_3$ | H | H |
| m-555 | $R^{A90}$ | $CD_3$ | H | H |
| m-556 | $R^{A91}$ | $CD_3$ | H | H |
| m-557 | $R^{A92}$ | $CD_3$ | H | H |
| m-558 | $R^{A93}$ | $CD_3$ | H | H |
| m-559 | $R^{A1}$ | $CD_3$ | H | $CD_3$ |
| m-560 | $R^{A2}$ | $CD_3$ | H | $CD_3$ |
| m-561 | $R^{A3}$ | $CD_3$ | H | $CD_3$ |
| m-562 | $R^{A4}$ | $CD_3$ | H | $CD_3$ |
| m-563 | $R^{A5}$ | $CD_3$ | H | $CD_3$ |
| m-564 | $R^{A6}$ | $CD_3$ | H | $CD_3$ |
| m-565 | $R^{A7}$ | $CD_3$ | H | $CD_3$ |
| m-566 | $R^{A8}$ | $CD_3$ | H | $CD_3$ |
| m-567 | $R^{A9}$ | $CD_3$ | H | $CD_3$ |
| m-568 | $R^{A10}$ | $CD_3$ | H | $CD_3$ |
| m-569 | $R^{A11}$ | $CD_3$ | H | $CD_3$ |
| m-570 | $R^{A12}$ | $CD_3$ | H | $CD_3$ |
| m-571 | $R^{A13}$ | $CD_3$ | H | $CD_3$ |
| m-572 | $R^{A14}$ | $CD_3$ | H | $CD_3$ |
| m-573 | $R^{A15}$ | $CD_3$ | H | $CD_3$ |
| m-574 | $R^{A16}$ | $CD_3$ | H | $CD_3$ |
| m-575 | $R^{A17}$ | $CD_3$ | H | $CD_3$ |
| m-576 | $R^{A18}$ | $CD_3$ | H | $CD_3$ |
| m-577 | $R^{A19}$ | $CD_3$ | H | $CD_3$ |
| m-578 | $R^{A20}$ | $CD_3$ | H | $CD_3$ |
| m-579 | $R^{A21}$ | $CD_3$ | H | $CD_3$ |
| m-580 | $R^{A22}$ | $CD_3$ | H | $CD_3$ |
| m-581 | $R^{A23}$ | $CD_3$ | H | $CD_3$ |
| m-582 | $R^{A24}$ | $CD_3$ | H | $CD_3$ |
| m-583 | $R^{A25}$ | $CD_3$ | H | $CD_3$ |
| m-584 | $R^{A26}$ | $CD_3$ | H | $CD_3$ |
| m-585 | $R^{A27}$ | $CD_3$ | H | $CD_3$ |
| m-586 | $R^{A28}$ | $CD_3$ | H | $CD_3$ |

-continued

| Compound # | $R^{1a}$ | $R^{1b}$ | $R^{2a}$ | $R^{2b}$ |
|---|---|---|---|---|
| m-587 | $R^{A29}$ | $CD_3$ | H | $CD_3$ |
| m-588 | $R^{A30}$ | $CD_3$ | H | $CD_3$ |
| m-589 | $R^{A31}$ | $CD_3$ | H | $CD_3$ |
| m-590 | $R^{A32}$ | $CD_3$ | H | $CD_3$ |
| m-591 | $R^{A33}$ | $CD_3$ | H | $CD_3$ |
| m-592 | $R^{A34}$ | $CD_3$ | H | $CD_3$ |
| m-593 | $R^{A35}$ | $CD_3$ | H | $CD_3$ |
| m-594 | $R^{A36}$ | $CD_3$ | H | $CD_3$ |
| m-595 | $R^{A37}$ | $CD_3$ | H | $CD_3$ |
| m-596 | $R^{A38}$ | $CD_3$ | H | $CD_3$ |
| m-597 | $R^{A39}$ | $CD_3$ | H | $CD_3$ |
| m-598 | $R^{A40}$ | $CD_3$ | H | $CD_3$ |
| m-599 | $R^{A41}$ | $CD_3$ | H | $CD_3$ |
| m-600 | $R^{A42}$ | $CD_3$ | H | $CD_3$ |
| m-601 | $R^{A43}$ | $CD_3$ | H | $CD_3$ |
| m-602 | $R^{A44}$ | $CD_3$ | H | $CD_3$ |
| m-603 | $R^{A45}$ | $CD_3$ | H | $CD_3$ |
| m-604 | $R^{A46}$ | $CD_3$ | H | $CD_3$ |
| m-605 | $R^{A47}$ | $CD_3$ | H | $CD_3$ |
| m-606 | $R^{A48}$ | $CD_3$ | H | $CD_3$ |
| m-607 | $R^{A49}$ | $CD_3$ | H | $CD_3$ |
| m-608 | $R^{A50}$ | $CD_3$ | H | $CD_3$ |
| m-609 | $R^{A51}$ | $CD_3$ | H | $CD_3$ |
| m-610 | $R^{A52}$ | $CD_3$ | H | $CD_3$ |
| m-611 | $R^{A53}$ | $CD_3$ | H | $CD_3$ |
| m-612 | $R^{A54}$ | $CD_3$ | H | $CD_3$ |
| m-613 | $R^{A55}$ | $CD_3$ | H | $CD_3$ |
| m-614 | $R^{A56}$ | $CD_3$ | H | $CD_3$ |
| m-615 | $R^{A57}$ | $CD_3$ | H | $CD_3$ |
| m-616 | $R^{A58}$ | $CD_3$ | H | $CD_3$ |
| m-617 | $R^{A59}$ | $CD_3$ | H | $CD_3$ |
| m-618 | $R^{A60}$ | $CD_3$ | H | $CD_3$ |
| m-619 | $R^{A61}$ | $CD_3$ | H | $CD_3$ |
| m-620 | $R^{A62}$ | $CD_3$ | H | $CD_3$ |
| m-621 | $R^{A63}$ | $CD_3$ | H | $CD_3$ |
| m-622 | $R^{A64}$ | $CD_3$ | H | $CD_3$ |
| m-623 | $R^{A65}$ | $CD_3$ | H | $CD_3$ |
| m-624 | $R^{A66}$ | $CD_3$ | H | $CD_3$ |
| m-625 | $R^{A67}$ | $CD_3$ | H | $CD_3$ |
| m-626 | $R^{A68}$ | $CD_3$ | H | $CD_3$ |
| m-627 | $R^{A69}$ | $CD_3$ | H | $CD_3$ |
| m-628 | $R^{A70}$ | $CD_3$ | H | $CD_3$ |
| m-629 | $R^{A71}$ | $CD_3$ | H | $CD_3$ |
| m-630 | $R^{A72}$ | $CD_3$ | H | $CD_3$ |
| m-631 | $R^{A73}$ | $CD_3$ | H | $CD_3$ |
| m-632 | $R^{A74}$ | $CD_3$ | H | $CD_3$ |
| m-633 | $R^{A75}$ | $CD_3$ | H | $CD_3$ |
| m-634 | $R^{A76}$ | $CD_3$ | H | $CD_3$ |
| m-635 | $R^{A77}$ | $CD_3$ | H | $CD_3$ |
| m-636 | $R^{A78}$ | $CD_3$ | H | $CD_3$ |
| m-637 | $R^{A79}$ | $CD_3$ | H | $CD_3$ |
| m-638 | $R^{A80}$ | $CD_3$ | H | $CD_3$ |
| m-639 | $R^{A81}$ | $CD_3$ | H | $CD_3$ |
| m-640 | $R^{A82}$ | $CD_3$ | H | $CD_3$ |
| m-641 | $R^{A83}$ | $CD_3$ | H | $CD_3$ |
| m-642 | $R^{A84}$ | $CD_3$ | H | $CD_3$ |
| m-643 | $R^{A85}$ | $CD_3$ | H | $CD_3$ |
| m-644 | $R^{A86}$ | $CD_3$ | H | $CD_3$ |
| m-645 | $R^{A87}$ | $CD_3$ | H | $CD_3$ |
| m-646 | $R^{A88}$ | $CD_3$ | H | $CD_3$ |
| m-647 | $R^{A89}$ | $CD_3$ | H | $CD_3$ |
| m-648 | $R^{A90}$ | $CD_3$ | H | $CD_3$ |
| m-649 | $R^{A91}$ | $CD_3$ | H | $CD_3$ |
| m-650 | $R^{A92}$ | $CD_3$ | H | $CD_3$ |
| m-651 | $R^{A93}$ | $CD_3$ | H | $CD_3$ |
| m-652 | $CD_3$ | $R^{A1}$ | H | $R^{A94}$ |
| m-653 | $CD_3$ | $R^{A2}$ | H | $R^{A94}$ |
| m-654 | $CD_3$ | $R^{A3}$ | H | $R^{A94}$ |
| m-655 | $CD_3$ | $R^{A4}$ | H | $R^{A94}$ |
| m-656 | $CD_3$ | $R^{A5}$ | H | $R^{A94}$ |
| m-657 | $CD_3$ | $R^{A6}$ | H | $R^{A94}$ |
| m-658 | $CD_3$ | $R^{A7}$ | H | $R^{A94}$ |
| m-659 | $CD_3$ | $R^{A8}$ | H | $R^{A94}$ |
| m-660 | $CD_3$ | $R^{A9}$ | H | $R^{A94}$ |
| m-661 | $CD_3$ | $R^{A10}$ | H | $R^{A94}$ |
| m-662 | $CD_3$ | $R^{A11}$ | H | $R^{A94}$ |
| m-663 | $CD_3$ | $R^{A12}$ | H | $R^{A94}$ |

-continued

| Compound # | $R^{1a}$ | $R^{1b}$ | $R^{2a}$ | $R^{2b}$ |
|---|---|---|---|---|
| m-664 | $CD_3$ | $R^{A13}$ | H | $R^{A94}$ |
| m-665 | $CD_3$ | $R^{A14}$ | H | $R^{A94}$ |
| m-666 | $CD_3$ | $R^{A15}$ | H | $R^{A94}$ |
| m-667 | $CD_3$ | $R^{A16}$ | H | $R^{A94}$ |
| m-668 | $CD_3$ | $R^{A17}$ | H | $R^{A94}$ |
| m-669 | $CD_3$ | $R^{A18}$ | H | $R^{A94}$ |
| m-670 | $CD_3$ | $R^{A19}$ | H | $R^{A94}$ |
| m-671 | $CD_3$ | $R^{A20}$ | H | $R^{A94}$ |
| m-672 | $CD_3$ | $R^{A21}$ | H | $R^{A94}$ |
| m-673 | $CD_3$ | $R^{A22}$ | H | $R^{A94}$ |
| m-674 | $CD_3$ | $R^{A23}$ | H | $R^{A94}$ |
| m-675 | $CD_3$ | $R^{A24}$ | H | $R^{A94}$ |
| m-676 | $CD_3$ | $R^{A25}$ | H | $R^{A94}$ |
| m-677 | $CD_3$ | $R^{A26}$ | H | $R^{A94}$ |
| m-678 | $CD_3$ | $R^{A27}$ | H | $R^{A94}$ |
| m-679 | $CD_3$ | $R^{A28}$ | H | $R^{A94}$ |
| m-680 | $CD_3$ | $R^{A29}$ | H | $R^{A94}$ |
| m-681 | $CD_3$ | $R^{A30}$ | H | $R^{A94}$ |
| m-682 | $CD_3$ | $R^{A31}$ | H | $R^{A94}$ |
| m-683 | $CD_3$ | $R^{A32}$ | H | $R^{A94}$ |
| m-684 | $CD_3$ | $R^{A33}$ | H | $R^{A94}$ |
| m-685 | $CD_3$ | $R^{A34}$ | H | $R^{A94}$ |
| m-686 | $CD_3$ | $R^{A35}$ | H | $R^{A94}$ |
| m-687 | $CD_3$ | $R^{A36}$ | H | $R^{A94}$ |
| m-688 | $CD_3$ | $R^{A37}$ | H | $R^{A94}$ |
| m-689 | $CD_3$ | $R^{A38}$ | H | $R^{A94}$ |
| m-690 | $CD_3$ | $R^{A39}$ | H | $R^{A94}$ |
| m-691 | $CD_3$ | $R^{A40}$ | H | $R^{A94}$ |
| m-692 | $CD_3$ | $R^{A41}$ | H | $R^{A94}$ |
| m-693 | $CD_3$ | $R^{A42}$ | H | $R^{A94}$ |
| m-694 | $CD_3$ | $R^{A43}$ | H | $R^{A94}$ |
| m-695 | $CD_3$ | $R^{A44}$ | H | $R^{A94}$ |
| m-696 | $CD_3$ | $R^{A45}$ | H | $R^{A94}$ |
| m-697 | $CD_3$ | $R^{A46}$ | H | $R^{A94}$ |
| m-698 | $CD_3$ | $R^{A47}$ | H | $R^{A94}$ |
| m-699 | $CD_3$ | $R^{A48}$ | H | $R^{A94}$ |
| m-700 | $CD_3$ | $R^{A49}$ | H | $R^{A94}$ |
| m-701 | $CD_3$ | $R^{A50}$ | H | $R^{A94}$ |
| m-702 | $CD_3$ | $R^{A51}$ | H | $R^{A94}$ |
| m-703 | $CD_3$ | $R^{A52}$ | H | $R^{A94}$ |
| m-704 | $CD_3$ | $R^{A53}$ | H | $R^{A94}$ |
| m-705 | $CD_3$ | $R^{A54}$ | H | $R^{A94}$ |
| m-706 | $CD_3$ | $R^{A55}$ | H | $R^{A94}$ |
| m-707 | $CD_3$ | $R^{A56}$ | H | $R^{A94}$ |
| m-708 | $CD_3$ | $R^{A57}$ | H | $R^{A94}$ |
| m-709 | $CD_3$ | $R^{A58}$ | H | $R^{A94}$ |
| m-710 | $CD_3$ | $R^{A59}$ | H | $R^{A94}$ |
| m-711 | $CD_3$ | $R^{A60}$ | H | $R^{A94}$ |
| m-712 | $CD_3$ | $R^{A61}$ | H | $R^{A94}$ |
| m-713 | $CD_3$ | $R^{A62}$ | H | $R^{A94}$ |
| m-714 | $CD_3$ | $R^{A63}$ | H | $R^{A94}$ |
| m-715 | $CD_3$ | $R^{A64}$ | H | $R^{A94}$ |
| m-716 | $CD_3$ | $R^{A65}$ | H | $R^{A94}$ |
| m-717 | $CD_3$ | $R^{A66}$ | H | $R^{A94}$ |
| m-718 | $CD_3$ | $R^{A67}$ | H | $R^{A94}$ |
| m-719 | $CD_3$ | $R^{A68}$ | H | $R^{A94}$ |
| m-720 | $CD_3$ | $R^{A69}$ | H | $R^{A94}$ |
| m-721 | $CD_3$ | $R^{A70}$ | H | $R^{A94}$ |
| m-722 | $CD_3$ | $R^{A71}$ | H | $R^{A94}$ |
| m-723 | $CD_3$ | $R^{A72}$ | H | $R^{A94}$ |
| m-724 | $CD_3$ | $R^{A73}$ | H | $R^{A94}$ |
| m-725 | $CD_3$ | $R^{A74}$ | H | $R^{A94}$ |
| m-726 | $CD_3$ | $R^{A75}$ | H | $R^{A94}$ |
| m-727 | $CD_3$ | $R^{A76}$ | H | $R^{A94}$ |
| m-728 | $CD_3$ | $R^{A77}$ | H | $R^{A94}$ |
| m-729 | $CD_3$ | $R^{A78}$ | H | $R^{A94}$ |
| m-730 | $CD_3$ | $R^{A79}$ | H | $R^{A94}$ |
| m-731 | $CD_3$ | $R^{A80}$ | H | $R^{A94}$ |
| m-732 | $CD_3$ | $R^{A81}$ | H | $R^{A94}$ |
| m-733 | $CD_3$ | $R^{A82}$ | H | $R^{A94}$ |
| m-734 | $CD_3$ | $R^{A83}$ | H | $R^{A94}$ |
| m-735 | $CD_3$ | $R^{A84}$ | H | $R^{A94}$ |
| m-736 | $CD_3$ | $R^{A85}$ | H | $R^{A94}$ |
| m-737 | $CD_3$ | $R^{A86}$ | H | $R^{A94}$ |
| m-738 | $CD_3$ | $R^{A87}$ | H | $R^{A94}$ |
| m-739 | $CD_3$ | $R^{A88}$ | H | $R^{A94}$ |
| m-740 | $CD_3$ | $R^{A89}$ | H | $R^{A94}$ |

-continued

| Compound # | $R^{1a}$ | $R^{1b}$ | $R^{2a}$ | $R^{2b}$ |
|---|---|---|---|---|
| m-741 | $CD_3$ | $R^{A90}$ | H | $R^{A94}$ |
| m-742 | $CD_3$ | $R^{A91}$ | H | $R^{A94}$ |
| m-743 | $CD_3$ | $R^{A92}$ | H | $R^{A94}$ |
| m-744 | $CD_3$ | $R^{A93}$ | H | $R^{A94}$ |
| m-745 | $R^{A1}$ | H | H | $R^{A94}$ |
| m-746 | $R^{A2}$ | H | H | $R^{A94}$ |
| m-747 | $R^{A3}$ | H | H | $R^{A94}$ |
| m-748 | $R^{A4}$ | H | H | $R^{A94}$ |
| m-749 | $R^{A5}$ | H | H | $R^{A94}$ |
| m-750 | $R^{A6}$ | H | H | $R^{A94}$ |
| m-751 | $R^{A7}$ | H | H | $R^{A94}$ |
| m-752 | $R^{A8}$ | H | H | $R^{A94}$ |
| m-753 | $R^{A9}$ | H | H | $R^{A94}$ |
| m-754 | $R^{A10}$ | H | H | $R^{A94}$ |
| m-755 | $R^{A11}$ | H | H | $R^{A94}$ |
| m-756 | $R^{A12}$ | H | H | $R^{A94}$ |
| m-757 | $R^{A13}$ | H | H | $R^{A94}$ |
| m-758 | $R^{A14}$ | H | H | $R^{A94}$ |
| m-759 | $R^{A15}$ | H | H | $R^{A94}$ |
| m-760 | $R^{A16}$ | H | H | $R^{A94}$ |
| m-761 | $R^{A17}$ | H | H | $R^{A94}$ |
| m-762 | $R^{A18}$ | H | H | $R^{A94}$ |
| m-763 | $R^{A19}$ | H | H | $R^{A94}$ |
| m-764 | $R^{A20}$ | H | H | $R^{A94}$ |
| m-765 | $R^{A21}$ | H | H | $R^{A94}$ |
| m-766 | $R^{A22}$ | H | H | $R^{A94}$ |
| m-767 | $R^{A23}$ | H | H | $R^{A94}$ |
| m-768 | $R^{A24}$ | H | H | $R^{A94}$ |
| m-769 | $R^{A25}$ | H | H | $R^{A94}$ |
| m-770 | $R^{A26}$ | H | H | $R^{A94}$ |
| m-771 | $R^{A27}$ | H | H | $R^{A94}$ |
| m-772 | $R^{A28}$ | H | H | $R^{A94}$ |
| m-773 | $R^{A29}$ | H | H | $R^{A94}$ |
| m-774 | $R^{A30}$ | H | H | $R^{A94}$ |
| m-775 | $R^{A31}$ | H | H | $R^{A94}$ |
| m-776 | $R^{A32}$ | H | H | $R^{A94}$ |
| m-777 | $R^{A33}$ | H | H | $R^{A94}$ |
| m-778 | $R^{A34}$ | H | H | $R^{A94}$ |
| m-779 | $R^{A35}$ | H | H | $R^{A94}$ |
| m-780 | $R^{A36}$ | H | H | $R^{A94}$ |
| m-781 | $R^{A37}$ | H | H | $R^{A94}$ |
| m-782 | $R^{A38}$ | H | H | $R^{A94}$ |
| m-783 | $R^{A39}$ | H | H | $R^{A94}$ |
| m-784 | $R^{A40}$ | H | H | $R^{A94}$ |
| m-785 | $R^{A41}$ | H | H | $R^{A94}$ |
| m-786 | $R^{A42}$ | H | H | $R^{A94}$ |
| m-787 | $R^{A43}$ | H | H | $R^{A94}$ |
| m-788 | $R^{A44}$ | H | H | $R^{A94}$ |
| m-789 | $R^{A45}$ | H | H | $R^{A94}$ |
| m-790 | $R^{A46}$ | H | H | $R^{A94}$ |
| m-791 | $R^{A47}$ | H | H | $R^{A94}$ |
| m-792 | $R^{A48}$ | H | H | $R^{A94}$ |
| m-793 | $R^{A49}$ | H | H | $R^{A94}$ |
| m-794 | $R^{A50}$ | H | H | $R^{A94}$ |
| m-795 | $R^{A51}$ | H | H | $R^{A94}$ |
| m-796 | $R^{A52}$ | H | H | $R^{A94}$ |
| m-797 | $R^{A53}$ | H | H | $R^{A94}$ |
| m-798 | $R^{A54}$ | H | H | $R^{A94}$ |
| m-799 | $R^{A55}$ | H | H | $R^{A94}$ |
| m-800 | $R^{A56}$ | H | H | $R^{A94}$ |
| m-801 | $R^{A57}$ | H | H | $R^{A94}$ |
| m-802 | $R^{A58}$ | H | H | $R^{A94}$ |
| m-803 | $R^{A59}$ | H | H | $R^{A94}$ |
| m-804 | $R^{A60}$ | H | H | $R^{A94}$ |
| m-805 | $R^{A61}$ | H | H | $R^{A94}$ |
| m-806 | $R^{A62}$ | H | H | $R^{A94}$ |
| m-807 | $R^{A63}$ | H | H | $R^{A94}$ |
| m-808 | $R^{A64}$ | H | H | $R^{A94}$ |
| m-809 | $R^{A65}$ | H | H | $R^{A94}$ |
| m-810 | $R^{A66}$ | H | H | $R^{A94}$ |
| m-811 | $R^{A67}$ | H | H | $R^{A94}$ |
| m-812 | $R^{A68}$ | H | H | $R^{A94}$ |
| m-813 | $R^{A69}$ | H | H | $R^{A94}$ |
| m-814 | $R^{A70}$ | H | H | $R^{A94}$ |
| m-815 | $R^{A71}$ | H | H | $R^{A94}$ |
| m-816 | $R^{A72}$ | H | H | $R^{A94}$ |
| m-817 | $R^{A73}$ | H | H | $R^{A94}$ |

-continued

| Compound # | $R^{1a}$ | $R^{1b}$ | $R^{2a}$ | $R^{2b}$ |
|---|---|---|---|---|
| m-818 | $R^{A74}$ | H | H | $R^{A94}$ |
| m-819 | $R^{A75}$ | H | H | $R^{A94}$ |
| m-820 | $R^{A76}$ | H | H | $R^{A94}$ |
| m-821 | $R^{A77}$ | H | H | $R^{A94}$ |
| m-822 | $R^{A78}$ | H | H | $R^{A94}$ |
| m-823 | $R^{A79}$ | H | H | $R^{A94}$ |
| m-824 | $R^{A80}$ | H | H | $R^{A94}$ |
| m-825 | $R^{A81}$ | H | H | $R^{A94}$ |
| m-826 | $R^{A82}$ | H | H | $R^{A94}$ |
| m-827 | $R^{A83}$ | H | H | $R^{A94}$ |
| m-828 | $R^{A84}$ | H | H | $R^{A94}$ |
| m-829 | $R^{A85}$ | H | H | $R^{A94}$ |
| m-830 | $R^{A86}$ | H | H | $R^{A94}$ |
| m-831 | $R^{A87}$ | H | H | $R^{A94}$ |
| m-832 | $R^{A88}$ | H | H | $R^{A94}$ |
| m-833 | $R^{A89}$ | H | H | $R^{A94}$ |
| m-834 | $R^{A90}$ | H | H | $R^{A94}$ |
| m-835 | $R^{A91}$ | H | H | $R^{A94}$ |
| m-836 | $R^{A92}$ | H | H | $R^{A94}$ |
| m-837 | $R^{A93}$ | H | H | $R^{A94}$ |
| m-838 | $R^{A1}$ | H | $R^{A94}$ | $R^{A94}$ |
| m-839 | $R^{A2}$ | H | $R^{A94}$ | $R^{A94}$ |
| m-840 | $R^{A3}$ | H | $R^{A94}$ | $R^{A94}$ |
| m-841 | $R^{A4}$ | H | $R^{A94}$ | $R^{A94}$ |
| m-842 | $R^{A5}$ | H | $R^{A94}$ | $R^{A94}$ |
| m-843 | $R^{A6}$ | H | $R^{A94}$ | $R^{A94}$ |
| m-844 | $R^{A7}$ | H | $R^{A94}$ | $R^{A94}$ |
| m-845 | $R^{A8}$ | H | $R^{A94}$ | $R^{A94}$ |
| m-846 | $R^{A9}$ | H | $R^{A94}$ | $R^{A94}$ |
| m-847 | $R^{A10}$ | H | $R^{A94}$ | $R^{A94}$ |
| m-848 | $R^{A11}$ | H | $R^{A94}$ | $R^{A94}$ |
| m-849 | $R^{A12}$ | H | $R^{A94}$ | $R^{A94}$ |
| m-850 | $R^{A13}$ | H | $R^{A94}$ | $R^{A94}$ |
| m-851 | $R^{A14}$ | H | $R^{A94}$ | $R^{A94}$ |
| m-852 | $R^{A15}$ | H | $R^{A94}$ | $R^{A94}$ |
| m-853 | $R^{A16}$ | H | $R^{A94}$ | $R^{A94}$ |
| m-854 | $R^{A17}$ | H | $R^{A94}$ | $R^{A94}$ |
| m-855 | $R^{A18}$ | H | $R^{A94}$ | $R^{A94}$ |
| m-856 | $R^{A19}$ | H | $R^{A94}$ | $R^{A94}$ |
| m-857 | $R^{A20}$ | H | $R^{A94}$ | $R^{A94}$ |
| m-858 | $R^{A21}$ | H | $R^{A94}$ | $R^{A94}$ |
| m-859 | $R^{A22}$ | H | $R^{A94}$ | $R^{A94}$ |
| m-860 | $R^{A23}$ | H | $R^{A94}$ | $R^{A94}$ |
| m-861 | $R^{A24}$ | H | $R^{A94}$ | $R^{A94}$ |
| m-862 | $R^{A25}$ | H | $R^{A94}$ | $R^{A94}$ |
| m-863 | $R^{A26}$ | H | $R^{A94}$ | $R^{A94}$ |
| m-864 | $R^{A27}$ | H | $R^{A94}$ | $R^{A94}$ |
| m-865 | $R^{A28}$ | H | $R^{A94}$ | $R^{A94}$ |
| m-866 | $R^{A29}$ | H | $R^{A94}$ | $R^{A94}$ |
| m-867 | $R^{A30}$ | H | $R^{A94}$ | $R^{A94}$ |
| m-868 | $R^{A31}$ | H | $R^{A94}$ | $R^{A94}$ |
| m-869 | $R^{A32}$ | H | $R^{A94}$ | $R^{A94}$ |
| m-870 | $R^{A33}$ | H | $R^{A94}$ | $R^{A94}$ |
| m-871 | $R^{A34}$ | H | $R^{A94}$ | $R^{A94}$ |
| m-872 | $R^{A35}$ | H | $R^{A94}$ | $R^{A94}$ |
| m-873 | $R^{A36}$ | H | $R^{A94}$ | $R^{A94}$ |
| m-874 | $R^{A37}$ | H | $R^{A94}$ | $R^{A94}$ |
| m-875 | $R^{A38}$ | H | $R^{A94}$ | $R^{A94}$ |
| m-876 | $R^{A39}$ | H | $R^{A94}$ | $R^{A94}$ |
| m-877 | $R^{A40}$ | H | $R^{A94}$ | $R^{A94}$ |
| m-878 | $R^{A41}$ | H | $R^{A94}$ | $R^{A94}$ |
| m-879 | $R^{A42}$ | H | $R^{A94}$ | $R^{A94}$ |
| m-880 | $R^{A43}$ | H | $R^{A94}$ | $R^{A94}$ |
| m-881 | $R^{A44}$ | H | $R^{A94}$ | $R^{A94}$ |
| m-882 | $R^{A45}$ | H | $R^{A94}$ | $R^{A94}$ |
| m-883 | $R^{A46}$ | H | $R^{A94}$ | $R^{A94}$ |
| m-884 | $R^{A47}$ | H | $R^{A94}$ | $R^{A94}$ |
| m-885 | $R^{A48}$ | H | $R^{A94}$ | $R^{A94}$ |
| m-886 | $R^{A49}$ | H | $R^{A94}$ | $R^{A94}$ |
| m-887 | $R^{A50}$ | H | $R^{A94}$ | $R^{A94}$ |
| m-888 | $R^{A51}$ | H | $R^{A94}$ | $R^{A94}$ |
| m-889 | $R^{A52}$ | H | $R^{A94}$ | $R^{A94}$ |
| m-890 | $R^{A53}$ | H | $R^{A94}$ | $R^{A94}$ |
| m-891 | $R^{A54}$ | H | $R^{A94}$ | $R^{A94}$ |
| m-892 | $R^{A55}$ | H | $R^{A94}$ | $R^{A94}$ |
| m-893 | $R^{A56}$ | H | $R^{A94}$ | $R^{A94}$ |
| m-894 | $R^{A57}$ | H | $R^{A94}$ | $R^{A94}$ |

-continued

| Compound # | $R^{1a}$ | $R^{1b}$ | $R^{2a}$ | $R^{2b}$ |
|---|---|---|---|---|
| m-895 | $R^{A58}$ | H | $R^{A94}$ | $R^{A94}$ |
| m-896 | $R^{A59}$ | H | $R^{A94}$ | $R^{A94}$ |
| m-897 | $R^{A60}$ | H | $R^{A94}$ | $R^{A94}$ |
| m-898 | $R^{A61}$ | H | $R^{A94}$ | $R^{A94}$ |
| m-899 | $R^{A62}$ | H | $R^{A94}$ | $R^{A94}$ |
| m-900 | $R^{A63}$ | H | $R^{A94}$ | $R^{A94}$ |
| m-901 | $R^{A64}$ | H | $R^{A94}$ | $R^{A94}$ |
| m-902 | $R^{A65}$ | H | $R^{A94}$ | $R^{A94}$ |
| m-903 | $R^{A66}$ | H | $R^{A94}$ | $R^{A94}$ |
| m-904 | $R^{A67}$ | H | $R^{A94}$ | $R^{A94}$ |
| m-905 | $R^{A68}$ | H | $R^{A94}$ | $R^{A94}$ |
| m-906 | $R^{A69}$ | H | $R^{A94}$ | $R^{A94}$ |
| m-907 | $R^{A70}$ | H | $R^{A94}$ | $R^{A94}$ |
| m-908 | $R^{A71}$ | H | $R^{A94}$ | $R^{A94}$ |
| m-909 | $R^{A72}$ | H | $R^{A94}$ | $R^{A94}$ |
| m-910 | $R^{A73}$ | H | $R^{A94}$ | $R^{A94}$ |
| m-911 | $R^{A74}$ | H | $R^{A94}$ | $R^{A94}$ |
| m-912 | $R^{A75}$ | H | $R^{A94}$ | $R^{A94}$ |
| m-913 | $R^{A76}$ | H | $R^{A94}$ | $R^{A94}$ |
| m-914 | $R^{A77}$ | H | $R^{A94}$ | $R^{A94}$ |
| m-915 | $R^{A78}$ | H | $R^{A94}$ | $R^{A94}$ |
| m-916 | $R^{A79}$ | H | $R^{A94}$ | $R^{A94}$ |
| m-917 | $R^{A80}$ | H | $R^{A94}$ | $R^{A94}$ |
| m-918 | $R^{A81}$ | H | $R^{A94}$ | $R^{A94}$ |
| m-919 | $R^{A82}$ | H | $R^{A94}$ | $R^{A94}$ |
| ?-920 | $R^{A83}$ | H | $R^{A94}$ | $R^{A94}$ |
| m-921 | $R^{A84}$ | H | $R^{A94}$ | $R^{A94}$ |
| m-922 | $R^{A85}$ | H | $R^{A94}$ | $R^{A94}$ |
| m-923 | $R^{A86}$ | H | $R^{A94}$ | $R^{A94}$ |
| m-924 | $R^{A87}$ | H | $R^{A94}$ | $R^{A94}$ |
| m-925 | $R^{A88}$ | H | $R^{A94}$ | $R^{A94}$ |
| m-926 | $R^{A89}$ | H | $R^{A94}$ | $R^{A94}$ |
| m-927 | $R^{A90}$ | H | $R^{A94}$ | $R^{A94}$ |
| m-928 | $R^{A91}$ | H | $R^{A94}$ | $R^{A94}$ |
| m-929 | $R^{A92}$ | H | $R^{A94}$ | $R^{A94}$ |
| m-930 | $R^{A93}$ | H | $R^{A94}$ | $R^{A94}$ |
| m-931 | $R^{A1}$ | H | $R^{A94}$ | $R^{A94}$ |
| m-932 | $R^{A2}$ | H | $R^{A94}$ | $R^{A94}$ |
| m-933 | $R^{A3}$ | H | $R^{A94}$ | $R^{A94}$ |
| m-934 | $R^{A4}$ | H | $R^{A94}$ | $R^{A94}$ |
| m-935 | $R^{A5}$ | H | $R^{A94}$ | $R^{A94}$ |
| m-936 | $R^{A6}$ | H | $R^{A94}$ | $R^{A94}$ |
| m-937 | $R^{A7}$ | H | $R^{A94}$ | $R^{A94}$ |
| m-938 | $R^{A8}$ | H | $R^{A94}$ | $R^{A94}$ |
| m-939 | $R^{A9}$ | H | $R^{A94}$ | $R^{A94}$ |
| m-940 | $R^{A10}$ | H | $R^{A94}$ | $R^{A94}$ |
| m-941 | $R^{A11}$ | H | $R^{A94}$ | $R^{A94}$ |
| m-942 | $R^{A12}$ | H | $R^{A94}$ | $R^{A94}$ |
| m-943 | $R^{A13}$ | H | $R^{A94}$ | $R^{A94}$ |
| m-944 | $R^{A14}$ | H | $R^{A94}$ | $R^{A94}$ |
| m-945 | $R^{A15}$ | H | $R^{A94}$ | $R^{A94}$ |
| m-946 | $R^{A16}$ | H | $R^{A94}$ | $R^{A94}$ |
| m-947 | $R^{A17}$ | H | $R^{A94}$ | $R^{A94}$ |
| m-948 | $R^{A18}$ | H | $R^{A94}$ | $R^{A94}$ |
| m-949 | $R^{A19}$ | H | $R^{A94}$ | $R^{A94}$ |
| m-950 | $R^{A20}$ | H | $R^{A94}$ | $R^{A94}$ |
| m-951 | $R^{A21}$ | H | $R^{A94}$ | $R^{A94}$ |
| m-952 | $R^{A22}$ | H | $R^{A94}$ | $R^{A94}$ |
| m-953 | $R^{A23}$ | H | $R^{A94}$ | $R^{A94}$ |
| m-954 | $R^{A24}$ | H | $R^{A94}$ | $R^{A94}$ |
| m-955 | $R^{A25}$ | H | $R^{A94}$ | $R^{A94}$ |
| m-956 | $R^{A26}$ | H | $R^{A94}$ | $R^{A94}$ |
| m-957 | $R^{A27}$ | H | $R^{A94}$ | $R^{A94}$ |
| m-958 | $R^{A28}$ | H | $R^{A94}$ | $R^{A94}$ |
| m-959 | $R^{A29}$ | H | $R^{A94}$ | $R^{A94}$ |
| m-960 | $R^{A30}$ | H | $R^{A94}$ | $R^{A94}$ |
| m-961 | $R^{A31}$ | H | $R^{A94}$ | $R^{A94}$ |
| m-962 | $R^{A32}$ | H | $R^{A94}$ | $R^{A94}$ |
| m-963 | $R^{A33}$ | H | $R^{A94}$ | $R^{A94}$ |
| m-964 | $R^{A34}$ | H | $R^{A94}$ | $R^{A94}$ |
| m-965 | $R^{A35}$ | H | $R^{A94}$ | $R^{A94}$ |
| m-966 | $R^{A36}$ | H | $R^{A94}$ | $R^{A94}$ |
| m-967 | $R^{A37}$ | H | $R^{A94}$ | $R^{A94}$ |
| m-968 | $R^{A38}$ | H | $R^{A94}$ | $R^{A94}$ |
| m-969 | $R^{A39}$ | H | $R^{A94}$ | $R^{A94}$ |
| m-970 | $R^{A40}$ | H | $R^{A94}$ | $R^{A94}$ |
| m-971 | $R^{A41}$ | H | $R^{A94}$ | $R^{A94}$ |

-continued

| Compound # | $R^{1a}$ | $R^{1b}$ | $R^{2a}$ | $R^{2b}$ |
|---|---|---|---|---|
| m-972 | $R^{A42}$ | H | $R^{A94}$ | $R^{A94}$ |
| m-973 | $R^{A43}$ | H | $R^{A94}$ | $R^{A94}$ |
| m-974 | $R^{A44}$ | H | $R^{A94}$ | $R^{A94}$ |
| m-975 | $R^{A45}$ | H | $R^{A94}$ | $R^{A94}$ |
| m-976 | $R^{A46}$ | H | $R^{A94}$ | $R^{A94}$ |
| m-977 | $R^{A47}$ | H | $R^{A94}$ | $R^{A94}$ |
| m-978 | $R^{A48}$ | H | $R^{A94}$ | $R^{A94}$ |
| m-979 | $R^{A49}$ | H | $R^{A94}$ | $R^{A94}$ |
| m-980 | $R^{A50}$ | H | $R^{A94}$ | $R^{A94}$ |
| m-981 | $R^{A51}$ | H | $R^{A94}$ | $R^{A94}$ |
| m-982 | $R^{A52}$ | H | $R^{A94}$ | $R^{A94}$ |
| m-983 | $R^{A53}$ | H | $R^{A94}$ | $R^{A94}$ |
| m-984 | $R^{A54}$ | H | $R^{A94}$ | $R^{A94}$ |
| m-985 | $R^{A55}$ | H | $R^{A94}$ | $R^{A94}$ |
| m-986 | $R^{A56}$ | H | $R^{A94}$ | $R^{A94}$ |
| m-987 | $R^{A57}$ | H | $R^{A94}$ | $R^{A94}$ |
| m-988 | $R^{A58}$ | H | $R^{A94}$ | $R^{A94}$ |
| m-989 | $R^{A59}$ | H | $R^{A94}$ | $R^{A94}$ |
| m-990 | $R^{A60}$ | H | $R^{A94}$ | $R^{A94}$ |
| m-991 | $R^{A61}$ | H | $R^{A94}$ | $R^{A94}$ |
| m-992 | $R^{A62}$ | H | $R^{A94}$ | $R^{A94}$ |
| m-993 | $R^{A63}$ | H | $R^{A94}$ | $R^{A94}$ |
| m-994 | $R^{A64}$ | H | $R^{A94}$ | $R^{A94}$ |
| m-995 | $R^{A65}$ | H | $R^{A94}$ | $R^{A94}$ |
| m-996 | $R^{A66}$ | H | $R^{A94}$ | $R^{A94}$ |
| m-997 | $R^{A67}$ | H | $R^{A94}$ | $R^{A94}$ |
| m-998 | $R^{A68}$ | H | $R^{A94}$ | $R^{A94}$ |
| m-999 | $R^{A69}$ | H | $R^{A94}$ | $R^{A94}$ |
| m-1000 | $R^{A70}$ | H | $R^{A94}$ | $R^{A94}$ |
| m-1001 | $R^{A71}$ | H | $R^{A94}$ | $R^{A94}$ |
| m-1002 | $R^{A72}$ | H | $R^{A94}$ | $R^{A94}$ |
| m-1003 | $R^{A73}$ | H | $R^{A94}$ | $R^{A94}$ |
| m-1004 | $R^{A74}$ | H | $R^{A94}$ | $R^{A94}$ |
| m-1005 | $R^{A75}$ | H | $R^{A94}$ | $R^{A94}$ |
| m-1006 | $R^{A76}$ | H | $R^{A94}$ | $R^{A94}$ |
| m-1007 | $R^{A77}$ | H | $R^{A94}$ | $R^{A94}$ |
| m-1008 | $R^{A78}$ | H | $R^{A94}$ | $R^{A94}$ |
| m-1009 | $R^{A79}$ | H | $R^{A94}$ | $R^{A94}$ |
| m-1010 | $R^{A80}$ | H | $R^{A94}$ | $R^{A94}$ |
| m-1011 | $R^{A81}$ | H | $R^{A94}$ | $R^{A94}$ |
| m-1012 | $R^{A82}$ | H | $R^{A94}$ | $R^{A94}$ |
| m-1013 | $R^{A83}$ | H | $R^{A94}$ | $R^{A94}$ |
| m-1014 | $R^{A84}$ | H | $R^{A94}$ | $R^{A94}$ |
| m-1015 | $R^{A85}$ | H | $R^{A94}$ | $R^{A94}$ |
| m-1016 | $R^{A86}$ | H | $R^{A94}$ | $R^{A94}$ |
| m-1017 | $R^{A87}$ | H | $R^{A94}$ | $R^{A94}$ |
| m-1018 | $R^{A88}$ | H | $R^{A94}$ | $R^{A94}$ |
| m-1019 | $R^{A89}$ | H | $R^{A94}$ | $R^{A94}$ |
| m-1020 | $R^{A90}$ | H | $R^{A94}$ | $R^{A94}$ |
| m-1021 | $R^{A91}$ | H | $R^{A94}$ | $R^{A94}$ |
| m-1022 | $R^{A92}$ | H | $R^{A94}$ | $R^{A94}$ |
| m-1023 | $R^{A93}$ | H | $R^{A94}$ | $R^{A94}$ |
| m-1024 | $R^{A1}$ | $R^{A94}$ | $R^{A94}$ | $R^{A94}$ |
| m-1025 | $R^{A2}$ | $R^{A94}$ | $R^{A94}$ | $R^{A94}$ |
| m-1026 | $R^{A3}$ | $R^{A94}$ | $R^{A94}$ | $R^{A94}$ |
| m-1027 | $R^{A4}$ | $R^{A94}$ | $R^{A94}$ | $R^{A94}$ |
| m-1028 | $R^{A5}$ | $R^{A94}$ | $R^{A94}$ | $R^{A94}$ |
| m-1029 | $R^{A6}$ | $R^{A94}$ | $R^{A94}$ | $R^{A94}$ |
| m-1030 | $R^{A7}$ | $R^{A94}$ | $R^{A94}$ | $R^{A94}$ |
| m-1031 | $R^{A8}$ | $R^{A94}$ | $R^{A94}$ | $R^{A94}$ |
| m-1032 | $R^{A9}$ | $R^{A94}$ | $R^{A94}$ | $R^{A94}$ |
| m-1033 | $R^{A10}$ | $R^{A94}$ | $R^{A94}$ | $R^{A94}$ |
| m-1034 | $R^{A11}$ | $R^{A94}$ | $R^{A94}$ | $R^{A94}$ |
| m-1035 | $R^{A12}$ | $R^{A94}$ | $R^{A94}$ | $R^{A94}$ |
| m-1036 | $R^{A13}$ | $R^{A94}$ | $R^{A94}$ | $R^{A94}$ |
| m-1037 | $R^{A14}$ | $R^{A94}$ | $R^{A94}$ | $R^{A94}$ |
| m-1038 | $R^{A15}$ | $R^{A94}$ | $R^{A94}$ | $R^{A94}$ |
| m-1039 | $R^{A16}$ | $R^{A94}$ | $R^{A94}$ | $R^{A94}$ |
| m-1040 | $R^{A17}$ | $R^{A94}$ | $R^{A94}$ | $R^{A94}$ |
| m-1041 | $R^{A18}$ | $R^{A94}$ | $R^{A94}$ | $R^{A94}$ |
| m-1042 | $R^{A19}$ | $R^{A94}$ | $R^{A94}$ | $R^{A94}$ |
| m-1043 | $R^{A20}$ | $R^{A94}$ | $R^{A94}$ | $R^{A94}$ |
| m-1044 | $R^{A21}$ | $R^{A94}$ | $R^{A94}$ | $R^{A94}$ |
| m-1045 | $R^{A22}$ | $R^{A94}$ | $R^{A94}$ | $R^{A94}$ |
| m-1046 | $R^{A23}$ | $R^{A94}$ | $R^{A94}$ | $R^{A94}$ |
| m-1047 | $R^{A24}$ | $R^{A94}$ | $R^{A94}$ | $R^{A94}$ |
| m-1048 | $R^{A25}$ | $R^{A94}$ | $R^{A94}$ | $R^{A94}$ |

-continued

| Compound # | $R^{1a}$ | $R^{1b}$ | $R^{2a}$ | $R^{2b}$ |
|---|---|---|---|---|
| m-1049 | $R^{A26}$ | $R^{A94}$ | $R^{A94}$ | $R^{A94}$ |
| m-1050 | $R^{A27}$ | $R^{A94}$ | $R^{A94}$ | $R^{A94}$ |
| m-1051 | $R^{A28}$ | $R^{A94}$ | $R^{A94}$ | $R^{A94}$ |
| m-1052 | $R^{A29}$ | $R^{A94}$ | $R^{A94}$ | $R^{A94}$ |
| m-1053 | $R^{A30}$ | $R^{A94}$ | $R^{A94}$ | $R^{A94}$ |
| m-1054 | $R^{A31}$ | $R^{A94}$ | $R^{A94}$ | $R^{A94}$ |
| m-1055 | $R^{A32}$ | $R^{A94}$ | $R^{A94}$ | $R^{A94}$ |
| m-1056 | $R^{A33}$ | $R^{A94}$ | $R^{A94}$ | $R^{A94}$ |
| m-1057 | $R^{A34}$ | $R^{A94}$ | $R^{A94}$ | $R^{A94}$ |
| m-1058 | $R^{A35}$ | $R^{A94}$ | $R^{A94}$ | $R^{A94}$ |
| m-1059 | $R^{A36}$ | $R^{A94}$ | $R^{A94}$ | $R^{A94}$ |
| m-1060 | $R^{A37}$ | $R^{A94}$ | $R^{A94}$ | $R^{A94}$ |
| m-1061 | $R^{A38}$ | $R^{A94}$ | $R^{A94}$ | $R^{A94}$ |
| m-1062 | $R^{A39}$ | $R^{A94}$ | $R^{A94}$ | $R^{A94}$ |
| m-1063 | $R^{A40}$ | $R^{A94}$ | $R^{A94}$ | $R^{A94}$ |
| m-1064 | $R^{A41}$ | $R^{A94}$ | $R^{A94}$ | $R^{A94}$ |
| m-1065 | $R^{A42}$ | $R^{A94}$ | $R^{A94}$ | $R^{A94}$ |
| m-1066 | $R^{A43}$ | $R^{A94}$ | $R^{A94}$ | $R^{A94}$ |
| m-1067 | $R^{A44}$ | $R^{A94}$ | $R^{A94}$ | $R^{A94}$ |
| m-1068 | $R^{A45}$ | $R^{A94}$ | $R^{A94}$ | $R^{A94}$ |
| m-1069 | $R^{A46}$ | $R^{A94}$ | $R^{A94}$ | $R^{A94}$ |
| m-1070 | $R^{A47}$ | $R^{A94}$ | $R^{A94}$ | $R^{A94}$ |
| m-1071 | $R^{A48}$ | $R^{A94}$ | $R^{A94}$ | $R^{A94}$ |
| m-1072 | $R^{A49}$ | $R^{A94}$ | $R^{A94}$ | $R^{A94}$ |
| m-1073 | $R^{A50}$ | $R^{A94}$ | $R^{A94}$ | $R^{A94}$ |
| m-1074 | $R^{A51}$ | $R^{A94}$ | $R^{A94}$ | $R^{A94}$ |
| m-1075 | $R^{A52}$ | $R^{A94}$ | $R^{A94}$ | $R^{A94}$ |
| m-1076 | $R^{A53}$ | $R^{A94}$ | $R^{A94}$ | $R^{A94}$ |
| m-1077 | $R^{A54}$ | $R^{A94}$ | $R^{A94}$ | $R^{A94}$ |
| m-1078 | $R^{A55}$ | $R^{A94}$ | $R^{A94}$ | $R^{A94}$ |
| m-1079 | $R^{A56}$ | $R^{A94}$ | $R^{A94}$ | $R^{A94}$ |
| m-1080 | $R^{A57}$ | $R^{A94}$ | $R^{A94}$ | $R^{A94}$ |
| m-1081 | $R^{A58}$ | $R^{A94}$ | $R^{A94}$ | $R^{A94}$ |
| m-1082 | $R^{A59}$ | $R^{A94}$ | $R^{A94}$ | $R^{A94}$ |
| m-1083 | $R^{A60}$ | $R^{A94}$ | $R^{A94}$ | $R^{A94}$ |
| m-1084 | $R^{A61}$ | $R^{A94}$ | $R^{A94}$ | $R^{A94}$ |
| m-1085 | $R^{A62}$ | $R^{A94}$ | $R^{A94}$ | $R^{A94}$ |
| m-1086 | $R^{A63}$ | $R^{A94}$ | $R^{A94}$ | $R^{A94}$ |
| m-1087 | $R^{A64}$ | $R^{A94}$ | $R^{A94}$ | $R^{A94}$ |
| m-1088 | $R^{A65}$ | $R^{A94}$ | $R^{A94}$ | $R^{A94}$ |
| m-1089 | $R^{A66}$ | $R^{A94}$ | $R^{A94}$ | $R^{A94}$ |
| m-1090 | $R^{A67}$ | $R^{A94}$ | $R^{A94}$ | $R^{A94}$ |
| m-1091 | $R^{A68}$ | $R^{A94}$ | $R^{A94}$ | $R^{A94}$ |
| m-1092 | $R^{A69}$ | $R^{A94}$ | $R^{A94}$ | $R^{A94}$ |
| m-1093 | $R^{A70}$ | $R^{A94}$ | $R^{A94}$ | $R^{A94}$ |
| m-1094 | $R^{A71}$ | $R^{A94}$ | $R^{A94}$ | $R^{A94}$ |
| m-1095 | $R^{A72}$ | $R^{A94}$ | $R^{A94}$ | $R^{A94}$ |
| m-1096 | $R^{A73}$ | $R^{A94}$ | $R^{A94}$ | $R^{A94}$ |
| m-1097 | $R^{A74}$ | $R^{A94}$ | $R^{A94}$ | $R^{A94}$ |
| m-1098 | $R^{A75}$ | $R^{A94}$ | $R^{A94}$ | $R^{A94}$ |
| m-1099 | $R^{A76}$ | $R^{A94}$ | $R^{A94}$ | $R^{A94}$ |
| m-1100 | $R^{A77}$ | $R^{A94}$ | $R^{A94}$ | $R^{A94}$ |
| m-1101 | $R^{A78}$ | $R^{A94}$ | $R^{A94}$ | $R^{A94}$ |
| m-1102 | $R^{A79}$ | $R^{A94}$ | $R^{A94}$ | $R^{A94}$ |
| m-1103 | $R^{A80}$ | $R^{A94}$ | $R^{A94}$ | $R^{A94}$ |
| m-1104 | $R^{A81}$ | $R^{A94}$ | $R^{A94}$ | $R^{A94}$ |
| m-1105 | $R^{A82}$ | $R^{A94}$ | $R^{A94}$ | $R^{A94}$ |
| m-1106 | $R^{A83}$ | $R^{A94}$ | $R^{A94}$ | $R^{A94}$ |
| m-1107 | $R^{A84}$ | $R^{A94}$ | $R^{A94}$ | $R^{A94}$ |
| m-1108 | $R^{A85}$ | $R^{A94}$ | $R^{A94}$ | $R^{A94}$ |
| m-1109 | $R^{A86}$ | $R^{A94}$ | $R^{A94}$ | $R^{A94}$ |
| m-1110 | $R^{A87}$ | $R^{A94}$ | $R^{A94}$ | $R^{A94}$ |
| m-1111 | $R^{A88}$ | $R^{A94}$ | $R^{A94}$ | $R^{A94}$ |
| m-1112 | $R^{A89}$ | $R^{A94}$ | $R^{A94}$ | $R^{A94}$ |
| m-1113 | $R^{A90}$ | $R^{A94}$ | $R^{A94}$ | $R^{A94}$ |
| m-1114 | $R^{A91}$ | $R^{A94}$ | $R^{A94}$ | $R^{A94}$ |
| m-1115 | $R^{A92}$ | $R^{A94}$ | $R^{A94}$ | $R^{A94}$ |
| m-1116 | $R^{A93}$ | $R^{A94}$ | $R^{A94}$ | $R^{A94}$ |
| m-1117 | $R^{A1}$ | $R^{A94}$ | H | H |
| m-1118 | $R^{A2}$ | $R^{A94}$ | H | H |
| m-1119 | $R^{A3}$ | $R^{A94}$ | H | H |
| m-1120 | $R^{A4}$ | $R^{A94}$ | H | H |
| m-1121 | $R^{A5}$ | $R^{A94}$ | H | H |
| m-1122 | $R^{A6}$ | $R^{A94}$ | H | H |
| m-1123 | $R^{A7}$ | $R^{A94}$ | H | H |
| m-1124 | $R^{A8}$ | $R^{A94}$ | H | H |
| m-1125 | $R^{A9}$ | $R^{A94}$ | H | H |

-continued

| Compound # | $R^{1a}$ | $R^{1b}$ | $R^{2a}$ | $R^{2b}$ |
|---|---|---|---|---|
| m-1126 | $R^{A10}$ | $R^{A94}$ | H | H |
| m-1127 | $R^{A11}$ | $R^{A94}$ | H | H |
| m-1128 | $R^{A12}$ | $R^{A94}$ | H | H |
| m-1129 | $R^{A13}$ | $R^{A94}$ | H | H |
| m-1130 | $R^{A14}$ | $R^{A94}$ | H | H |
| m-1131 | $R^{A15}$ | $R^{A94}$ | H | H |
| m-1132 | $R^{A16}$ | $R^{A94}$ | H | H |
| m-1133 | $R^{A17}$ | $R^{A94}$ | H | H |
| m-1134 | $R^{A18}$ | $R^{A94}$ | H | H |
| m-1135 | $R^{A19}$ | $R^{A94}$ | H | H |
| m-1136 | $R^{A20}$ | $R^{A94}$ | H | H |
| m-1137 | $R^{A21}$ | $R^{A94}$ | H | H |
| m-1138 | $R^{A22}$ | $R^{A94}$ | H | H |
| m-1139 | $R^{A23}$ | $R^{A94}$ | H | H |
| m-1140 | $R^{A24}$ | $R^{A94}$ | H | H |
| m-1141 | $R^{A25}$ | $R^{A94}$ | H | H |
| m-1142 | $R^{A26}$ | $R^{A94}$ | H | H |
| m-1143 | $R^{A27}$ | $R^{A94}$ | H | H |
| m-1144 | $R^{A28}$ | $R^{A94}$ | H | H |
| m-1145 | $R^{A29}$ | $R^{A94}$ | H | H |
| m-1146 | $R^{A30}$ | $R^{A94}$ | H | H |
| m-1147 | $R^{A31}$ | $R^{A94}$ | H | H |
| m-1148 | $R^{A32}$ | $R^{A94}$ | H | H |
| m-1149 | $R^{A33}$ | $R^{A94}$ | H | H |
| m-1150 | $R^{A34}$ | $R^{A94}$ | H | H |
| m-1151 | $R^{A35}$ | $R^{A94}$ | H | H |
| m-1152 | $R^{A36}$ | $R^{A94}$ | H | H |
| m-1153 | $R^{A37}$ | $R^{A94}$ | H | H |
| m-1154 | $R^{A38}$ | $R^{A94}$ | H | H |
| m-1155 | $R^{A39}$ | $R^{A94}$ | H | H |
| m-1156 | $R^{A40}$ | $R^{A94}$ | H | H |
| m-1157 | $R^{A41}$ | $R^{A94}$ | H | H |
| m-1158 | $R^{A42}$ | $R^{A94}$ | H | H |
| m-1159 | $R^{A43}$ | $R^{A94}$ | H | H |
| m-1160 | $R^{A44}$ | $R^{A94}$ | H | H |
| m-1161 | $R^{A45}$ | $R^{A94}$ | H | H |
| m-1162 | $R^{A46}$ | $R^{A94}$ | H | H |
| m-1163 | $R^{A47}$ | $R^{A94}$ | H | H |
| m-1164 | $R^{A48}$ | $R^{A94}$ | H | H |
| m-1165 | $R^{A49}$ | $R^{A94}$ | H | H |
| m-1166 | $R^{A50}$ | $R^{A94}$ | H | H |
| m-1167 | $R^{A51}$ | $R^{A94}$ | H | H |
| m-1168 | $R^{A52}$ | $R^{A94}$ | H | H |
| m-1169 | $R^{A53}$ | $R^{A94}$ | H | H |
| m-1170 | $R^{A54}$ | $R^{A94}$ | H | H |
| m-1171 | $R^{A55}$ | $R^{A94}$ | H | H |
| m-1172 | $R^{A56}$ | $R^{A94}$ | H | H |
| m-1173 | $R^{A57}$ | $R^{A94}$ | H | H |
| m-1174 | $R^{A58}$ | $R^{A94}$ | H | H |
| m-1175 | $R^{A59}$ | $R^{A94}$ | H | H |
| m-1176 | $R^{A60}$ | $R^{A94}$ | H | H |
| m-1177 | $R^{A61}$ | $R^{A94}$ | H | H |
| m-1178 | $R^{A62}$ | $R^{A94}$ | H | H |
| m-1179 | $R^{A63}$ | $R^{A94}$ | H | H |
| m-1180 | $R^{A64}$ | $R^{A94}$ | H | H |
| m-1181 | $R^{A65}$ | $R^{A94}$ | H | H |
| m-1182 | $R^{A66}$ | $R^{A94}$ | H | H |
| m-1183 | $R^{A67}$ | $R^{A94}$ | H | H |
| m-1184 | $R^{A68}$ | $R^{A94}$ | H | H |
| m-1185 | $R^{A69}$ | $R^{A94}$ | H | H |
| m-1186 | $R^{A70}$ | $R^{A94}$ | H | H |
| m-1187 | $R^{A71}$ | $R^{A94}$ | H | H |
| m-1188 | $R^{A72}$ | $R^{A94}$ | H | H |
| m-1189 | $R^{A73}$ | $R^{A94}$ | H | H |
| m-1190 | $R^{A74}$ | $R^{A94}$ | H | H |
| m-1191 | $R^{A75}$ | $R^{A94}$ | H | H |
| m-1192 | $R^{A76}$ | $R^{A94}$ | H | H |
| m-1193 | $R^{A77}$ | $R^{A94}$ | H | H |
| m-1194 | $R^{A78}$ | $R^{A94}$ | H | H |
| m-1195 | $R^{A79}$ | $R^{A94}$ | H | H |
| m-1196 | $R^{A80}$ | $R^{A94}$ | H | H |
| m-1197 | $R^{A81}$ | $R^{A94}$ | H | H |
| m-1198 | $R^{A82}$ | $R^{A94}$ | H | H |
| m-1199 | $R^{A83}$ | $R^{A94}$ | H | H |
| m-1200 | $R^{A84}$ | $R^{A94}$ | H | H |
| m-1201 | $R^{A85}$ | $R^{A94}$ | H | H |
| m-1202 | $R^{A86}$ | $R^{A94}$ | H | H |

-continued

| Compound # | $R^{1a}$ | $R^{1b}$ | $R^{2a}$ | $R^{2b}$ |
|---|---|---|---|---|
| m-1203 | $R^{A87}$ | $R^{A94}$ | H | H |
| m-1204 | $R^{A88}$ | $R^{A94}$ | H | H |
| m-1205 | $R^{A89}$ | $R^{A94}$ | H | H |
| m-1206 | $R^{A90}$ | $R^{A94}$ | H | H |
| m-1207 | $R^{A91}$ | $R^{A94}$ | H | H |
| m-1208 | $R^{A92}$ | $R^{A94}$ | H | H |
| m-1209 | $R^{A93}$ | $R^{A94}$ | H | H |
| m-1210 | $R^{A1}$ | $R^{A94}$ | H | $R^{A94}$ |
| m-1211 | $R^{A2}$ | $R^{A94}$ | H | $R^{A94}$ |
| m-1212 | $R^{A3}$ | $R^{A94}$ | H | $R^{A94}$ |
| m-1213 | $R^{A4}$ | $R^{A94}$ | H | $R^{A94}$ |
| m-1214 | $R^{A5}$ | $R^{A94}$ | H | $R^{A94}$ |
| m-1215 | $R^{A6}$ | $R^{A94}$ | H | $R^{A94}$ |
| m-1216 | $R^{A7}$ | $R^{A94}$ | H | $R^{A94}$ |
| m-1217 | $R^{A8}$ | $R^{A94}$ | H | $R^{A94}$ |
| m-1218 | $R^{A9}$ | $R^{A94}$ | H | $R^{A94}$ |
| m-1219 | $R^{A10}$ | $R^{A94}$ | H | $R^{A94}$ |
| m-1220 | $R^{A11}$ | $R^{A94}$ | H | $R^{A94}$ |
| m-1221 | $R^{A12}$ | $R^{A94}$ | H | $R^{A94}$ |
| m-1222 | $R^{A13}$ | $R^{A94}$ | H | $R^{A94}$ |
| m-1223 | $R^{A14}$ | $R^{A94}$ | H | $R^{A94}$ |
| m-1224 | $R^{A15}$ | $R^{A94}$ | H | $R^{A94}$ |
| m-1225 | $R^{A16}$ | $R^{A94}$ | H | $R^{A94}$ |
| m-1226 | $R^{A17}$ | $R^{A94}$ | H | $R^{A94}$ |
| m-1227 | $R^{A18}$ | $R^{A94}$ | H | $R^{A94}$ |
| m-1228 | $R^{A19}$ | $R^{A94}$ | H | $R^{A94}$ |
| m-1229 | $R^{A20}$ | $R^{A94}$ | H | $R^{A94}$ |
| m-1230 | $R^{A21}$ | $R^{A94}$ | H | $R^{A94}$ |
| m-1231 | $R^{A22}$ | $R^{A94}$ | H | $R^{A94}$ |
| m-1232 | $R^{A23}$ | $R^{A94}$ | H | $R^{A94}$ |
| m-1233 | $R^{A24}$ | $R^{A94}$ | H | $R^{A94}$ |
| m-1234 | $R^{A25}$ | $R^{A94}$ | H | $R^{A94}$ |
| m-1235 | $R^{A26}$ | $R^{A94}$ | H | $R^{A94}$ |
| m-1236 | $R^{A27}$ | $R^{A94}$ | H | $R^{A94}$ |
| m-1237 | $R^{A28}$ | $R^{A94}$ | H | $R^{A94}$ |
| m-1238 | $R^{A29}$ | $R^{A94}$ | H | $R^{A94}$ |
| m-1239 | $R^{A30}$ | $R^{A94}$ | H | $R^{A94}$ |
| m-1240 | $R^{A31}$ | $R^{A94}$ | H | $R^{A94}$ |
| m-1241 | $R^{A32}$ | $R^{A94}$ | H | $R^{A94}$ |
| m-1242 | $R^{A33}$ | $R^{A94}$ | H | $R^{A94}$ |
| m-1243 | $R^{A34}$ | $R^{A94}$ | H | $R^{A94}$ |
| m-1244 | $R^{A35}$ | $R^{A94}$ | H | $R^{A94}$ |
| m-1245 | $R^{A36}$ | $R^{A94}$ | H | $R^{A94}$ |
| m-1246 | $R^{A37}$ | $R^{A94}$ | H | $R^{A94}$ |
| m-1247 | $R^{A38}$ | $R^{A94}$ | H | $R^{A94}$ |
| m-1248 | $R^{A39}$ | $R^{A94}$ | H | $R^{A94}$ |
| m-1249 | $R^{A40}$ | $R^{A94}$ | H | $R^{A94}$ |
| m-1250 | $R^{A41}$ | $R^{A94}$ | H | $R^{A94}$ |
| m-1251 | $R^{A42}$ | $R^{A94}$ | H | $R^{A94}$ |
| m-1252 | $R^{A43}$ | $R^{A94}$ | H | $R^{A94}$ |
| m-1253 | $R^{A44}$ | $R^{A94}$ | H | $R^{A94}$ |
| m-1254 | $R^{A45}$ | $R^{A94}$ | H | $R^{A94}$ |
| m-1255 | $R^{A46}$ | $R^{A94}$ | H | $R^{A94}$ |
| m-1256 | $R^{A47}$ | $R^{A94}$ | H | $R^{A94}$ |
| m-1257 | $R^{A48}$ | $R^{A94}$ | H | $R^{A94}$ |
| m-1258 | $R^{A49}$ | $R^{A94}$ | H | $R^{A94}$ |
| m-1259 | $R^{A50}$ | $R^{A94}$ | H | $R^{A94}$ |
| m-1260 | $R^{A51}$ | $R^{A94}$ | H | $R^{A94}$ |
| m-1261 | $R^{A52}$ | $R^{A94}$ | H | $R^{A94}$ |
| m-1262 | $R^{A53}$ | $R^{A94}$ | H | $R^{A94}$ |
| m-1263 | $R^{A54}$ | $R^{A94}$ | H | $R^{A94}$ |
| m-1264 | $R^{A55}$ | $R^{A94}$ | H | $R^{A94}$ |
| m-1265 | $R^{A56}$ | $R^{A94}$ | H | $R^{A94}$ |
| m-1266 | $R^{A57}$ | $R^{A94}$ | H | $R^{A94}$ |
| m-1267 | $R^{A58}$ | $R^{A94}$ | H | $R^{A94}$ |
| m-1268 | $R^{A59}$ | $R^{A94}$ | H | $R^{A94}$ |
| m-1269 | $R^{A60}$ | $R^{A94}$ | H | $R^{A94}$ |
| m-1270 | $R^{A61}$ | $R^{A94}$ | H | $R^{A94}$ |
| m-1271 | $R^{A62}$ | $R^{A94}$ | H | $R^{A94}$ |
| m-1272 | $R^{A63}$ | $R^{A94}$ | H | $R^{A94}$ |
| m-1273 | $R^{A64}$ | $R^{A94}$ | H | $R^{A94}$ |
| m-1274 | $R^{A65}$ | $R^{A94}$ | H | $R^{A94}$ |
| m-1275 | $R^{A66}$ | $R^{A94}$ | H | $R^{A94}$ |
| m-1276 | $R^{A67}$ | $R^{A94}$ | H | $R^{A94}$ |
| m-1277 | $R^{A68}$ | $R^{A94}$ | H | $R^{A94}$ |
| m-1278 | $R^{A69}$ | $R^{A94}$ | H | $R^{A94}$ |
| m-1279 | $R^{A70}$ | $R^{A94}$ | H | $R^{A94}$ |

-continued

| Compound # | $R^{1a}$ | $R^{1b}$ | $R^{2a}$ | $R^{2b}$ |
|---|---|---|---|---|
| m-1280 | $R^{A71}$ | $R^{A94}$ | H | $R^{A94}$ |
| m-1281 | $R^{A72}$ | $R^{A94}$ | H | $R^{A94}$ |
| m-1282 | $R^{A73}$ | $R^{A94}$ | H | $R^{A94}$ |
| m-1283 | $R^{A74}$ | $R^{A94}$ | H | $R^{A94}$ |
| m-1284 | $R^{A75}$ | $R^{A94}$ | H | $R^{A94}$ |
| m-1285 | $R^{A76}$ | $R^{A94}$ | H | $R^{A94}$ |
| m-1286 | $R^{A77}$ | $R^{A94}$ | H | $R^{A94}$ |
| m-1287 | $R^{A78}$ | $R^{A94}$ | H | $R^{A94}$ |
| m-1288 | $R^{A79}$ | $R^{A94}$ | H | $R^{A94}$ |
| m-1289 | $R^{A80}$ | $R^{A94}$ | H | $R^{A94}$ |
| m-1290 | $R^{A81}$ | $R^{A94}$ | H | $R^{A94}$ |
| m-1291 | $R^{A82}$ | $R^{A94}$ | H | $R^{A94}$ |
| m-1292 | $R^{A83}$ | $R^{A94}$ | H | $R^{A94}$ |
| m-1293 | $R^{A84}$ | $R^{A94}$ | H | $R^{A94}$ |
| m-1294 | $R^{A85}$ | $R^{A94}$ | H | $R^{A94}$ |
| m-1295 | $R^{A86}$ | $R^{A94}$ | H | $R^{A94}$ |
| m-1296 | $R^{A87}$ | $R^{A94}$ | H | $R^{A94}$ |
| m-1297 | $R^{A88}$ | $R^{A94}$ | H | $R^{A94}$ |
| m-1298 | $R^{A89}$ | $R^{A94}$ | H | $R^{A94}$ |
| m-1299 | $R^{A90}$ | $R^{A94}$ | H | $R^{A94}$ |
| m-1300 | $R^{A91}$ | $R^{A94}$ | H | $R^{A94}$ |
| m-1301 | $R^{A92}$ | $R^{A94}$ | H | $R^{A94}$ |
| m-1395 | $R^{A93}$ | $R^{A94}$ | H | $R^{A94}$ |
| m-1303 | $R^{A1}$ | $CD_3$ | H | $R^{A94}$ |
| m-1304 | $R^{A2}$ | $CD_3$ | H | $R^{A94}$ |
| m-1305 | $R^{A3}$ | $CD_3$ | H | $R^{A94}$ |
| m-1306 | $R^{A4}$ | $CD_3$ | H | $R^{A94}$ |
| m-1307 | $R^{A5}$ | $CD_3$ | H | $R^{A94}$ |
| m-1308 | $R^{A6}$ | $CD_3$ | H | $R^{A94}$ |
| m-1309 | $R^{A7}$ | $CD_3$ | H | $R^{A94}$ |
| m-1310 | $R^{A8}$ | $CD_3$ | H | $R^{A94}$ |
| m-1311 | $R^{A9}$ | $CD_3$ | H | $R^{A94}$ |
| m-1312 | $R^{A10}$ | $CD_3$ | H | $R^{A94}$ |
| m-1313 | $R^{A11}$ | $CD_3$ | H | $R^{A94}$ |
| m-1314 | $R^{A12}$ | $CD_3$ | H | $R^{A94}$ |
| m-1315 | $R^{A13}$ | $CD_3$ | H | $R^{A94}$ |
| m-1316 | $R^{A14}$ | $CD_3$ | H | $R^{A94}$ |
| m-1317 | $R^{A15}$ | $CD_3$ | H | $R^{A94}$ |
| m-1318 | $R^{A16}$ | $CD_3$ | H | $R^{A94}$ |
| m-1319 | $R^{A17}$ | $CD_3$ | H | $R^{A94}$ |
| m-1320 | $R^{A18}$ | $CD_3$ | H | $R^{A94}$ |
| m-1321 | $R^{A19}$ | $CD_3$ | H | $R^{A94}$ |
| m-1322 | $R^{A20}$ | $CD_3$ | H | $R^{A94}$ |
| m-1323 | $R^{A21}$ | $CD_3$ | H | $R^{A94}$ |
| m-1324 | $R^{A22}$ | $CD_3$ | H | $R^{A94}$ |
| m-1325 | $R^{A23}$ | $CD_3$ | H | $R^{A94}$ |
| m-1326 | $R^{A24}$ | $CD_3$ | H | $R^{A94}$ |
| m-1327 | $R^{A25}$ | $CD_3$ | H | $R^{A94}$ |
| m-1328 | $R^{A26}$ | $CD_3$ | H | $R^{A94}$ |
| m-1329 | $R^{A27}$ | $CD_3$ | H | $R^{A94}$ |
| m-1330 | $R^{A28}$ | $CD_3$ | H | $R^{A94}$ |
| m-1331 | $R^{A29}$ | $CD_3$ | H | $R^{A94}$ |
| m-1332 | $R^{A30}$ | $CD_3$ | H | $R^{A94}$ |
| m-1333 | $R^{A31}$ | $CD_3$ | H | $R^{A94}$ |
| m-1334 | $R^{A32}$ | $CD_3$ | H | $R^{A94}$ |
| m-1335 | $R^{A33}$ | $CD_3$ | H | $R^{A94}$ |
| m-1336 | $R^{A34}$ | $CD_3$ | H | $R^{A94}$ |
| m-1337 | $R^{A35}$ | $CD_3$ | H | $R^{A94}$ |
| m-1338 | $R^{A36}$ | $CD_3$ | H | $R^{A94}$ |
| m-1339 | $R^{A37}$ | $CD_3$ | H | $R^{A94}$ |
| m-1340 | $R^{A38}$ | $CD_3$ | H | $R^{A94}$ |
| m-1341 | $R^{A39}$ | $CD_3$ | H | $R^{A94}$ |
| m-1342 | $R^{A40}$ | $CD_3$ | H | $R^{A94}$ |
| m-1343 | $R^{A41}$ | $CD_3$ | H | $R^{A94}$ |
| m-1344 | $R^{A42}$ | $CD_3$ | H | $R^{A94}$ |
| m-1345 | $R^{A43}$ | $CD_3$ | H | $R^{A94}$ |
| m-1346 | $R^{A44}$ | $CD_3$ | H | $R^{A94}$ |
| m-1347 | $R^{A45}$ | $CD_3$ | H | $R^{A94}$ |
| m-1348 | $R^{A46}$ | $CD_3$ | H | $R^{A94}$ |
| m-1349 | $R^{A47}$ | $CD_3$ | H | $R^{A94}$ |
| m-1350 | $R^{A48}$ | $CD_3$ | H | $R^{A94}$ |
| m-1351 | $R^{A49}$ | $CD_3$ | H | $R^{A94}$ |
| m-1352 | $R^{A50}$ | $CD_3$ | H | $R^{A94}$ |
| m-1353 | $R^{A51}$ | $CD_3$ | H | $R^{A94}$ |
| m-1354 | $R^{A52}$ | $CD_3$ | H | $R^{A94}$ |
| m-1355 | $R^{A53}$ | $CD_3$ | H | $R^{A94}$ |
| m-1356 | $R^{A54}$ | $CD_3$ | H | $R^{A94}$ |
| m-1357 | $R^{A55}$ | $CD_3$ | H | $R^{A94}$ |
| m-1358 | $R^{A56}$ | $CD_3$ | H | $R^{A94}$ |
| m-1359 | $R^{A57}$ | $CD_3$ | H | $R^{A94}$ |
| m-1360 | $R^{A58}$ | $CD_3$ | H | $R^{A94}$ |
| m-1361 | $R^{A59}$ | $CD_3$ | H | $R^{A94}$ |
| m-1362 | $R^{A60}$ | $CD_3$ | H | $R^{A94}$ |
| m-1363 | $R^{A61}$ | $CD_3$ | H | $R^{A94}$ |
| m-1364 | $R^{A62}$ | $CD_3$ | H | $R^{A94}$ |
| m-1365 | $R^{A63}$ | $CD_3$ | H | $R^{A94}$ |
| m-1366 | $R^{A64}$ | $CD_3$ | H | $R^{A94}$ |
| m-1367 | $R^{A65}$ | $CD_3$ | H | $R^{A94}$ |
| m-1368 | $R^{A66}$ | $CD_3$ | H | $R^{A94}$ |
| m-1369 | $R^{A67}$ | $CD_3$ | H | $R^{A94}$ |
| m-1370 | $R^{A68}$ | $CD_3$ | H | $R^{A94}$ |
| m-1371 | $R^{A69}$ | $CD_3$ | H | $R^{A94}$ |
| m-1372 | $R^{A70}$ | $CD_3$ | H | $R^{A94}$ |
| m-1373 | $R^{A71}$ | $CD_3$ | H | $R^{A94}$ |
| m-1374 | $R^{A72}$ | $CD_3$ | H | $R^{A94}$ |
| m-1375 | $R^{A73}$ | $CD_3$ | H | $R^{A94}$ |
| m-1376 | $R^{A74}$ | $CD_3$ | H | $R^{A94}$ |
| m-1377 | $R^{A75}$ | $CD_3$ | H | $R^{A94}$ |
| m-1378 | $R^{A76}$ | $CD_3$ | H | $R^{A94}$ |
| m-1379 | $R^{A77}$ | $CD_3$ | H | $R^{A94}$ |
| m-1380 | $R^{A78}$ | $CD_3$ | H | $R^{A94}$ |
| m-1381 | $R^{A79}$ | $CD_3$ | H | $R^{A94}$ |
| m-1382 | $R^{A80}$ | $CD_3$ | H | $R^{A94}$ |
| m-1383 | $R^{A81}$ | $CD_3$ | H | $R^{A94}$ |
| m-1384 | $R^{A82}$ | $CD_3$ | H | $R^{A94}$ |
| m-1385 | $R^{A83}$ | $CD_3$ | H | $R^{A94}$ |
| m-1386 | $R^{A84}$ | $CD_3$ | H | $R^{A94}$ |
| m-1387 | $R^{A85}$ | $CD_3$ | H | $R^{A94}$ |
| m-1388 | $R^{A86}$ | $CD_3$ | H | $R^{A94}$ |
| m-1389 | $R^{A87}$ | $CD_3$ | H | $R^{A94}$ |
| m-1390 | $R^{A88}$ | $CD_3$ | H | $R^{A94}$ |
| m-1391 | $R^{A89}$ | $CD_3$ | H | $R^{A94}$ |
| m-1392 | $R^{A90}$ | $CD_3$ | H | $R^{A94}$ |
| m-1393 | $R^{A91}$ | $CD_3$ | H | $R^{A94}$ |
| m-1394 | $R^{A92}$ | $CD_3$ | H | $R^{A94}$ |
| m-1395 | $R^{A93}$ | $CD_3$ | H | $R^{A94}$ |
| m-1396 | H | $R^{A1}$ | H | H |
| m-1397 | H | $R^{A2}$ | H | H |
| m-1398 | H | $R^{A3}$ | H | H |
| m-1399 | H | $R^{A4}$ | H | H |
| m-1400 | H | $R^{A5}$ | H | H |
| m-1401 | H | $R^{A6}$ | H | H |
| m-1402 | H | $R^{A7}$ | H | H |
| m-1403 | H | $R^{A8}$ | H | H |
| m-1404 | H | $R^{A9}$ | H | H |
| m-1405 | H | $R^{A10}$ | H | H |
| m-1406 | H | $R^{A11}$ | H | H |
| m-1407 | H | $R^{A12}$ | H | H |
| m-1408 | H | $R^{A13}$ | H | H |
| m-1409 | H | $R^{A14}$ | H | H |
| m-1410 | H | $R^{A15}$ | H | H |
| m-1411 | H | $R^{A16}$ | H | H |
| m-1412 | H | $R^{A17}$ | H | H |
| m-1413 | H | $R^{A18}$ | H | H |
| m-1414 | H | $R^{A19}$ | H | H |
| m-1415 | H | $R^{A20}$ | H | H |
| m-1416 | H | $R^{A21}$ | H | H |
| m-1417 | H | $R^{A22}$ | H | H |
| m-1418 | H | $R^{A23}$ | H | H |
| m-1419 | H | $R^{A24}$ | H | H |
| m-1420 | H | $R^{A25}$ | H | H |
| m-1421 | H | $R^{A26}$ | H | H |
| m-1422 | H | $R^{A27}$ | H | H |
| m-1423 | H | $R^{A28}$ | H | H |
| m-1424 | H | $R^{A29}$ | H | H |
| m-1425 | H | $R^{A30}$ | H | H |
| m-1426 | H | $R^{A31}$ | H | H |
| m-1427 | H | $R^{A32}$ | H | H |
| m-1428 | H | $R^{A33}$ | H | H |
| m-1429 | H | $R^{A34}$ | H | H |
| m-1430 | H | $R^{A35}$ | H | H |
| m-1431 | H | $R^{A36}$ | H | H |
| m-1432 | H | $R^{A37}$ | H | H |
| m-1433 | H | $R^{A38}$ | H | H |

-continued

| Compound # | $R^{1a}$ | $R^{1b}$ | $R^{2a}$ | $R^{2b}$ |
|---|---|---|---|---|
| m-1434 | H | $R^{A39}$ | H | H |
| m-1435 | H | $R^{A40}$ | H | H |
| m-1436 | H | $R^{A41}$ | H | H |
| m-1437 | H | $R^{A42}$ | H | H |
| m-1438 | H | $R^{A43}$ | H | H |
| m-1439 | H | $R^{A44}$ | H | H |
| m-1440 | H | $R^{A45}$ | H | H |
| m-1441 | H | $R^{A46}$ | H | H |
| m-1442 | H | $R^{A47}$ | H | H |
| m-1443 | H | $R^{A48}$ | H | H |
| m-1444 | H | $R^{A49}$ | H | H |
| m-1445 | H | $R^{A50}$ | H | H |
| m-1446 | H | $R^{A51}$ | H | H |
| m-1447 | H | $R^{A52}$ | H | H |
| m-1448 | H | $R^{A53}$ | H | H |
| m-1449 | H | $R^{A54}$ | H | H |
| m-1450 | H | $R^{A55}$ | H | H |
| m-1451 | H | $R^{A56}$ | H | H |
| m-1452 | H | $R^{A57}$ | H | H |
| m-1453 | H | $R^{A58}$ | H | H |
| m-1454 | H | $R^{A59}$ | H | H |
| m-1455 | H | $R^{A60}$ | H | H |
| m-1456 | H | $R^{A61}$ | H | H |
| m-1457 | H | $R^{A62}$ | H | H |
| m-1458 | H | $R^{A63}$ | H | H |
| m-1459 | H | $R^{A64}$ | H | H |
| m-1460 | H | $R^{A65}$ | H | H |
| m-1461 | H | $R^{A66}$ | H | H |
| m-1462 | H | $R^{A67}$ | H | H |
| m-1463 | H | $R^{A68}$ | H | H |
| m-1464 | H | $R^{A69}$ | H | H |
| m-1465 | H | $R^{A70}$ | H | H |
| m-1466 | H | $R^{A71}$ | H | H |
| m-1467 | H | $R^{A72}$ | H | H |
| m-1468 | H | $R^{A73}$ | H | H |
| m-1469 | H | $R^{A74}$ | H | H |
| m-1470 | H | $R^{A75}$ | H | H |
| m-1471 | H | $R^{A76}$ | H | H |
| m-1472 | H | $R^{A77}$ | H | H |
| m-1473 | H | $R^{A78}$ | H | H |
| m-1474 | H | $R^{A79}$ | H | H |
| m-1475 | H | $R^{A80}$ | H | H |
| m-1476 | H | $R^{A81}$ | H | H |
| m-1477 | H | $R^{A82}$ | H | H |
| m-1478 | H | $R^{A83}$ | H | H |
| m-1479 | H | $R^{A84}$ | H | H |
| m-1480 | H | $R^{A85}$ | H | H |
| m-1481 | H | $R^{A86}$ | H | H |
| m-1482 | H | $R^{A87}$ | H | H |
| m-1483 | H | $R^{A88}$ | H | H |
| m-1484 | H | $R^{A89}$ | H | H |
| m-1485 | H | $R^{A90}$ | H | H |
| m-1486 | H | $R^{A91}$ | H | H |
| m-1487 | H | $R^{A92}$ | H | H |
| m-1488 | H | $R^{A93}$ | H | H |

$R^{A1}$

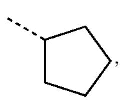

$R^{A2}$

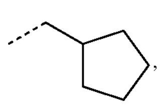

$R^{A3}$

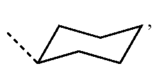

$R^{A4}$

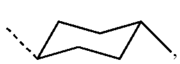

-continued $R^{A5}$

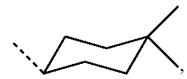

$R^{A6}$

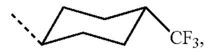

$R^{A7}$

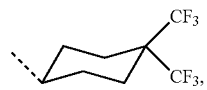

$R^{A8}$

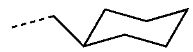

$R^{A9}$

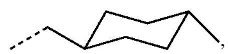

$R^{A10}$

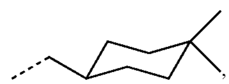

$R^{A11}$

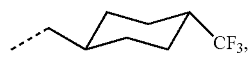

$R^{A12}$

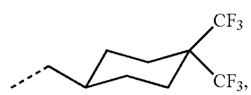

$R^{A13}$

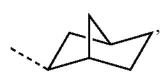

$R^{A14}$

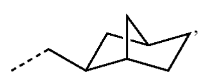

$R^{A15}$

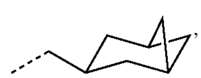

$R^{A16}$

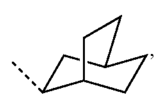

$R^{A17}$

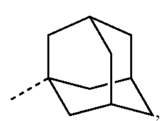

$R^{A18}$

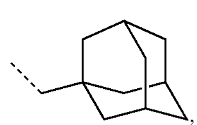

$R^{A19}$

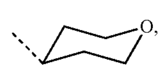

$R^{A20}$

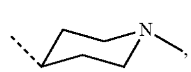

$R^{A21}$

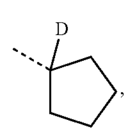

-continued
$R^{A22}$
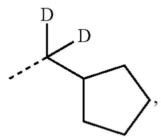
$R^{A23}$
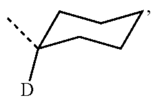
$R^{A24}$
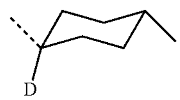
$R^{A25}$
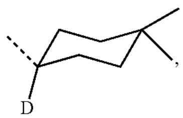
$R^{A26}$
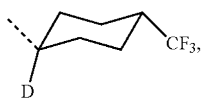
$R^{A27}$
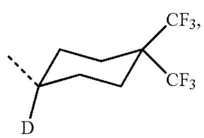
$R^{A28}$
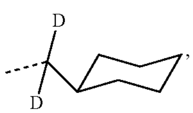
$R^{A29}$
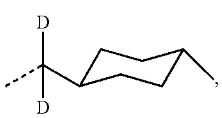
$R^{A30}$
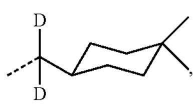
$R^{A31}$
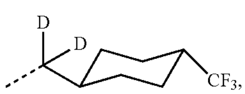
$R^{A32}$
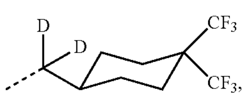
$R^{A33}$
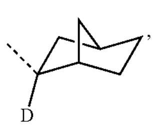
$R^{A34}$
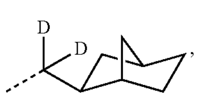
-continued
$R^{A35}$
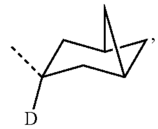
$R^{A36}$
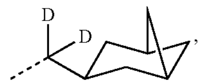
$R^{A37}$
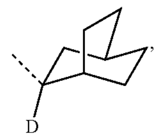
$R^{A38}$
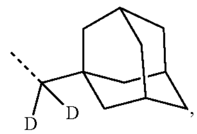
$R^{A39}$
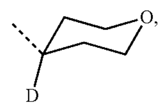
$R^{A40}$
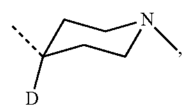
$R^{A41}$
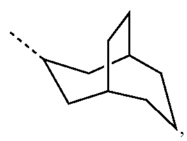
$R^{A42}$
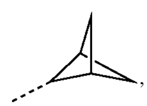
$R^{A43}$
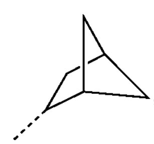
$R^{A44}$
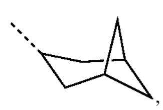
$R^{A45}$
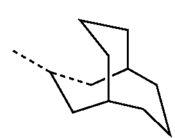
$R^{A46}$
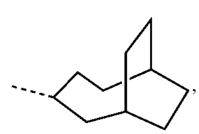

-continued
$R^{A447}$
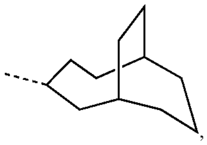
$R^{A448}$
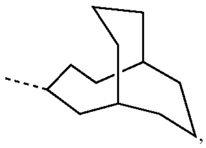
$R^{A449}$
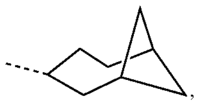
$R^{A450}$
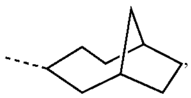
$R^{A451}$
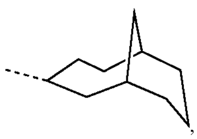
$R^{A452}$
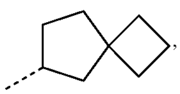
$R^{A453}$
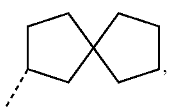
$R^{A454}$
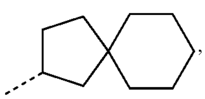
$R^{A455}$
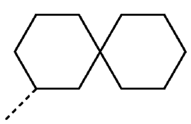
$R^{A456}$
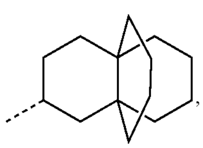
$R^{A457}$
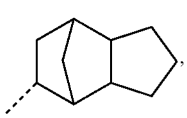
$R^{A458}$
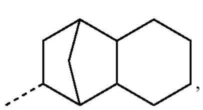
-continued
$R^{A459}$
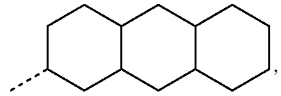
$R^{A460}$
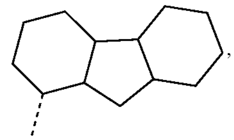
$R^{A461}$
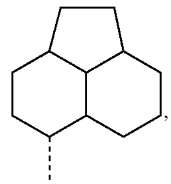
$R^{A462}$
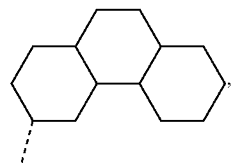
$R^{A463}$
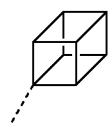
$R^{A464}$
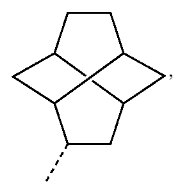
$R^{A465}$
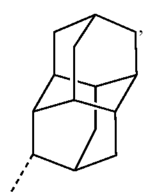
$R^{A466}$
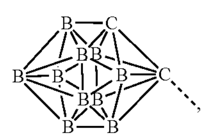
$R^{A467}$
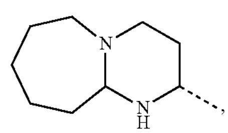
$R^{A468}$
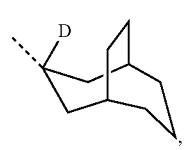

-continued
$R^{A469}$
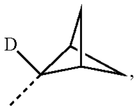
$R^{A470}$
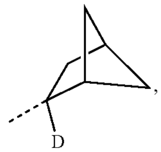
$R^{A471}$
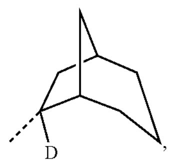
$R^{A472}$
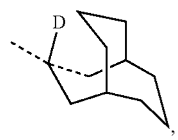
$R^{A473}$
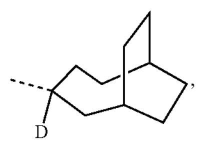
$R^{A474}$
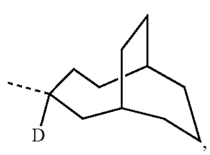
$R^{A475}$
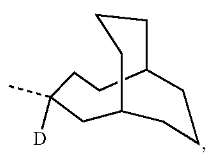
$R^{A476}$
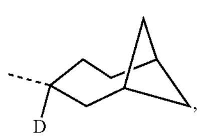
$R^{A477}$
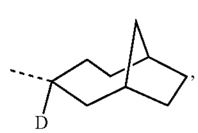
$R^{A478}$
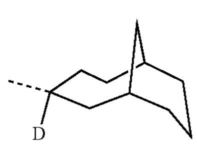
-continued
$R^{A479}$
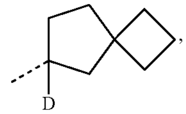
$R^{A480}$
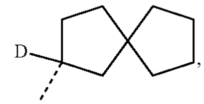
$R^{A481}$
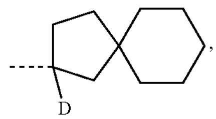
$R^{A482}$
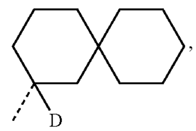
$R^{A482}$
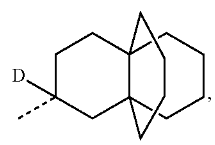
$R^{A484}$
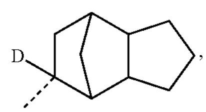
$R^{A485}$
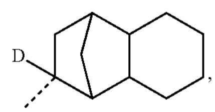
$R^{A486}$
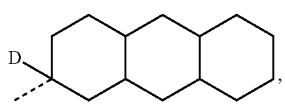
$R^{A487}$
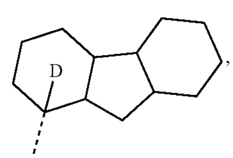
$R^{A488}$
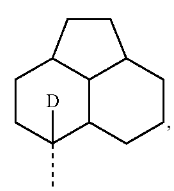
$R^{A489}$
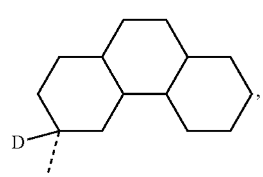

-continued
$R^{A90}$
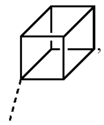
$R^{A91}$
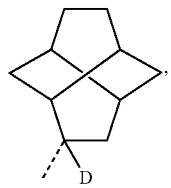
$R^{A92}$
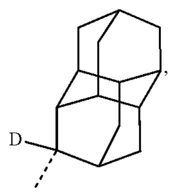
$R^{A93}$
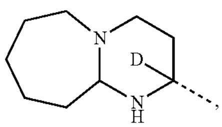
$R^{A94}$
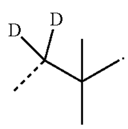
In some embodiments, the compound is defined in the above table corresponding to those substituents selected from the group consisting of:
$R^{A1}$
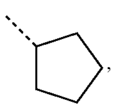
$R^{A2}$
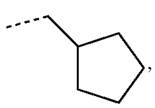
$R^{A3}$
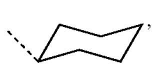
$R^{A5}$
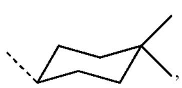
$R^{A7}$
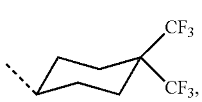
$R^{A17}$
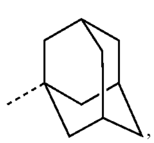
-continued
$R^{A21}$
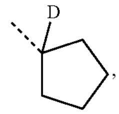
$R^{A22}$
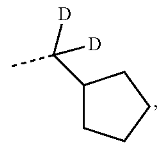
$R^{A23}$
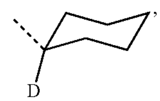
$R^{A25}$
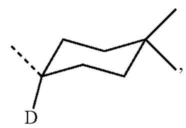
and
$R^{A27}$
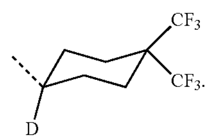
In some embodiments, $L_B$ is selected from the group consisting of:
$L_{B1}$
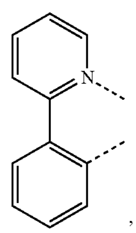
$L_{B2}$
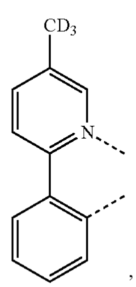
$L_{B3}$
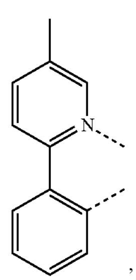

-continued
$L_{B4}$
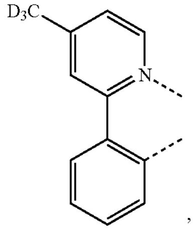
$L_{B5}$
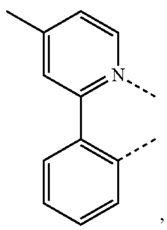
$L_{B6}$
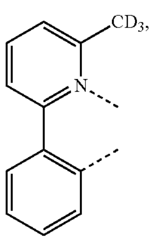
$L_{B7}$
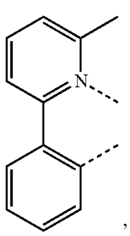
$L_{B8}$
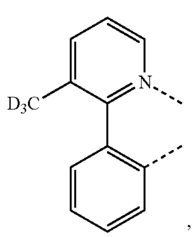
$L_{B9}$
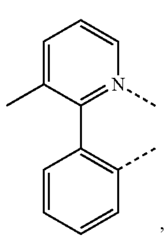
-continued
$L_{B10}$
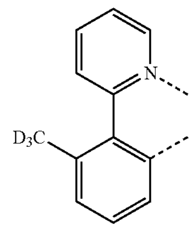
$L_{B11}$
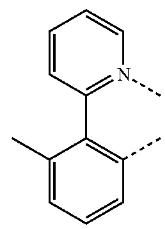
$L_{B12}$
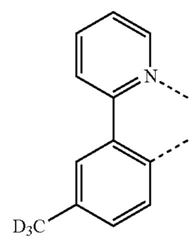
$L_{B13}$
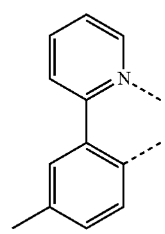
$L_{B14}$
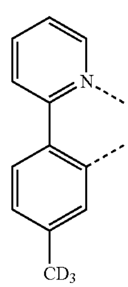
$L_{B15}$
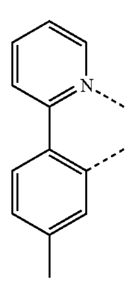

-continued
$L_{B16}$
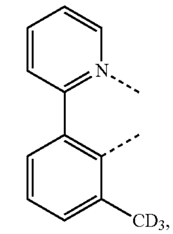
$L_{B17}$
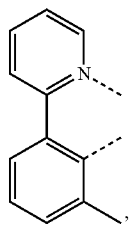
$L_{B18}$
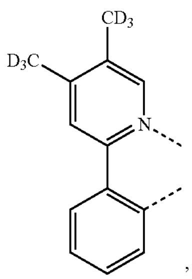
$L_{B19}$
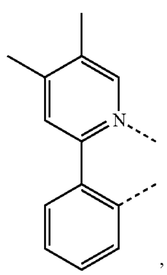
$L_{B20}$
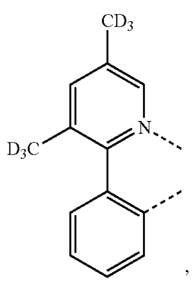
$L_{B21}$
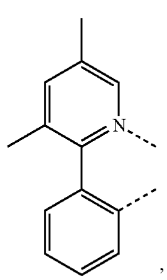
-continued
$L_{B22}$
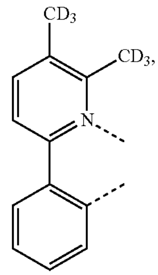
$L_{B23}$
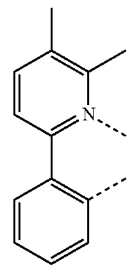
$L_{B24}$
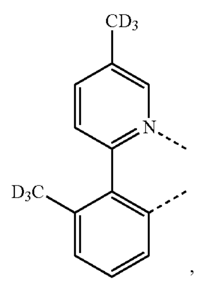
$L_{B25}$
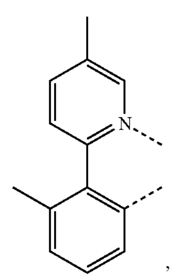
$L_{B26}$
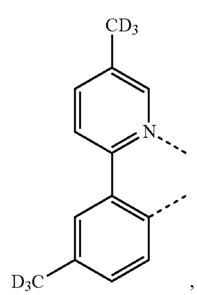

-continued
$L_{B27}$
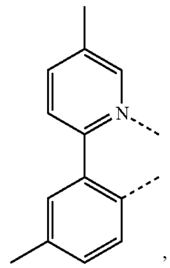
$L_{B28}$
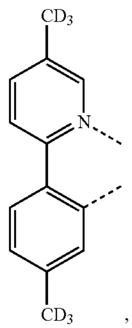
$L_{B29}$
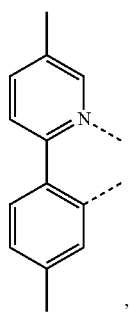
$L_{B30}$
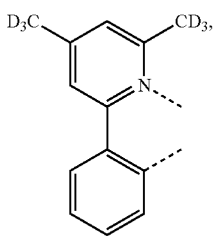
$L_{B31}$
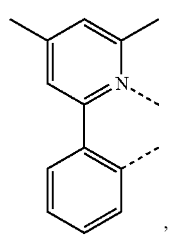
$L_{B32}$
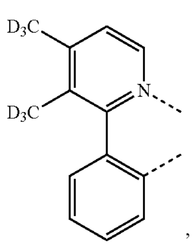
-continued
$L_{B33}$
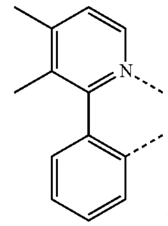
$L_{B34}$
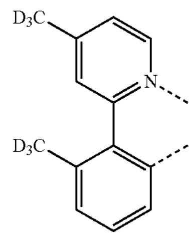
$L_{B35}$
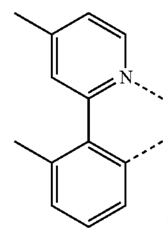
$L_{B36}$
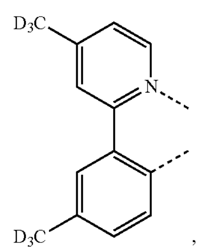
$L_{B37}$
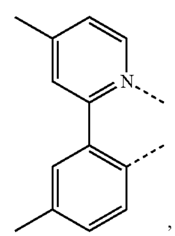
$L_{B38}$
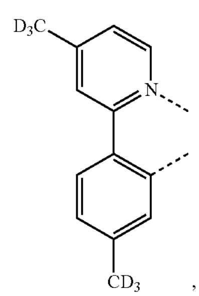

-continued
$L_{B39}$
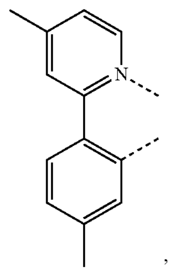
$L_{B40}$
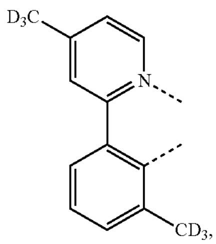
$L_{B41}$
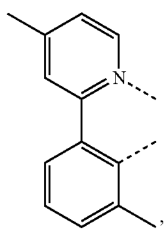
$L_{B42}$
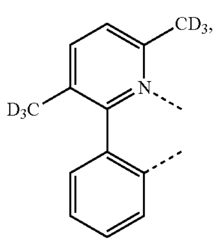
$L_{B43}$
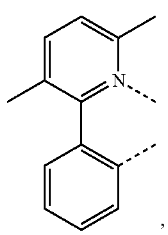
$L_{B44}$
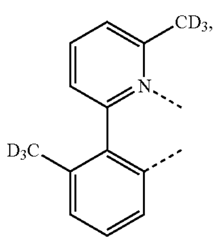
-continued
$L_{B45}$
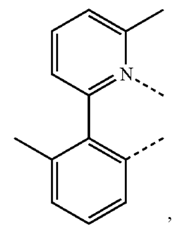
$L_{B46}$
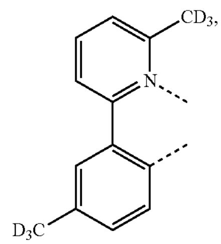
$L_{B47}$
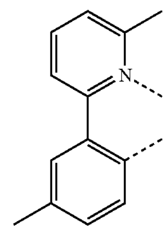
$L_{B48}$
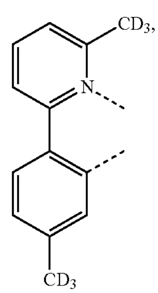
$L_{B49}$
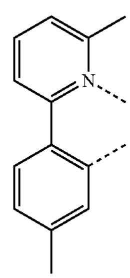
$L_{B50}$
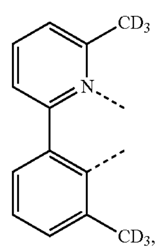

-continued
L$_{B51}$
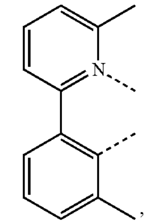
L$_{B52}$
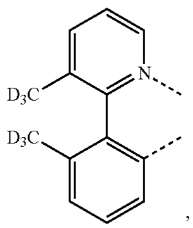
L$_{B53}$
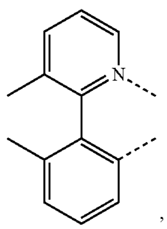
L$_{B54}$
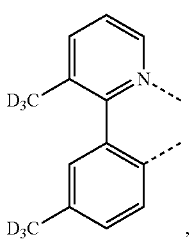
L$_{B55}$
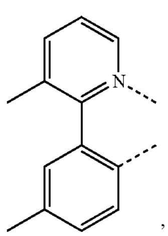
L$_{B56}$
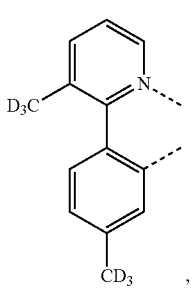
-continued
L$_{B57}$
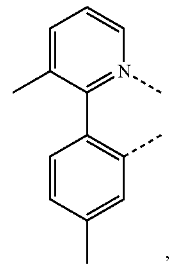
L$_{B58}$
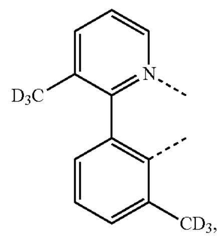
L$_{B59}$
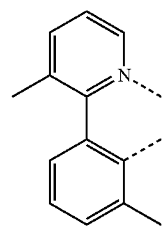
L$_{B60}$
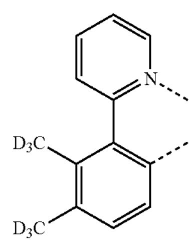
L$_{B61}$
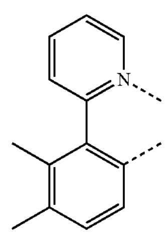
L$_{B62}$
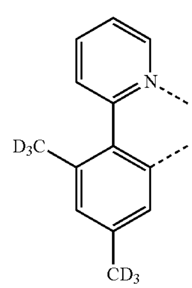

-continued
LB63
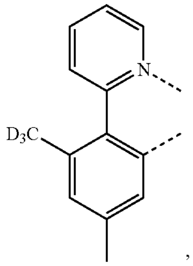
LB64
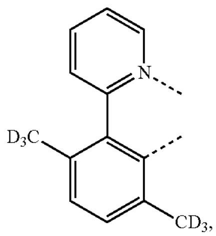
LB65
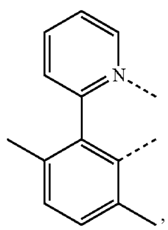
LB66
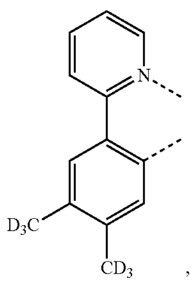
LB67
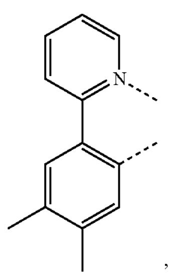
LB68
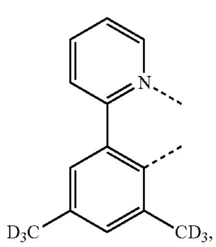
-continued
LB69
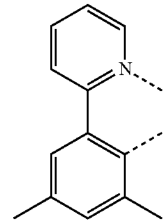
LB70
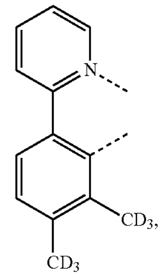
LB71
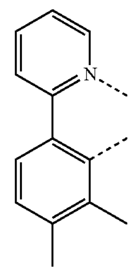
LB72
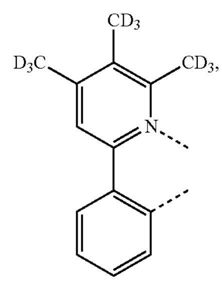
LB73
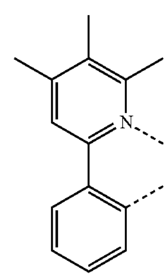
LB74
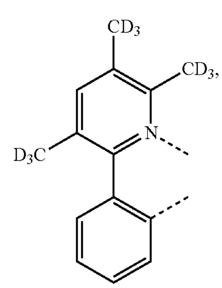

-continued
$L_{B75}$
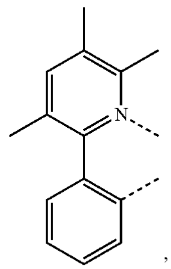
$L_{B76}$
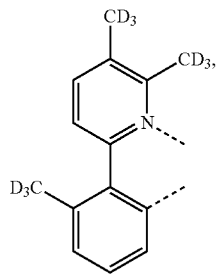
$L_{B77}$
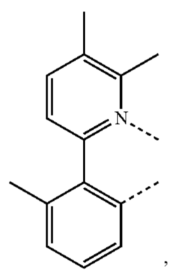
$L_{B78}$
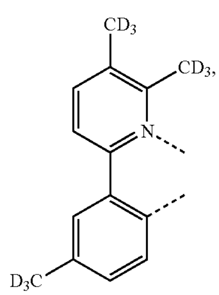
$L_{B79}$
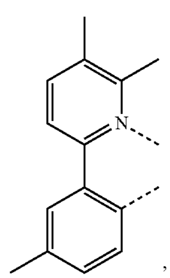
-continued
$L_{B80}$
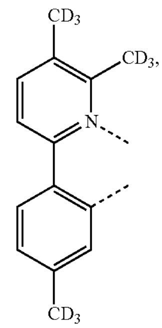
$L_{B81}$
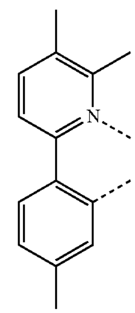
$L_{B82}$
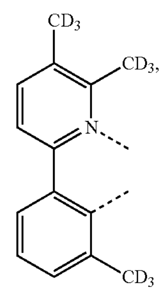
$L_{B83}$
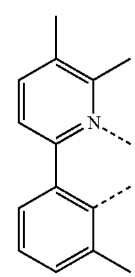
$L_{B84}$
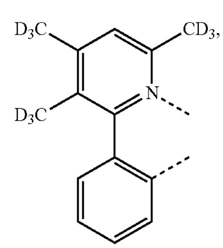

-continued
$L_{B85}$
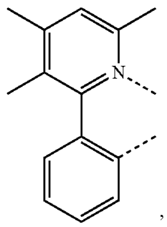
$L_{B86}$
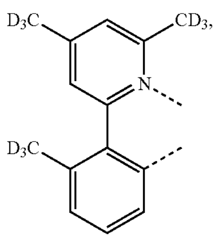
$L_{B87}$
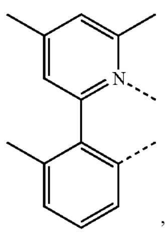
$L_{B88}$
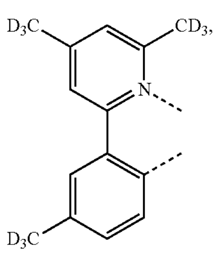
$L_{B89}$
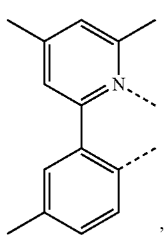
$L_{B90}$
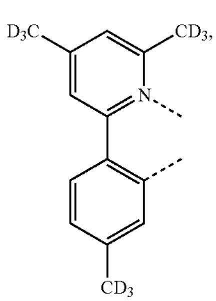
-continued
$L_{B91}$
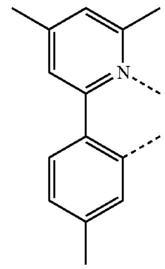
$L_{B92}$
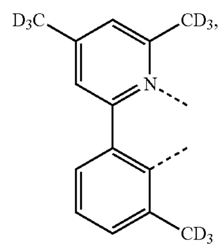
$L_{B93}$
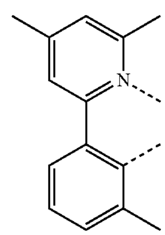
$L_{B94}$
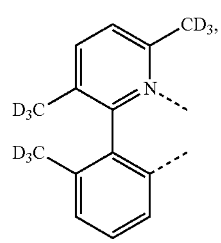
$L_{B95}$
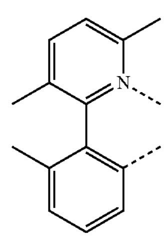
$L_{B96}$
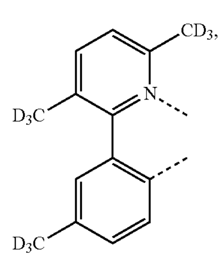

-continued
$L_{B97}$
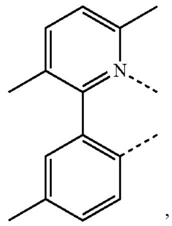
$L_{B98}$
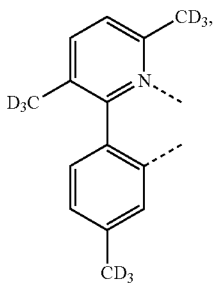
$L_{B99}$
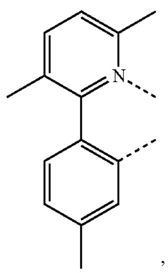
$L_{B100}$
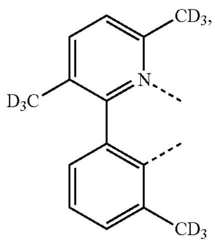
$L_{B101}$
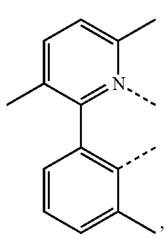
$L_{B102}$
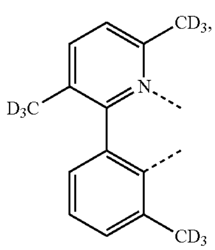
-continued
$L_{B103}$
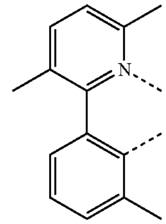
$L_{B104}$
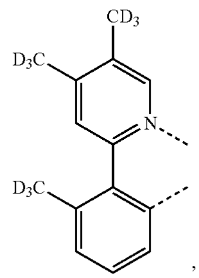
$L_{B105}$
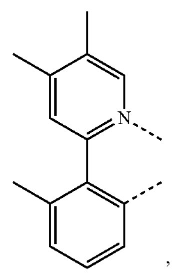
$L_{B106}$
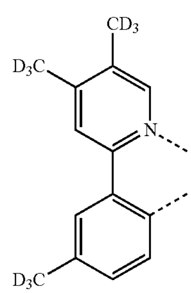
$L_{B107}$
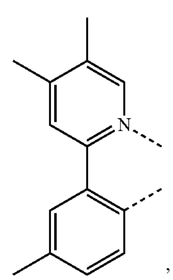

-continued
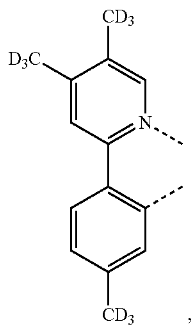
$L_{B108}$
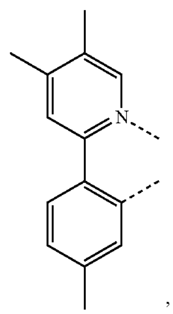
$L_{B109}$
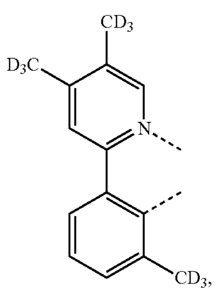
$L_{B110}$
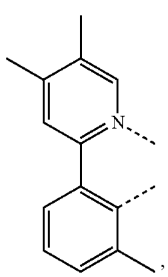
$L_{B111}$
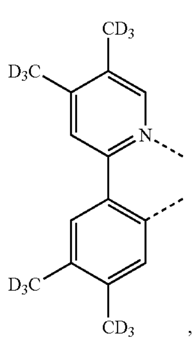
$L_{B112}$
-continued
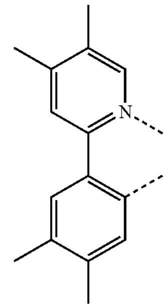
$L_{B113}$
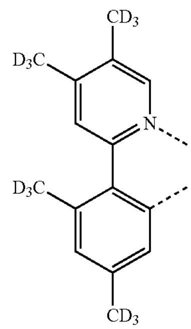
$L_{B114}$
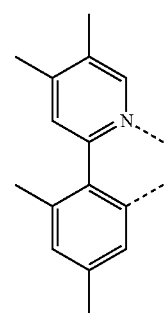
$L_{B115}$
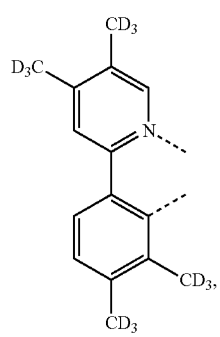
$L_{B116}$
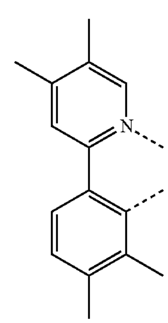
$L_{B117}$ -continued
$L_{B118}$
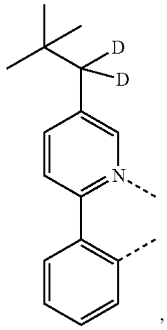
$L_{B119}$
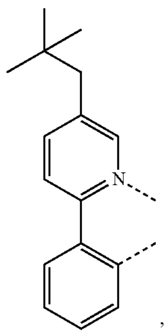
$L_{B120}$
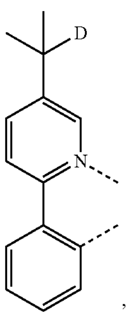
$L_{B121}$
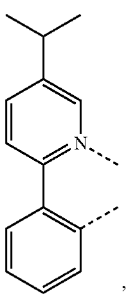
$L_{B122}$
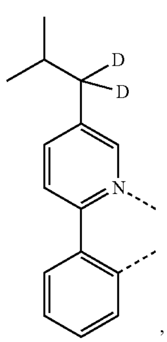
-continued
$L_{B123}$
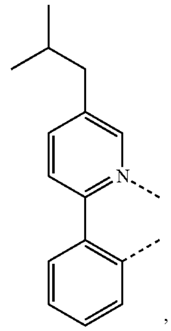
$L_{B124}$
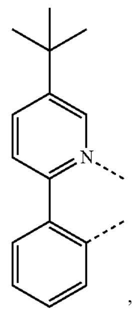
$L_{B125}$
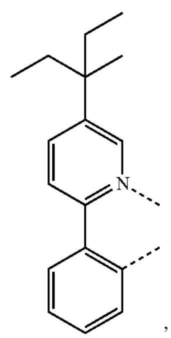
$L_{B126}$
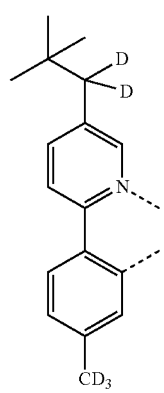

-continued
$L_{B127}$
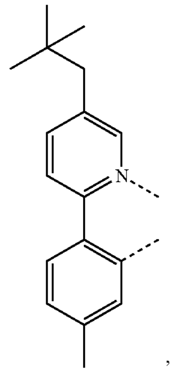
$L_{B128}$
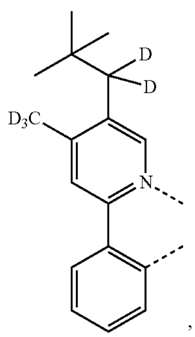
$L_{B129}$
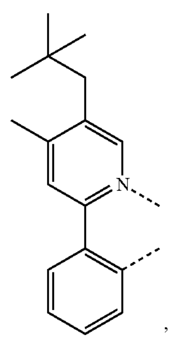
$L_{B130}$
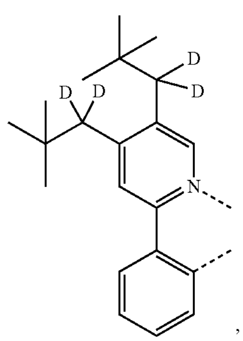
-continued
$L_{B131}$
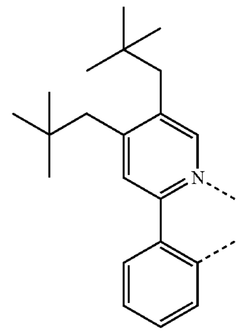
$L_{B132}$
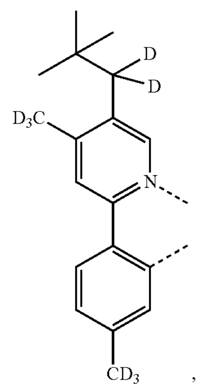
$L_{B133}$
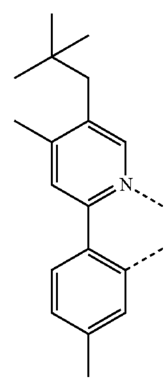
$L_{B134}$
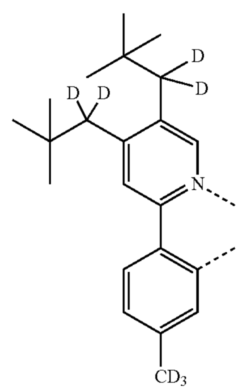

-continued
$L_{B135}$
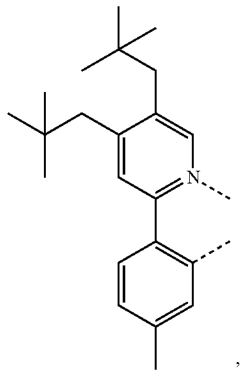
$L_{B136}$
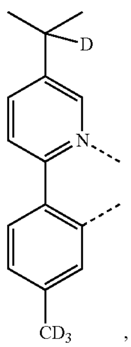
$L_{B137}$
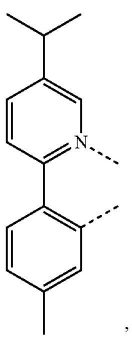
$L_{B138}$
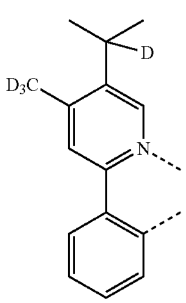
-continued
$L_{B139}$
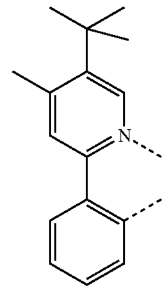
$L_{B140}$
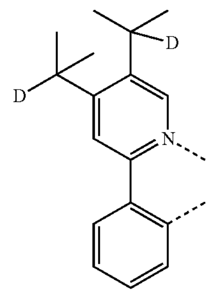
$L_{B141}$
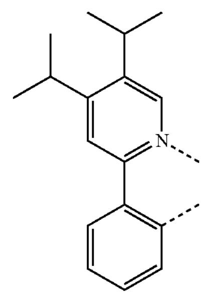
$L_{B142}$
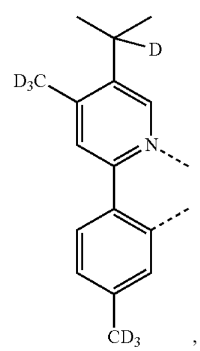
$L_{B143}$
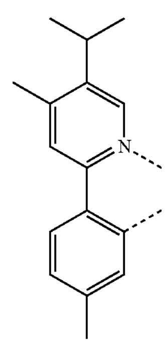

$L_{B144}$
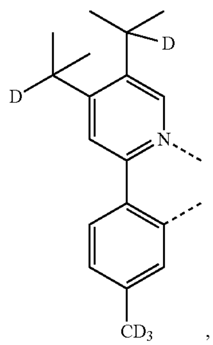
$L_{B145}$
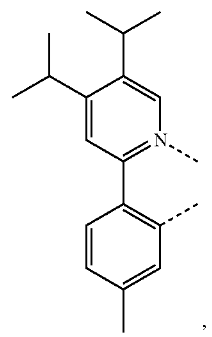
$L_{B146}$
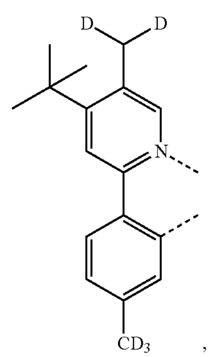
$L_{B147}$
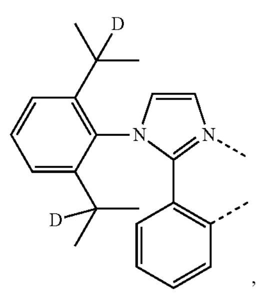
$L_{B148}$
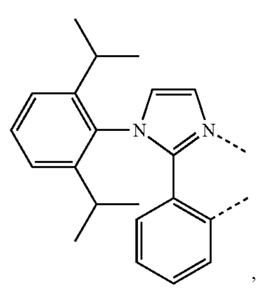
$L_{B149}$
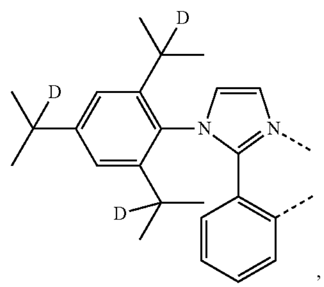
$L_{B150}$
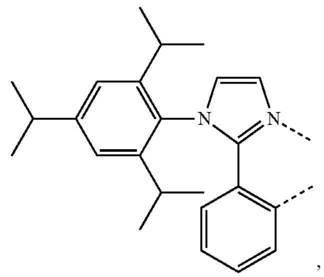
$L_{B151}$
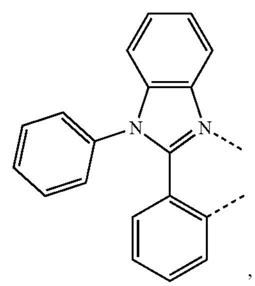
$L_{B152}$
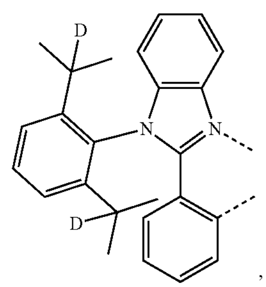
$L_{B153}$
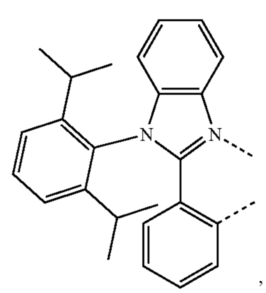

-continued
$L_{B154}$
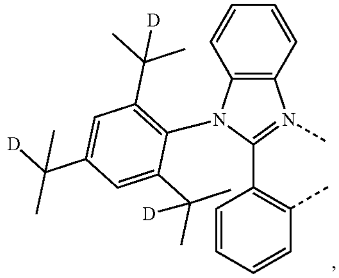
$L_{B155}$
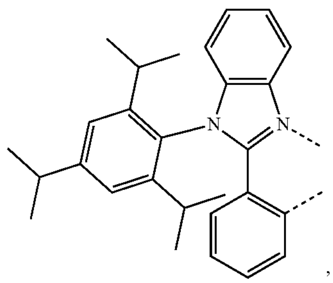
$L_{B156}$
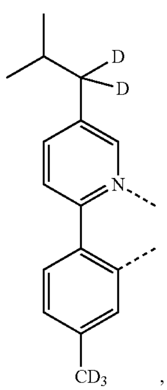
$L_{B157}$
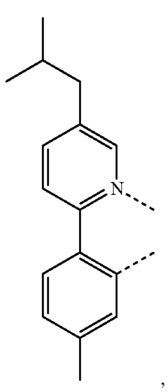
-continued
$L_{B158}$
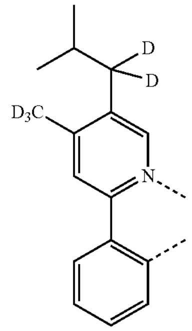
$L_{B159}$
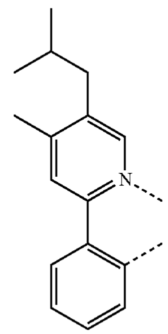
$L_{B160}$
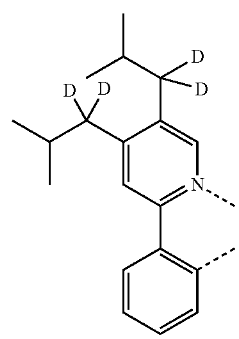
$L_{B161}$
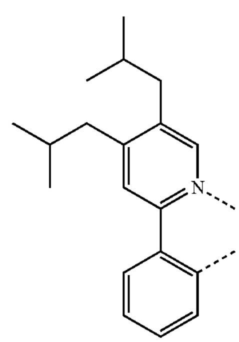

-continued
$L_{B162}$
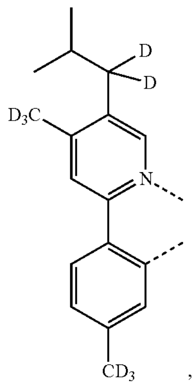
$L_{B163}$
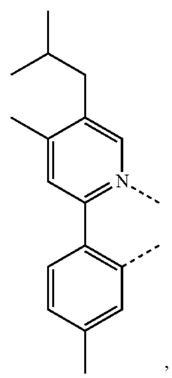
$L_{B164}$
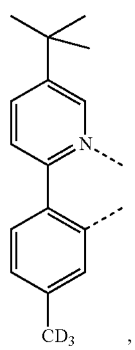
$L_{B165}$
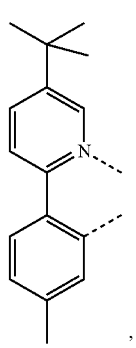
-continued
$L_{B166}$
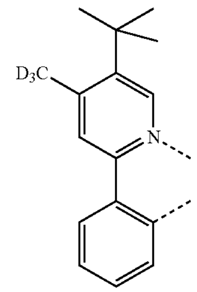
$L_{B167}$
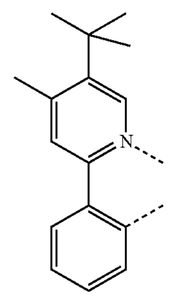
$L_{B168}$
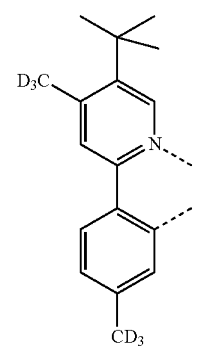
$L_{B169}$
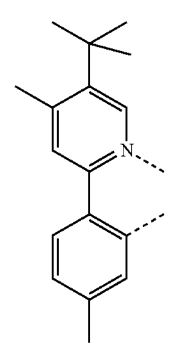

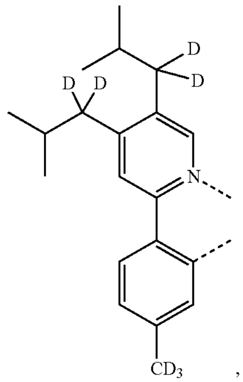
$L_{B170}$
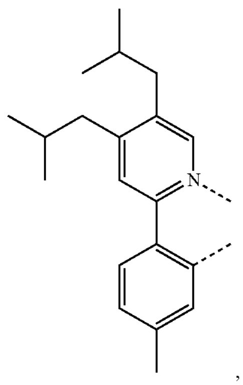
$L_{B171}$
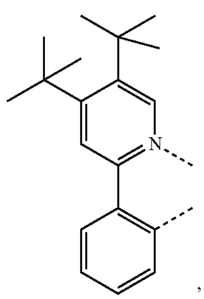
$L_{B172}$
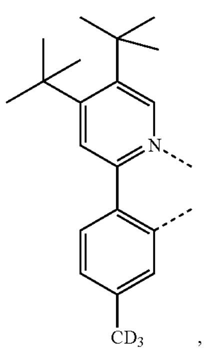
$L_{B173}$
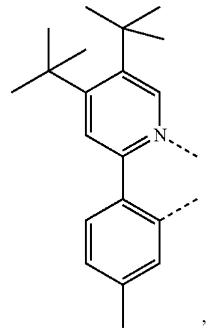
$L_{B174}$
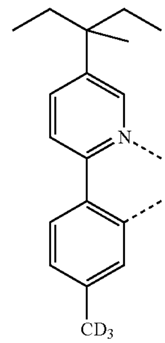
$L_{B175}$
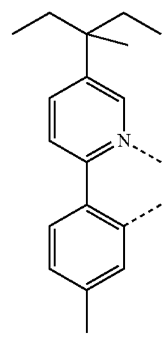
$L_{B176}$
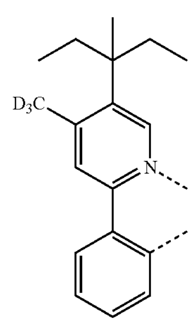
$L_{B177}$ $L_{B178}$
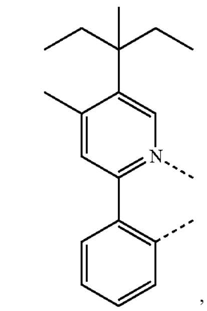
$L_{B179}$
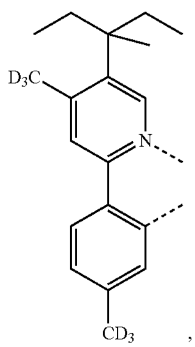
$L_{B180}$
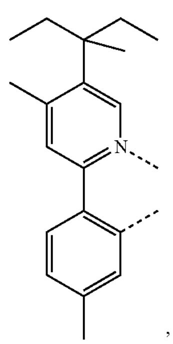
$L_{B181}$
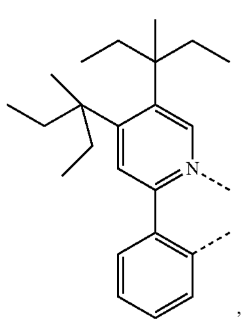
$L_{B182}$
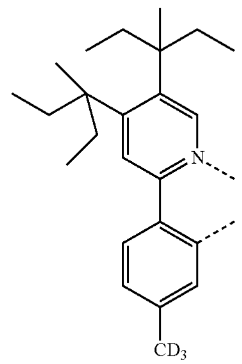
$L_{B183}$
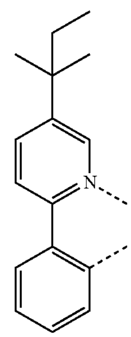
$L_{B184}$
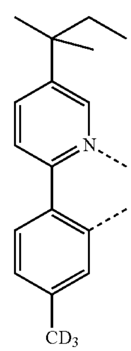
$L_{B185}$
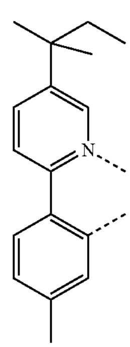

$L_{B186}$
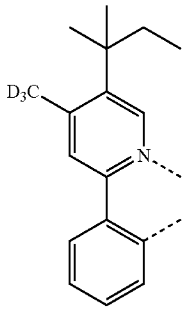
,
$L_{B187}$
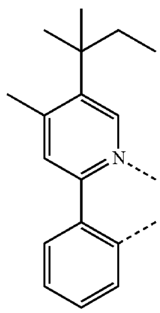
,
$L_{B188}$
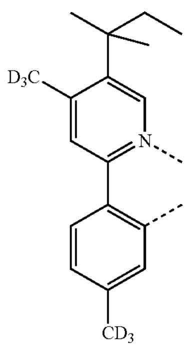
,
$L_{B189}$
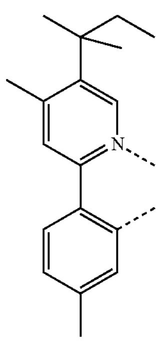
,
$L_{B190}$
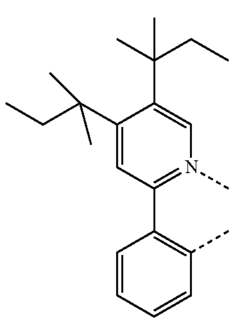
,
$L_{B191}$
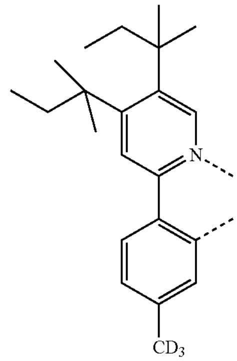
,
$L_{B192}$
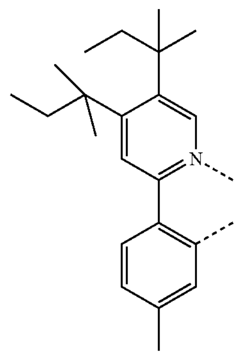
,
$L_{B193}$
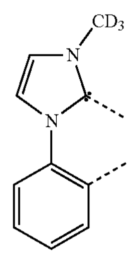
,
$L_{B194}$
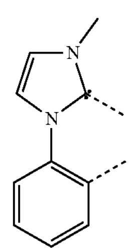
,
$L_{B195}$
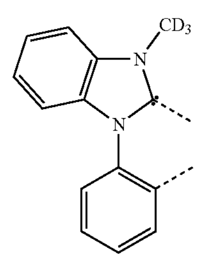
,

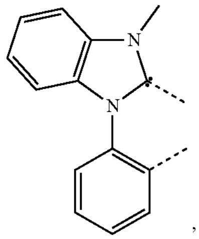
$L_{B196}$
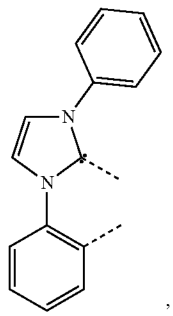
$L_{B197}$
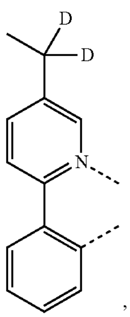
$L_{B198}$
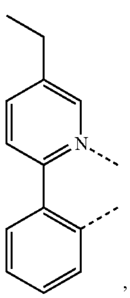
$L_{B199}$
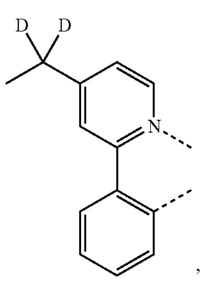
$L_{B200}$
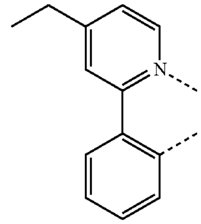
$L_{B201}$
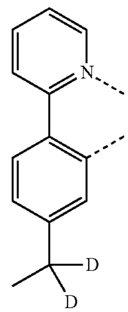
$L_{B202}$
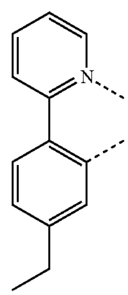
$L_{B203}$
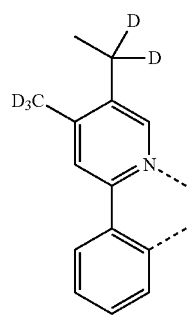
$L_{B204}$
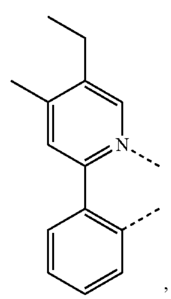
$L_{B205}$ -continued
$L_{B206}$
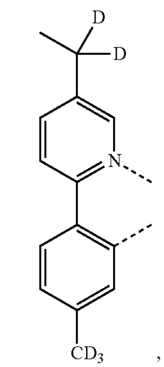
$L_{B207}$
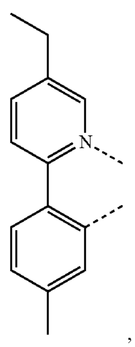
$L_{B208}$
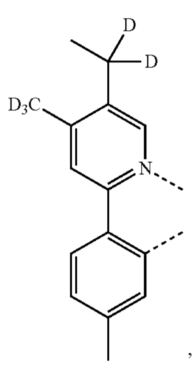
$L_{B209}$
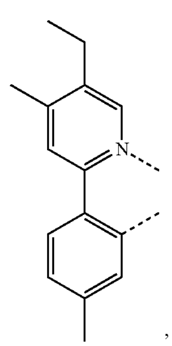
-continued
$L_{B210}$
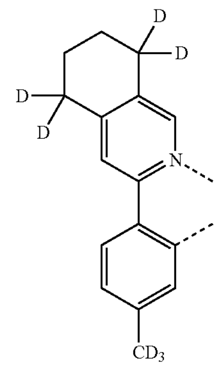
$L_{B211}$
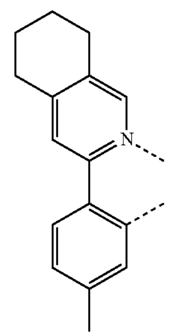
$L_{B212}$
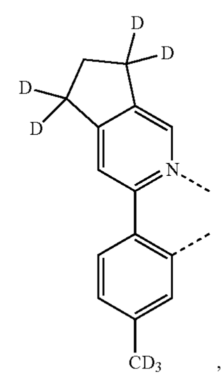
$L_{B213}$
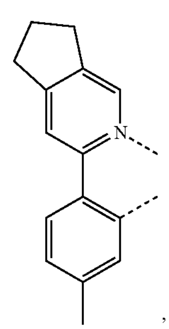

-continued
LB214
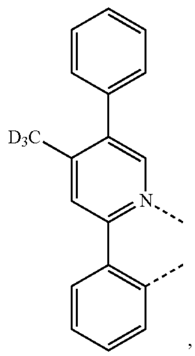
LB215
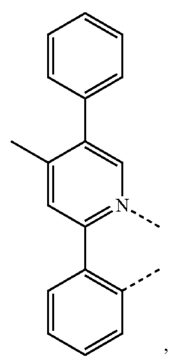
LB216
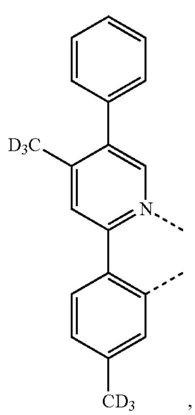
LB217
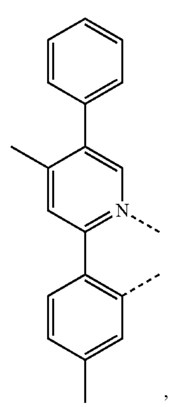
-continued
LB218
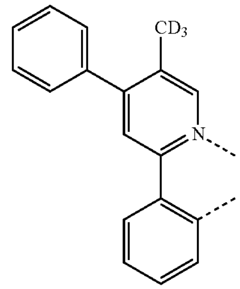
LB219
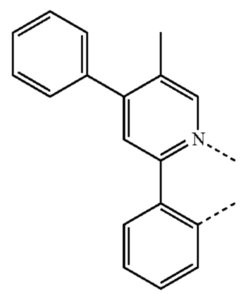
LB220
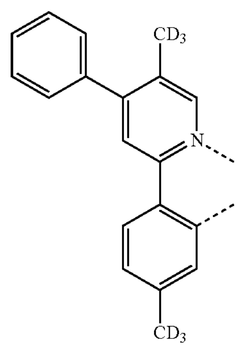
LB221
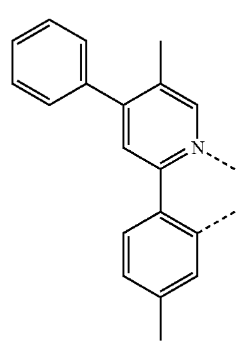

-continued
$L_{B222}$
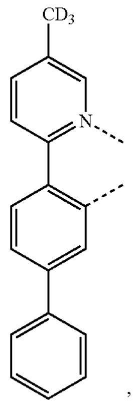
,
$L_{B223}$
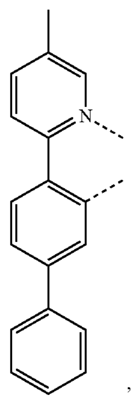
,
$L_{B224}$
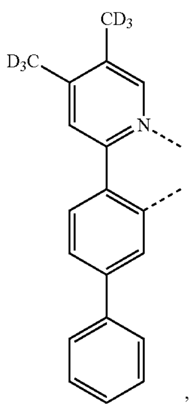
,
$L_{B225}$
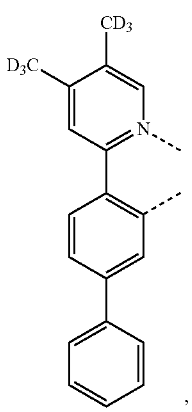
,
-continued
$L_{B226}$
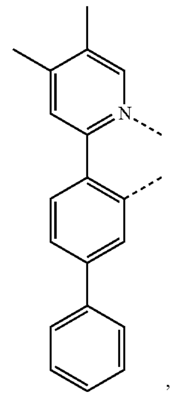
,
$L_{B227}$
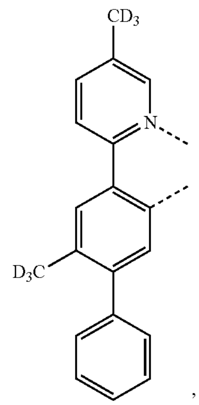
,
$L_{B228}$
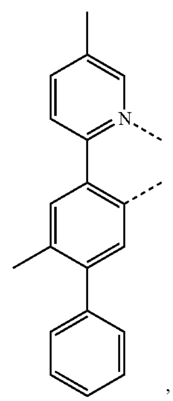
,
$L_{B229}$
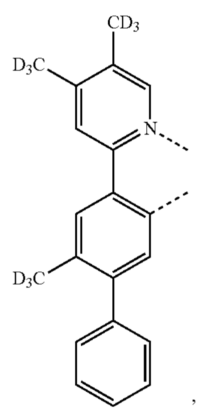
, -continued
$L_{B230}$
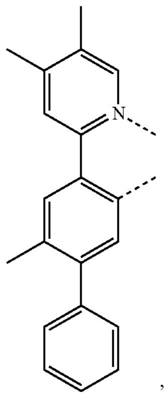
$L_{B231}$
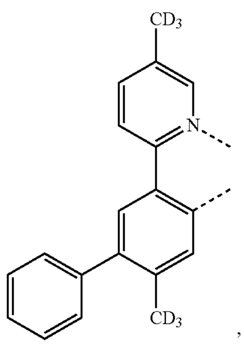
$L_{B232}$
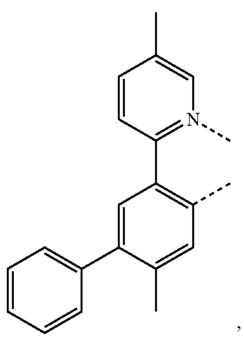
$L_{B233}$
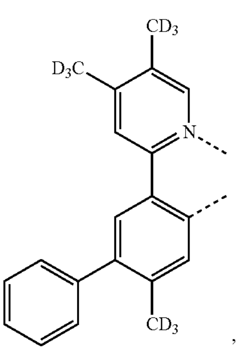
-continued
$L_{B234}$
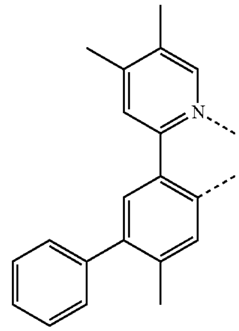
$L_{B235}$
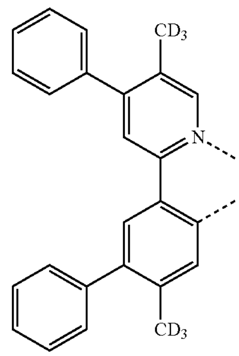
$L_{B236}$
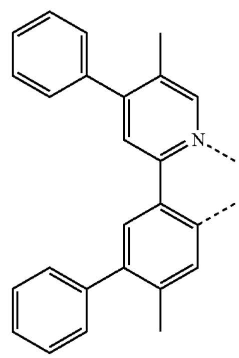
$L_{B237}$
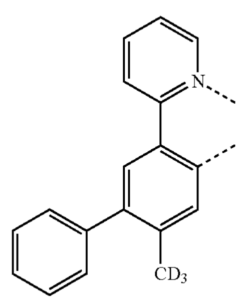
$L_{B238}$
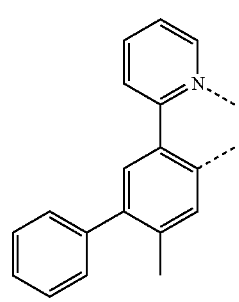

-continued
L_B239
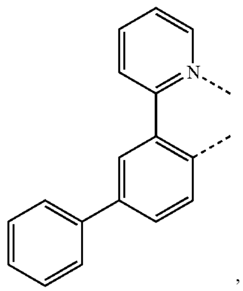
L_B240
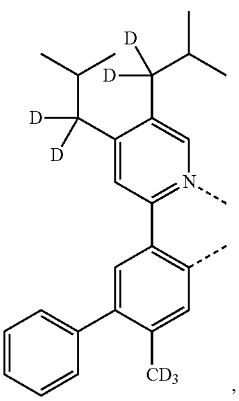
L_B241
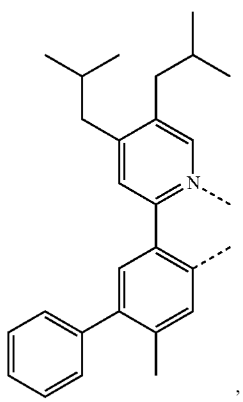
L_B242
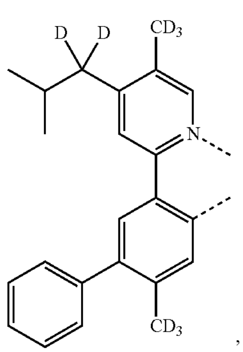
-continued
L_B243
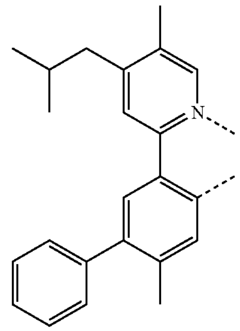
L_B244
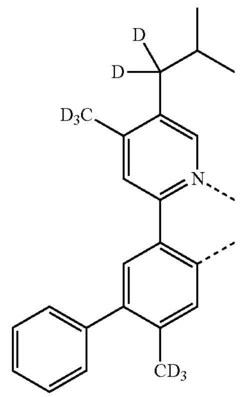
L_B245
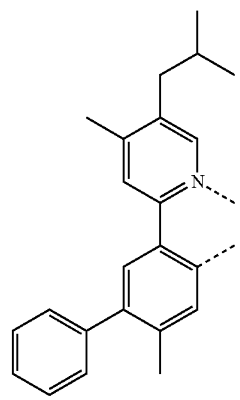
L_B246
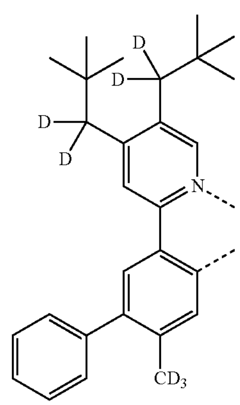

-continued
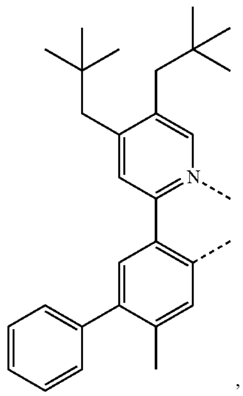
$L_{B247}$
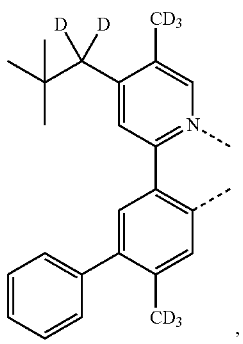
$L_{B248}$
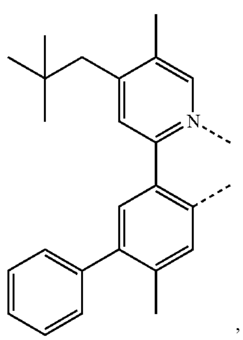
$L_{B249}$
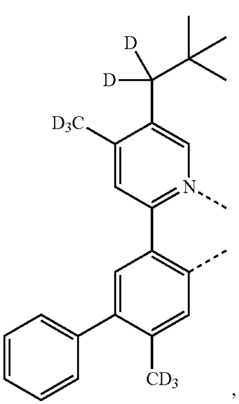
$L_{B250}$
-continued
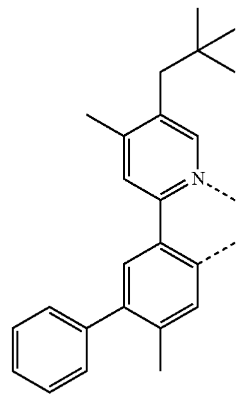
$L_{B251}$
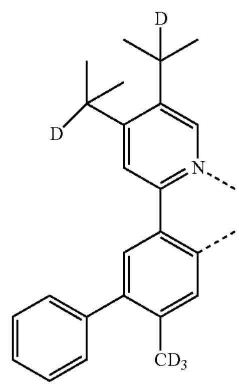
$L_{B252}$
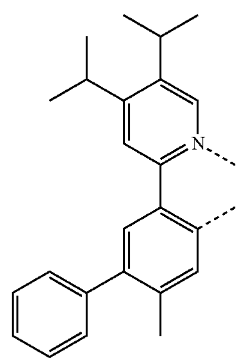
$L_{B253}$
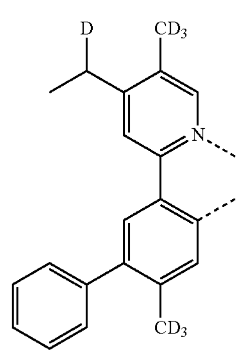
$L_{B254}$ -continued
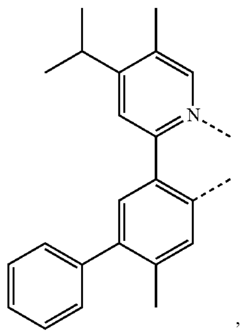
$L_{B255}$
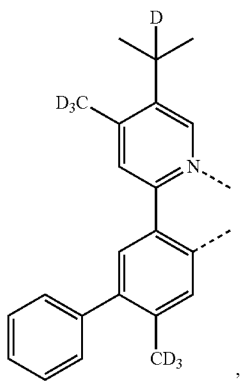
$L_{B256}$
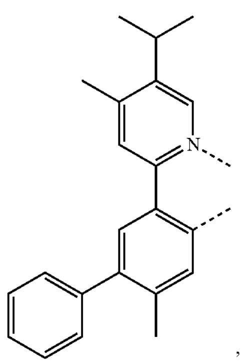
$L_{B257}$
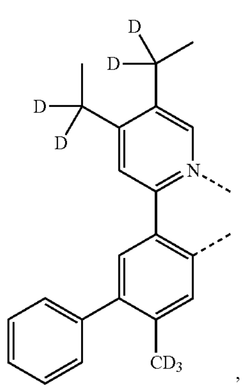
$L_{B258}$
-continued
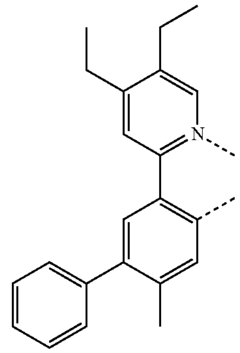
$L_{B259}$
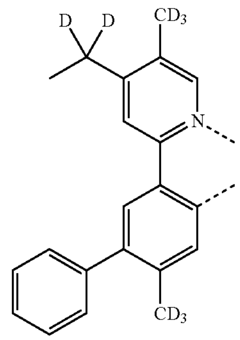
$L_{B260}$
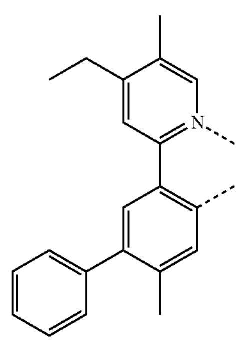
$L_{B261}$
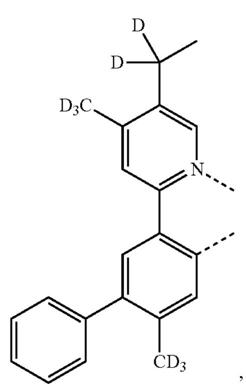
$L_{B262}$
and $L_{B263}$
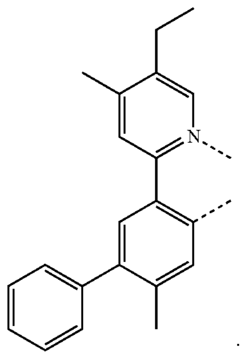
In some embodiments, $L_B$ is selected from the group consisting of:
$L_{B1}$
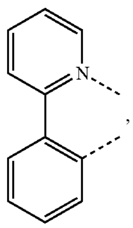
$L_{B2}$
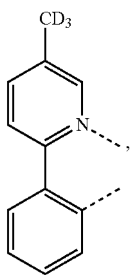
$L_{B18}$
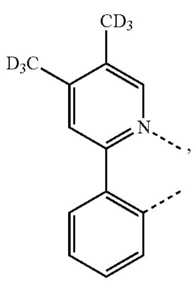
$L_{B28}$
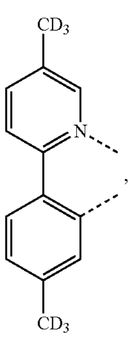
$L_{B38}$
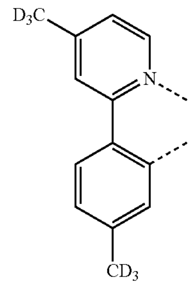
$L_{B108}$
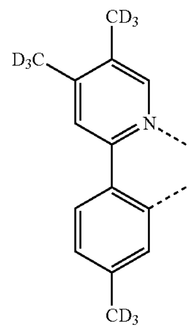
$L_{B118}$
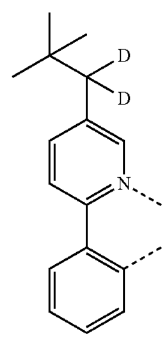
$L_{B122}$
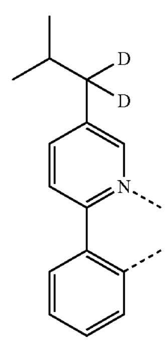

-continued
$L_{B126}$
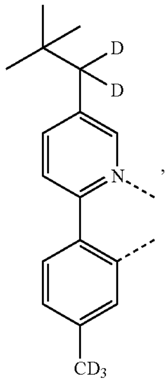
$L_{B128}$
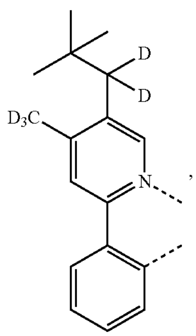
$L_{B130}$
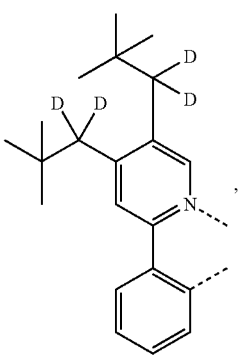
$L_{B132}$
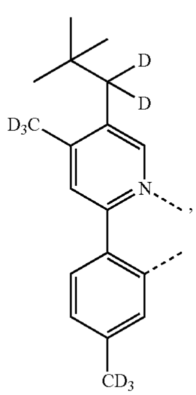
-continued
$L_{B134}$
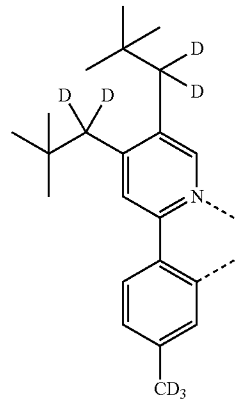
$L_{B136}$
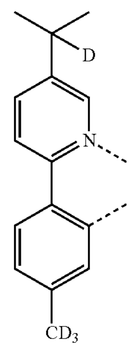
$L_{B138}$
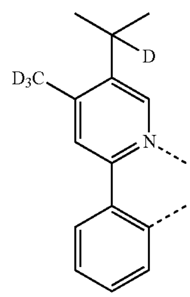
$L_{B140}$
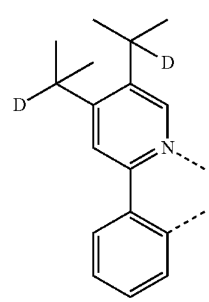

$L_{B142}$
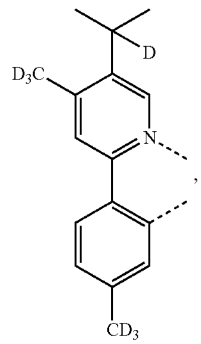
$L_{B144}$
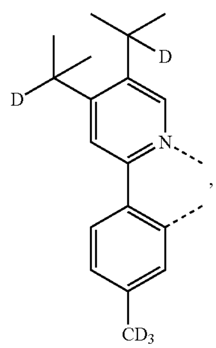
$L_{B156}$
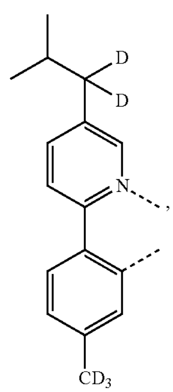
$L_{B158}$
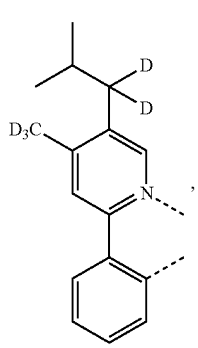
$L_{B160}$
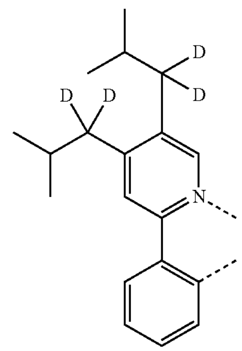
$L_{B162}$
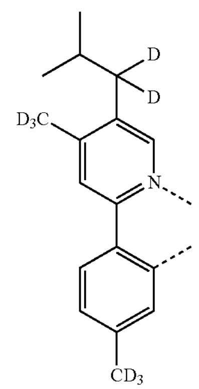
$L_{B204}$
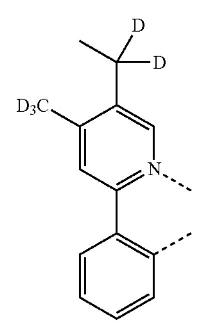
$L_{B206}$
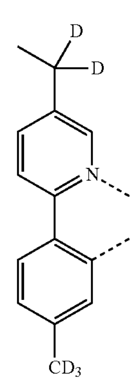

-continued
$L_{B214}$
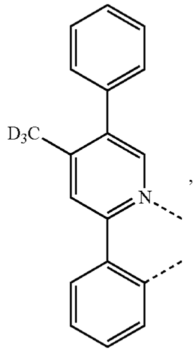
$L_{B216}$
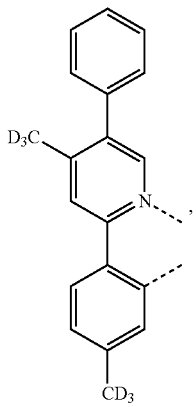
$L_{B218}$
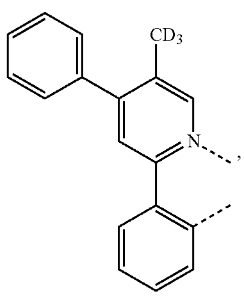
$L_{B220}$
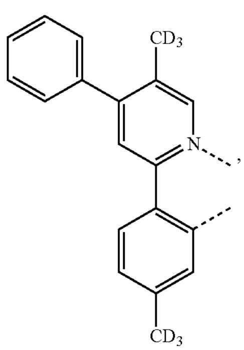
-continued
$L_{B222}$
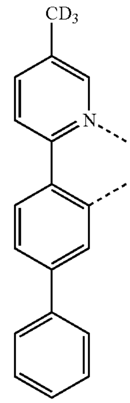
$L_{B231}$
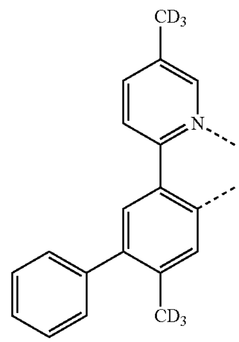
$L_{B233}$
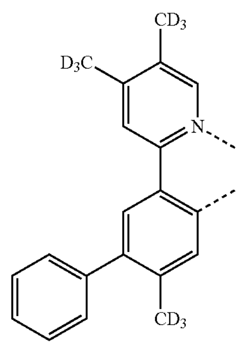
$L_{B235}$
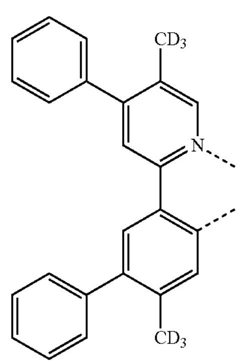

$L_{B237}$
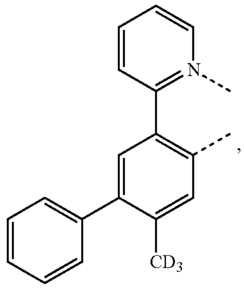
$L_{B240}$
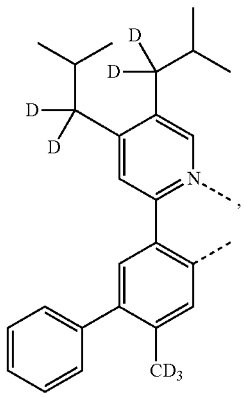
$L_{B242}$
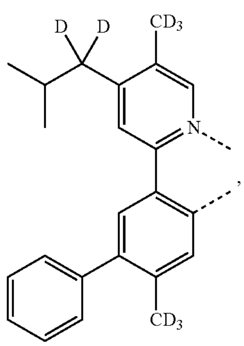
$L_{B244}$
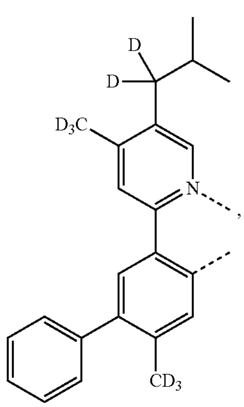
$L_{B246}$
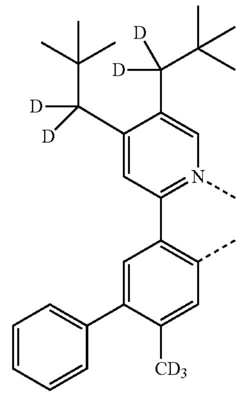
$L_{B248}$
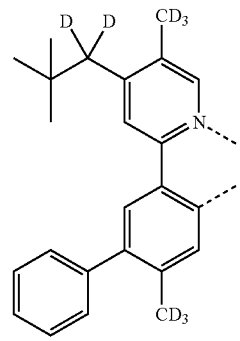
$L_{B250}$
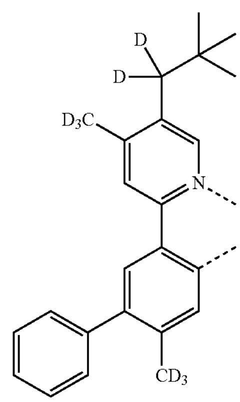
$L_{B252}$
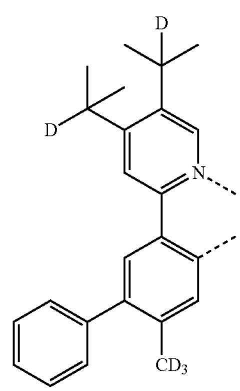

-continued
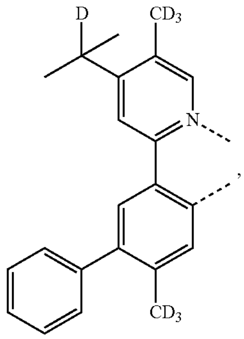
$L_{B254}$
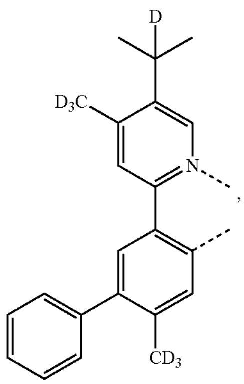
$L_{B256}$
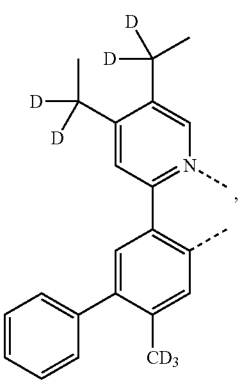
$L_{B258}$
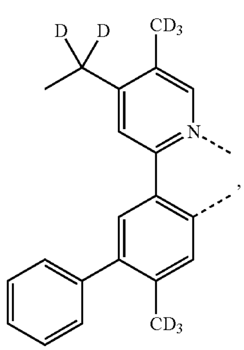
$L_{B260}$
-continued
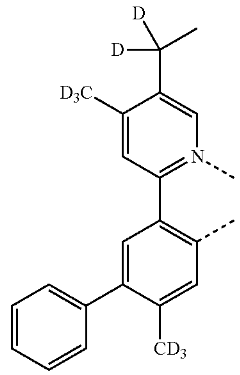
$L_{B262}$
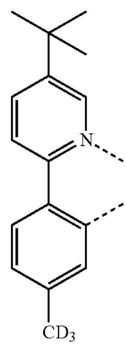
$L_{B164}$
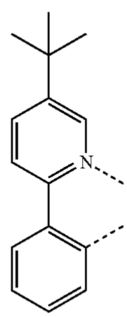
$L_{B124}$
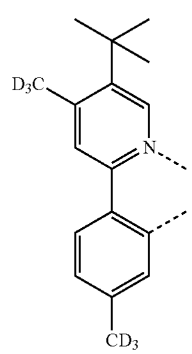
$L_{B168}$ -continued
$L_{B172}$
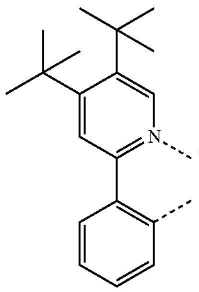
, and
$L_{B175}$
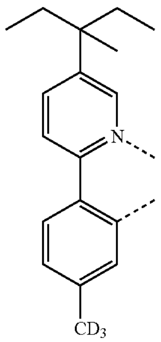
.
In some embodiments, $L_B$ is selected from the group consisting of:
$L_{B1}$
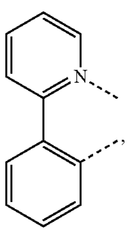
,
$L_{B2}$
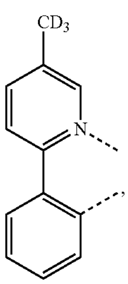
,
$L_{B18}$
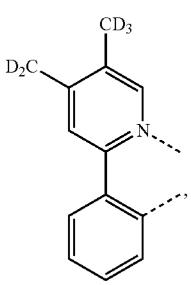
,
-continued
$L_{B28}$
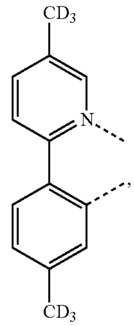
,
$L_{B38}$
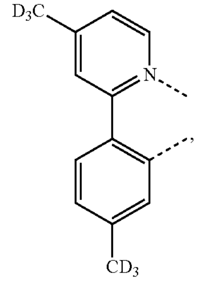
,
$L_{B108}$
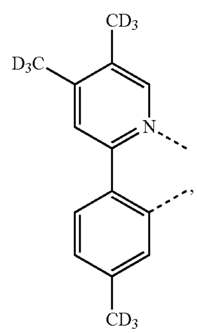
,
$L_{B118}$
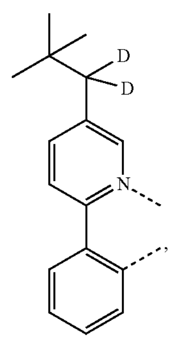
,
$L_{B122}$
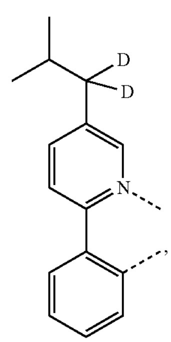
, $L_{B126}$
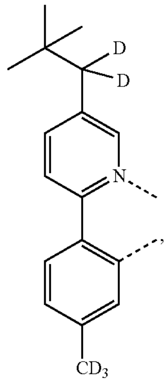
$L_{B128}$
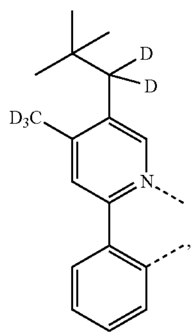
$L_{B132}$
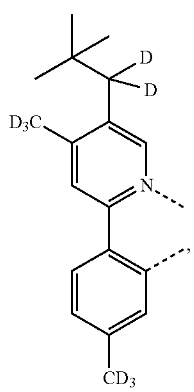
$L_{B136}$
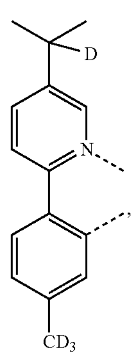
$L_{B138}$
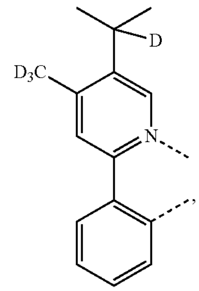
$L_{B142}$
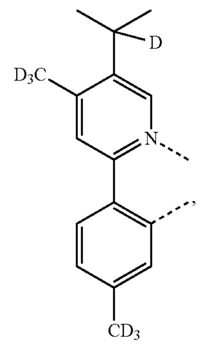
$L_{B156}$
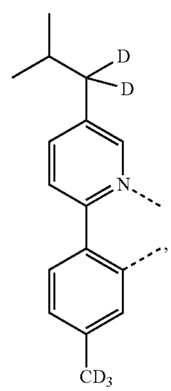
$L_{B162}$
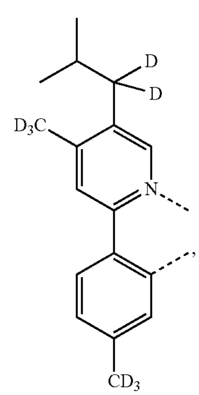

-continued
$L_{B204}$
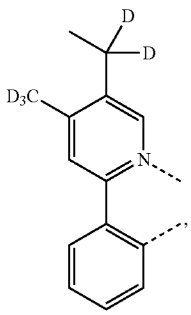
$L_{B206}$
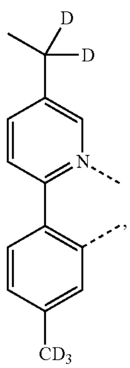
$L_{B214}$
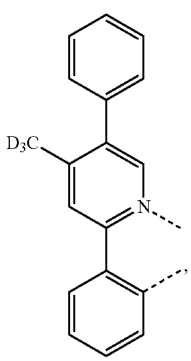
$L_{B216}$
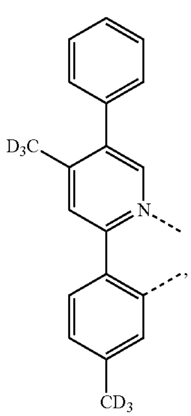
-continued
$L_{B218}$
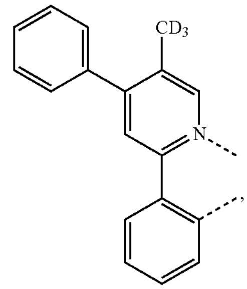
$L_{B220}$
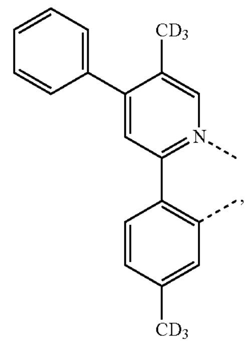
$L_{B231}$
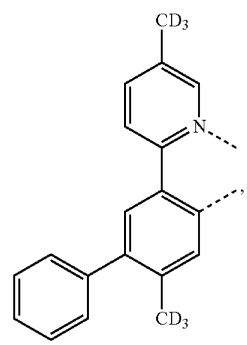
$L_{B233}$
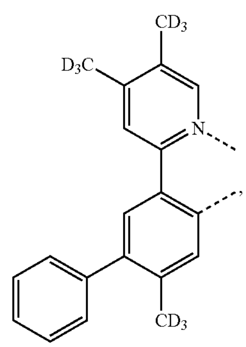
and
$L_{B237}$
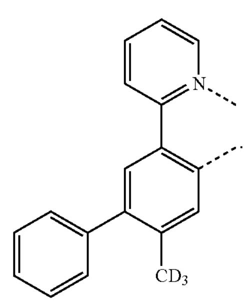

In some embodiments, the compound is selected from the group consisting of:
-continued
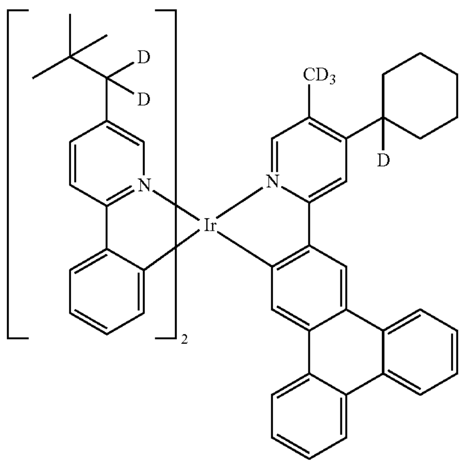
,
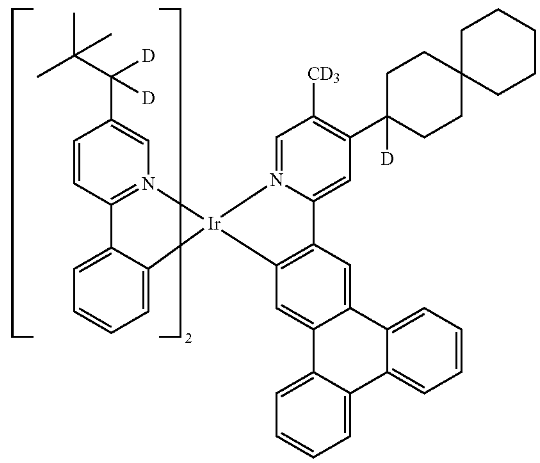
,
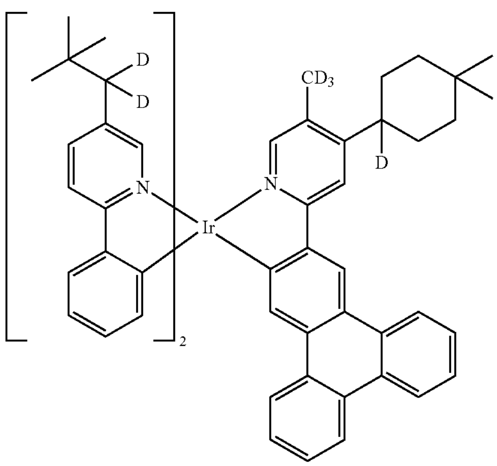
,
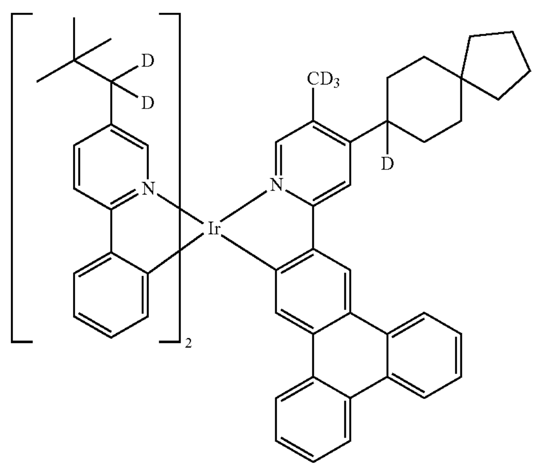
,
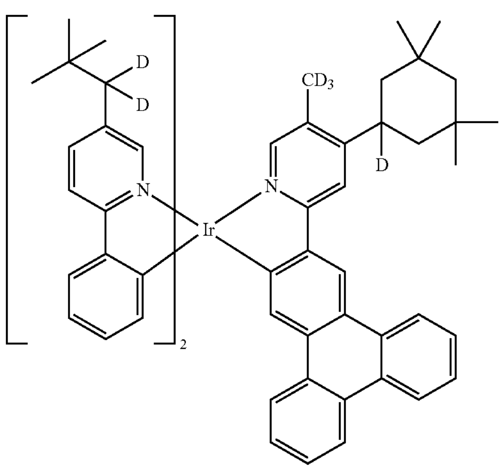
,
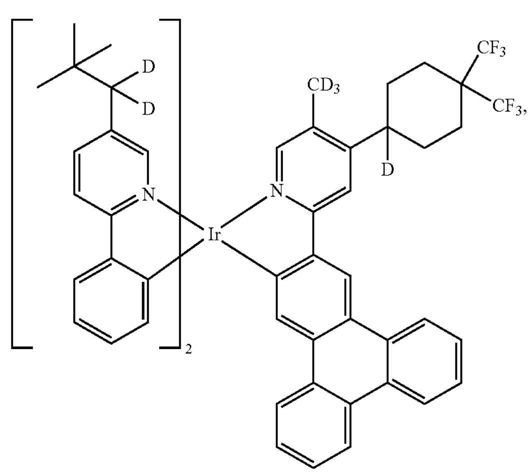

-continued
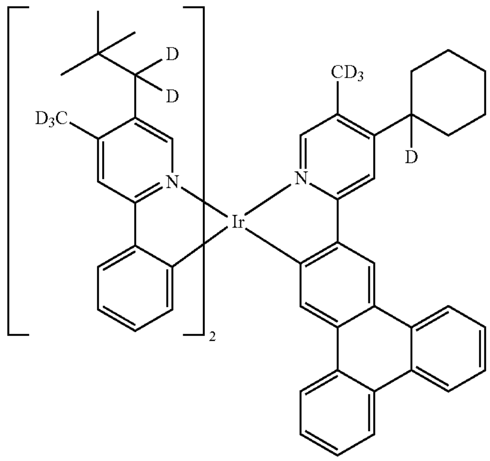
,
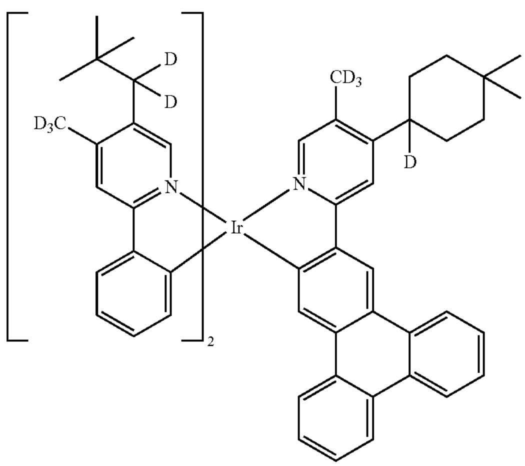
,
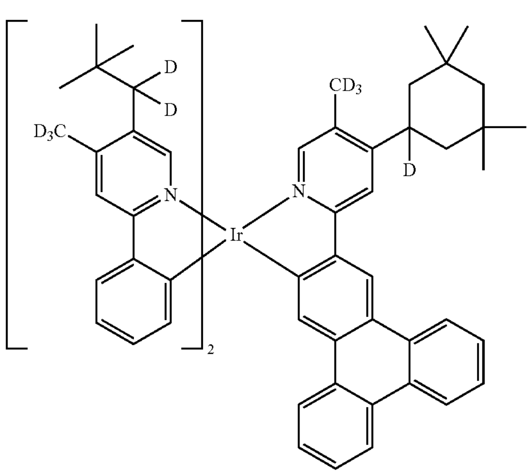
,
-continued
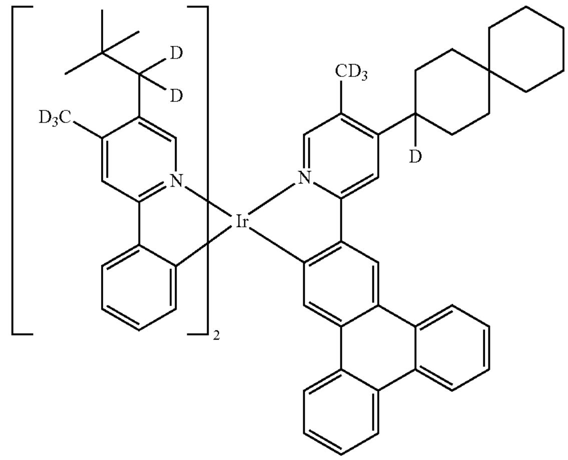
,
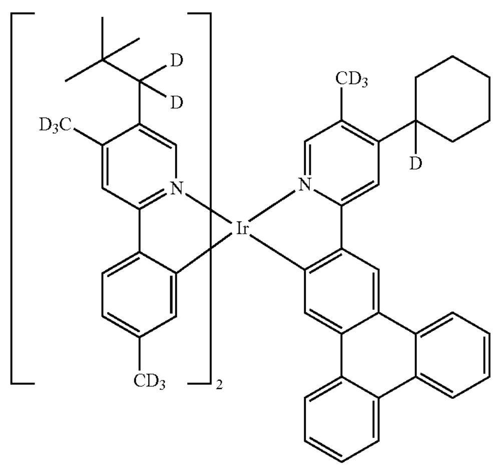
,
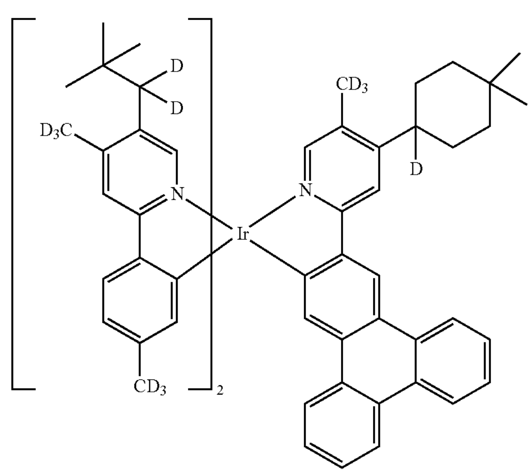
, -continued
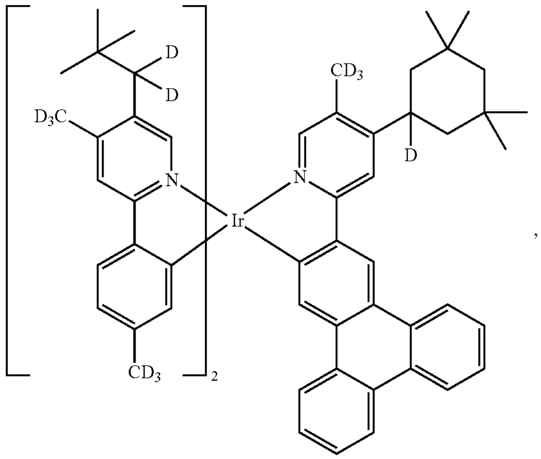
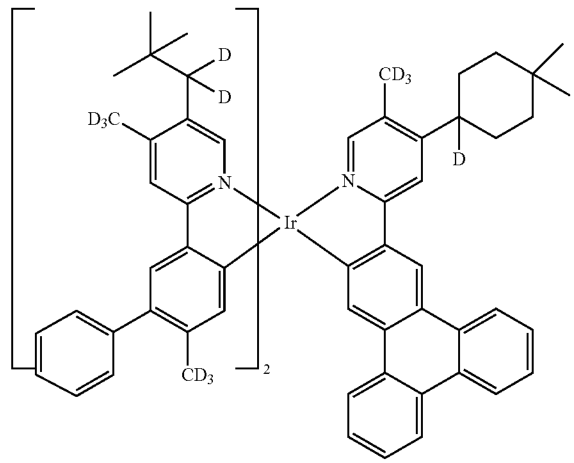
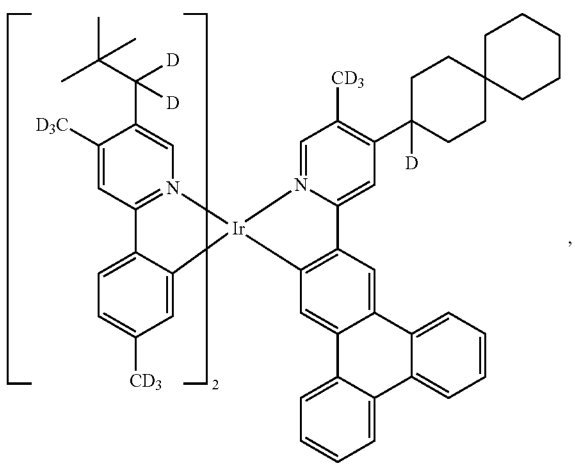
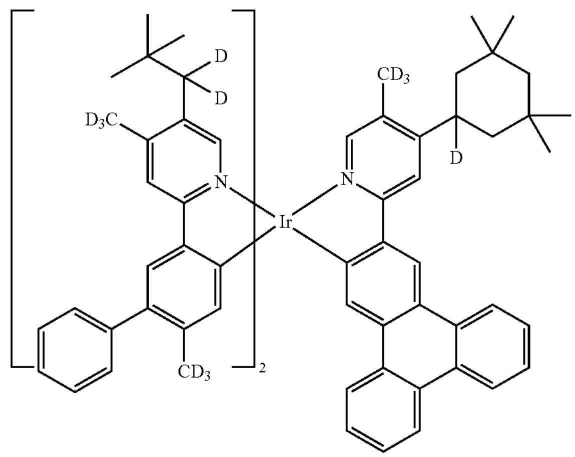
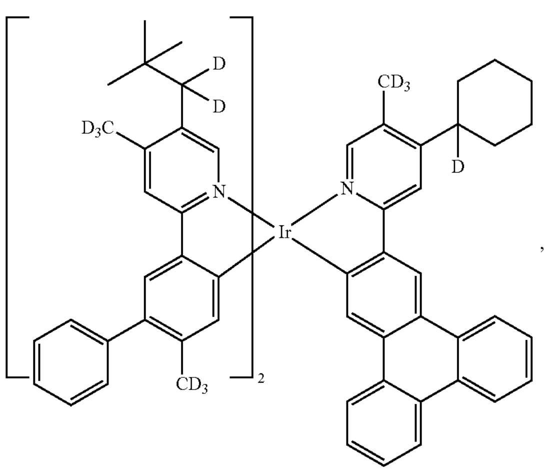
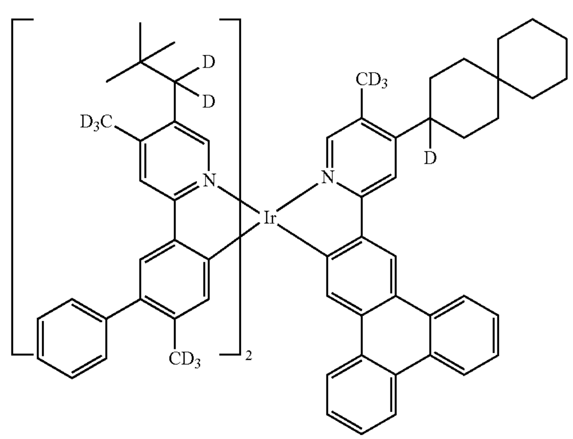

-continued
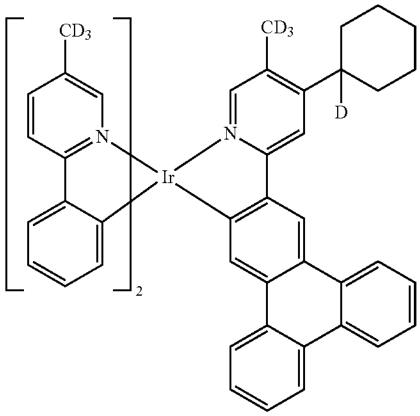
,
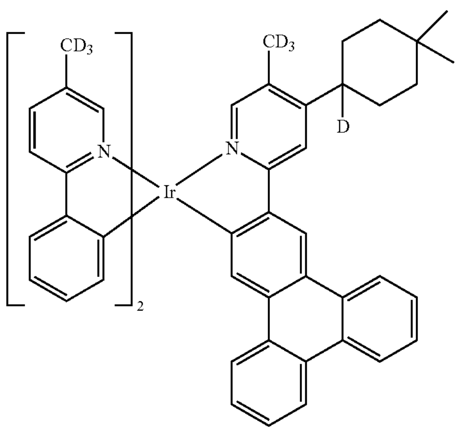
,
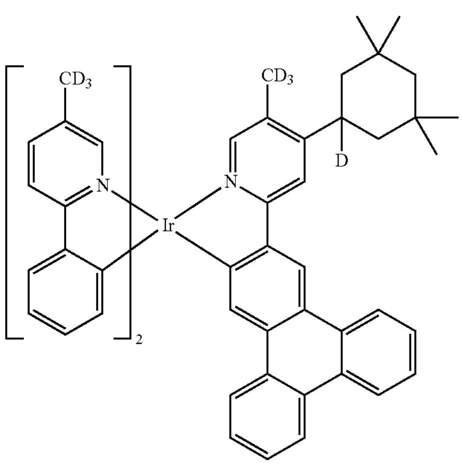
,
-continued
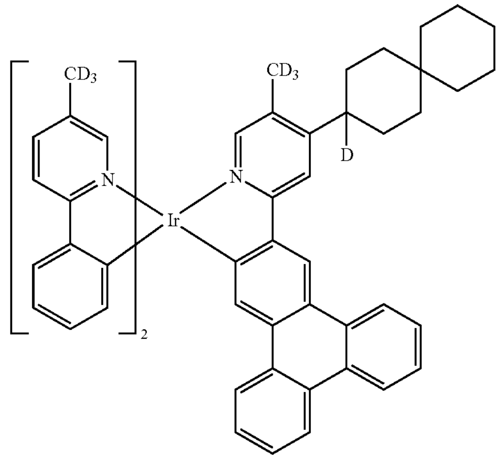
,
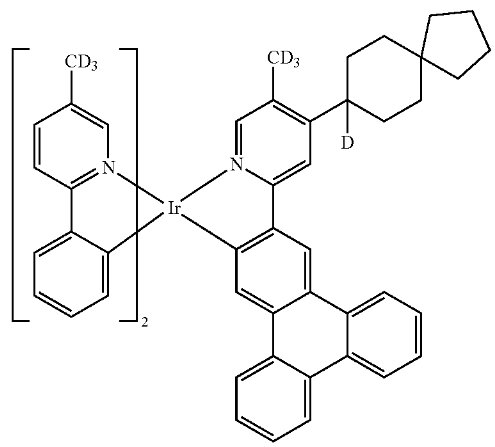
,
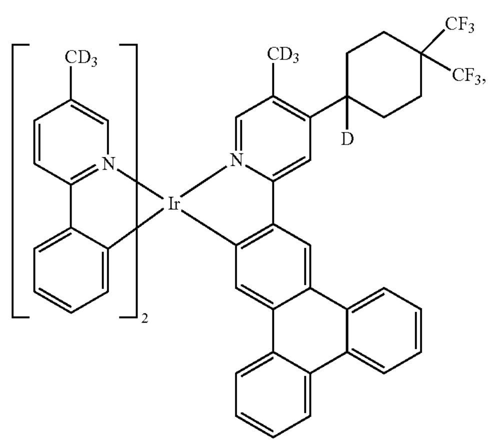

-continued
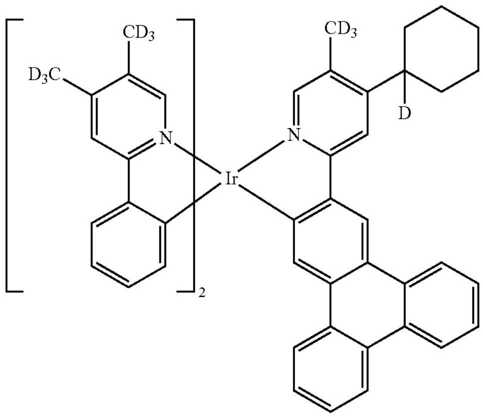
,
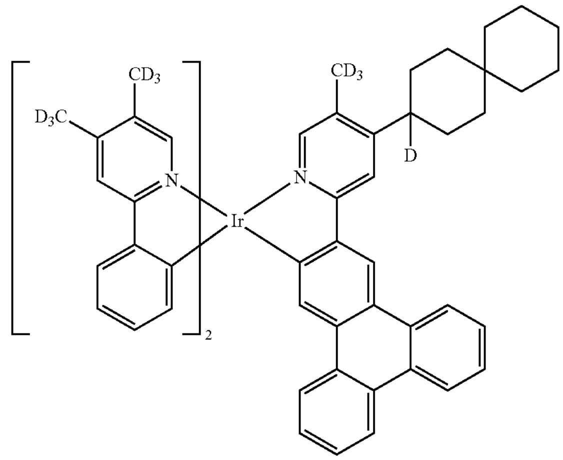
,
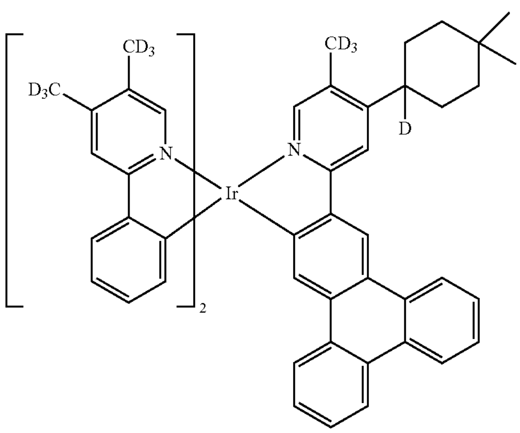
,
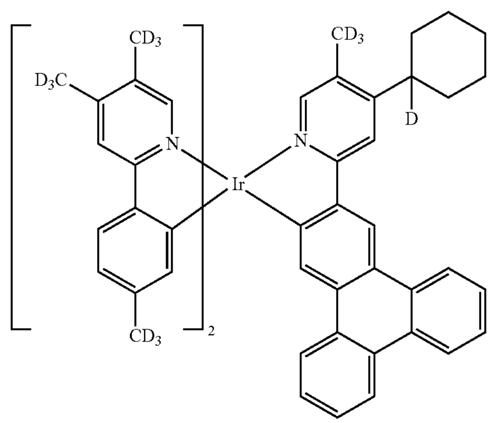
,
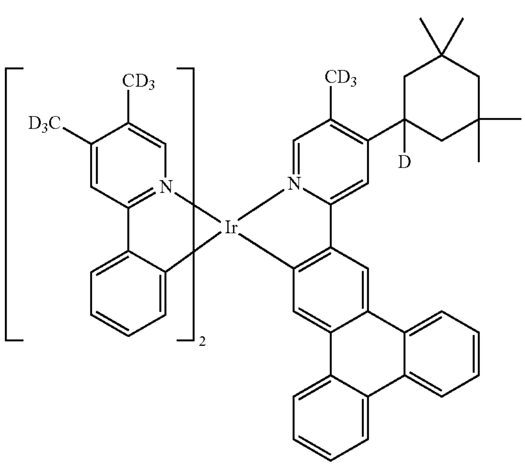
,
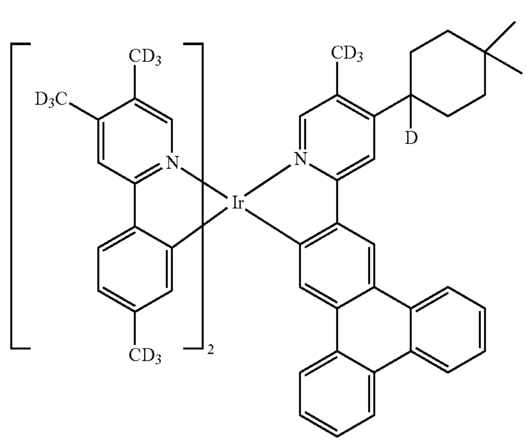
, -continued
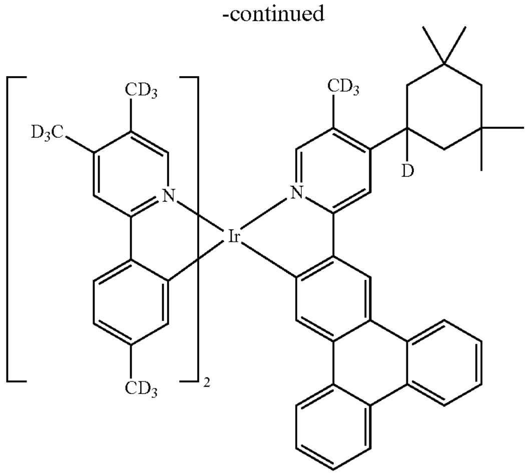
,
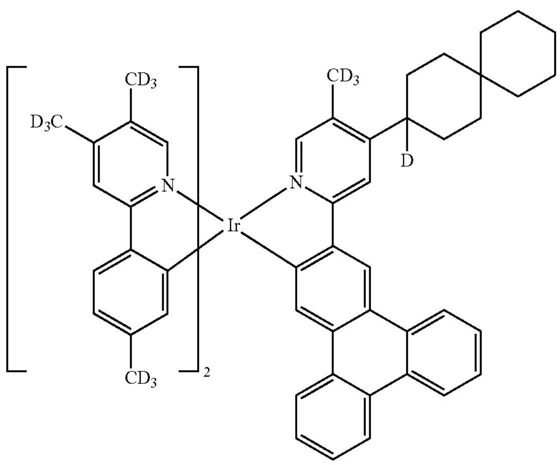
,
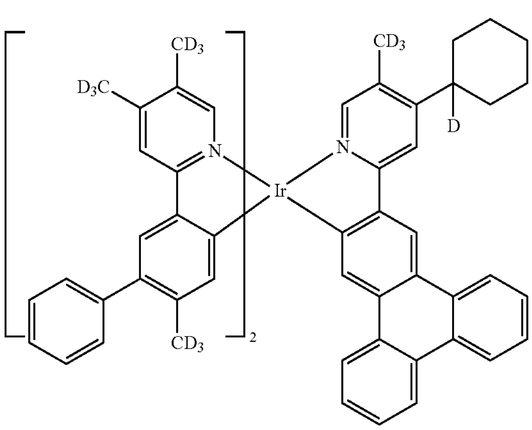
,
-continued
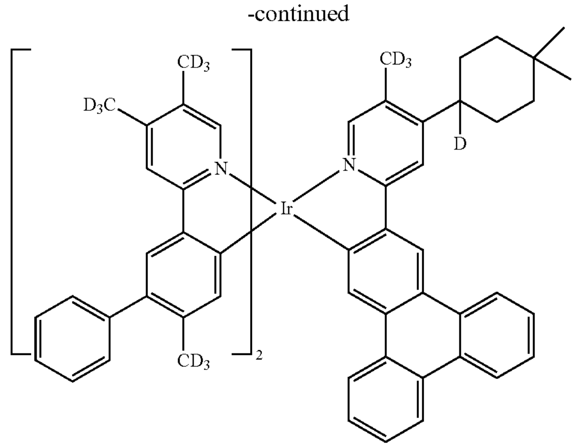
,
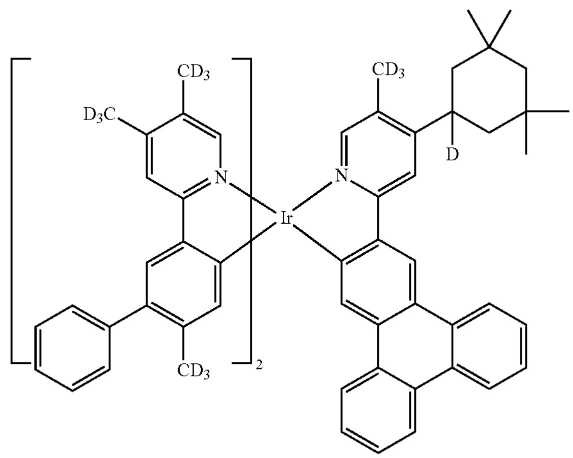
,
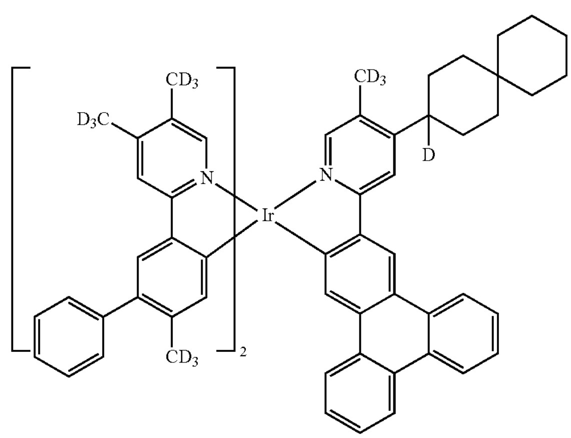
,
An organic light emitting device (OLED) incorporating the novel compound of Formula I is also disclosed. The OLED comprises: an anode; a cathode; and an organic layer, disposed between the anode and the cathode. The organic layer comprising a compound of Formula I

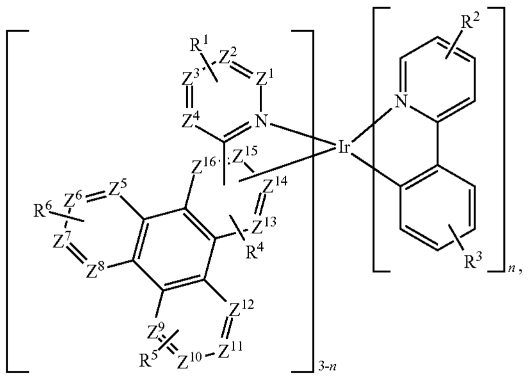

where all of the variables are as defined above.

In some embodiments of the OLED, the compound is a sensitizer and the OLED further comprises an acceptor; and where the acceptor is selected from the group consisting of fluorescent emitter, delayed fluorescence emitter, and combination thereof.

A consumer product comprising the OLED incorporating the novel compound of Formula I is also disclosed. All of the variables in Formula I is as defined above.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, published on Mar. 14, 2019 as U.S. patent application publication No. 2019/0081248, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others).

When there are more than one ligand coordinated to a metal, the ligands can all be the same in some embodiments. In some other embodiments, at least one ligand is different from the other ligand(s). In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

In some embodiments, the compound of the present disclosure is neutrally charged.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n+}{-}Ar_1$, or the host has no substitutions. In the preceding substituents n can range from 1 to 10; and $A_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the Host Group consisting of:

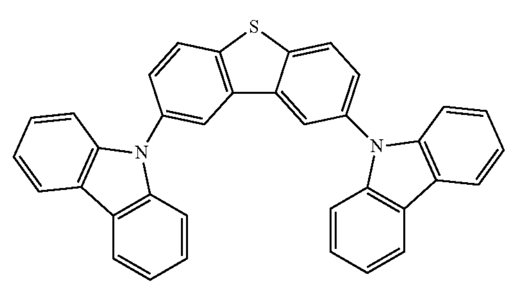

-continued
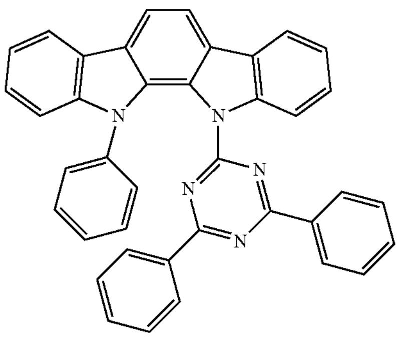
,
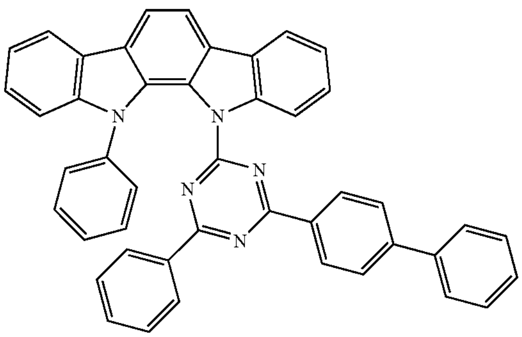
,
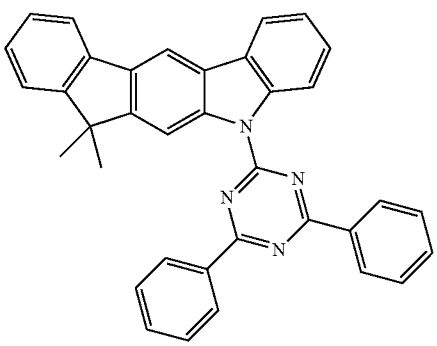
,
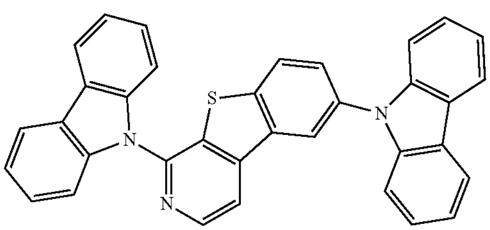
,
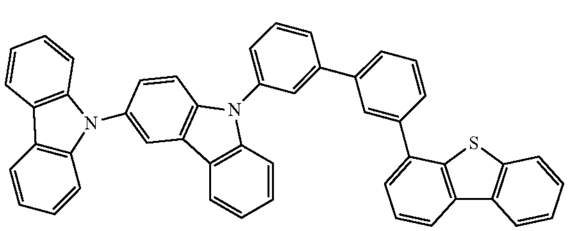
,
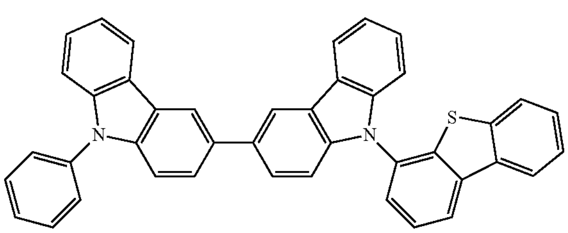
,
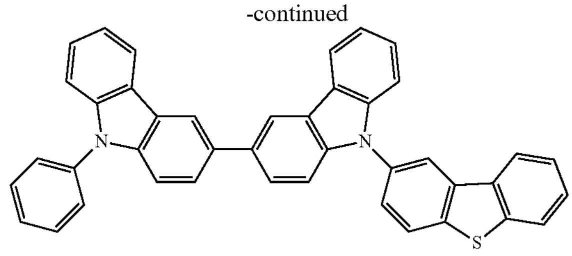
,
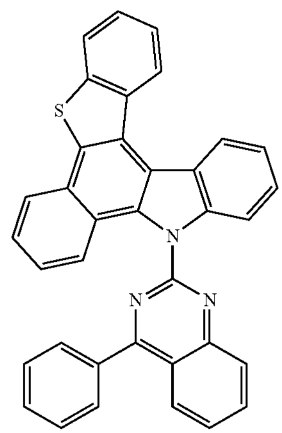
,
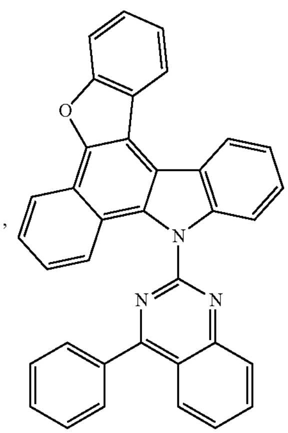
,
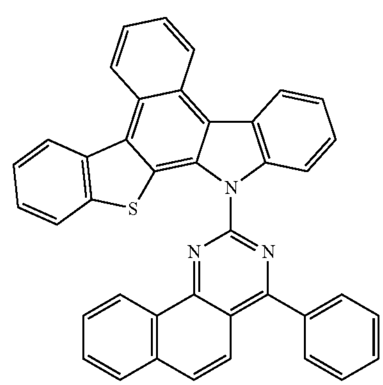
,
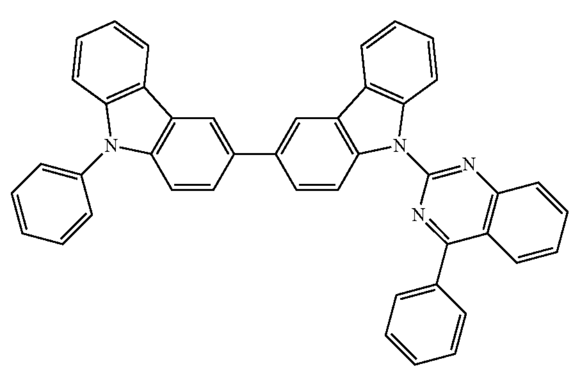
, -continued
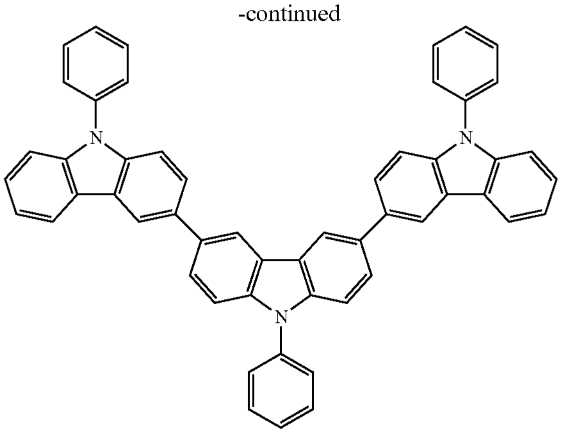
,
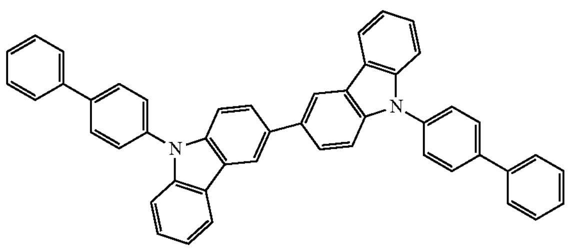
,
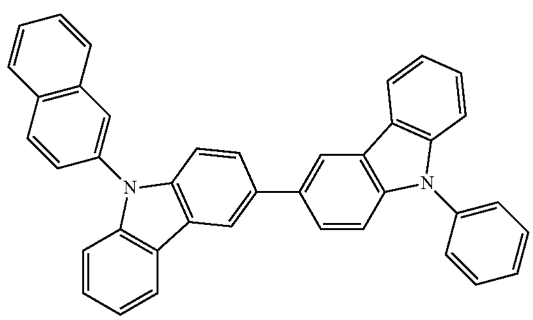
,
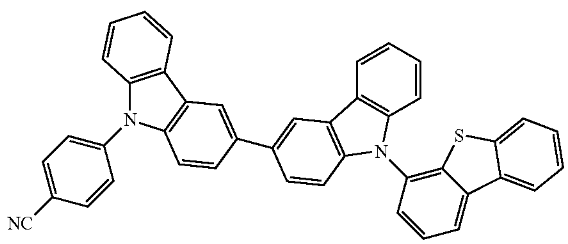
,
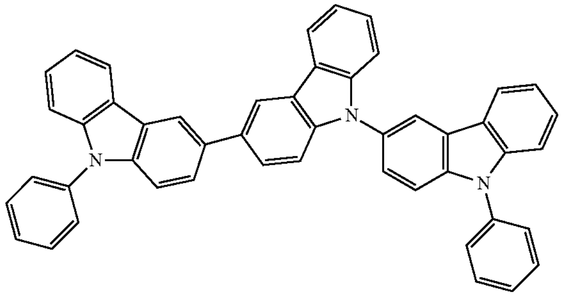
,
-continued
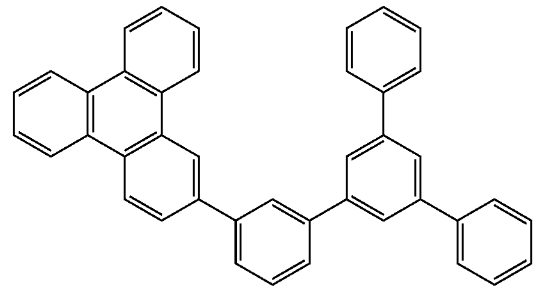
,
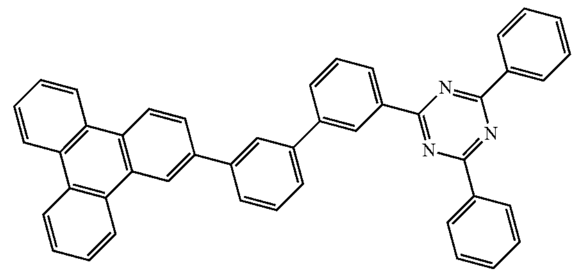
,
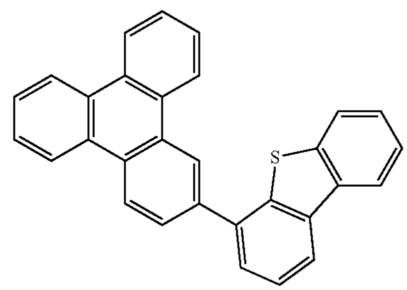
,
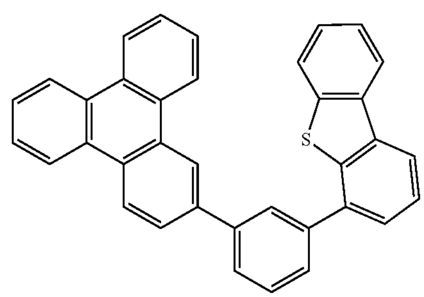
,
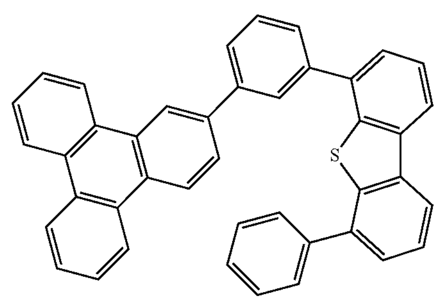
,
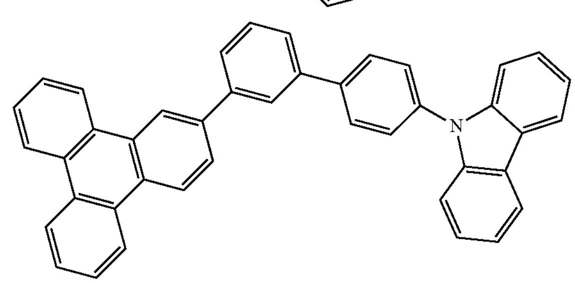
, -continued

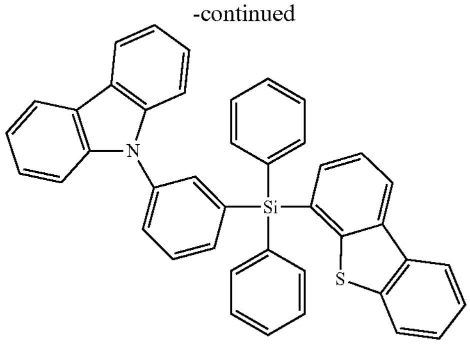

,

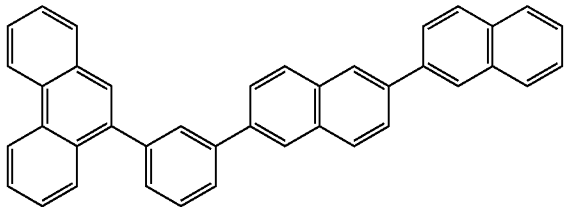

, and combinations thereof.

Additional information on possible hosts is provided below.

An emissive region in an OLED is also disclosed. The emissive region comprises a compound of Formula I

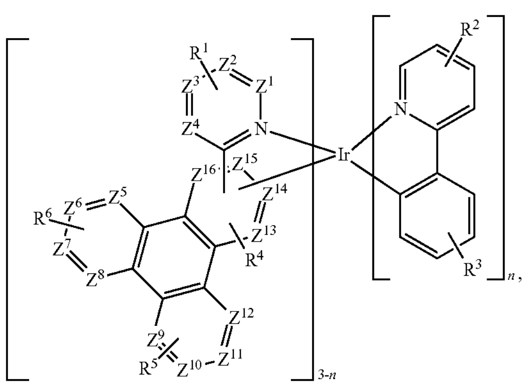

where n=0, 1, or 2; $Z^1$ to $Z^{16}$ are each independently C or N; any of $Z^{13}$ to $Z^{16}$ is C when it forms a bond with Ir, or when it forms a bond with the ring having $R^1$; any chelate ring comprising Ir is a 5-membered ring; $R^1$ to $R^6$ each independently represents mono to the maximum allowable substitution, or no substitution; each $R^1$ to $R^6$ is independently hydrogen or a substituent selected from the group consisting of the general substituents defined above; any two substituents may be joined or fused together to form a ring; and at least one of $R^1$ and $R^2$ is an alkyl or cycloalkyl group comprising five or more C atoms.

In some embodiments of the emissive region, the compound is an emissive dopant or a non-emissive dopant.

In some embodiments of the emissive region, the emissive region further comprises a host, wherein the host contains at least one group selected from the group consisting of metal complex, triphenylene, carbazole, dibenzothiophene, dibenzofuran, dibenzoselenophene, aza-tripheny lene, aza-carbazole, aza-dibenzothiophene, aza-dibenzofuran, and aza-dibenzoselenophene.

In some embodiments, the emissive region further comprises a host, wherein the host is selected from the Host Group defined above.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound is can also be incorporated into the supramolecule complex without covalent bonds.

Combination With Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

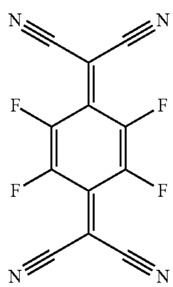
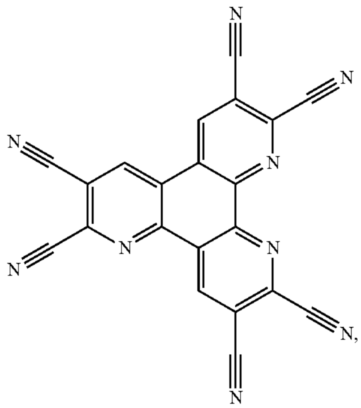
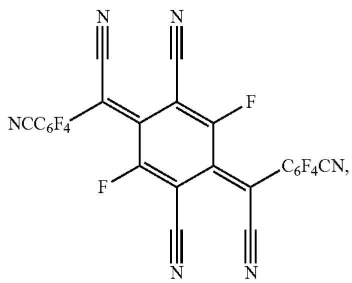
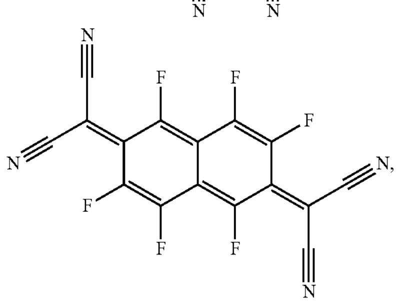
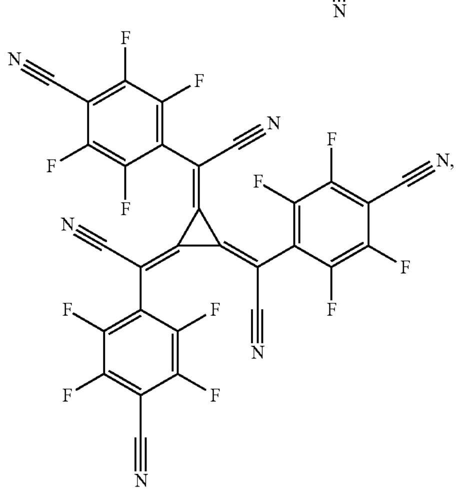
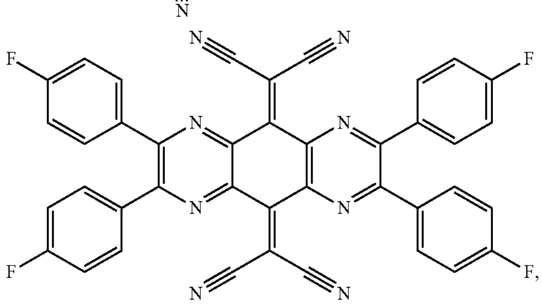
-continued
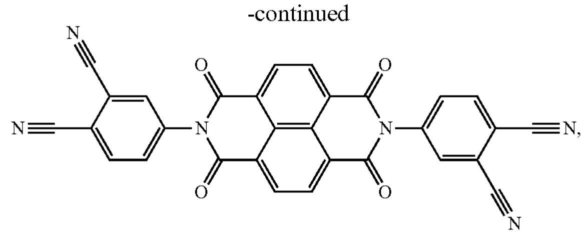
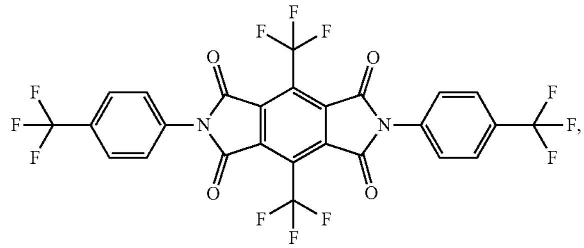
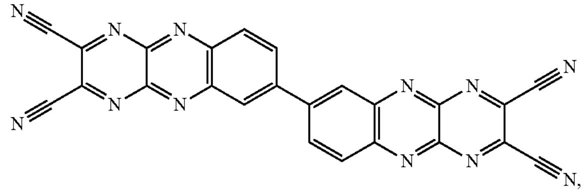
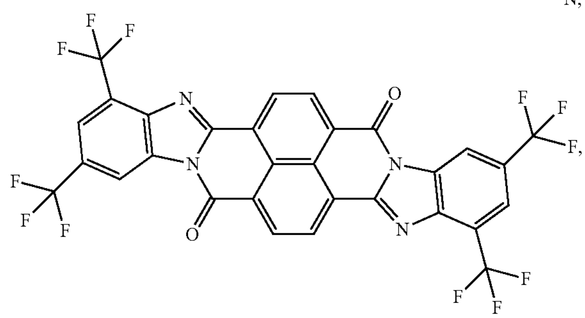
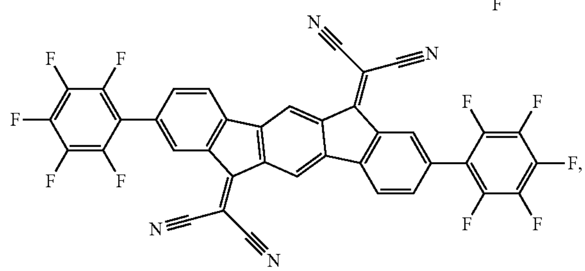
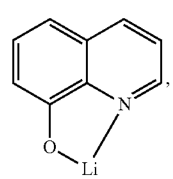
, and
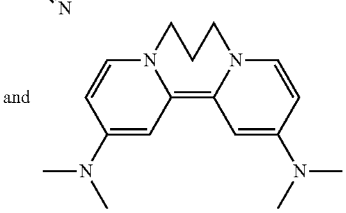
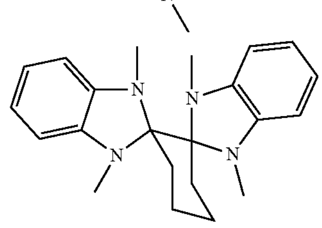
.
HIL/HTL:
A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

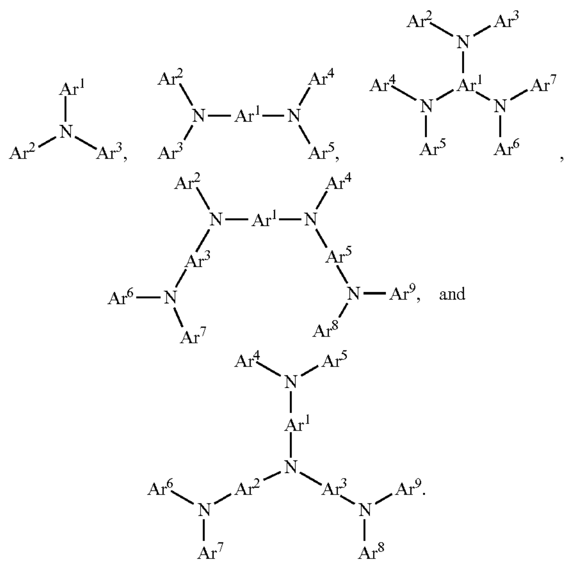

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

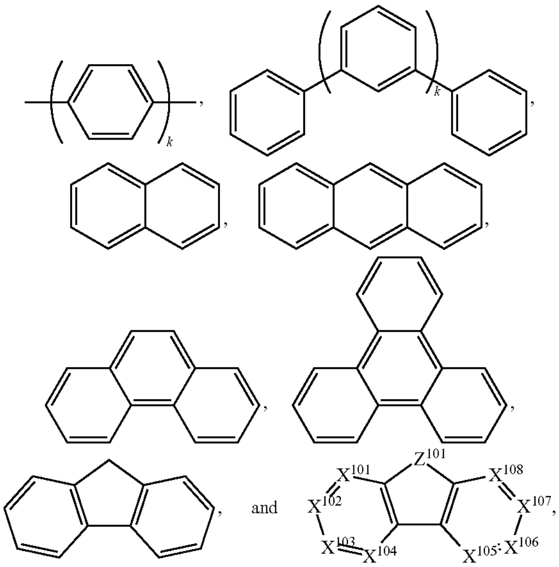

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

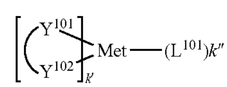

wherein Met is a metal, which can have an atomic weight greater than 40; $(Y^{101}$-$Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}$-$Y^{102})$ is a 2-phenylpyridine derivative. In another aspect, $(Y^{101}$-$Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, US06517957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, US5061569, US5639914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.
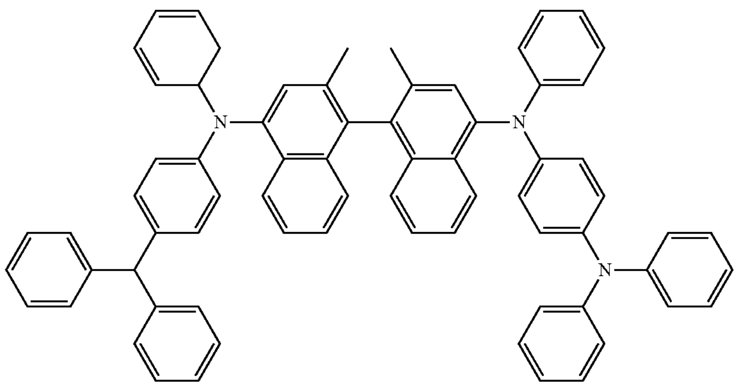
,
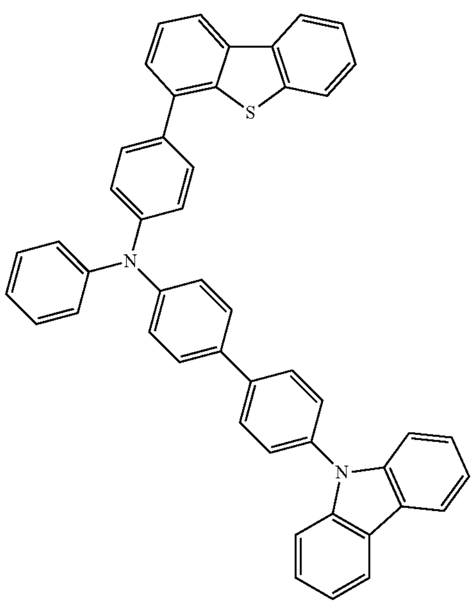
, -continued
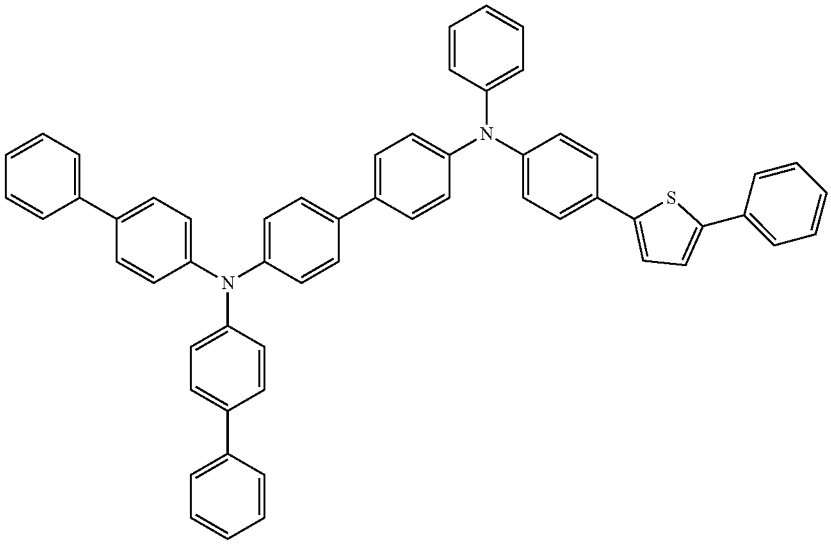
,
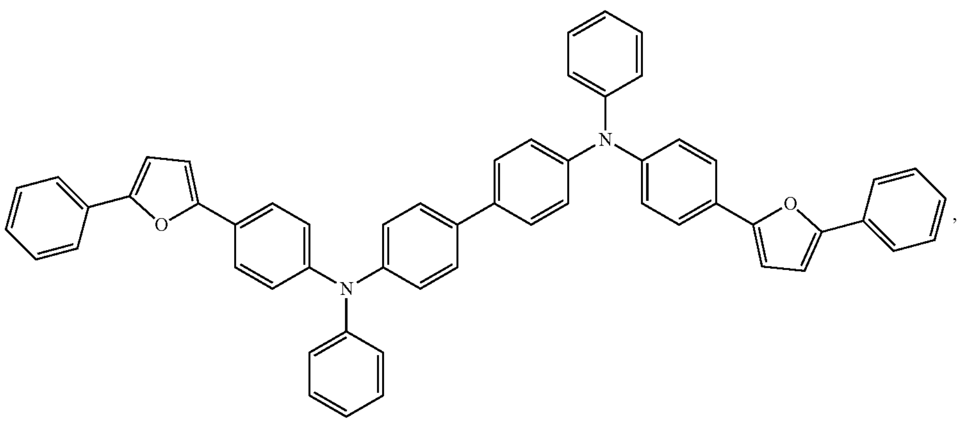
,
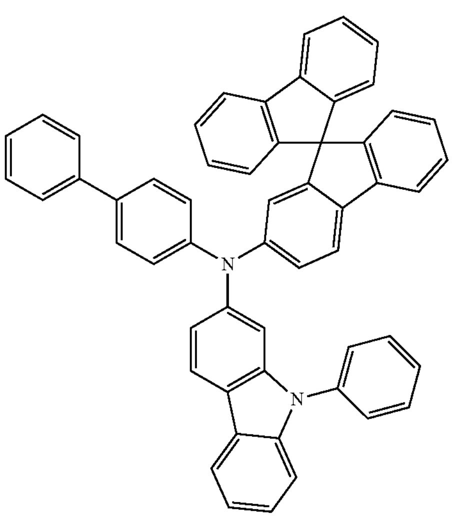
, -continued
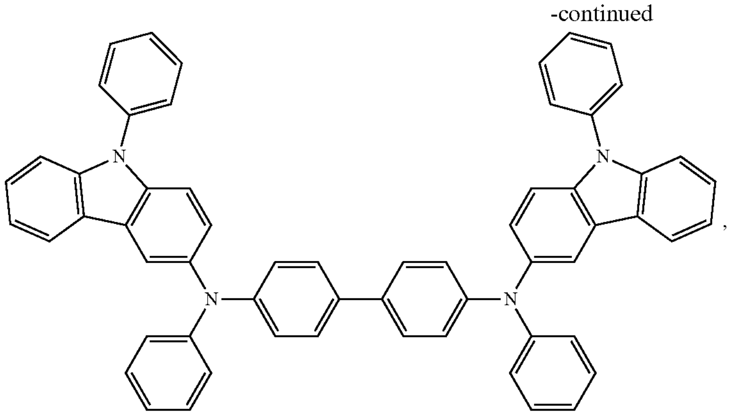
,
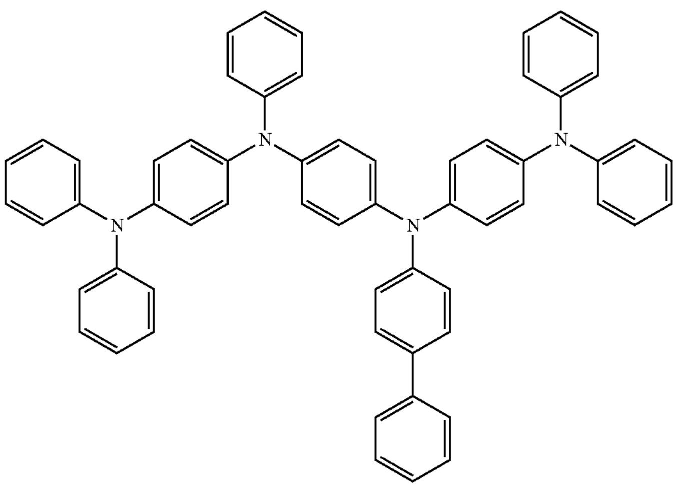
,
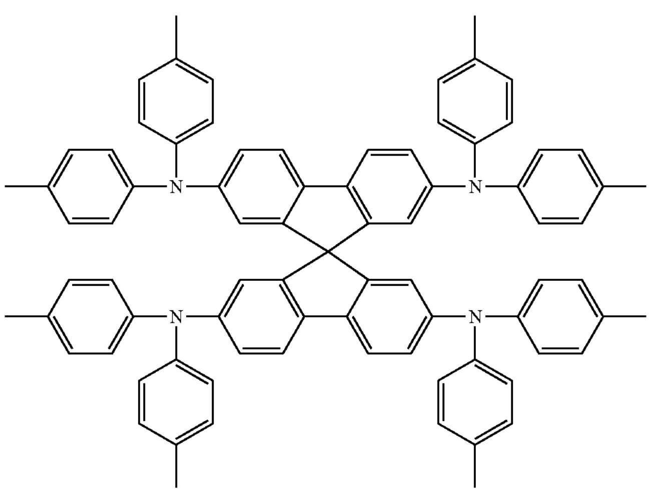
, -continued
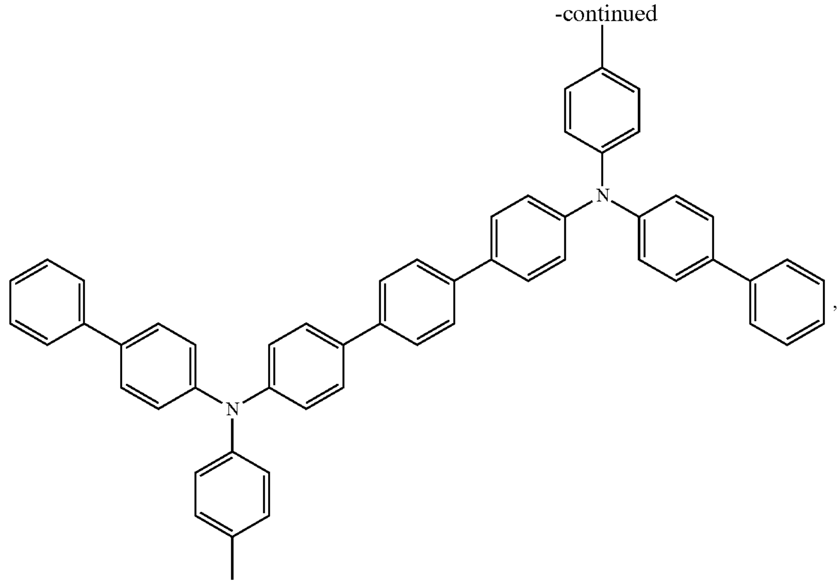
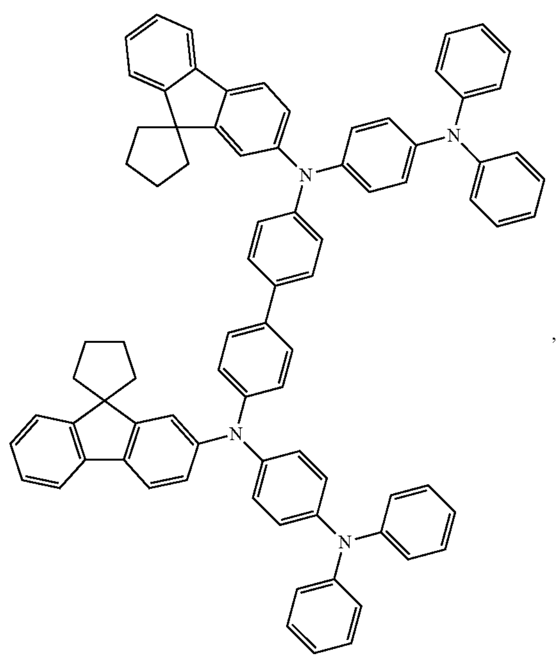
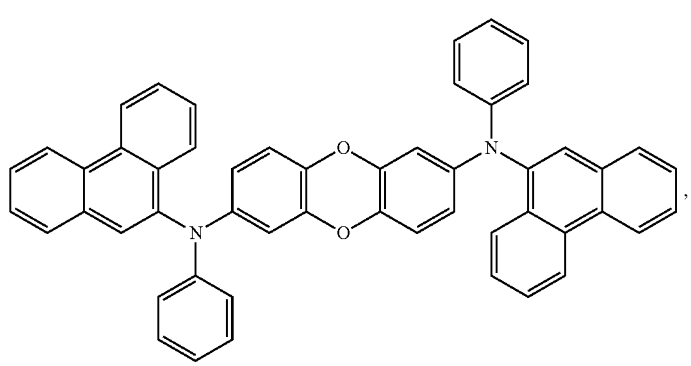

-continued
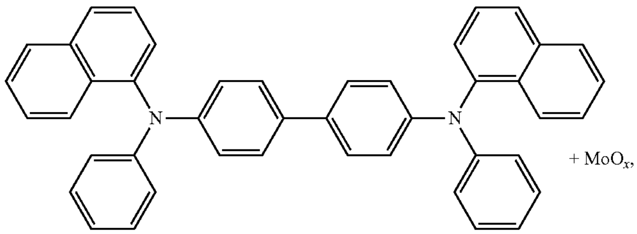
+ $MoO_x$,
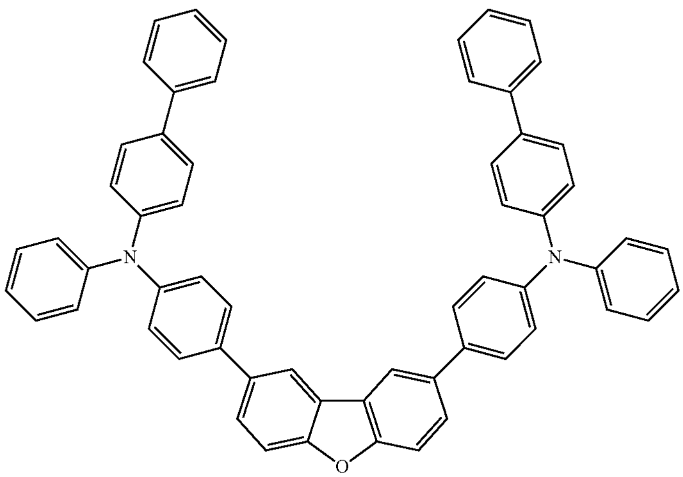
,
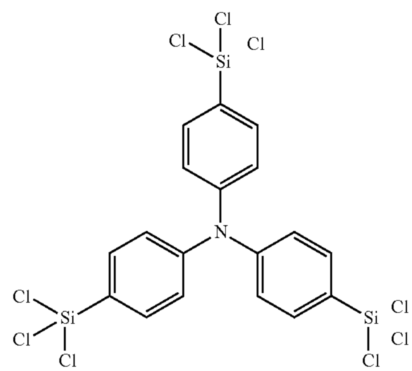
,
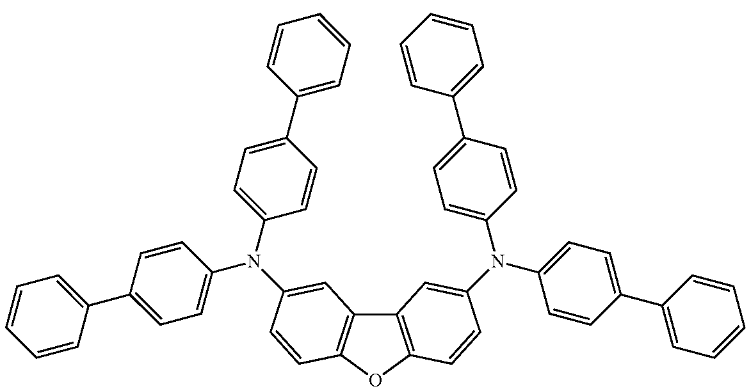
,
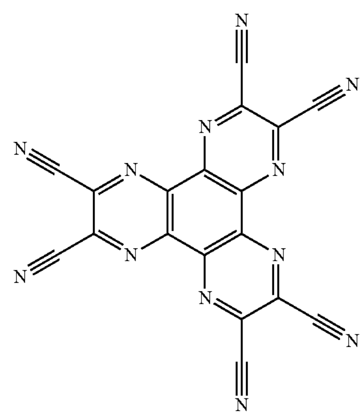
,
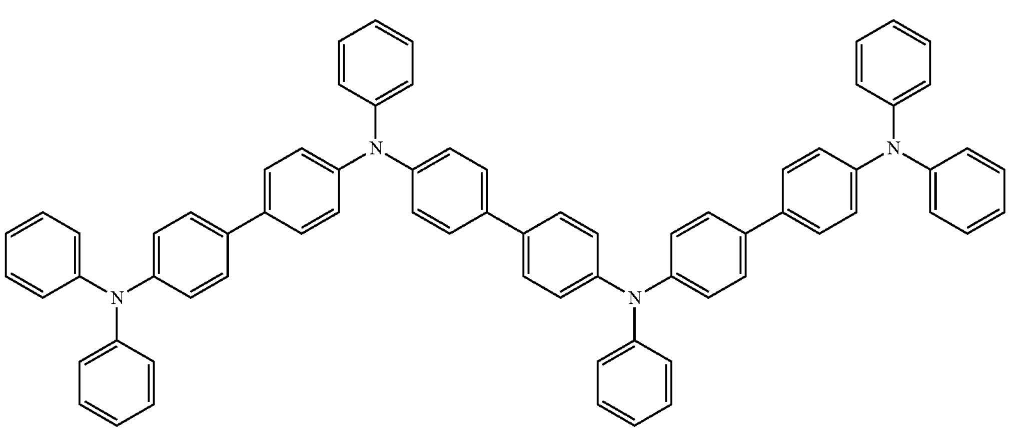
, -continued
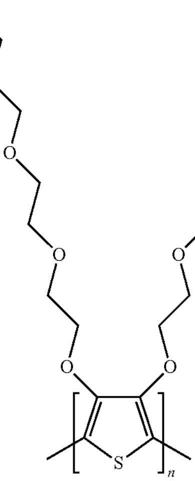
,
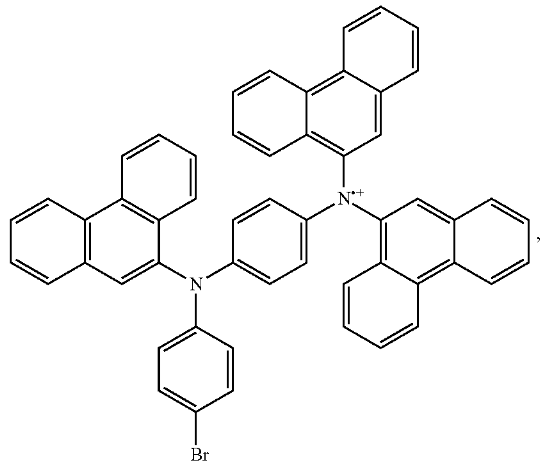
,
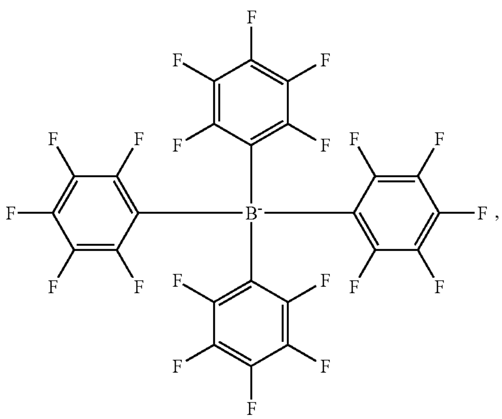
,
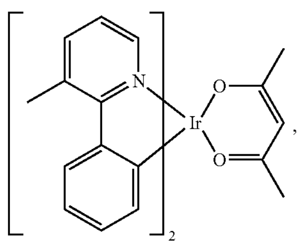
,
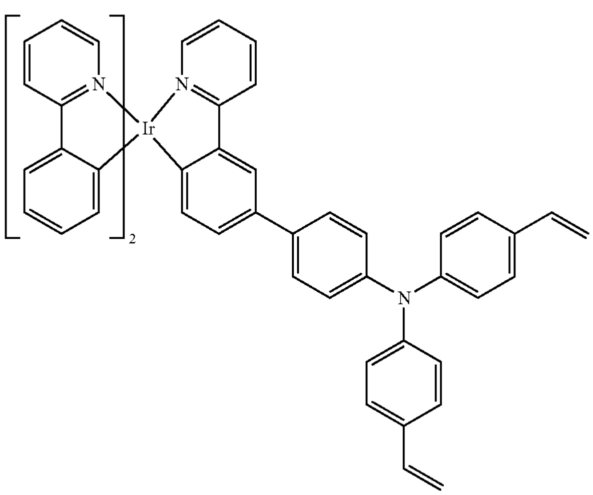
, -continued
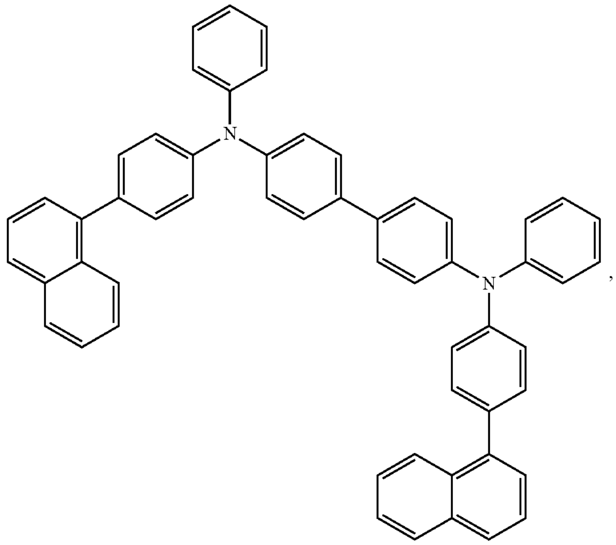
,
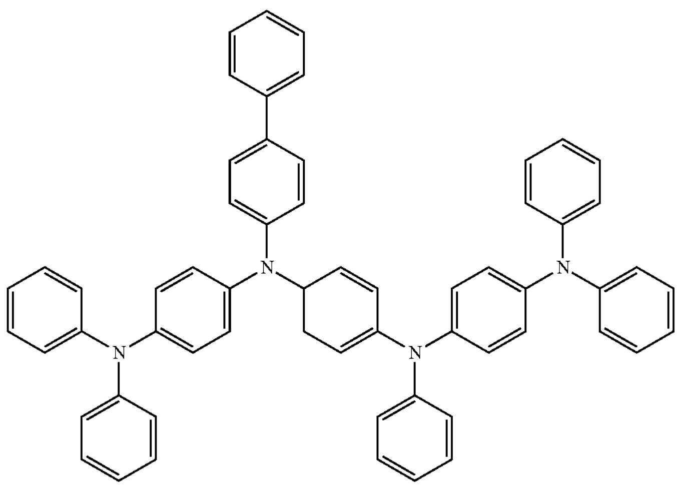
,
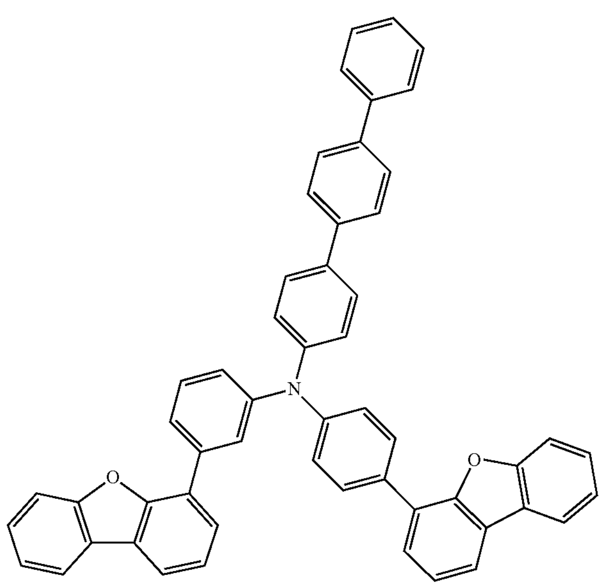
, -continued
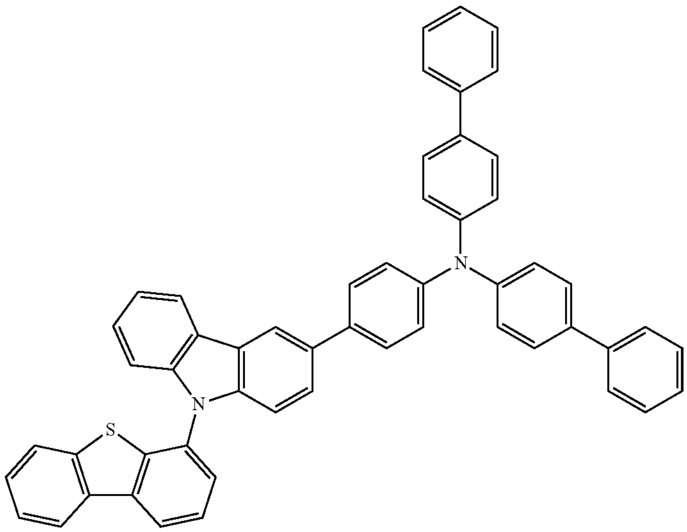
,
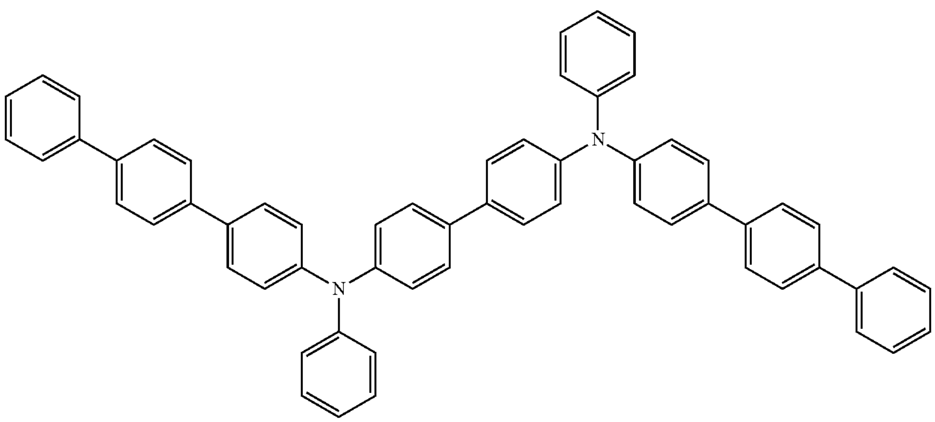
,
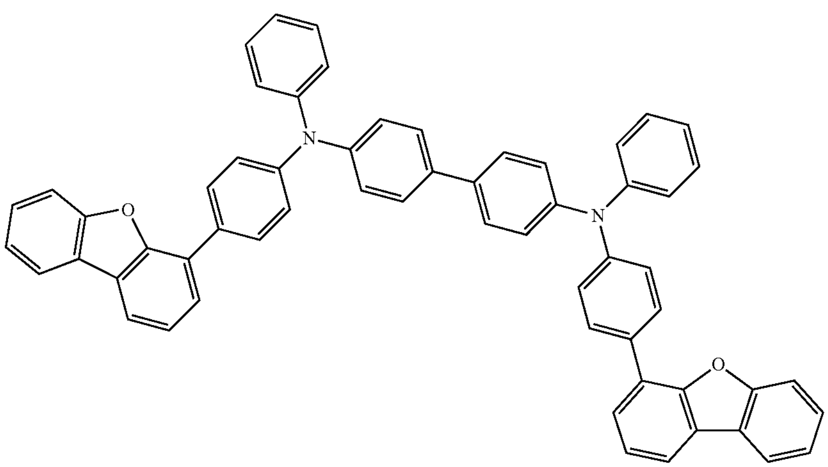
, -continued
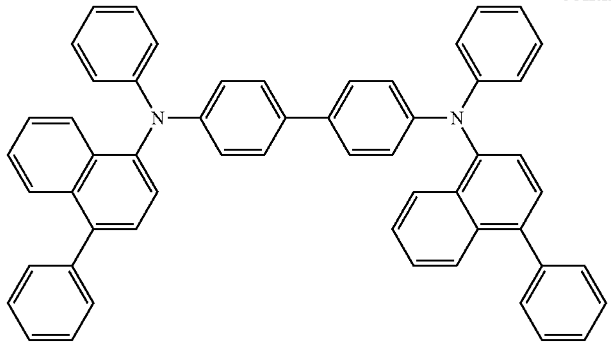
,
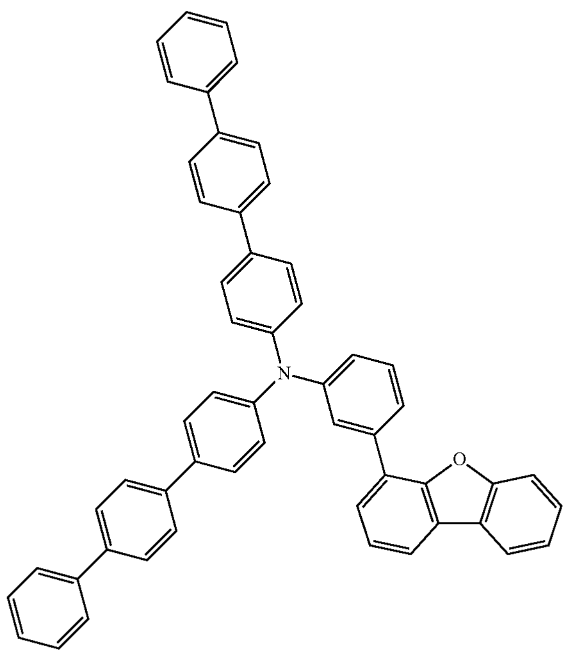
,
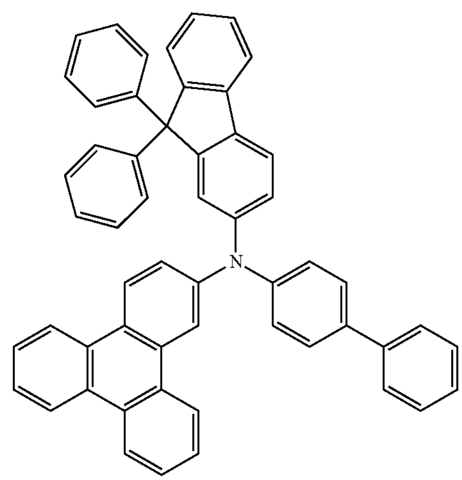
,
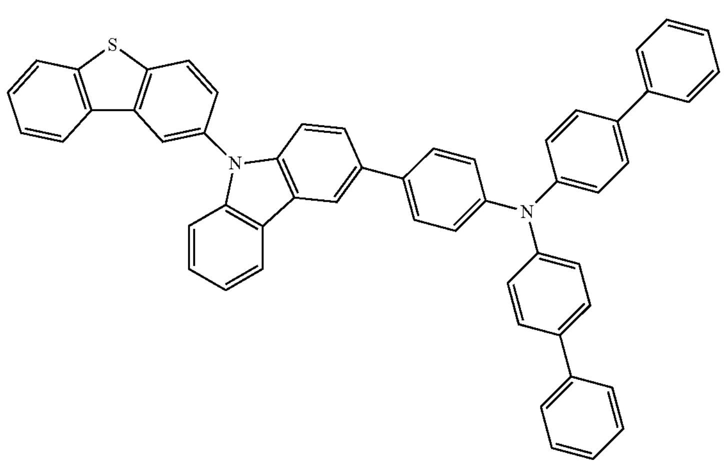
, -continued
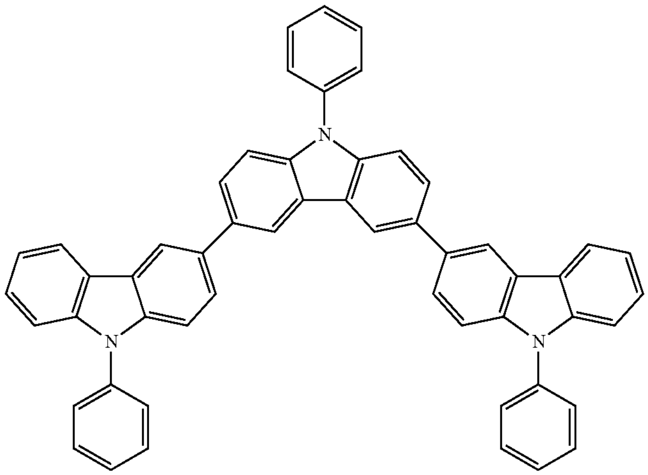
,
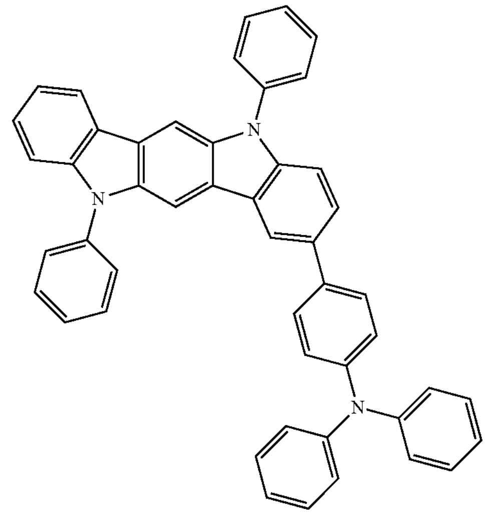
,
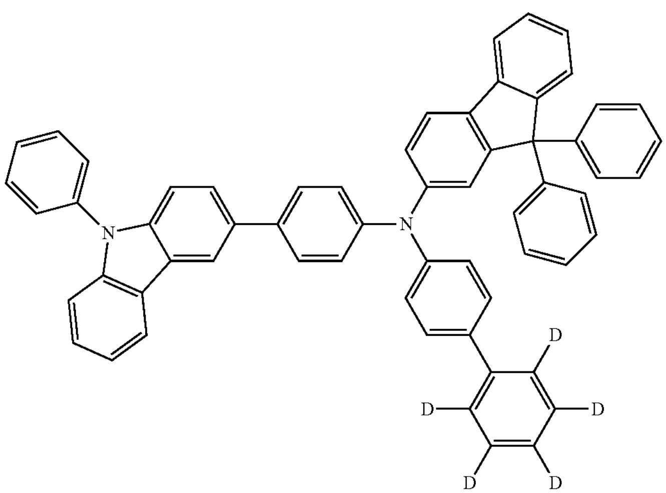
,
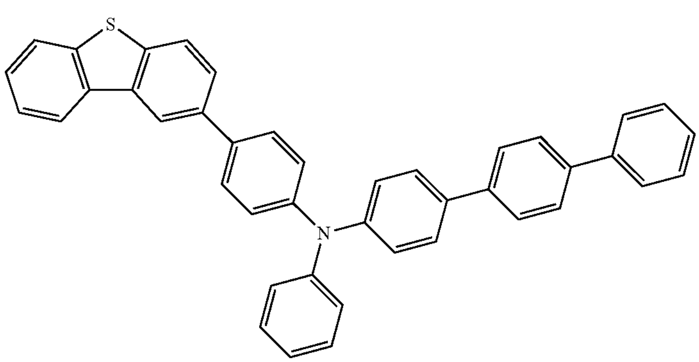
, -continued
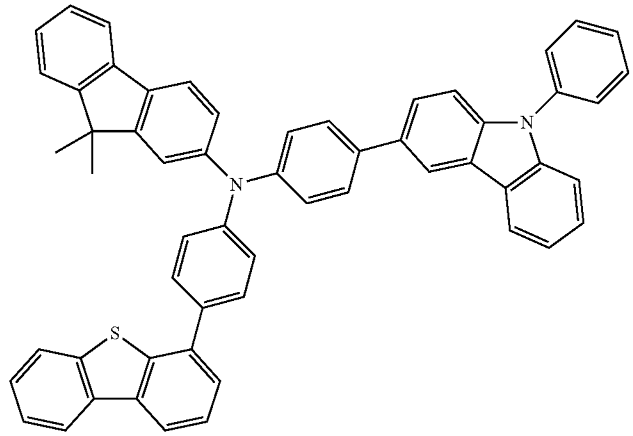
,
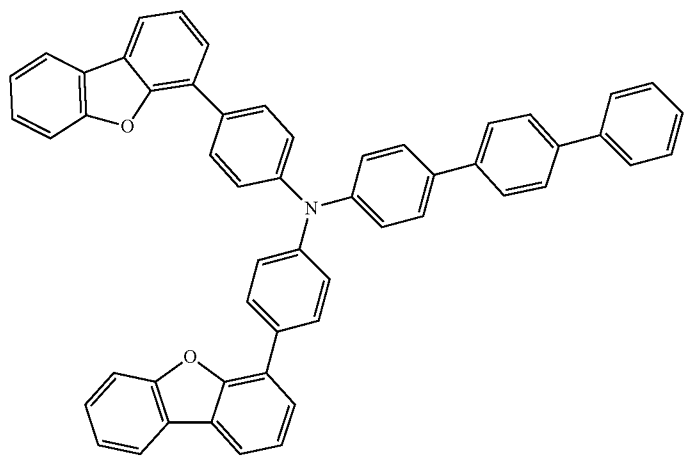
,
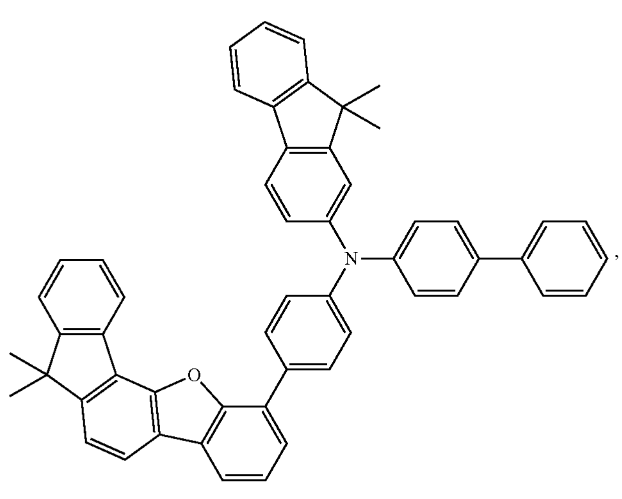
,
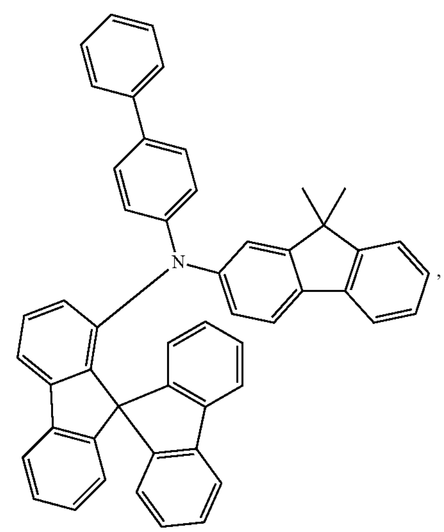
, -continued
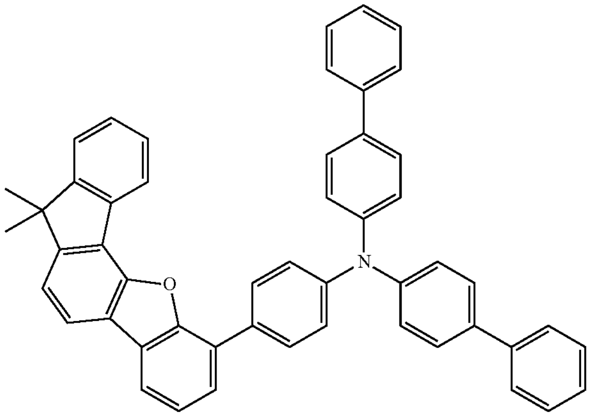
,
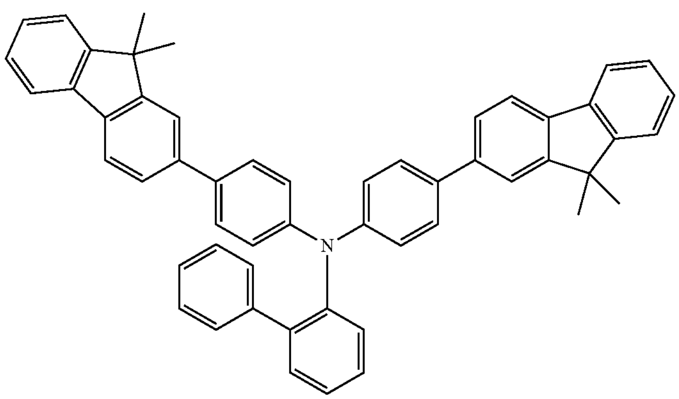
,
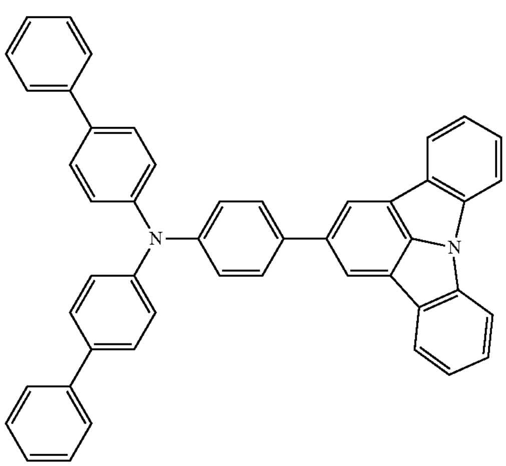
,
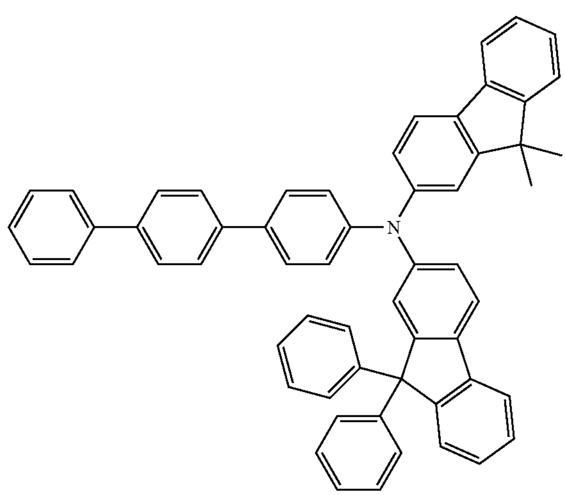
, -continued
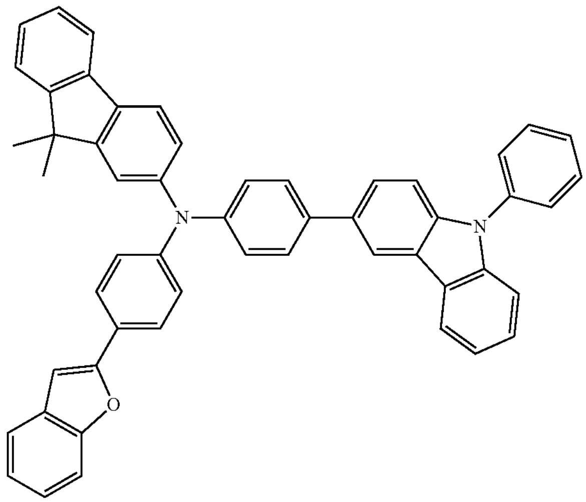
,
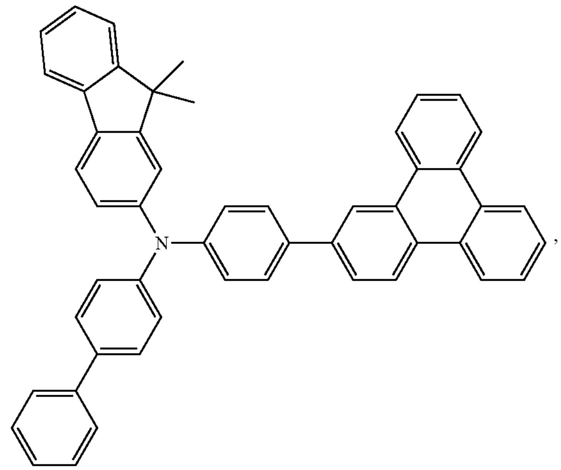
,
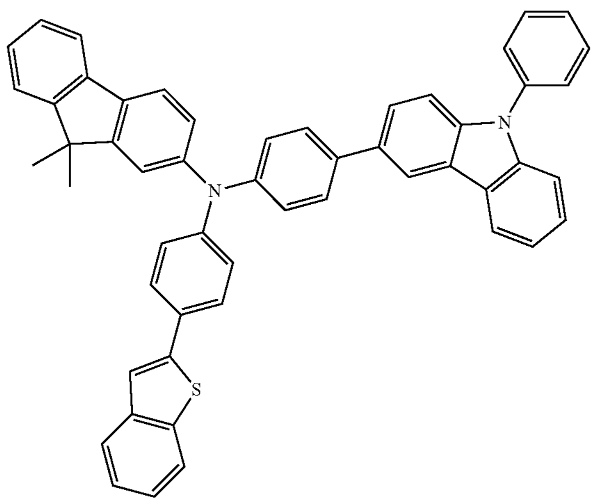
,
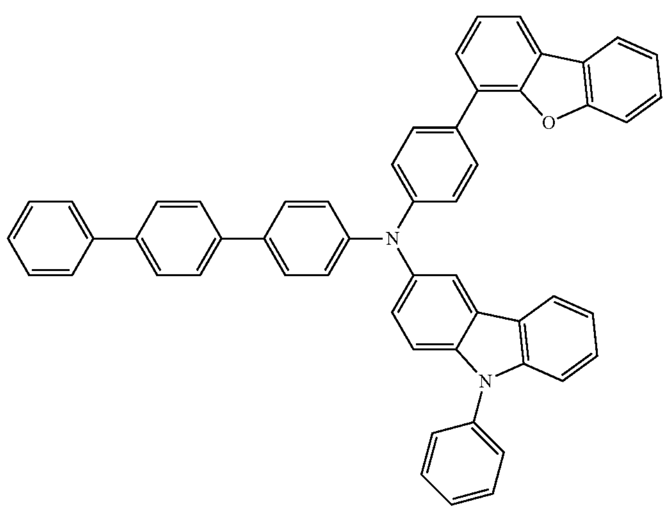
, -continued
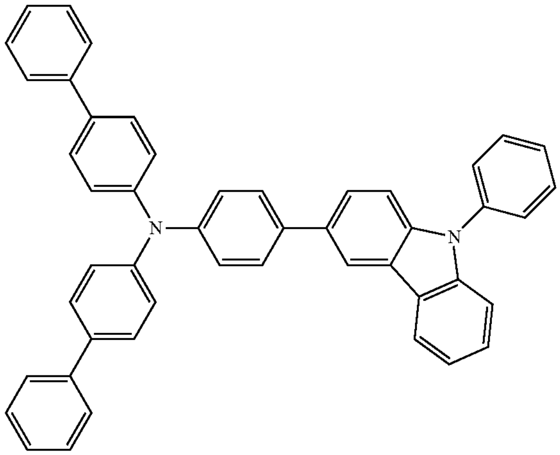
,
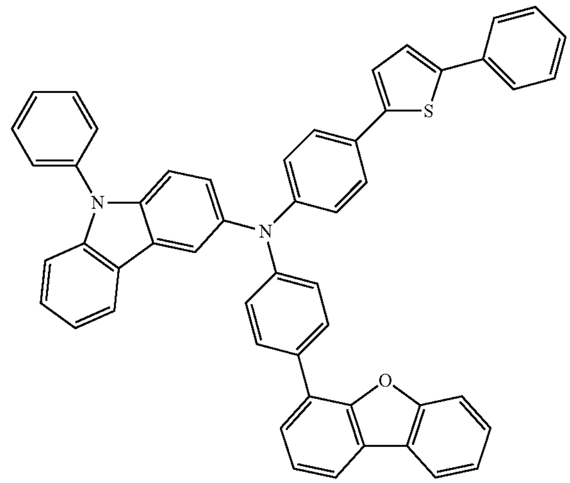
,
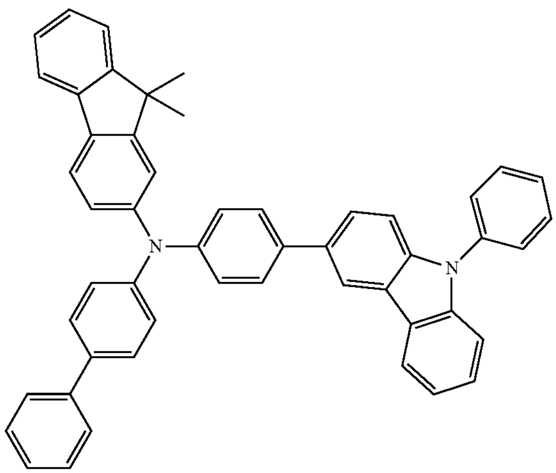
,
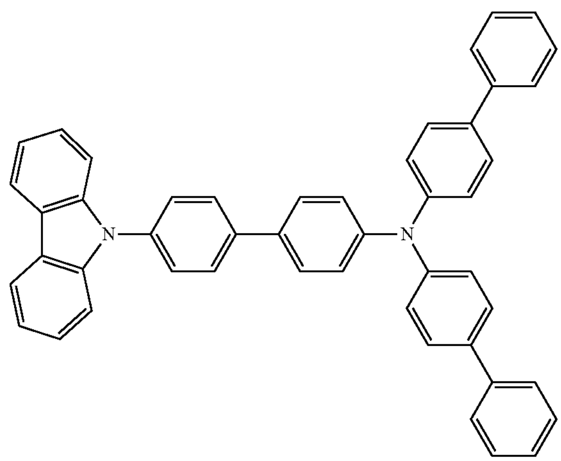
,
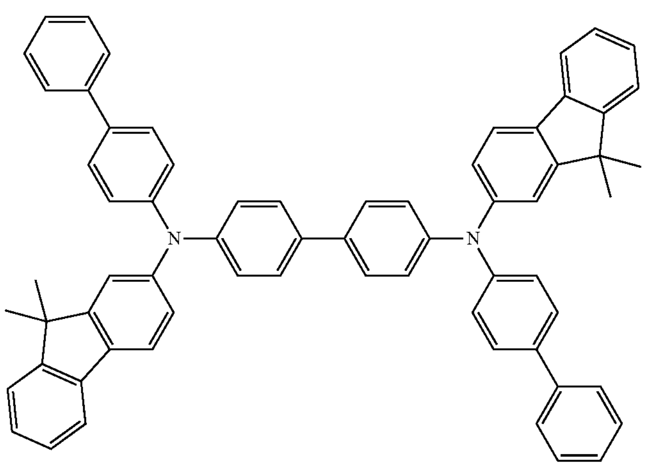
, -continued
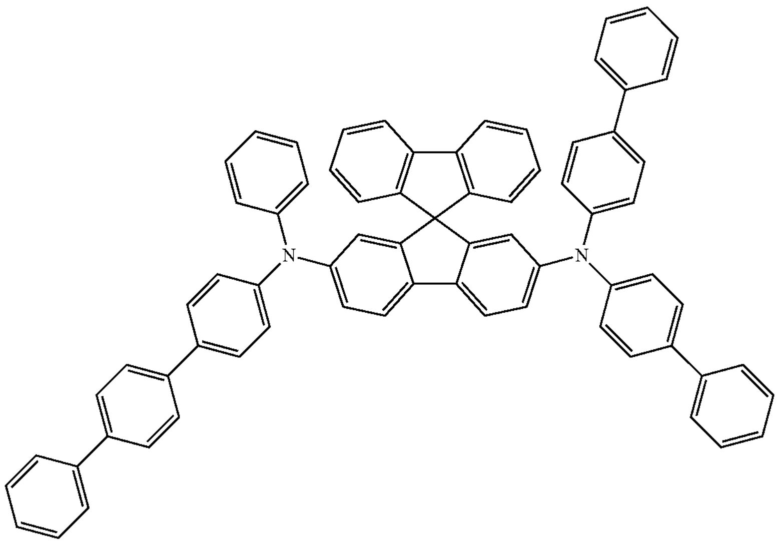
,
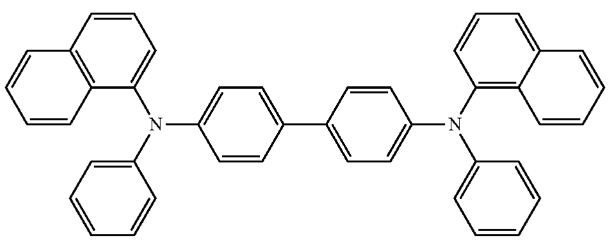
,
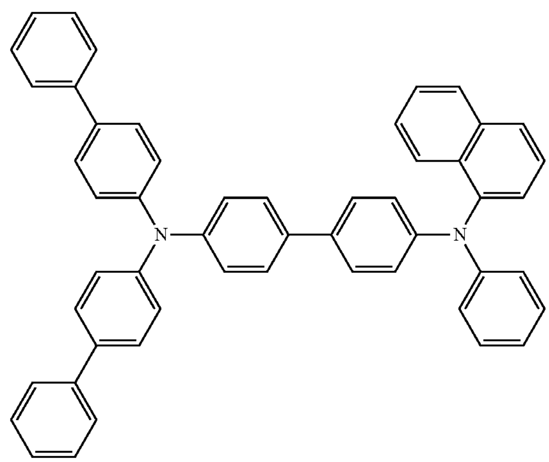
,
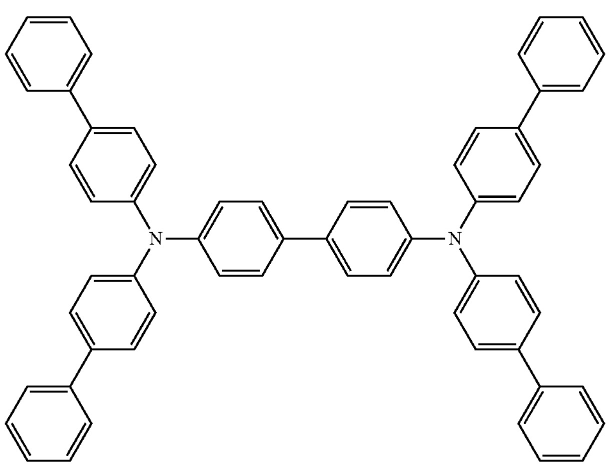
, -continued
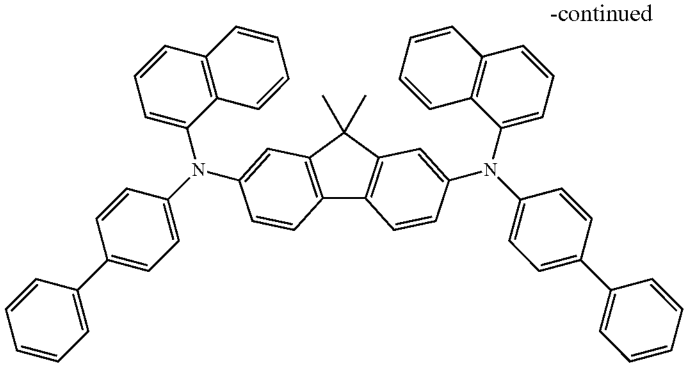
,
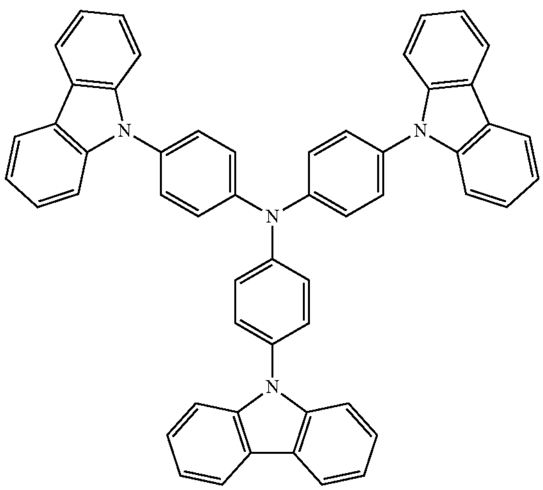
,
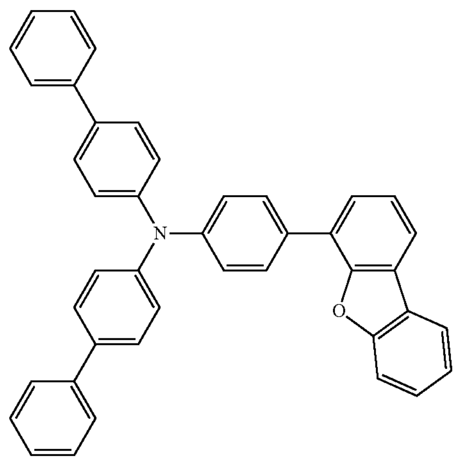
,
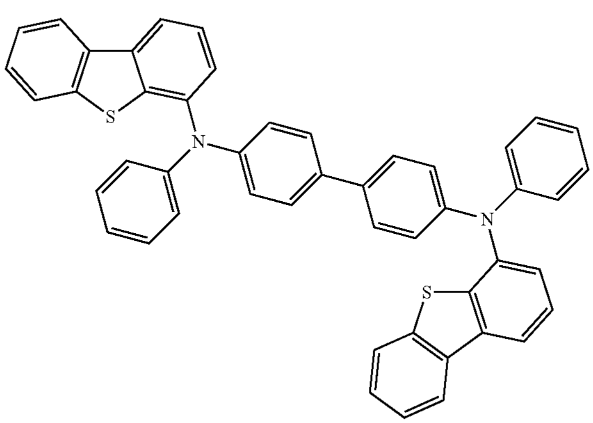
,
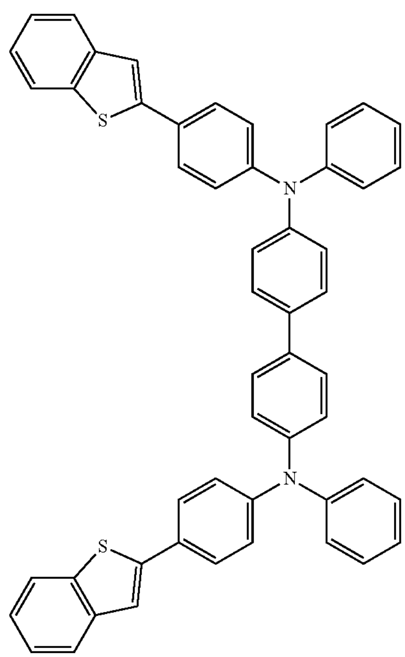
, and -continued

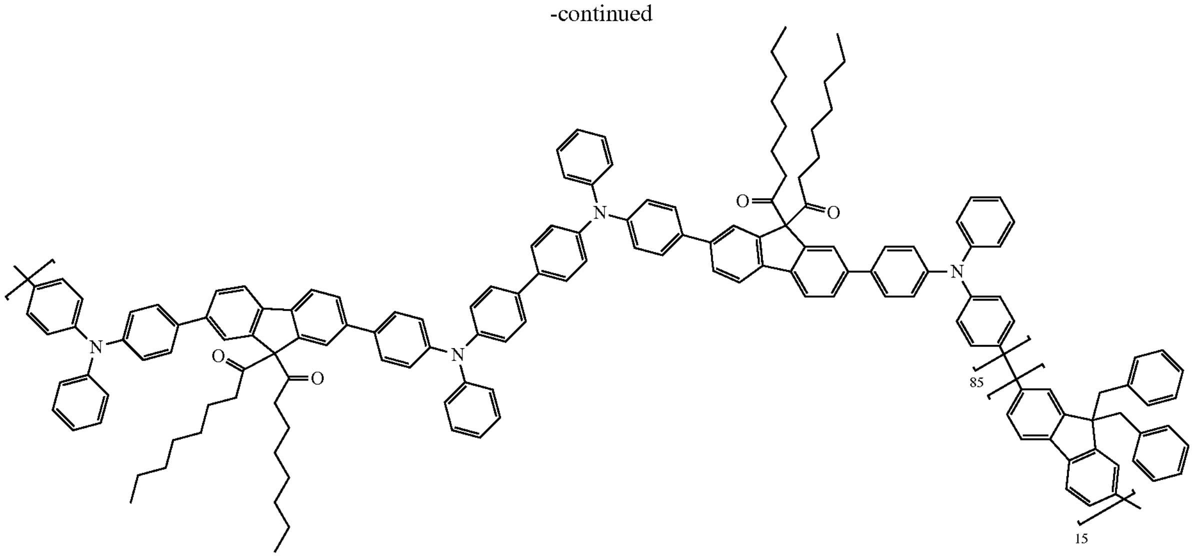

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

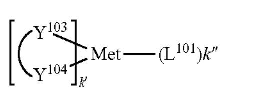

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

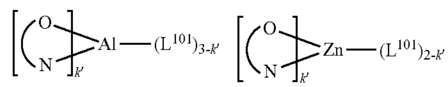

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

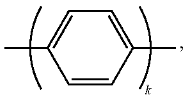
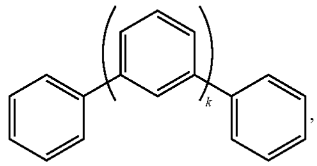
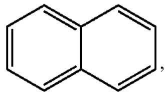
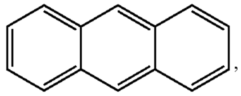
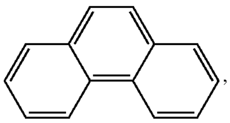
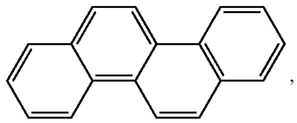
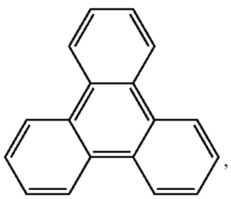
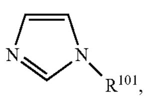
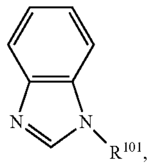
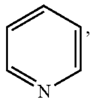
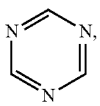
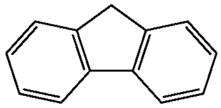
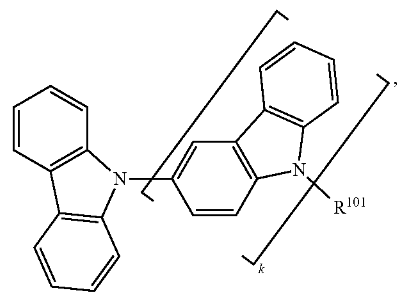
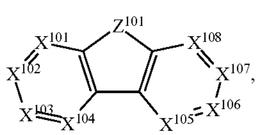
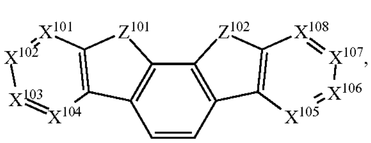
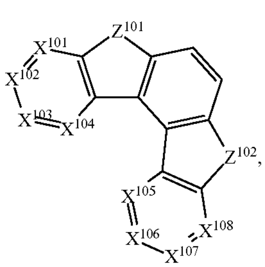

-continued

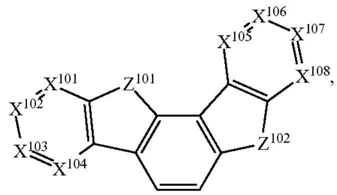
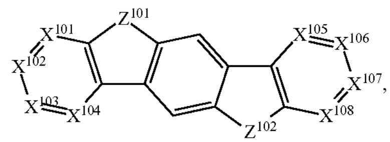
and
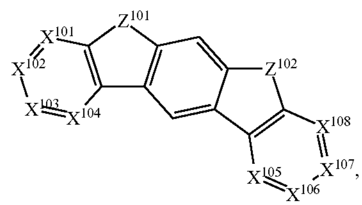

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, US7154114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013954872, WO2013035275, WO2013081315, WO2013191404, WO2014142472, US20170263869, US20160163995, US9466803,

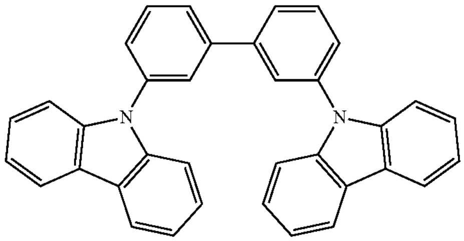,
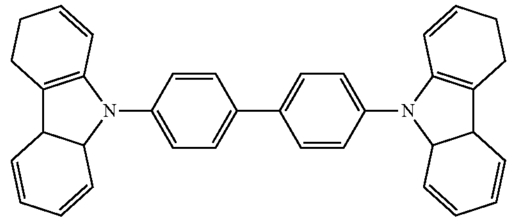,
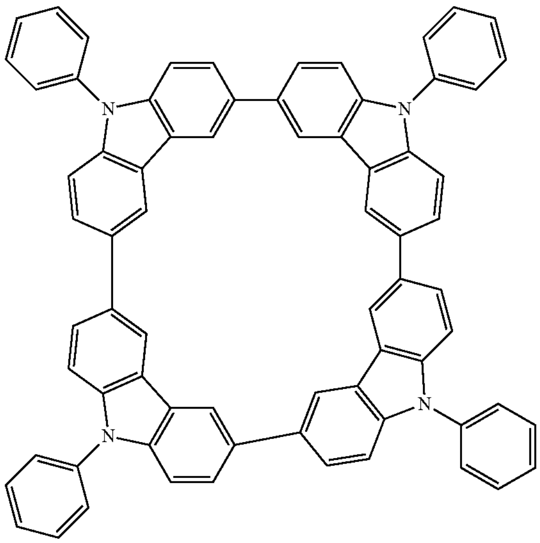,
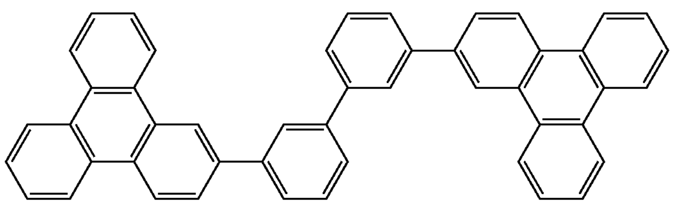,
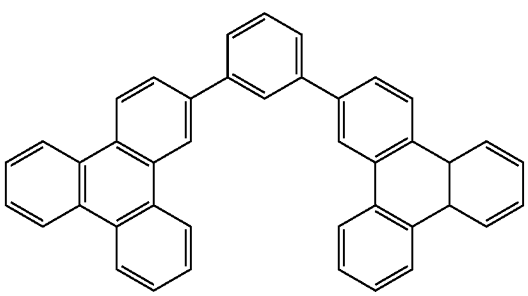,
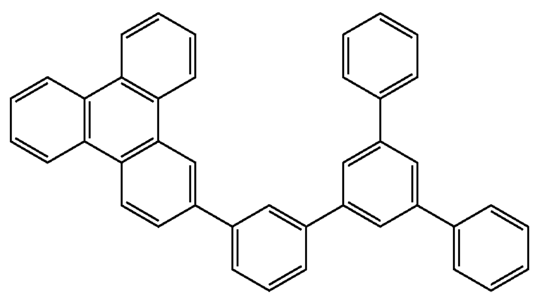,
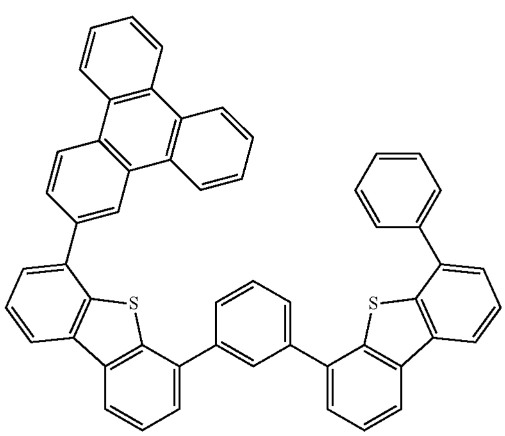,
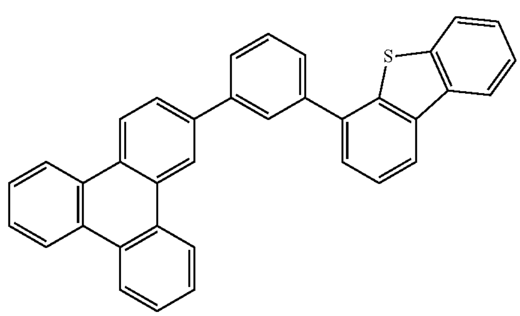, -continued
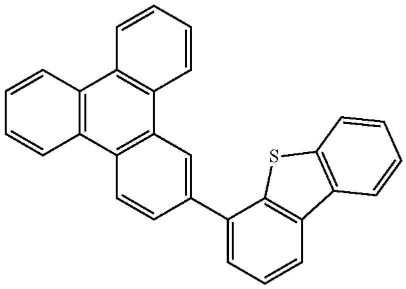,
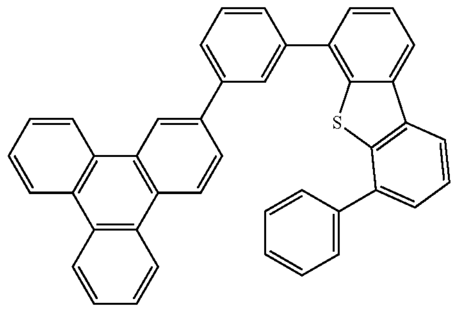,
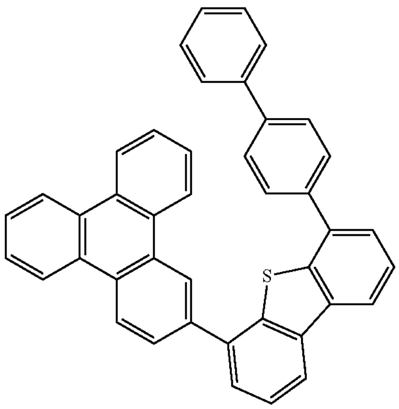,
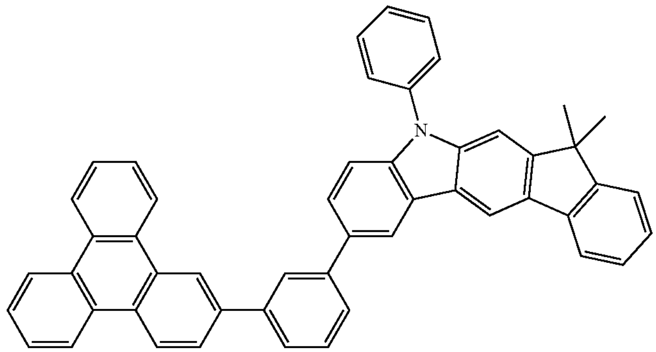,
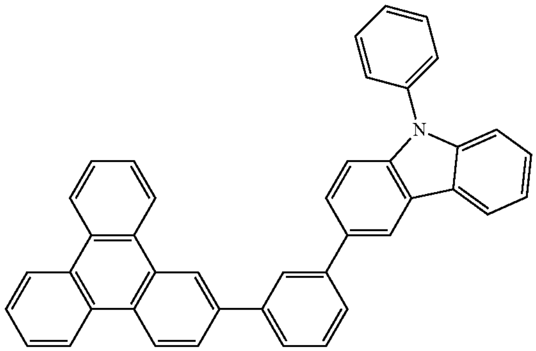,
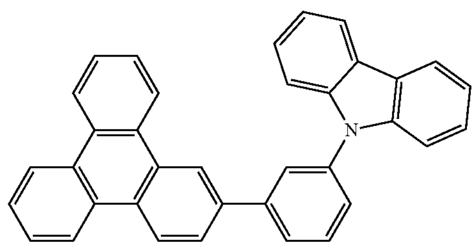,
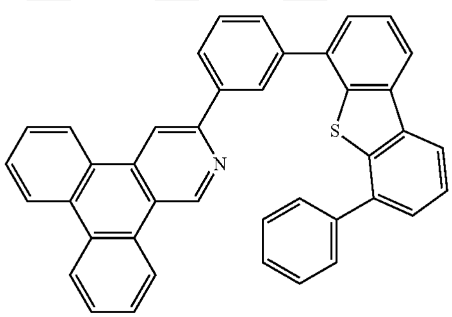,
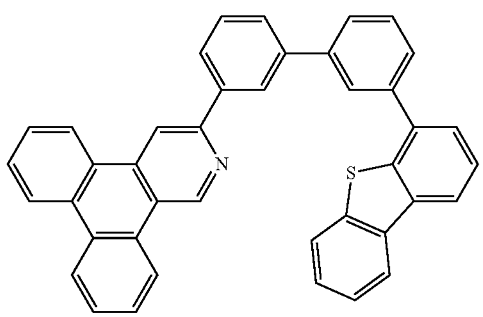,
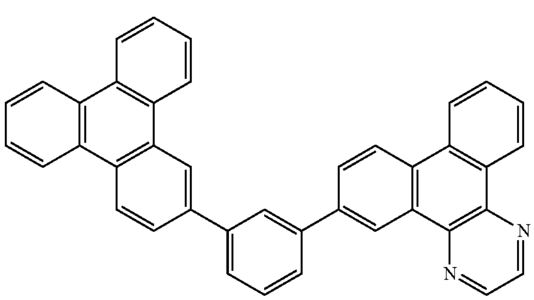,
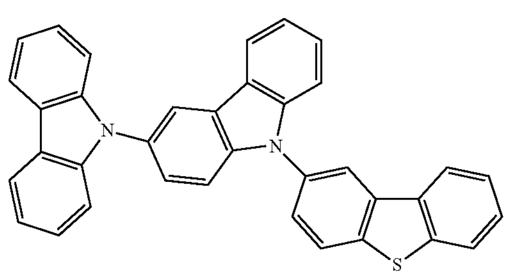, -continued
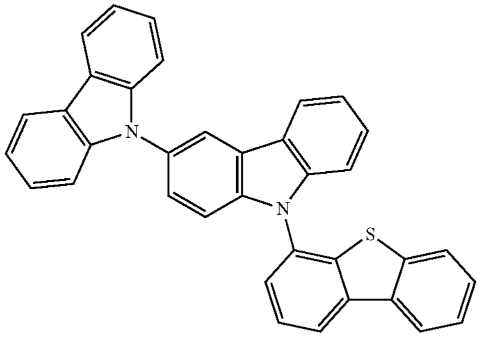
,
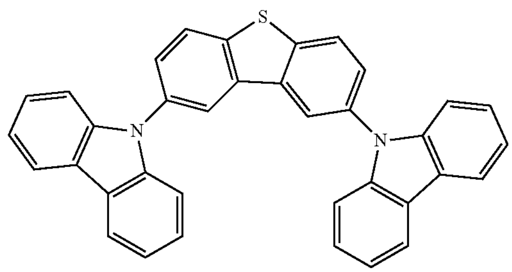
,
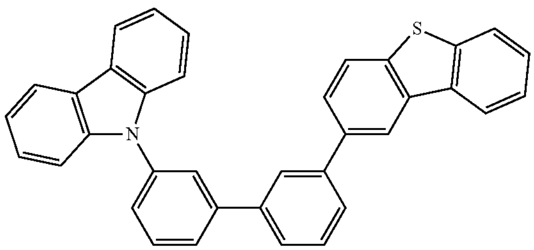
,
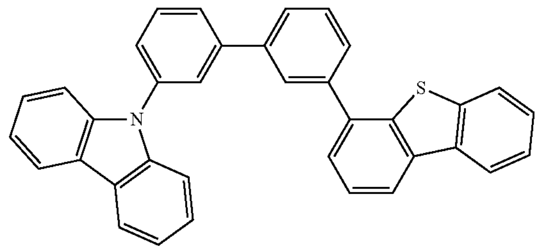
,
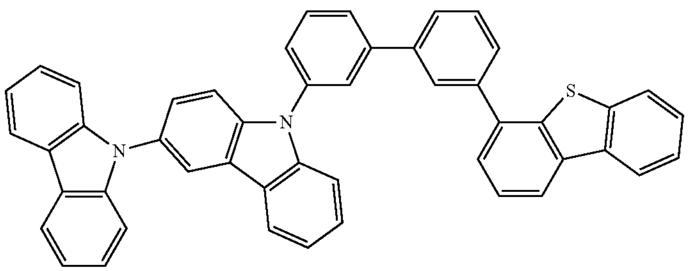
,
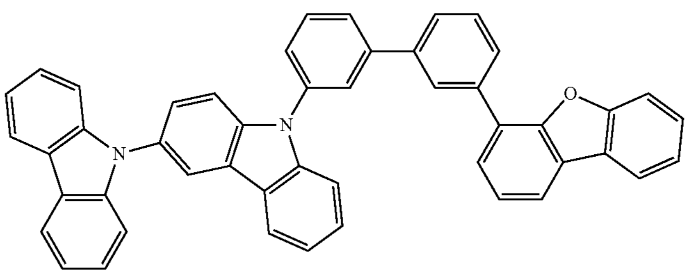
,
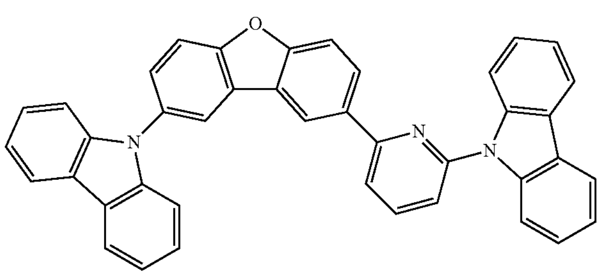
,
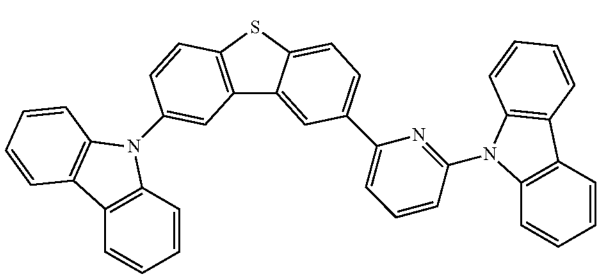
, -continued
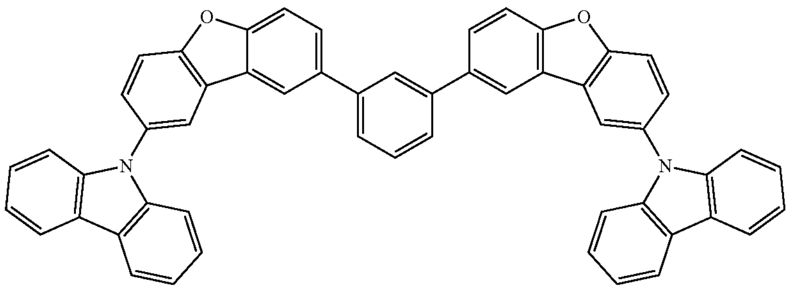
,
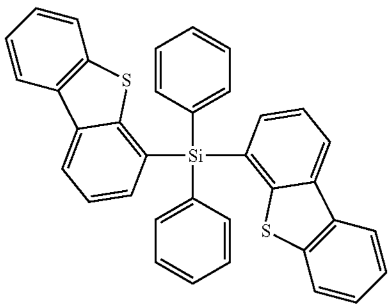
,
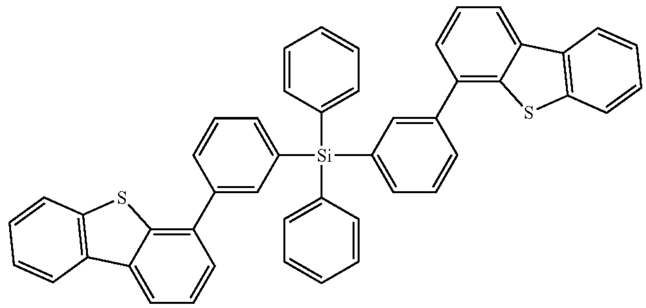
,
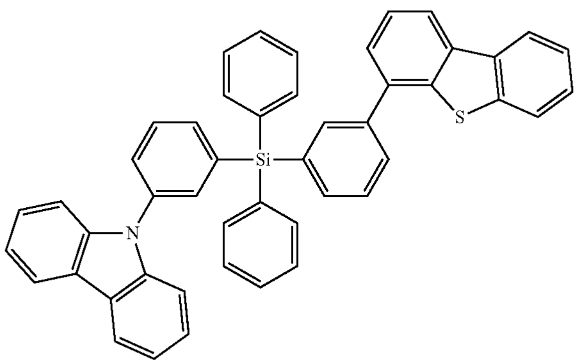
,
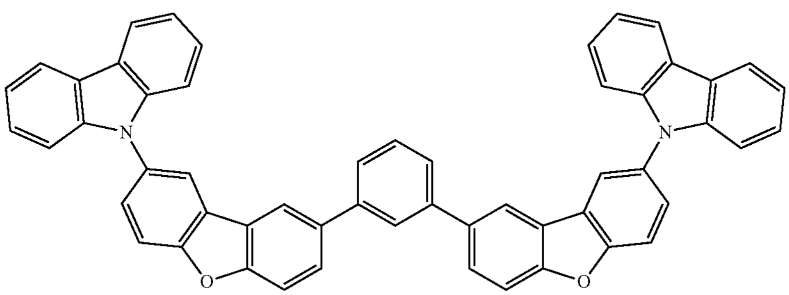
,
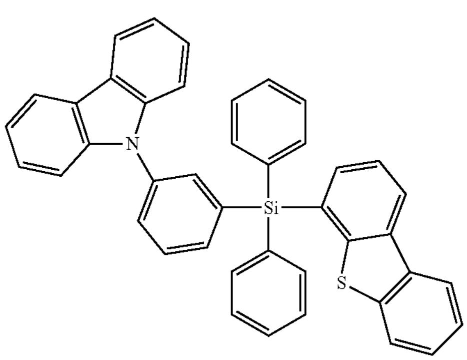
,
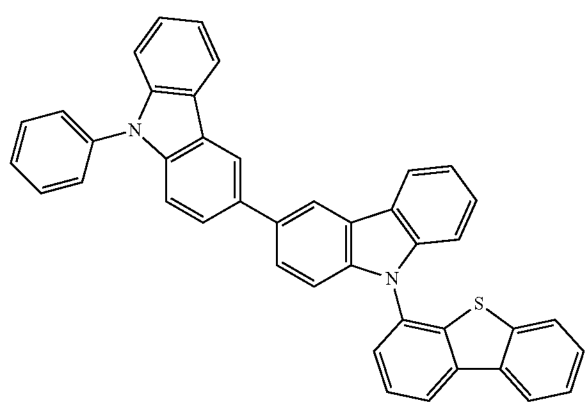
, -continued
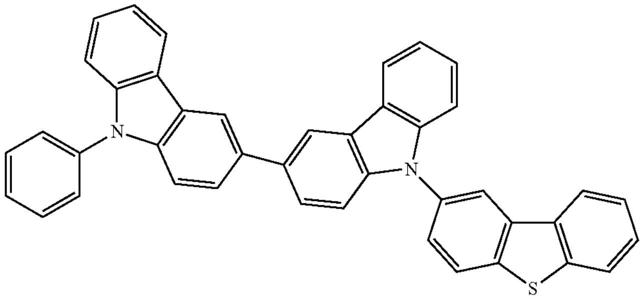
,
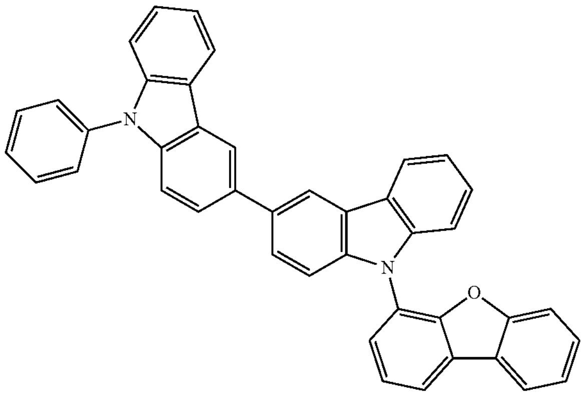
,
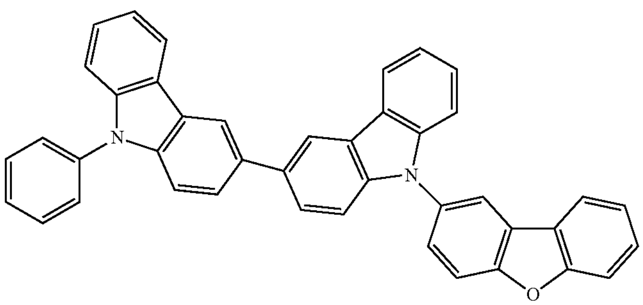
,
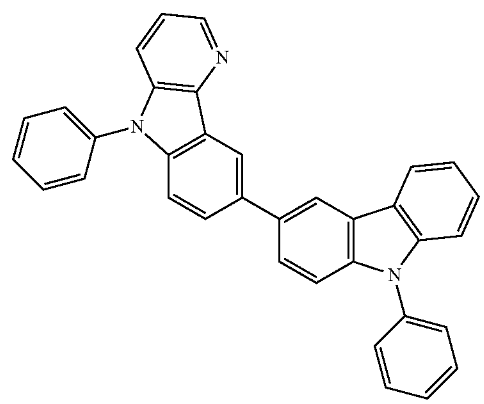
,
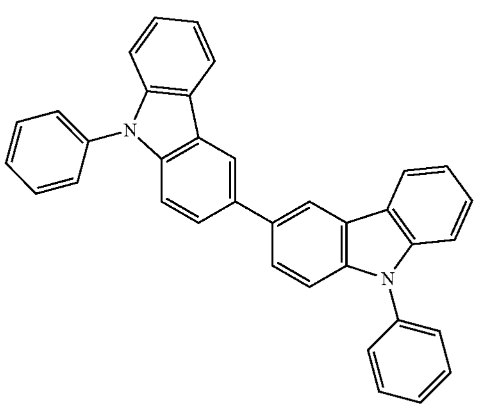
,
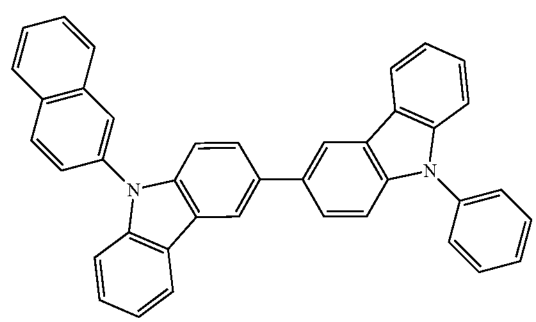
, -continued
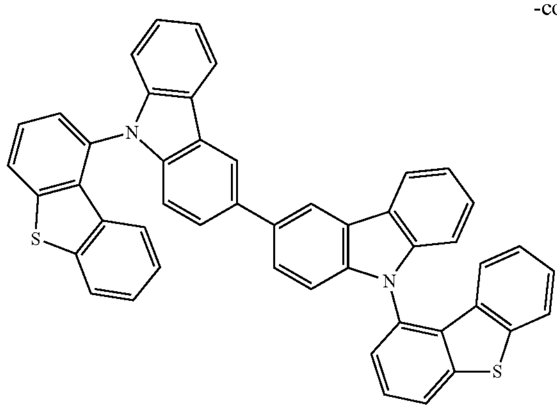
,
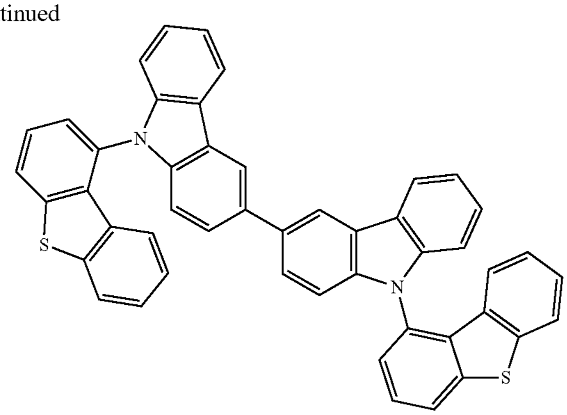
,
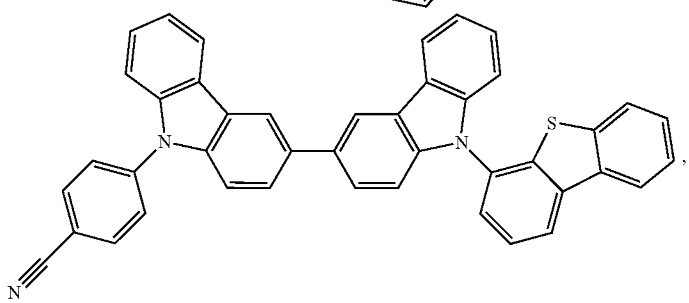
,
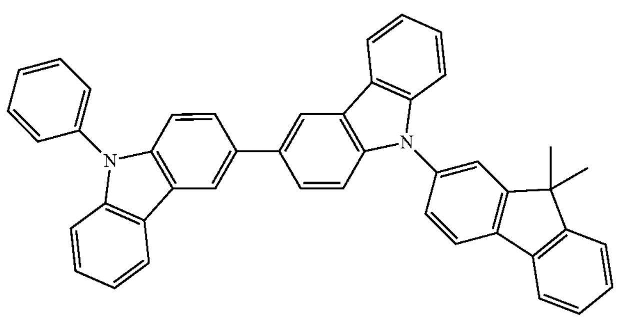
,
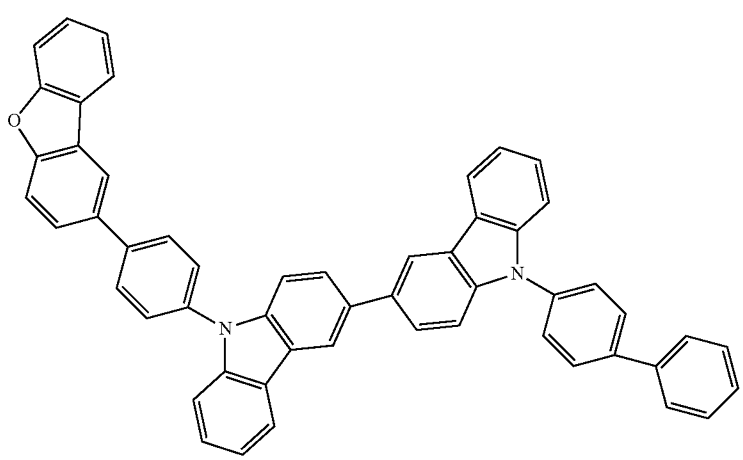
, -continued
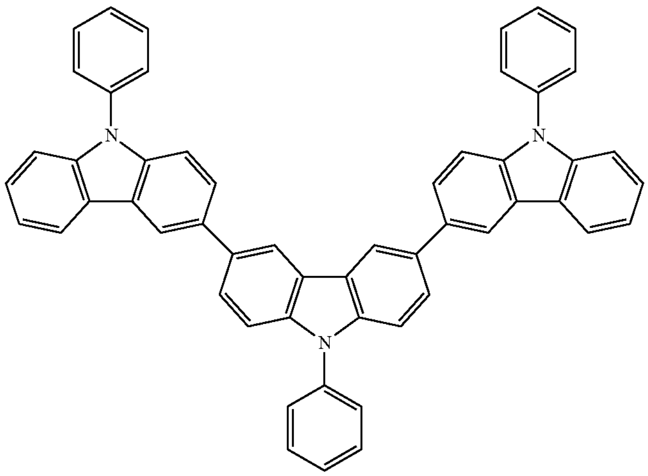
,
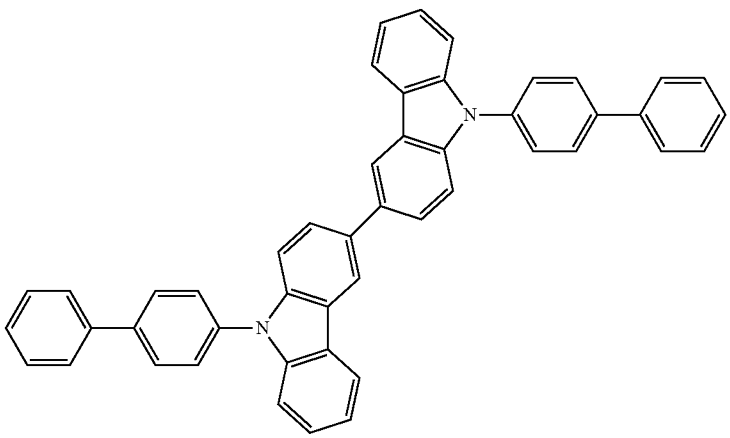
,
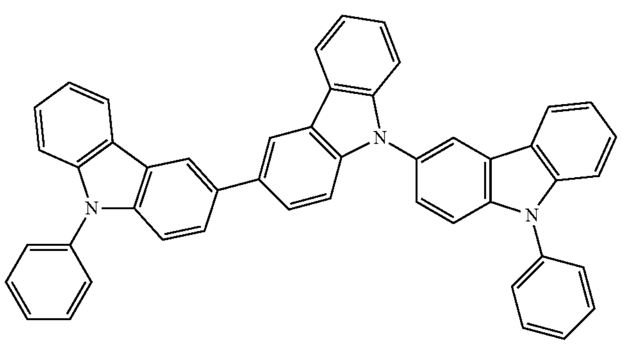
,
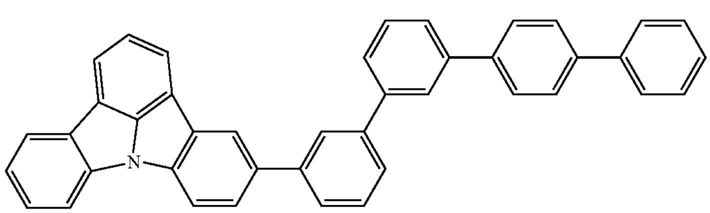
, -continued
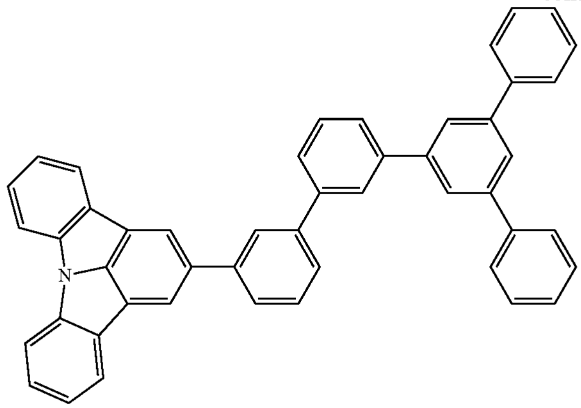
,
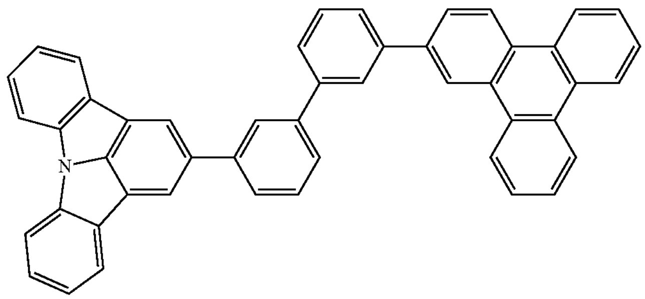
,
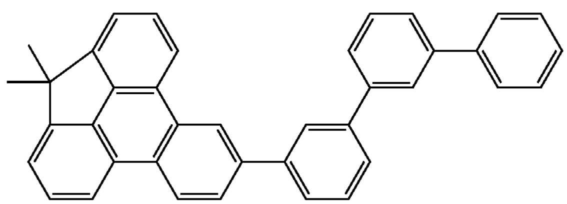
,
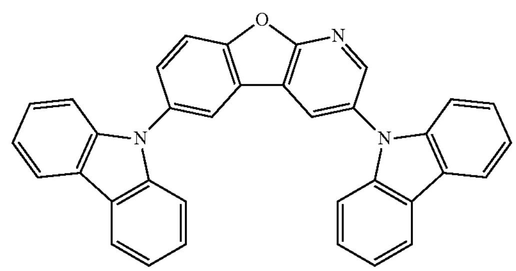
,
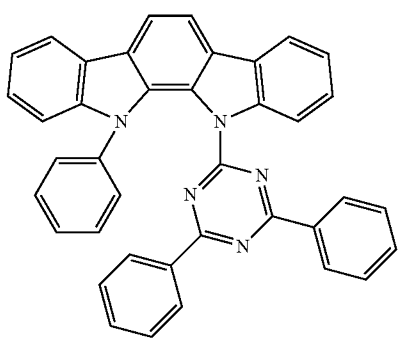
,
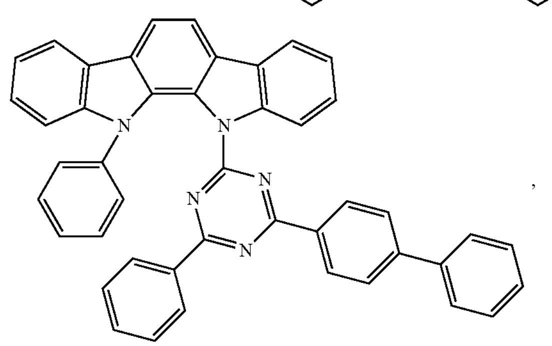
,
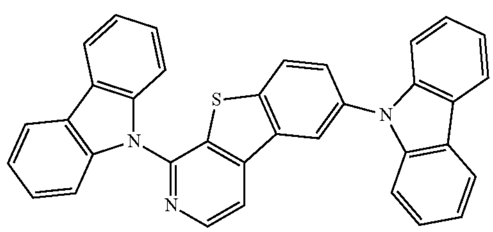
,
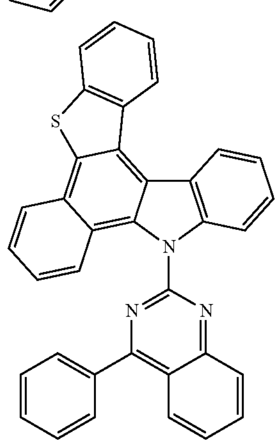
,
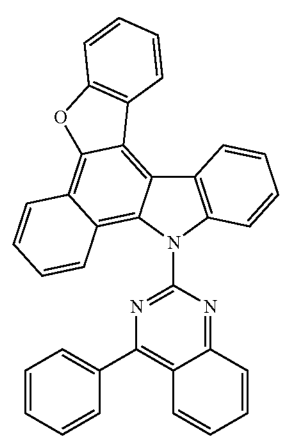
, -continued
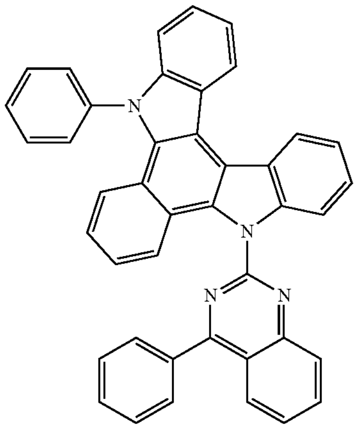
,
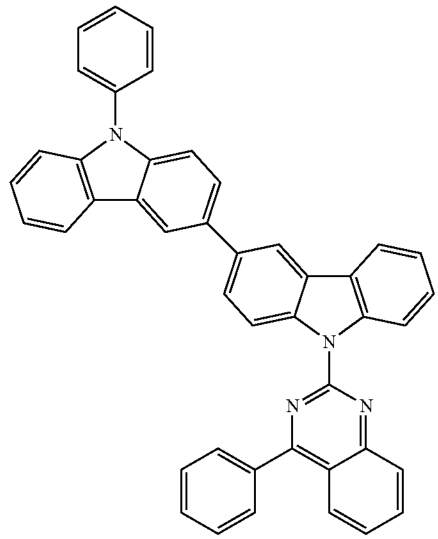
,
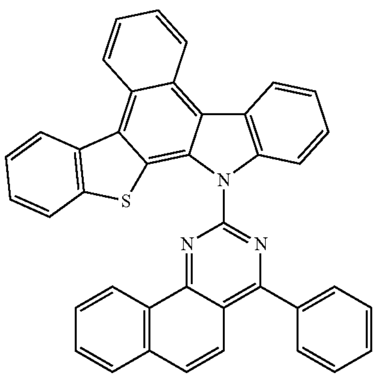
,
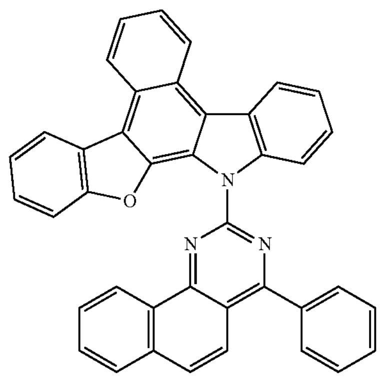
,
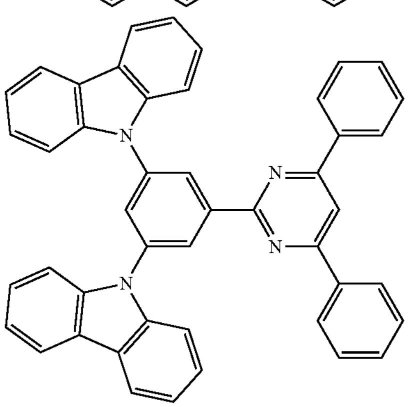
,
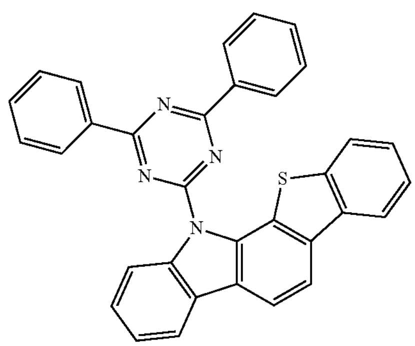
,
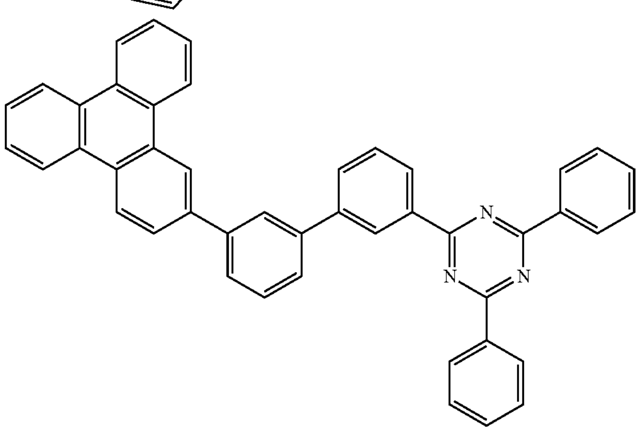
, -continued
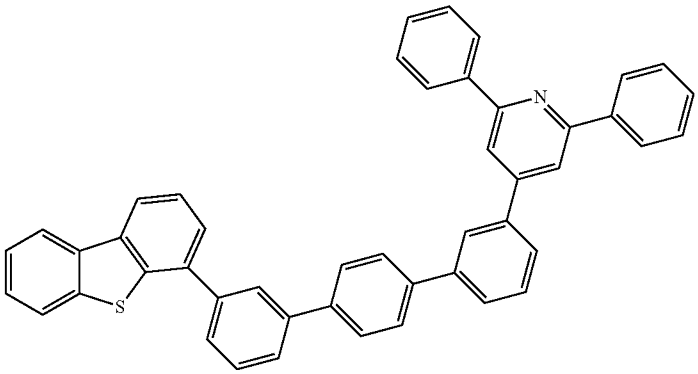
,
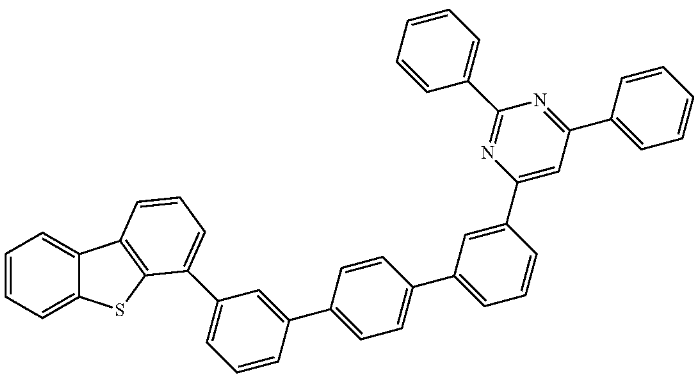
,
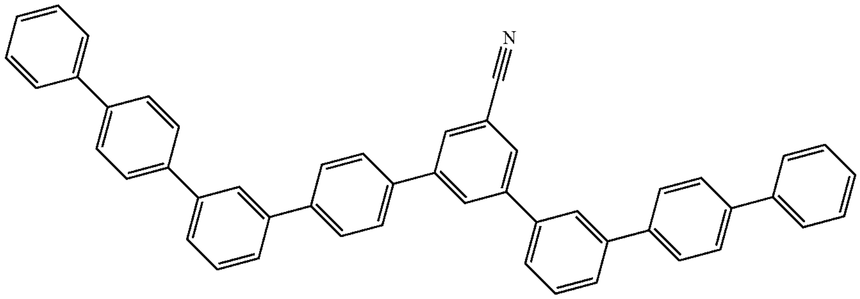
,
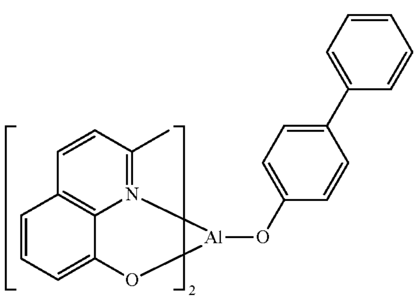
,
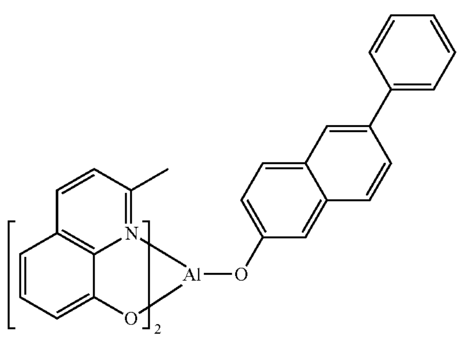
,
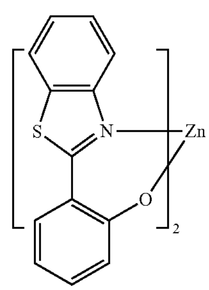
,
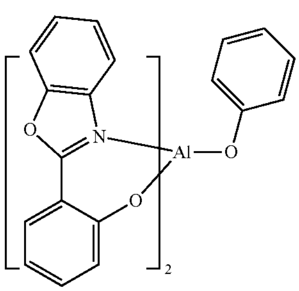
,
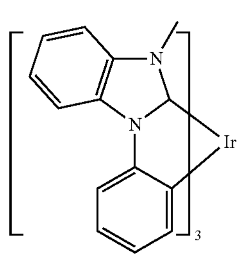
,
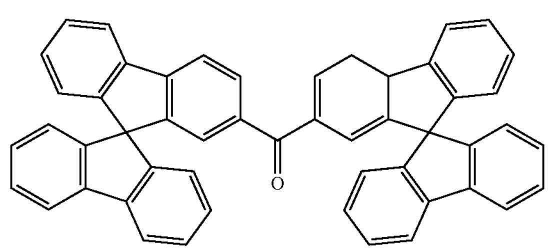
, -continued

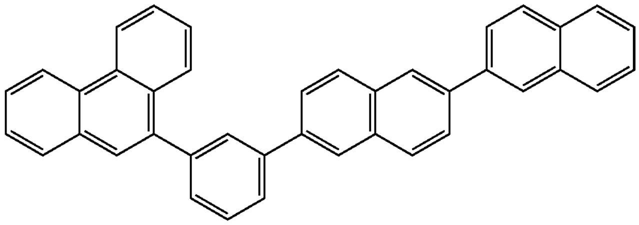

,

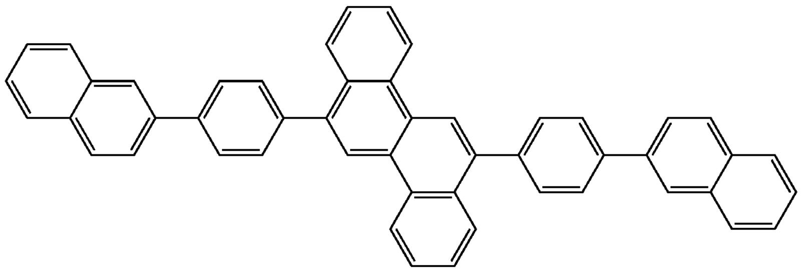

, and

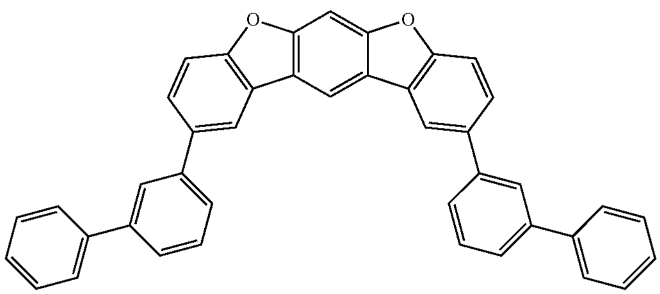

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, US06699599, US06916554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, US6303238, US6413656, US6653654, US6670645, US6687266, US6835469, US6921915, US7279704, US7332232, US7378162, US7534505, US7675228, US7728137, US7740957, US7759489, US7951947, US8067099, US8592586, US8871361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
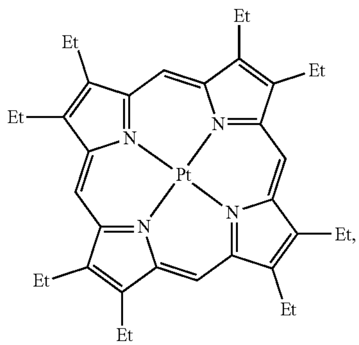
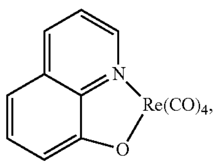
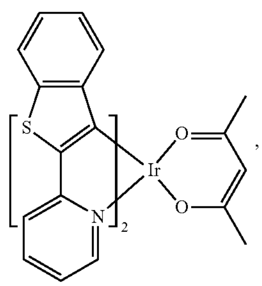
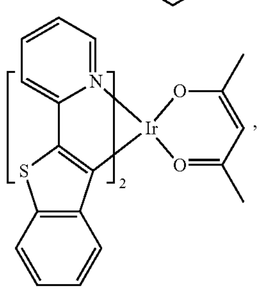
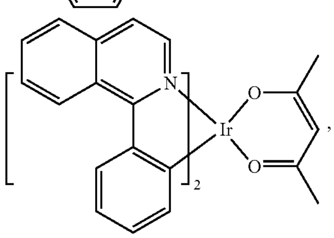
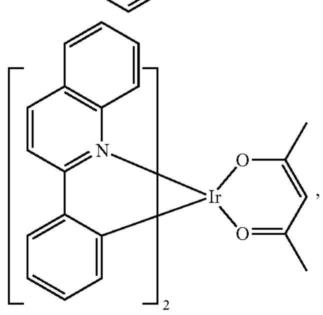
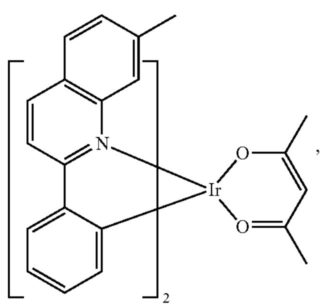
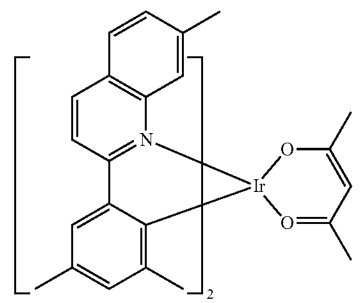
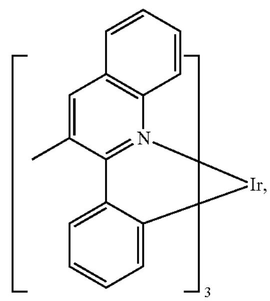
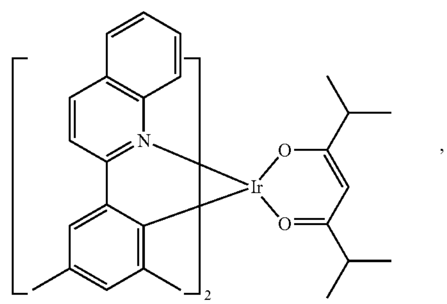
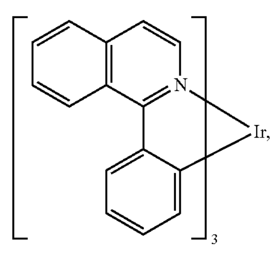
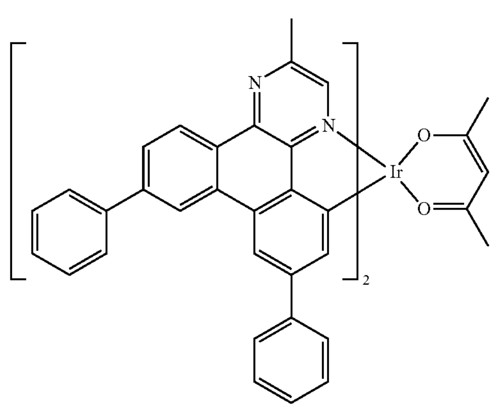

-continued
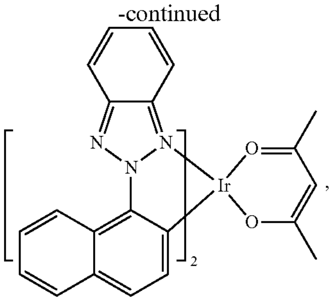
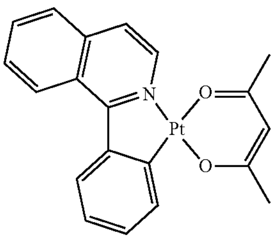
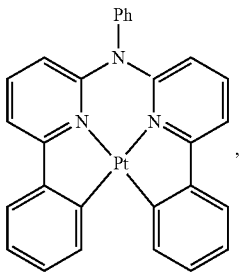
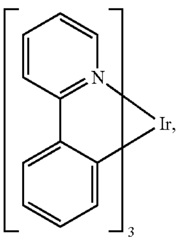
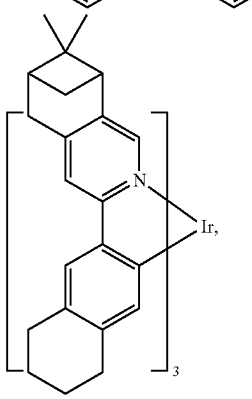
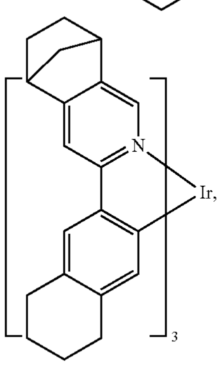
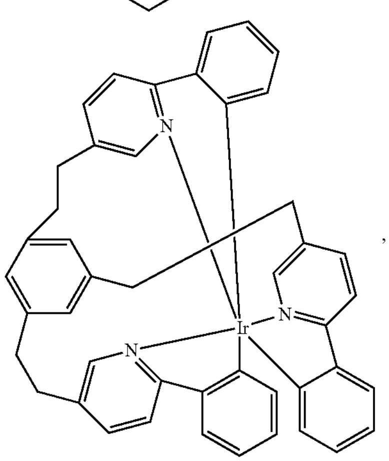
-continued
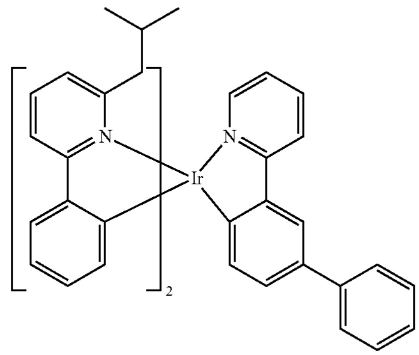
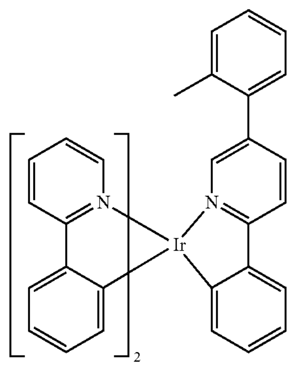
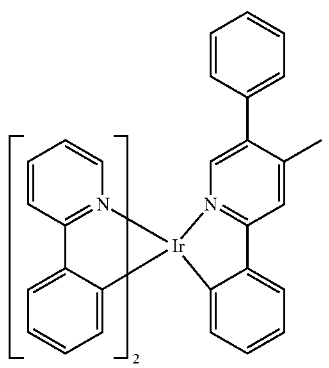
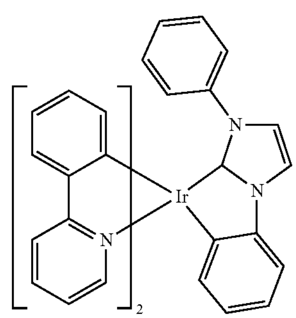
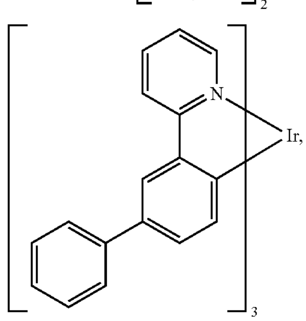
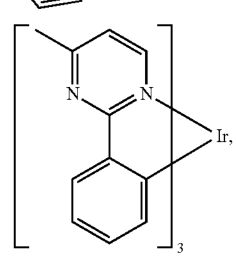

-continued
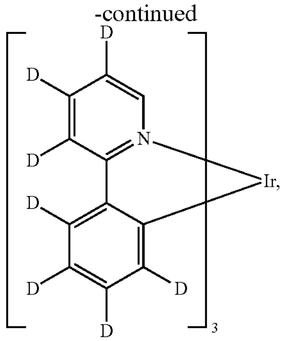
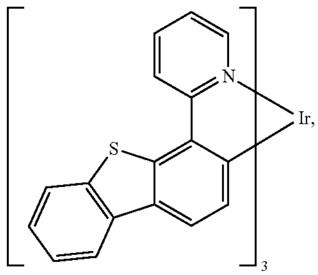
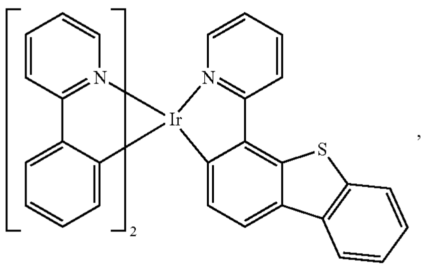
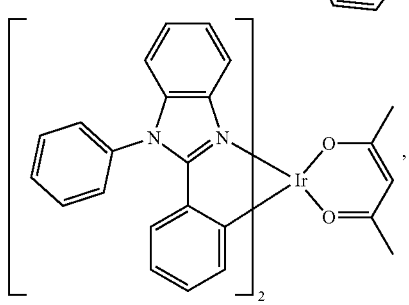
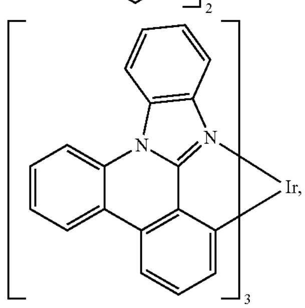
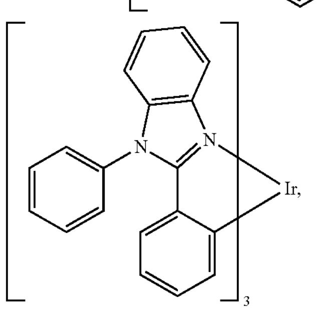
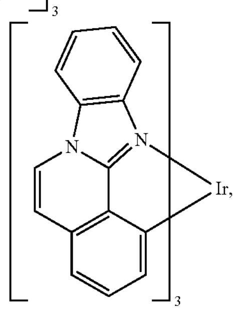
-continued
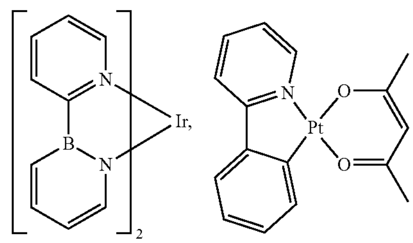
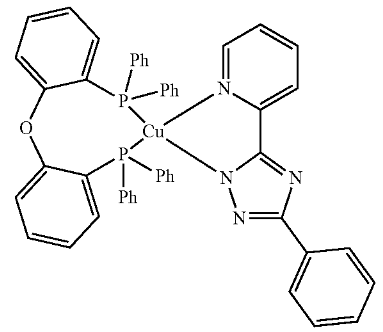
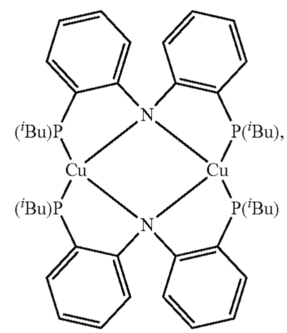
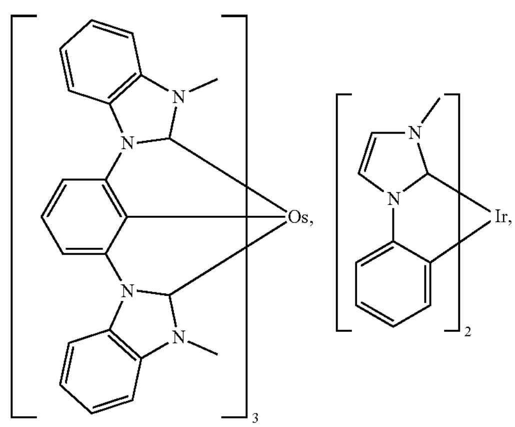
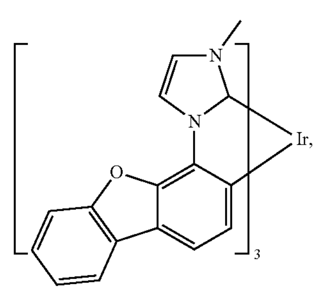

-continued
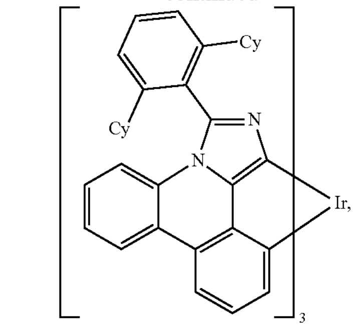
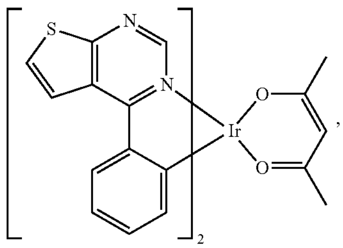
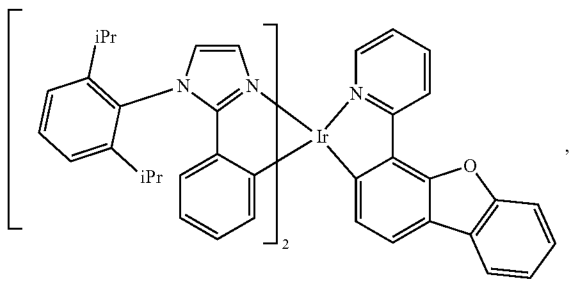
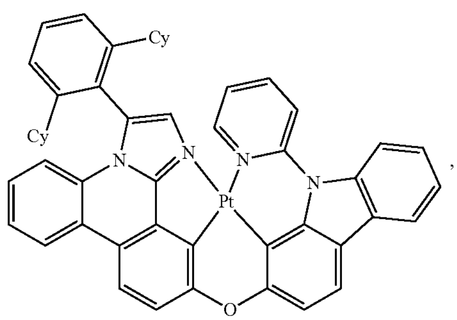
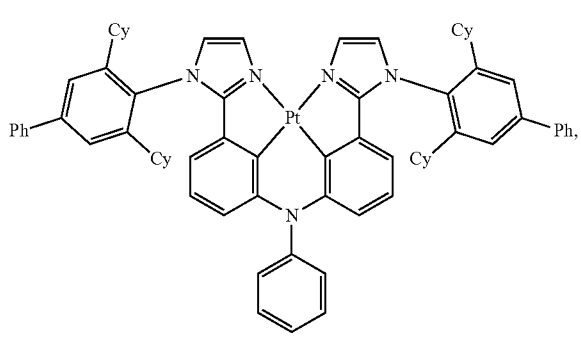
-continued
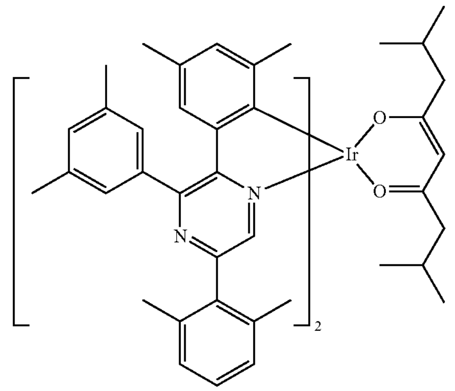
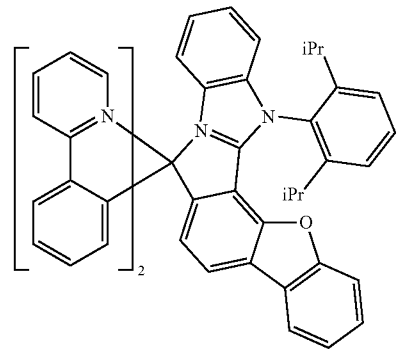
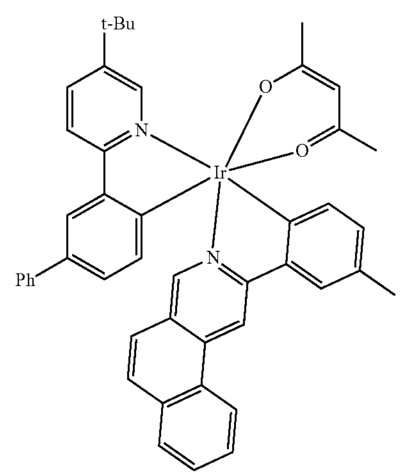
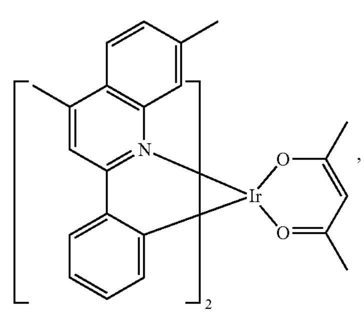

-continued
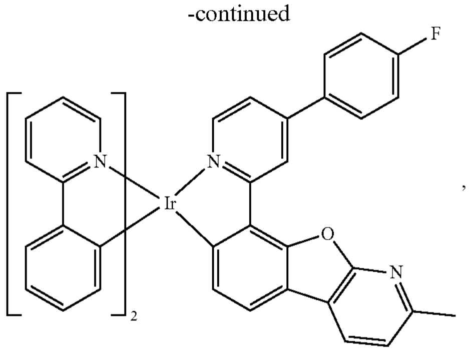
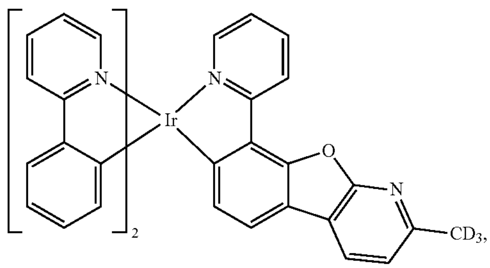
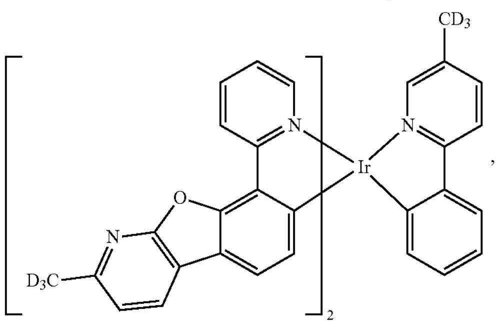
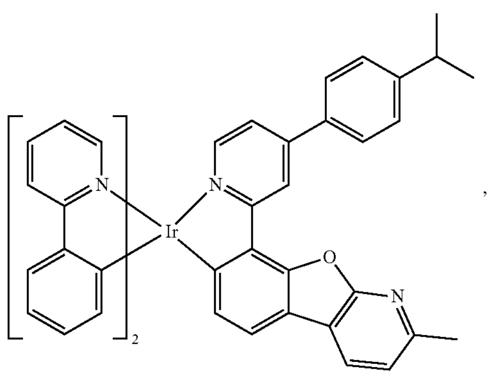
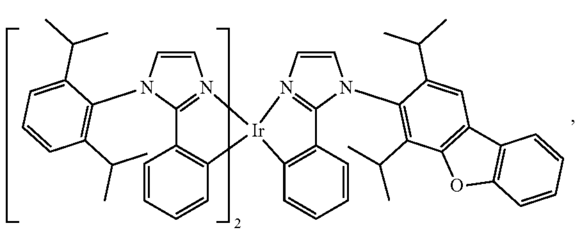
-continued
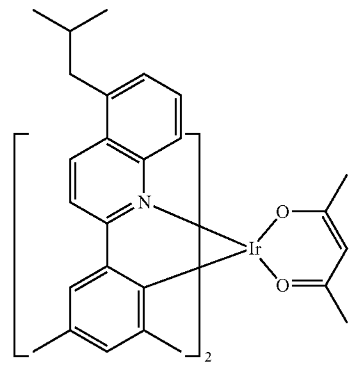
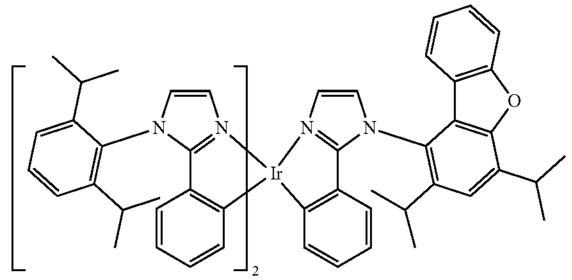
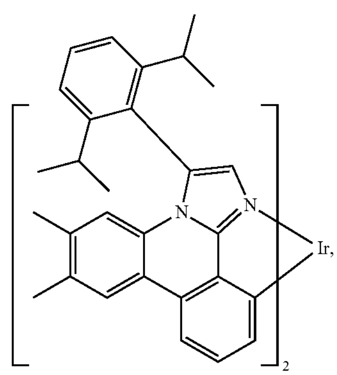
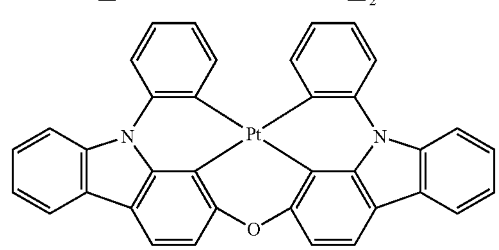
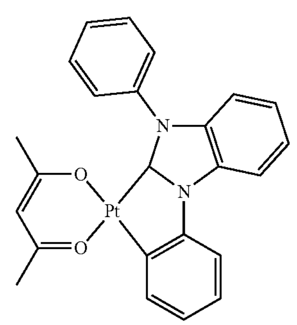

-continued
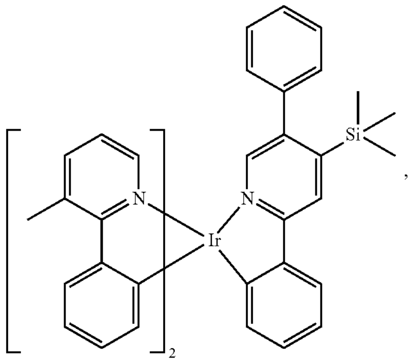
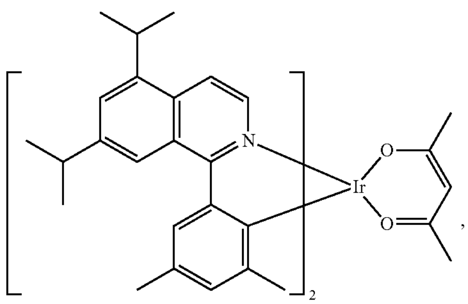
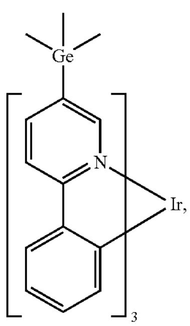
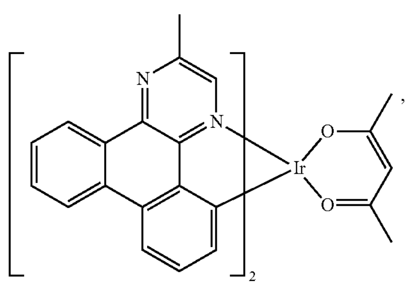
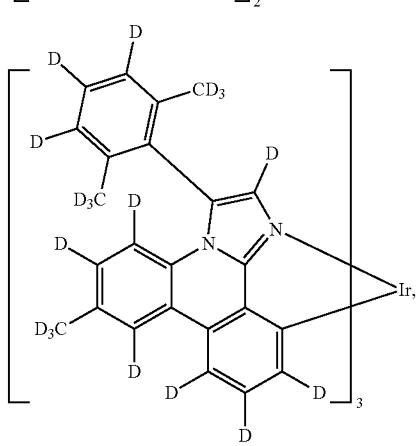
-continued
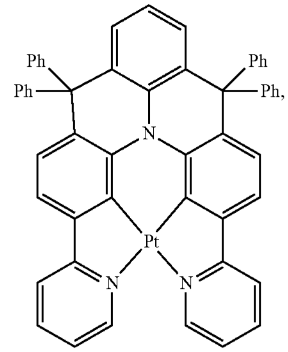
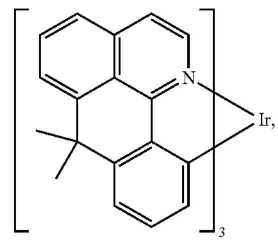
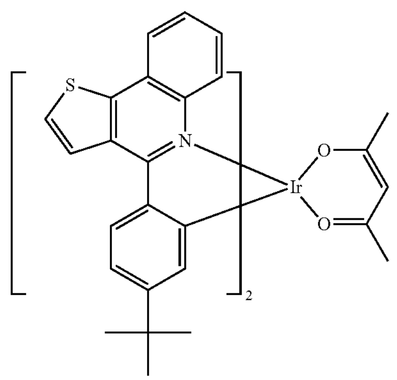
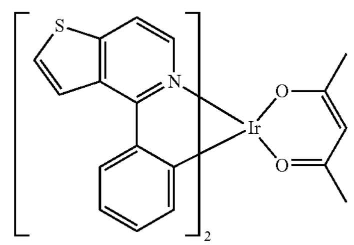
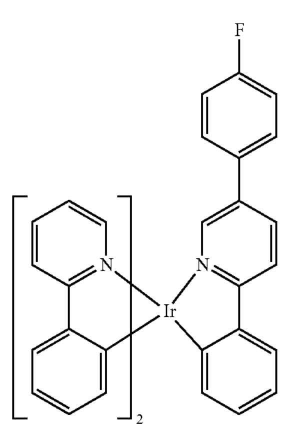

-continued
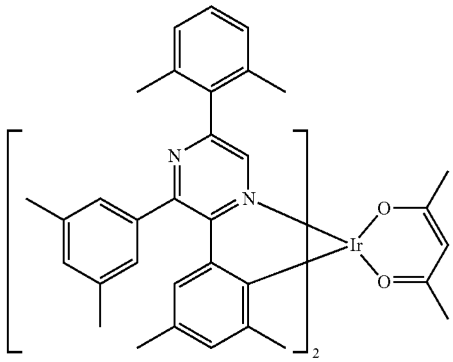
,
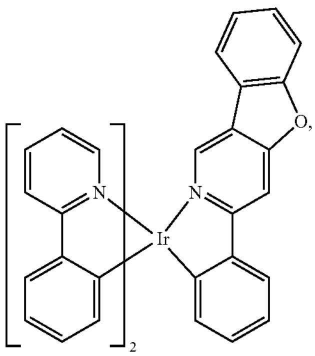
,
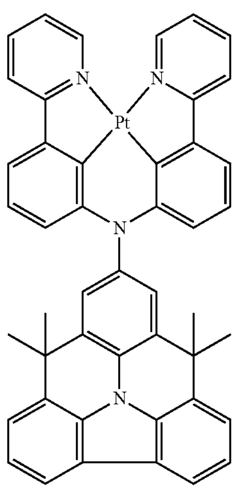
,
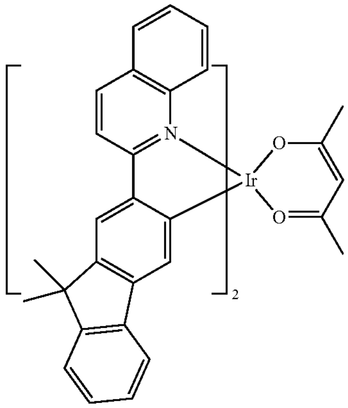
,
-continued
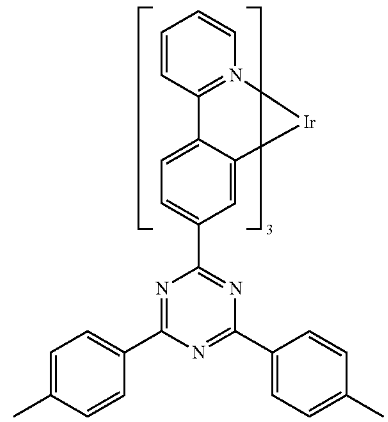
,
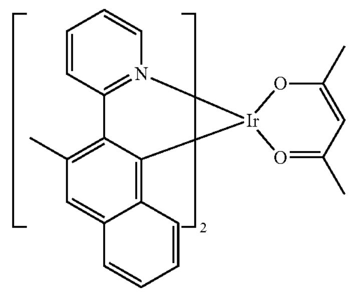
,
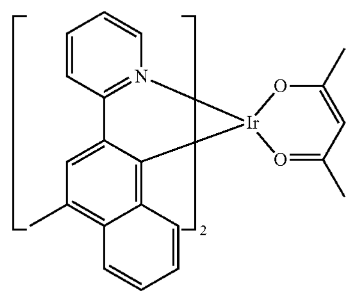
,
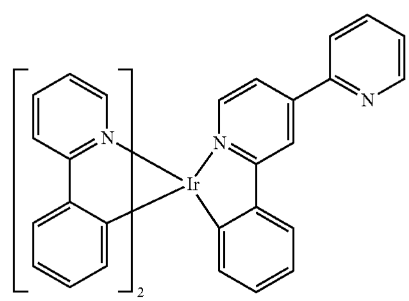
,
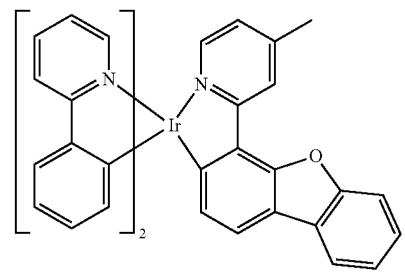
,

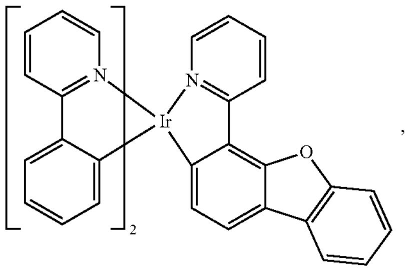
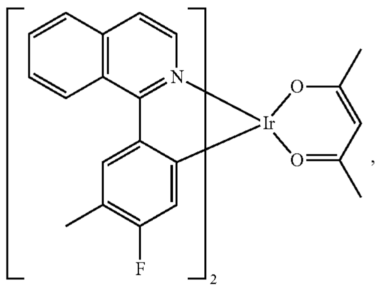
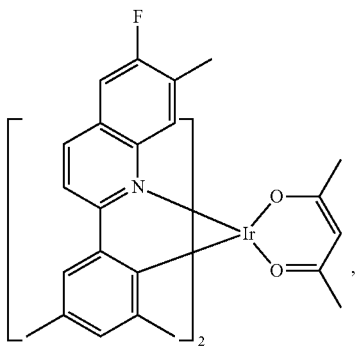
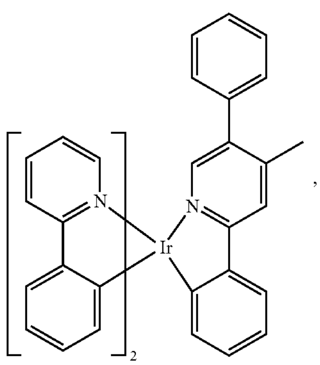
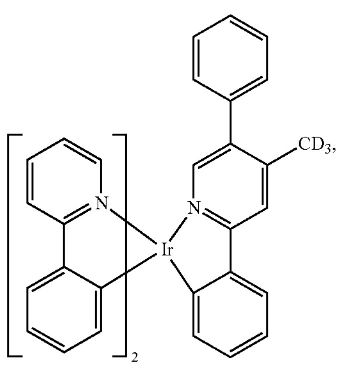
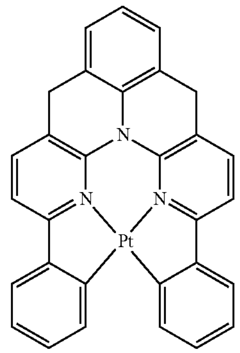
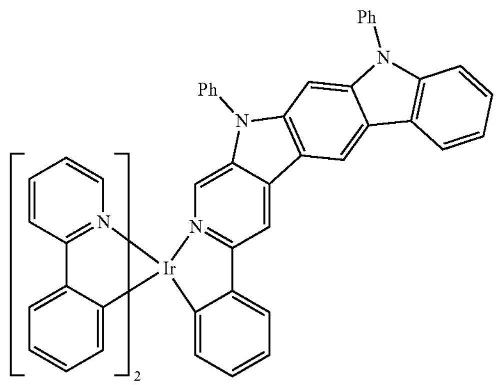
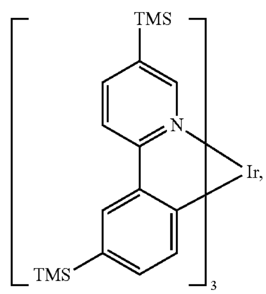
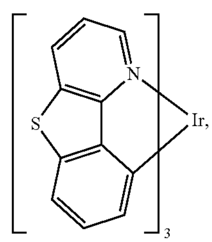
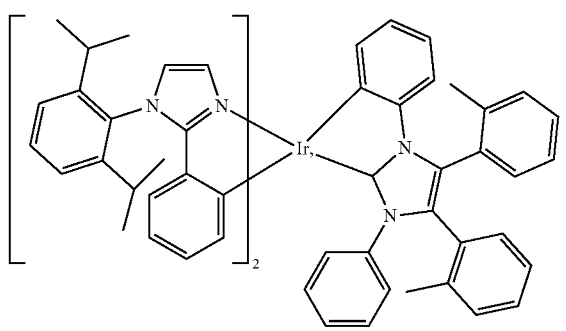
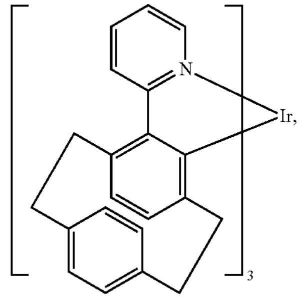

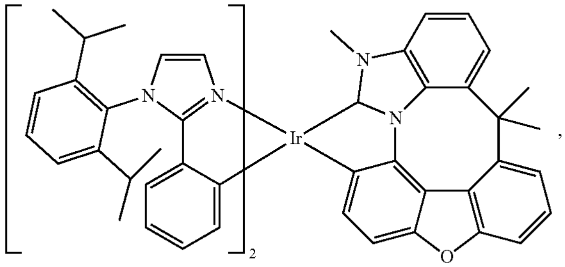
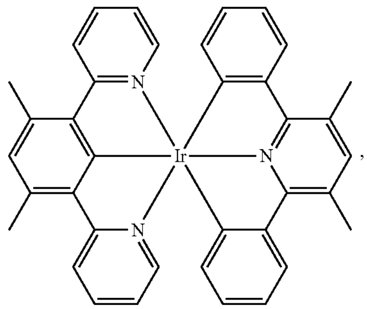
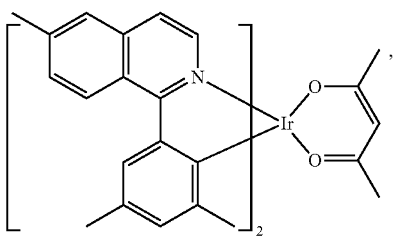
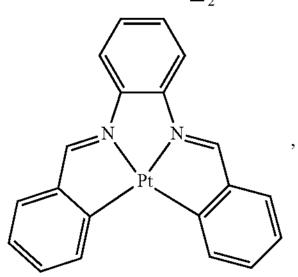
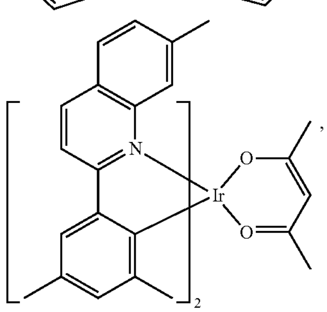
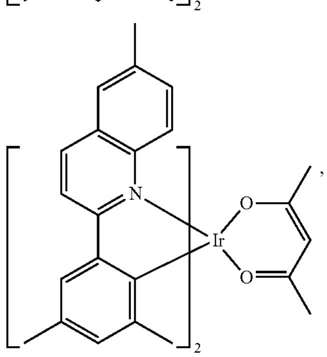
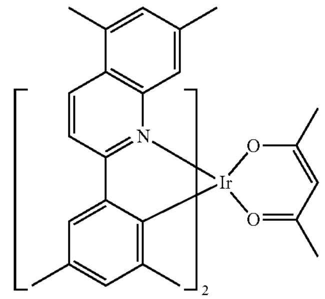
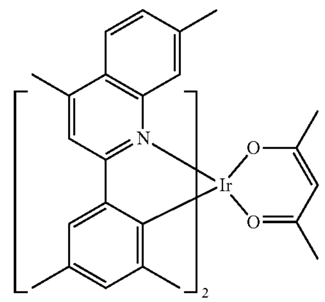
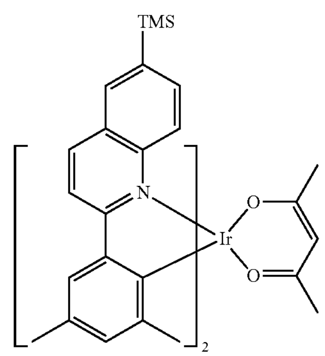
TMS
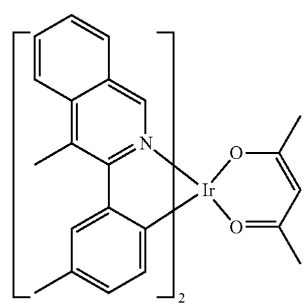
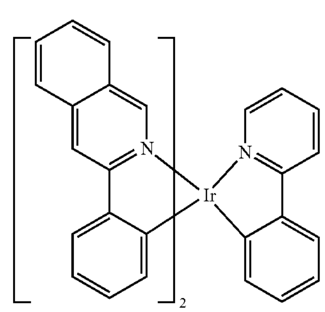

-continued
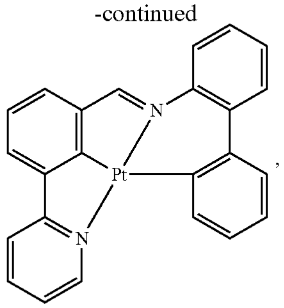
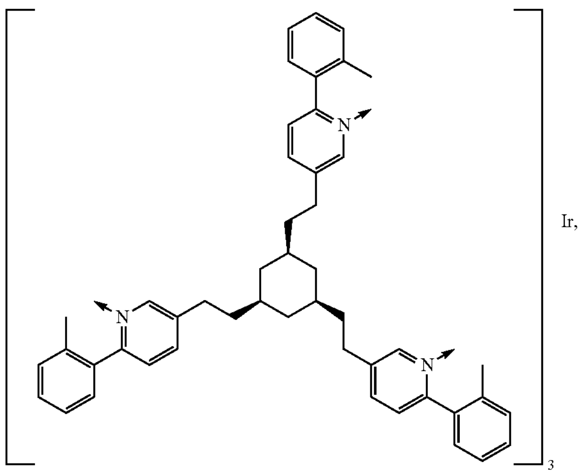
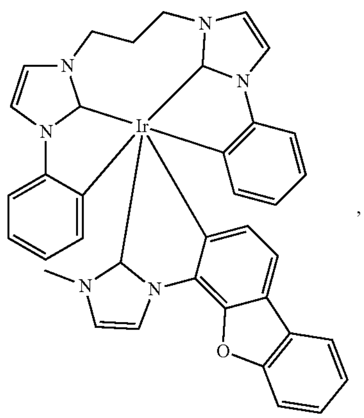
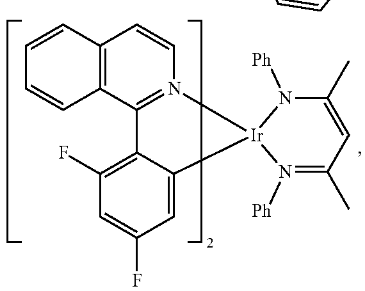
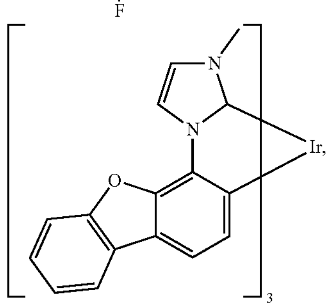
-continued
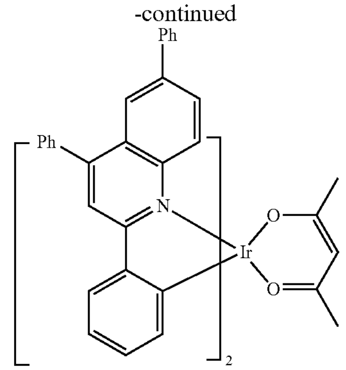
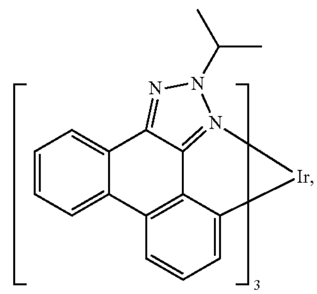
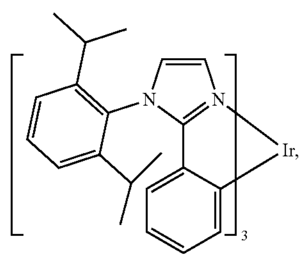
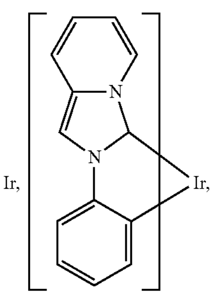
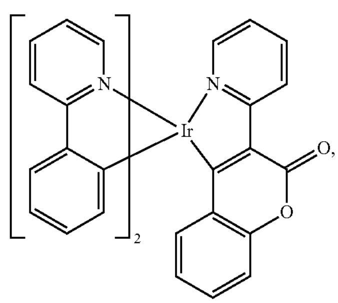
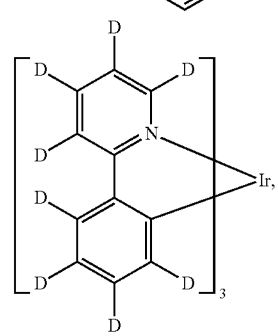

-continued

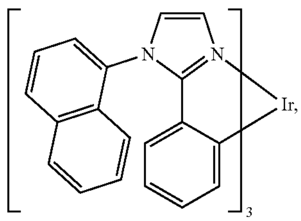

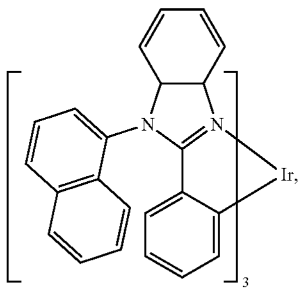

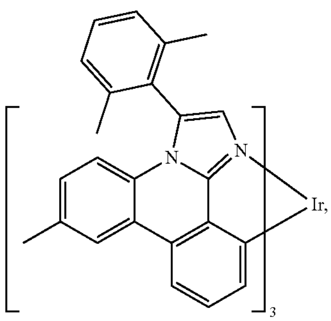

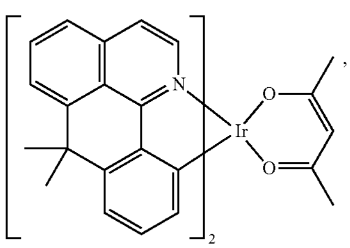

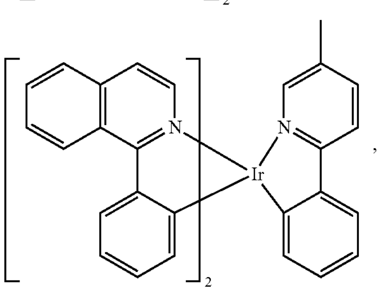

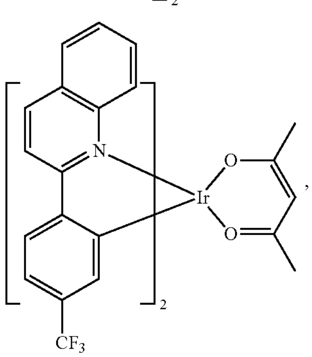

-continued

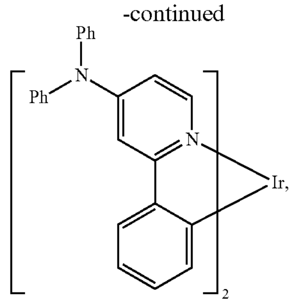

and

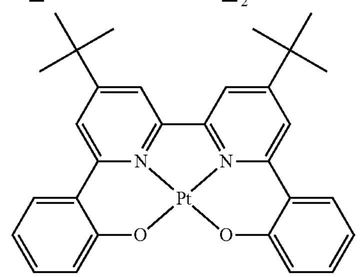

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

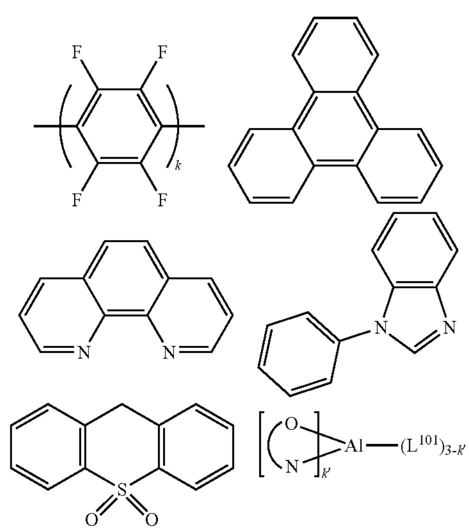

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

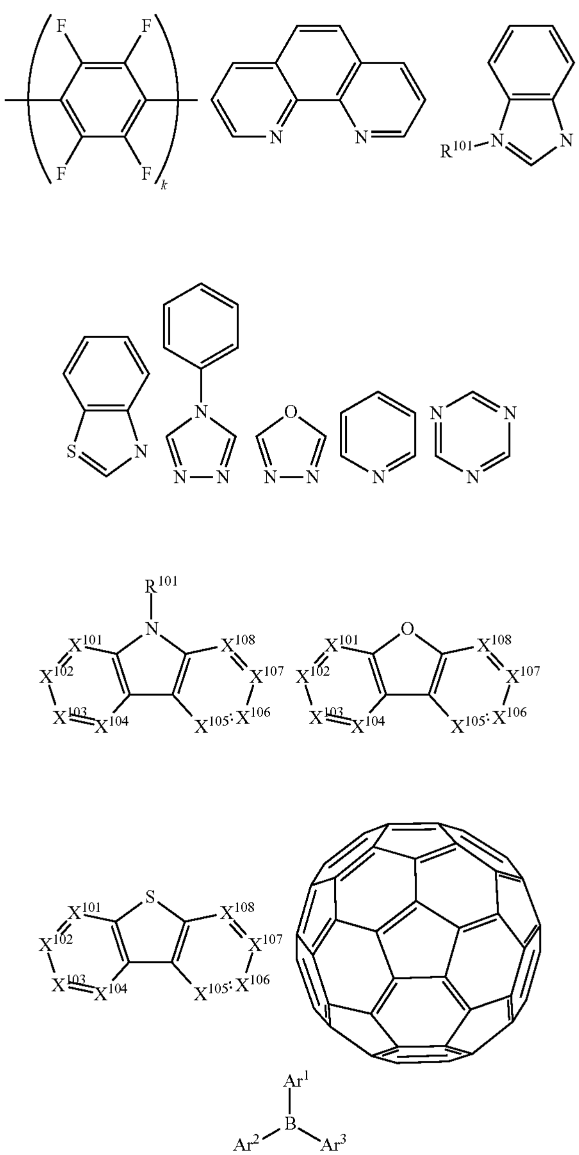

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

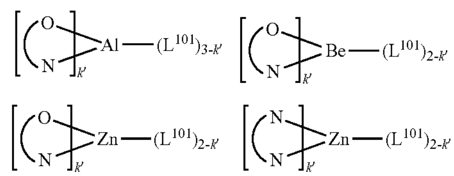

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, US6656612, US8415031, WO2003060956, WO2007111263, WO2009148269, WO2010067894, WO2010072300, WO2011074770, WO2011105373, WO2013079217, WO2013145667, WO2013180376, WO2014104499, WO2014104535,

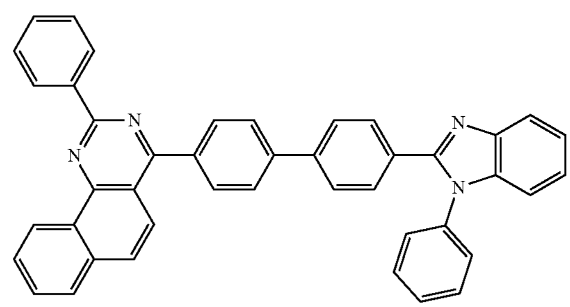

,

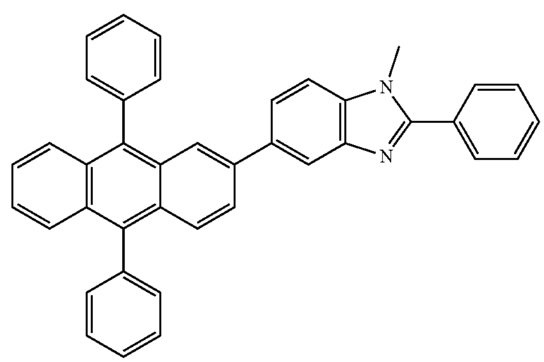

,

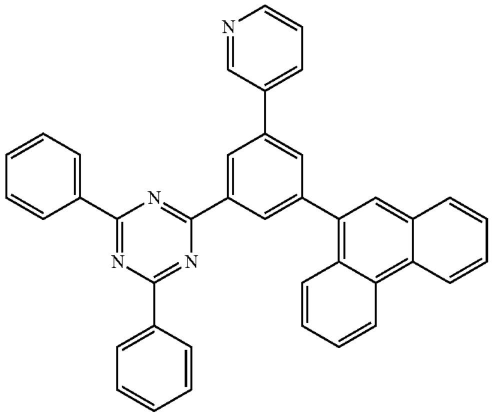
,
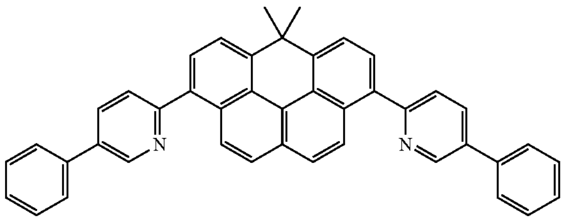
,
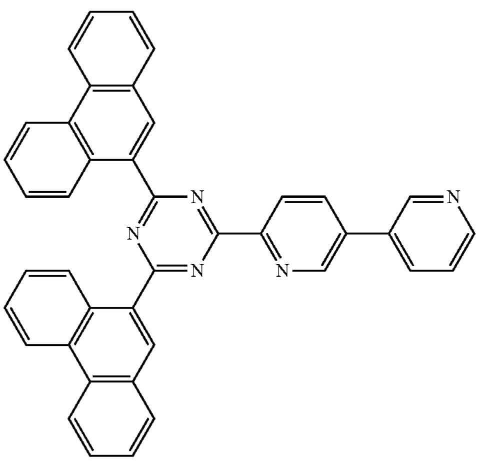
,
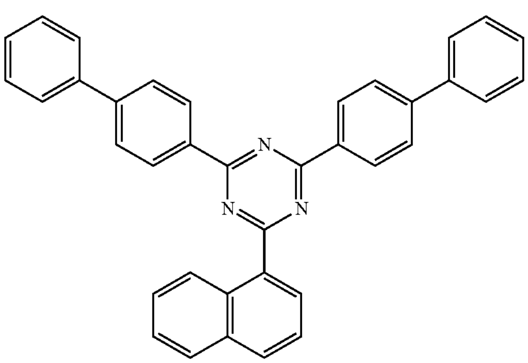
,
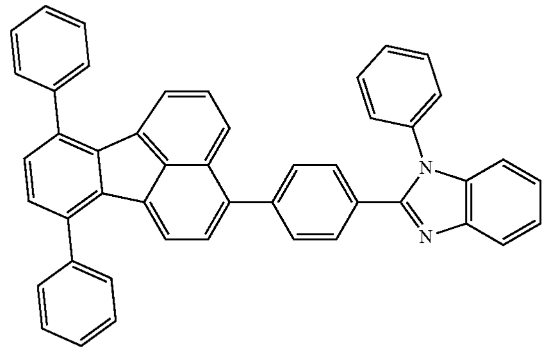
,
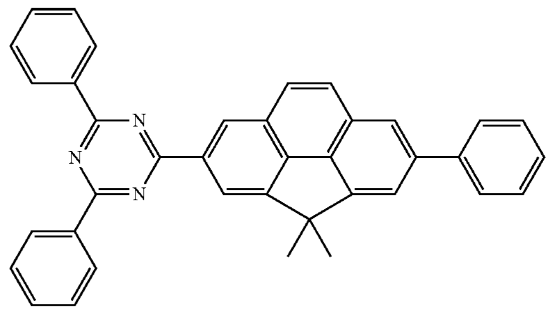
,
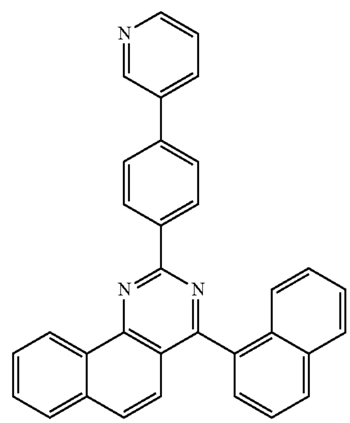
,
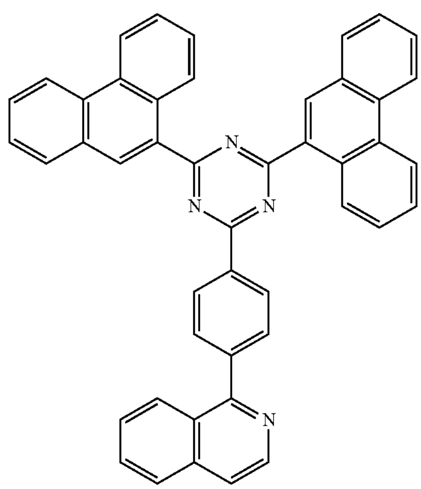
, -continued
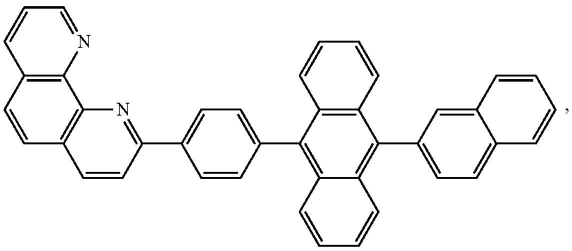
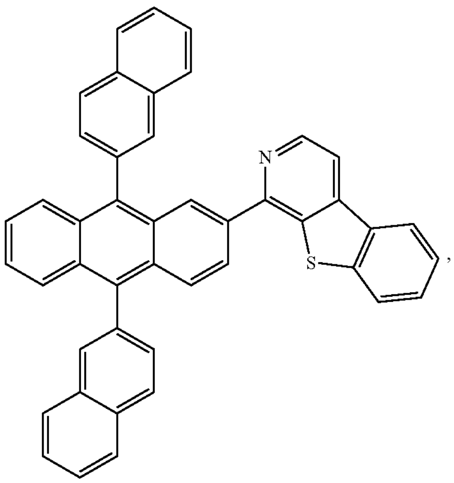
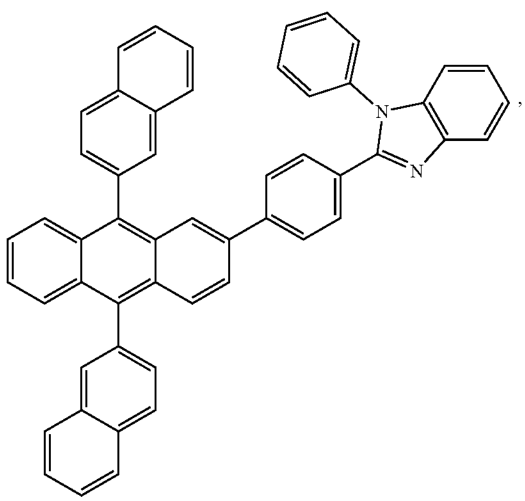
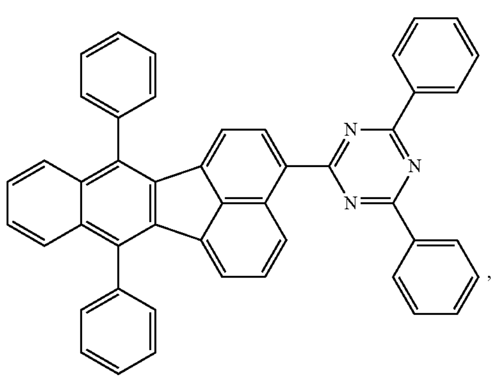 [SMILES: c1ccc(-c2nc(-c3ccccc3)nc(-c3ccc4c5c(cccc35)-c3c-4c(-c4ccccc4)c4ccccc4c3-c3ccccc3)n2)cc1 ; ","]
-continued
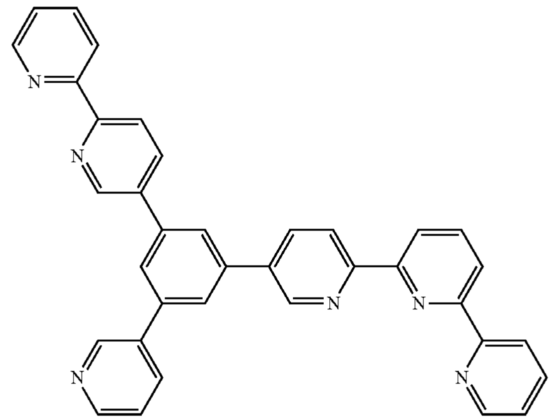
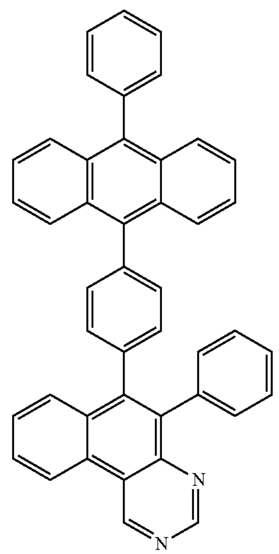
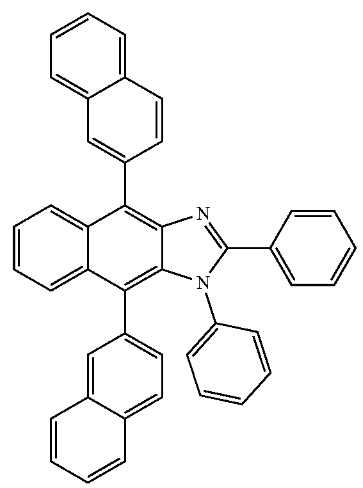

-continued
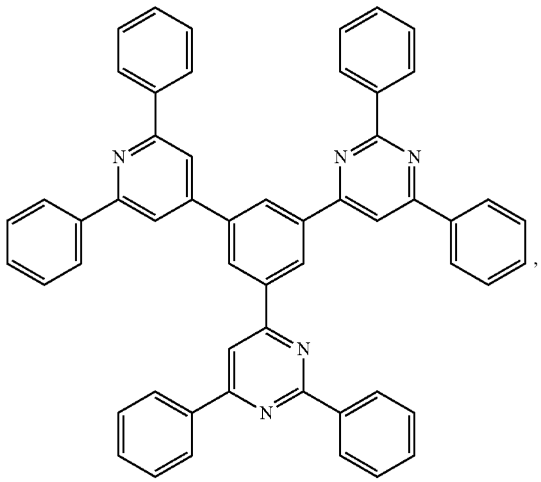
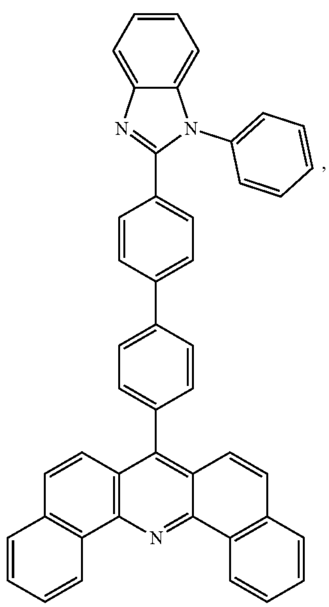
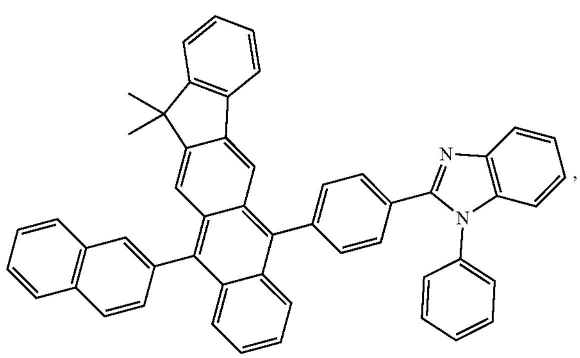
-continued
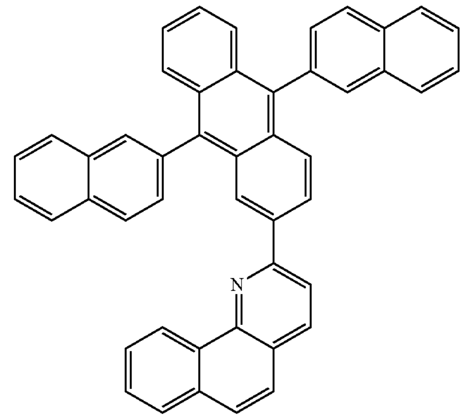
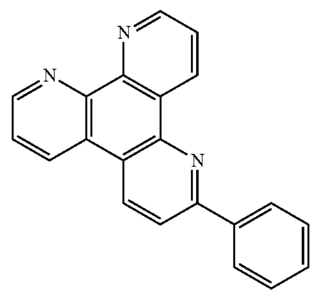
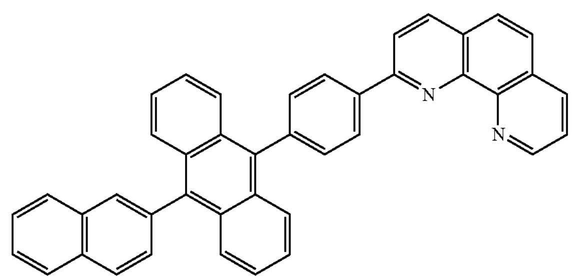
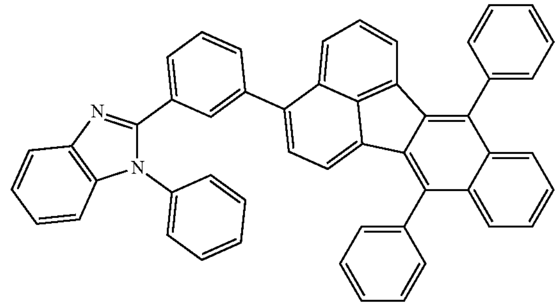

-continued
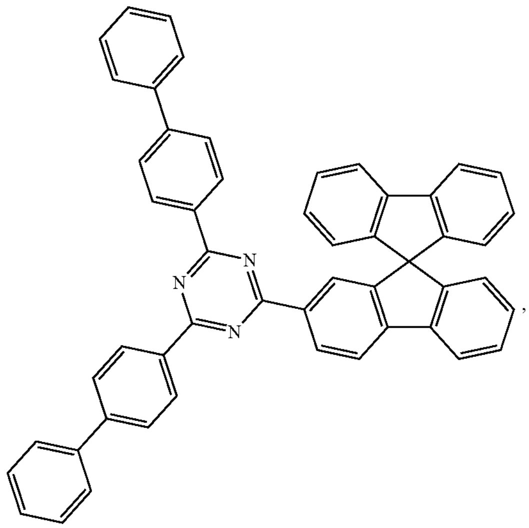
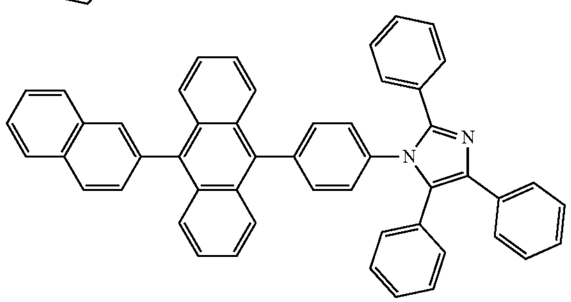
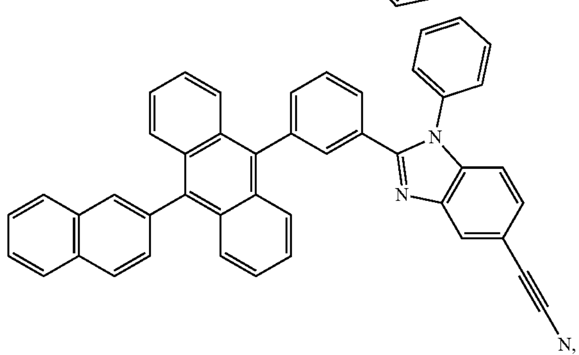
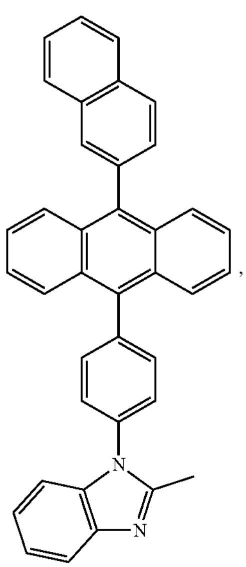
-continued
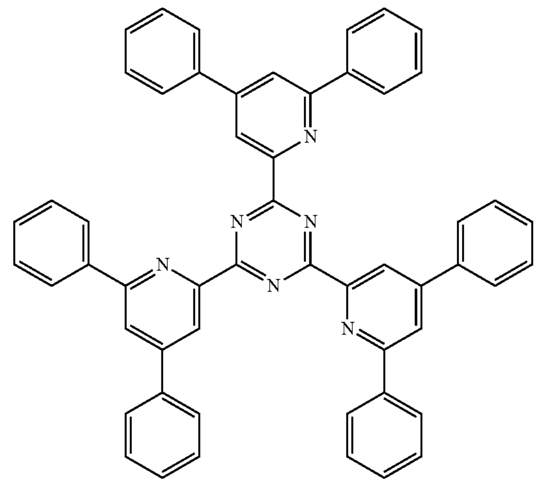
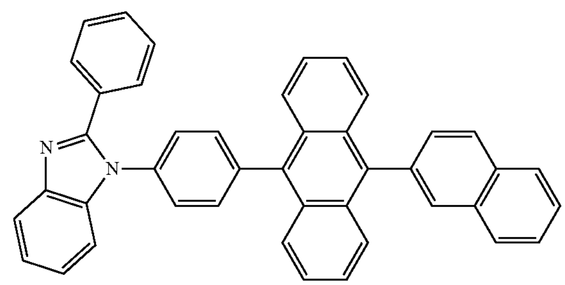
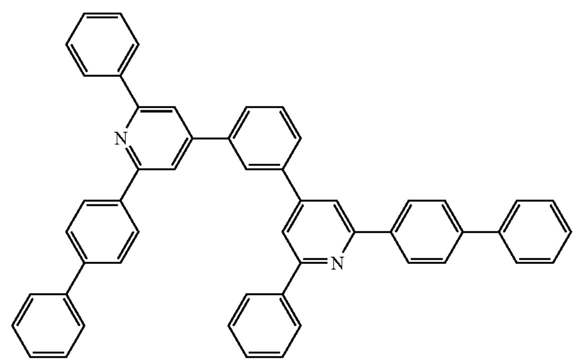
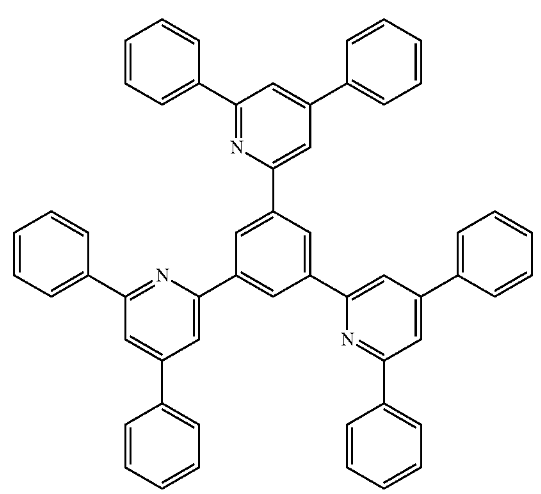

-continued

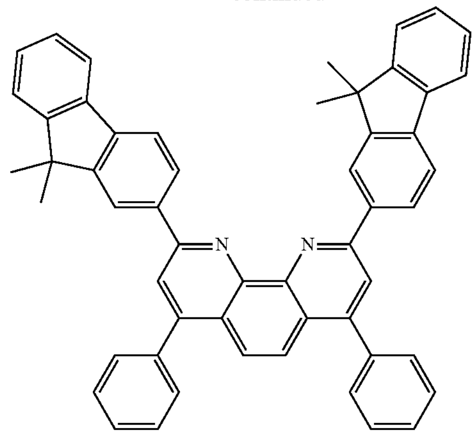

, and

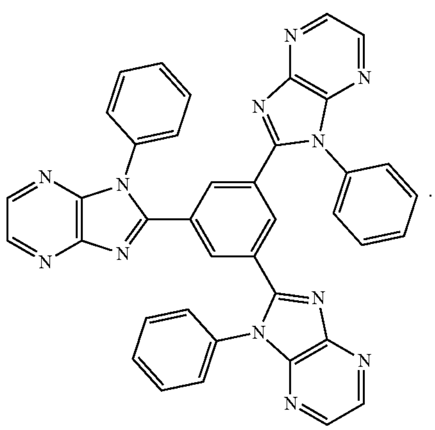 [SMILES: c1ccc(-n2c(-c3cc(-c4nc5nccnc5n4-c4ccccc4)cc(-c4nc5nccnc5n4-c4ccccc4)c3)nc3nccnc32)cc1 ; "."]

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Synthesis of Materials (A)

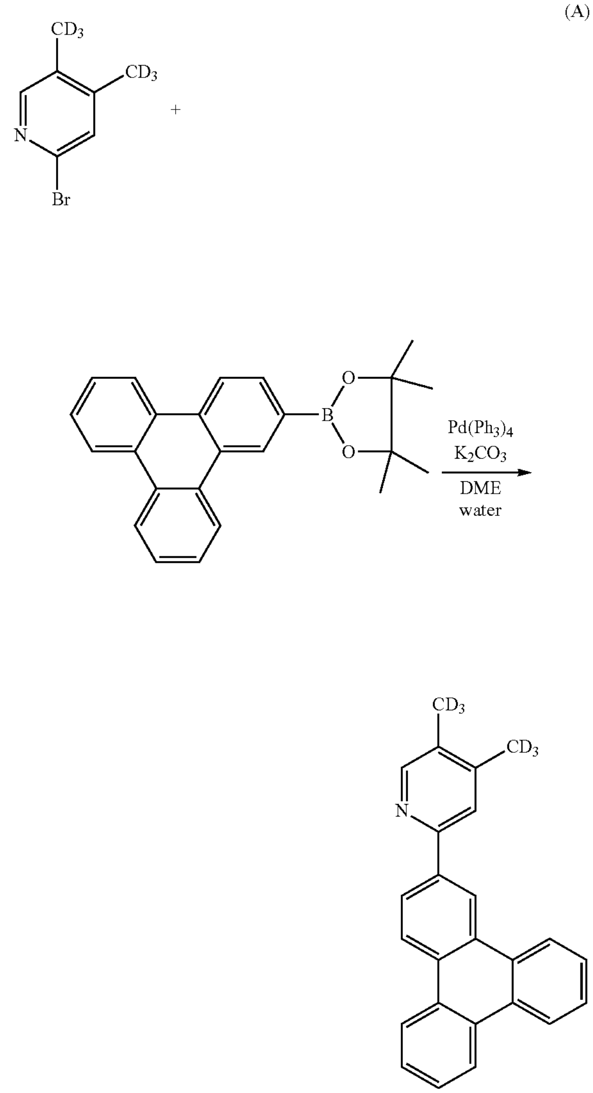

4,4,5,5-tetramethyl-2-(triphenylen-2-yl)-1,3,2-dioxaborolane (5.09 g, 14.37 mmol), 2-bromo-4,5-bis(methyl-d3)pyridine (3.04 g, 15.80 mmol), potassium phosphate tribasic monohydrate (6.62 g, 28.7 mmol), dicyclohexyl(2',6''-dimethoxy-[1,1'-biphenyl]-2-yl)phosphane (0.354 g, 0.862 mmol), toluene (75 ml), and water (25.00 ml) were added to a 300 mL 3-neck flask. Nitrogen was bubbled into the mixture, and then $Pd_2(dba)_3$ (0.395 g, 0.431 mmol) was added. The reaction mixture was heated to reflux for 16 hours under nitrogen. After the reaction mixture was cooled to room temperature, it was diluted with ethyl acetate and water, and filtered off an insoluble solid. The solvent was removed and the residue was purified by column chromatography on silica gel eluted with 0 to 5% ethyl acetate/DCM to obtain 1.1 g of a yellow solid (23%).

(B)

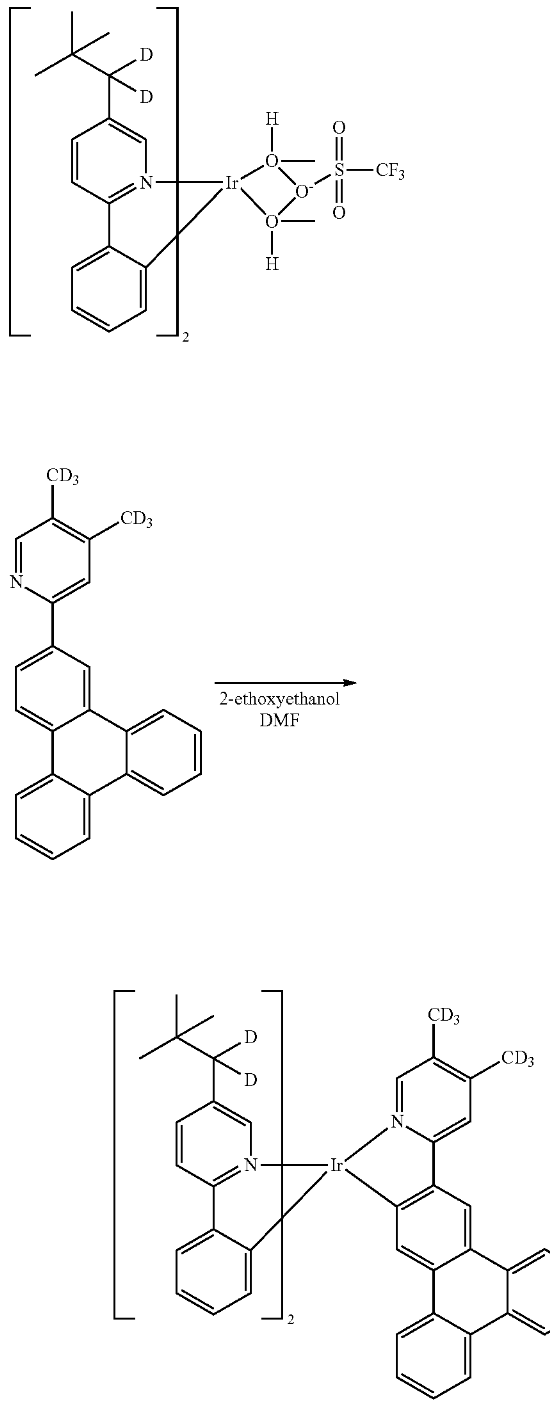

Precursor (2.8 g, 3.26 mmol), 4,5-bis(methyl-d3)-2-(triphenylen-2-yl)pyridine (1.994 g, 5.87 mmol), 2-ethoxyethanol (25 ml) and DMF (25.00 ml) was added to a 250 mL round bottom flask. The reaction mixture was degassed and replaced with nitrogen and heated to 80° C. internal temperature overnight under nitrogen for 2 weeks. After the solvent was removed, the residue was purified by column chromatography eluting with 50% toluene/35% heptane/15% dichloromethane to obtain 1.17 g of desired material (37%).

(C)

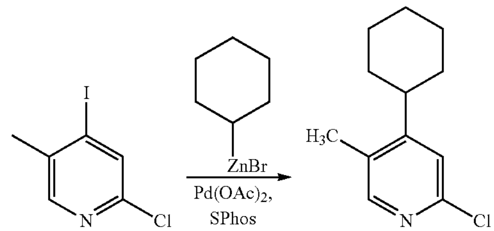

A 3 L 4-neck flask was equipped with a mechanical stirrer, an addition funnel, and a thermocouple, and was charged with 2-chloro-4-iodo-5-methylpyridine (30.0 g, 118.0 mmol, 1.0 equiv) in anhydrous tetrahydrofuran (237 mL). The solution was sparged with nitrogen for 15 minutes then cooled to 0° C. Then, 2-dicyclohexyl phosphino-2',6'-dimethoxybi-phenyl (SPhos) (2.92 g, 7.1 mmol, 0.06 equiv) and palladium(II) acetate (0.8 g, 3.55 mmol, 0.03 equiv) were added. A 0.61 M solution of cyclohexylzinc(II) bromide in tetrahydrofuran (213.0 mL, 130 mmol, 1.1 equiv) was added drop-wise, maintaining the temperature below 5° C. When addition was completed, the reaction mixture was allowed to warm to room temperature and stirred overnight. Saturated aqueous sodium bicarbonate (200 mL) and ethyl acetate (200 mL) were added. The layers were separated and the aqueous layer was extracted with ethyl acetate (200 mL). The combined organic layers were dried over sodium sulfate, filtered and concentrated under reduced pressure. The crude product was chromatographed on silica gel (500 g), eluting with a gradient of 0-30% ethyl acetate in heptanes (1.0 L of solvent mixture for each 10% increase in polarity), to give 2-chloro-4-cyclohexyl-5-methylpyridine (18.0 g, 73% yield) as a yellow syrup.

(D)

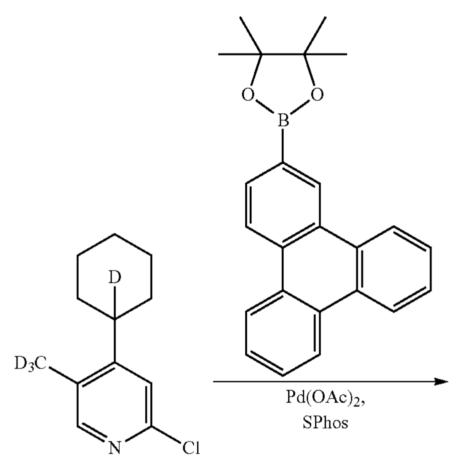

-continued

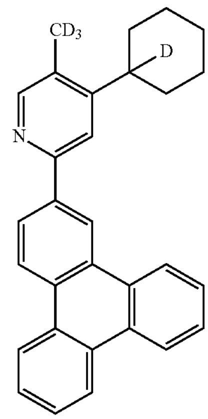

A 250 mL 4-neck round bottom flask, equipped with a condenser, stir bar and thermocouple, was charged with 4,4,5,5-tetramethyl-2-(triphenylen-2-yl)-1,3,2-dioxaborolane (10.3 g, 29.1 mmol, 1.0 equiv), 2-chloro-4-(cyclohexyl-1-d)-5-(methyl-$d_3$)pyridine (6.53 g, 30.5 mmol, 1.05 equiv), potassium carbonate (10.05 g, 72.7 mmol, 2.5 equiv), 1,4-dioxane (109 mL) and DIUF water (36 mL). The mixture was sparged with nitrogen for 15 minutes, then palladium(II) acetate (0.4 g, 1.745 mmol, 0.06 equiv) and 2-dicyclohexyl phosphino-2',6'-dimethoxy-biphenyl (SPhos) (1.4 g, 3.49 mmol, 0.12 equiv) were added, and the reaction mixture heated at 85° C. overnight. The cooled reaction mixture was filtered through paper and the solid was washed with ethyl acetate (100 mL) and dichloromethane (200 mL). The filtrate was diluted with water (100 mL). Then, the organic layer was separated and dried over sodium sulfate, filtered, and concentrated under reduced pressure. The solid was triturated with warm ethyl acetate (20 mL) at 50° C. and filtered to give 4-(cyclohexyl-1-d)-5-(methyl-$d_3$)-2-(triphenylen-2-yl)pyridine (7.1 g, 60% yield) as a white solid.

(E)

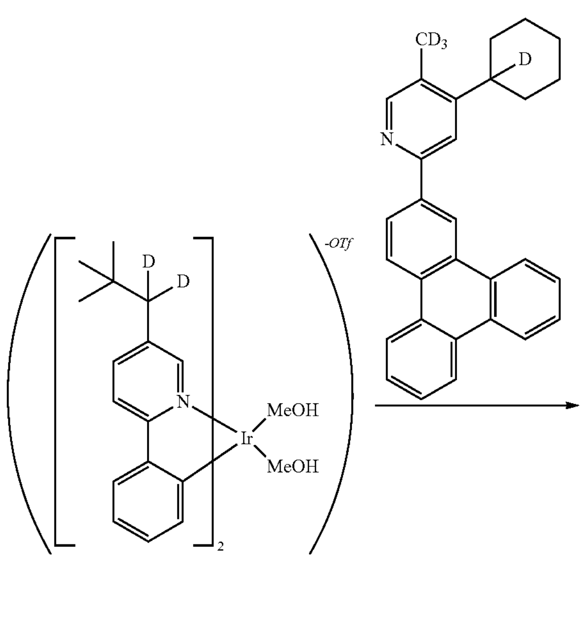

-continued

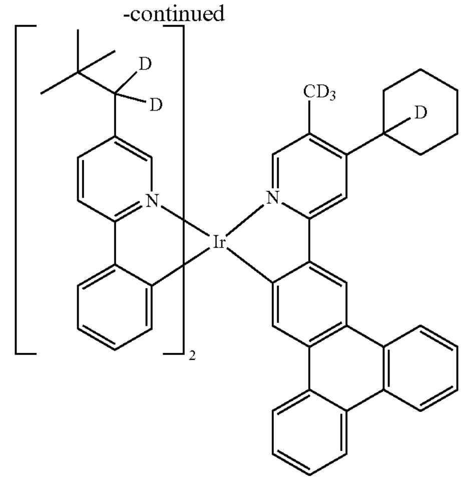

A 50 mL, 2-neck round bottom flask, equipped with a condenser, thermocouple and stir bar, was charged with Ir precursor (1.6 g, 1.87 mmol, 1.0 equiv), 4-(cyclohexyl-1-d)-5-(methyl-$d_3$)-2-(triphenylen-2-yl)pyridine (1.4 g, 3.45 mmol, 2.1 equiv), 2-ethoxyethanol (15.0 mL) and N,N-dimethylformamide (15.0 mL). The flask was wrapped with foil to block light and the mixture heated at 85° C. for 7 days, After the reaction mixture was cooled to room temperature, it was filtered and the solid washed with methanol (50 mL). The solid was dissolved in dichloromethane and chromatographed on a short pad of basic alumina (30 g) layered with silica gel (~30 g), eluting with dichloromethane (200 mL), to give bis[5-(2,2-dimethylpropyl-1,1-$d_2$)-2-(phenyl-2'-yl) ppyridin-1-yl]-[4-(cyclohexyl-1-d)-5-(methyl-$d_3$)-2-((triphenylen-2-yl)-3'-yl)pyridin-1-yl]iridium(III) (1.0 g, 51% yield, 99.5% UHPLC purity) as a yellow solid.

Device Examples

All devices were fabricated by high vacuum (<$10^{-7}$ Torr) thermal evaporation. The anode electrode was 80 nm of indium tin oxide (ITO). The cathode electrode consisted of 1 nm of LiQ followed by 100 nm of Al. All devices were encapsulated with a glass lid sealed with an epoxy resin in a nitrogen glove box (<1 ppm of $H_2O$ and $O_2$) immediately after fabrication, and a moisture getter was incorporated inside the package.

The organic stack of the device examples consisted of sequentially, from the ITO surface, 10 nm of LG-101 (available from LG Chem. Inc.) as the hole injection layer (HIL), 40 nm of PPh-TPD as the hole transporting layer (HTL), 5 nm of electron blocking layer comprised of (H-3), 40 nm of emissive layer (EML) comprised of premixed host doped with 12 wt % of the invention compound or comparative compound as the emitter, 35 nm of aDBT-ADN with 35 wt % LiQ as the electron-transport layer (ETL). The premixed host comprises of a mixture of HM1 and HM2 in a weight ratio of 7:3 and was deposited from a single evaporation source. The comparative example with Compound A was fabricated similarly to the Device Examples. The chemical structures of the compounds used are shown below:

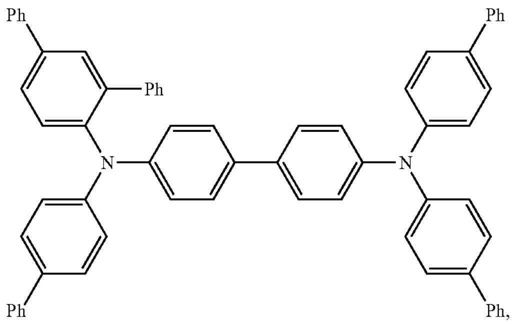
PPh-TPD
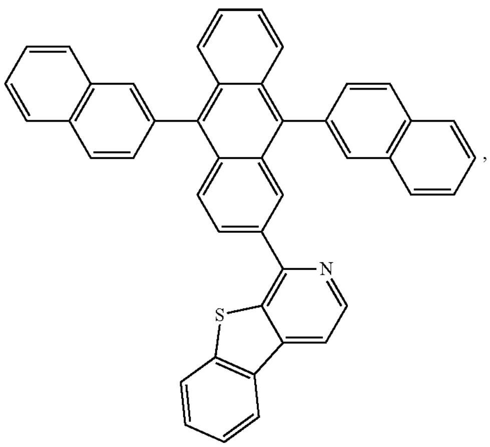
aDBT-ADN
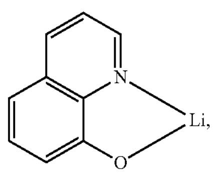
LiQ
HM1
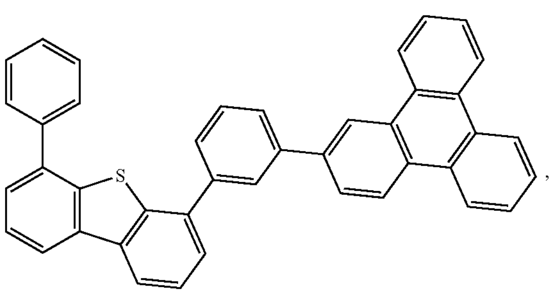
HM2
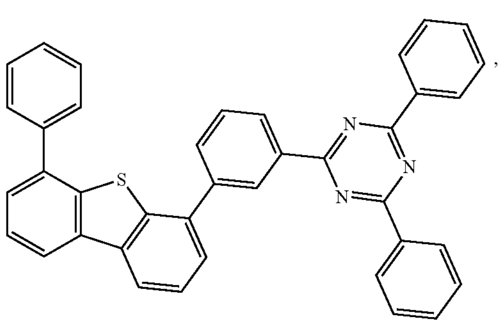
-continued
H-3
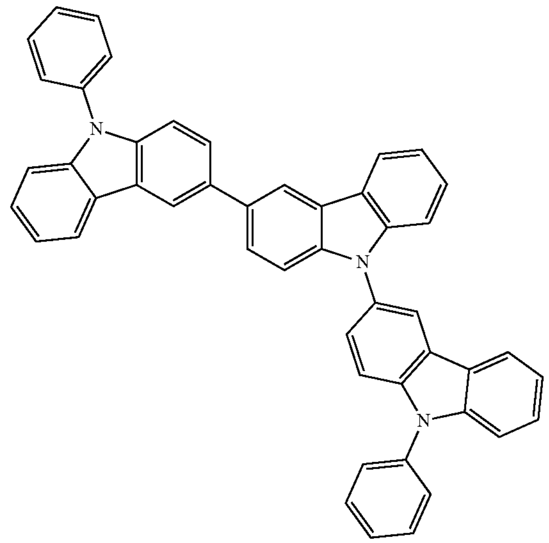
Compound II-1325
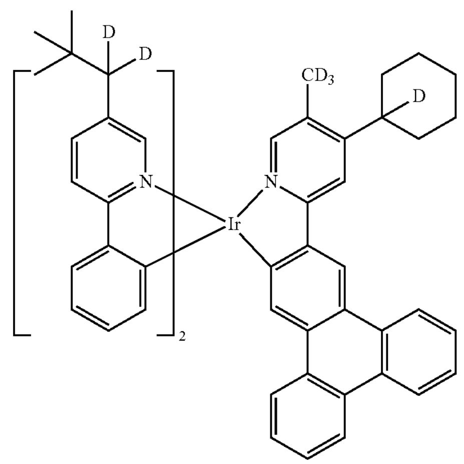
Inventive compound
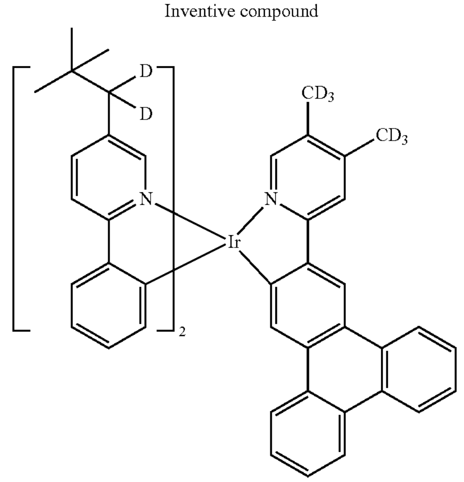
Comparative compound
Provided in Table 1 below is a summary of the device data including emission color, voltage, luminous efficiency (LE), external quantum efficiency (EQE) and power efficiency (PE), recorded at 1000 nits for device examples.

TABLE 1

| Device | Emission Color | Voltage [V] | LE [cd/A] | EQE [%] | PE [lm/W] |
|---|---|---|---|---|---|
| Inventive compound Compound II-1325 | Green | 0.97 | 1.1 | 1.09 | 1.12 |
| Comparative compound I | Green | 1 | 1 | 1 | 1 |

The data in Table 1 show that the device using the inventive compound as the emitter achieved the same color emission but higher efficiency and lower voltage in comparison with the comparative example. The only difference between the inventive example Compound II-1325 and the comparative example compound was the substituent at the $R^{1a}$ position of Formula II, which is the key to achieving higher device efficiency likely due to the decreased aggregation and enhanced alignment of emitter in the device.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound of $(L_A)_{3-n}Ir(L_B)_n$ of Formula I

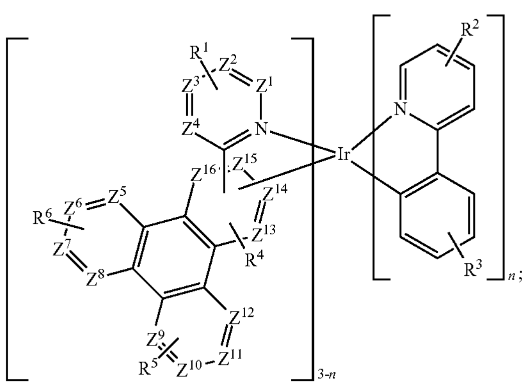

wherein n=0, 1, or 2;

wherein $Z^1$ to $Z^{16}$ are each independently C or N;

wherein any of $Z^{13}$ to $Z^{16}$ is C when it forms a bond with Ir, or when it forms a bond with the ring having $R^1$;

wherein any chelate ring comprising Ir is a 5-membered ring;

wherein $R^1$ to $R^6$ each independently represents mono to the maximum allowable substitution, or no substitution;

wherein each $R^1$ to $R^6$ is independently hydrogen or a substituent selected from the group consisting of deuterium, halogen, alkyl, cycloalkyl, heteroalkyl, heterocycloalkyl, arylalkyl, alkoxy, aryloxy, amino, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

wherein any two substituents may be joined or fused together to form a ring;

$Z^2$ and $Z^3$ are both C and each of $Z^2$ and $Z^3$ has a substituent $R^1$ that is hydrogen, alkyl, or cycloalkyl group comprising five or more C atoms wherein the $R^1$ that is alkyl or cycloalkyl may be fully or partially deuterated;

at least one $R^1$ bonded to $Z^2$ or $Z^3$ is a cycloalkyl group comprising five or more C atoms;

the pyridine ring containing $R^2$ has at least one substituent $R^2$ that is an alkyl group;

the at least one $R^2$ that is an alkyl group bonds at carbon 4 and/or 5 of the pyridine ring and the alkyl group is fully or partially deuterated;

at least one of the following is true:

$R^2$ is an alkyl group that is partially deuterated;

the $R^1$ that is cycloalkyl contains no deuterium or is partially deuterated.

2. The compound of claim 1, wherein each $R^1$ to $R^6$ is independently hydrogen, or a substituent selected from the group consisting of deuterium, fluorine, alkyl, cycloalkyl, heteroalkyl, alkoxy, aryloxy, amino, alkenyl, cycloalkenyl, heteroalkenyl, aryl, L heteroaryl, nitrile, isonitrile, sulfanyl, and combinations thereof.

3. The compound of claim 1, wherein n=2.

4. The compound of claim 1, wherein $Z^1$ to $Z^{16}$ are each C.

5. The compound of claim 1, wherein at least one of $Z^1$ and $Z^4$ to $Z^{16}$ is N.

6. The compound of claim 1, wherein $L_B$ is selected from the group consisting of:

$L_{B2}$

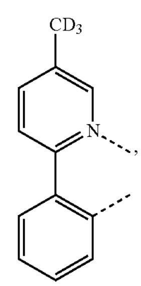

$L_{B4}$

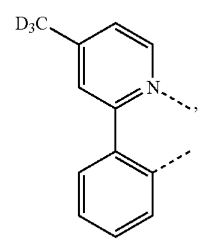

$L_{B18}$

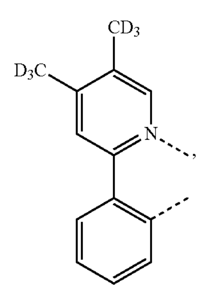

-continued
$L_{B24}$
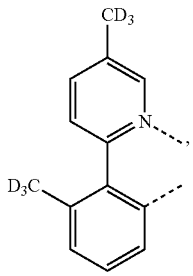
$L_{B26}$
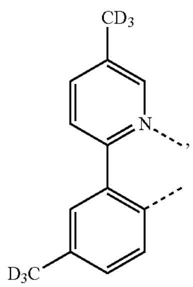
$L_{B28}$
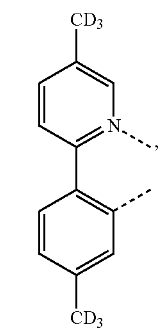
$L_{B34}$
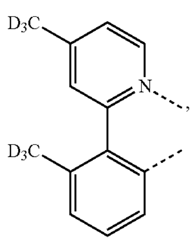
$L_{B36}$
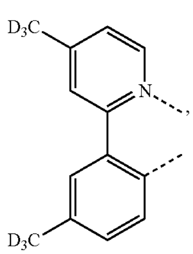
-continued
$L_{B38}$
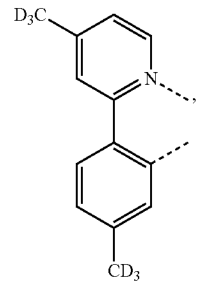
$L_{B40}$
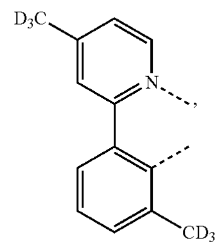
$L_{B104}$
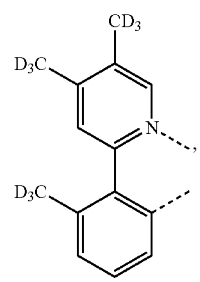
$L_{B106}$
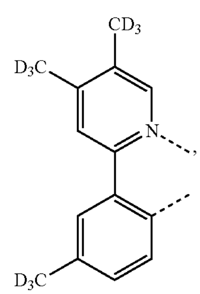
$L_{B108}$
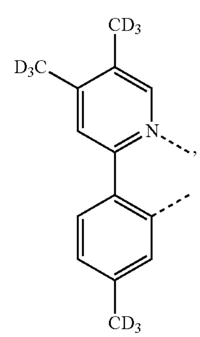

-continued
$L_{B110}$
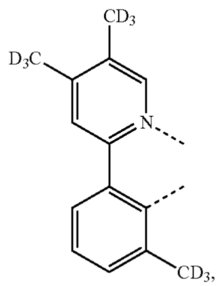
$L_{B112}$
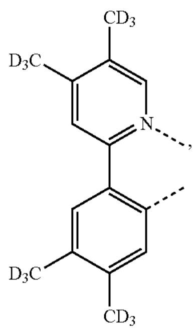
$L_{B114}$
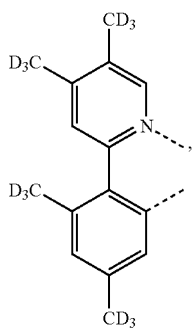
$L_{B116}$
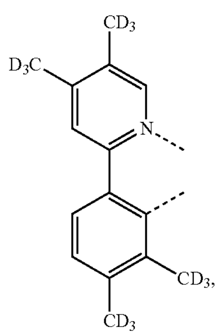
$L_{B118}$
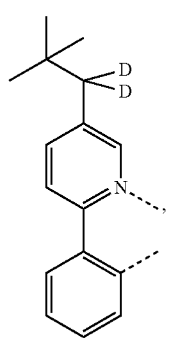
-continued
$L_{B120}$
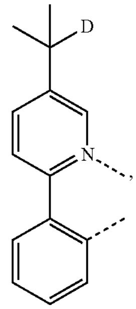
$L_{B122}$
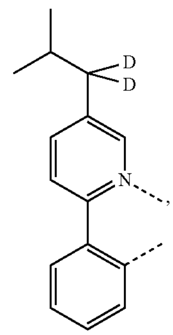
$L_{B126}$
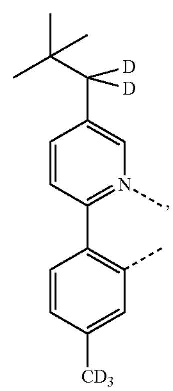
$L_{B128}$
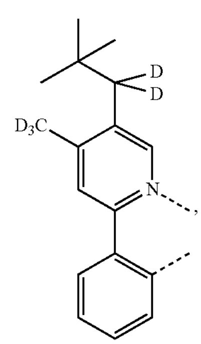

-continued
$L_{B130}$
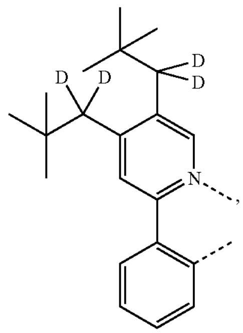
$L_{B132}$
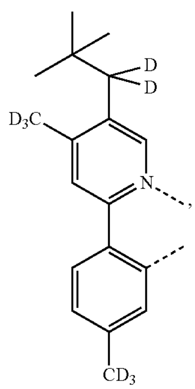
$L_{B134}$
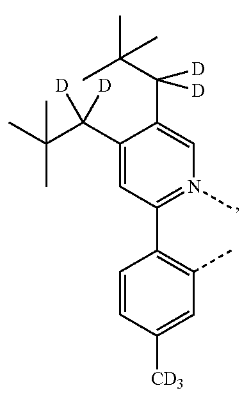
$L_{B136}$
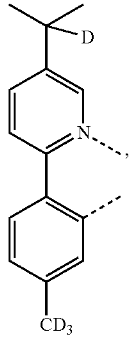
-continued
$L_{B138}$
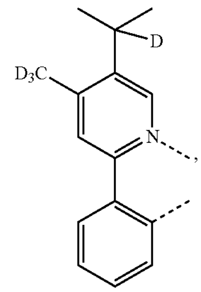
$L_{B140}$
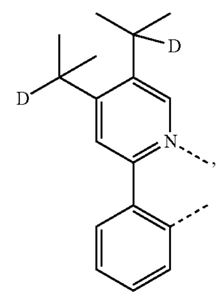
$L_{B142}$
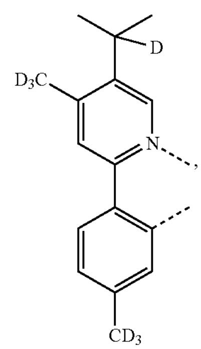
$L_{B144}$
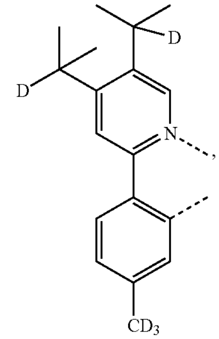

-continued
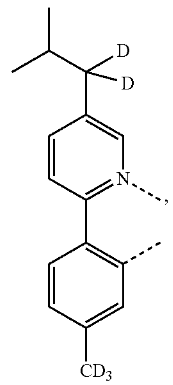
$L_{B156}$
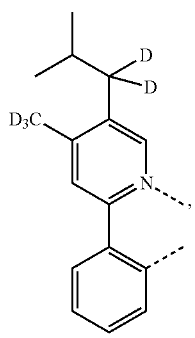
$L_{B158}$
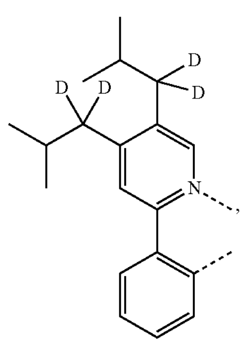
$L_{B160}$
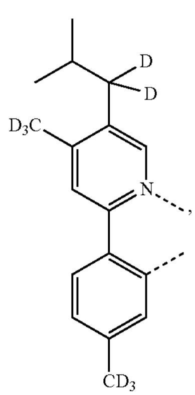
$L_{B162}$
-continued
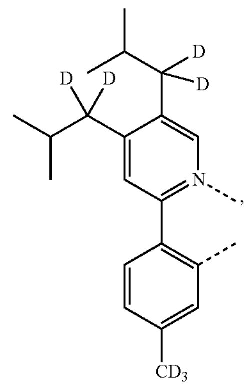
$L_{B170}$
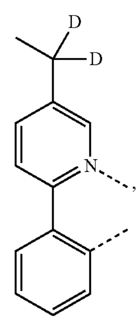
$L_{B198}$
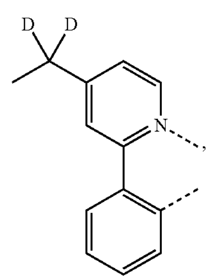
$L_{B200}$
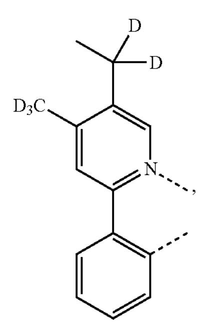
$L_{B204}$ -continued
L$_{B206}$
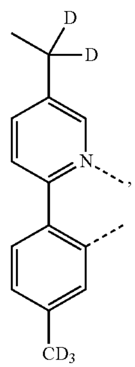
L$_{B208}$
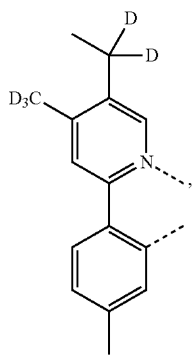
L$_{B210}$
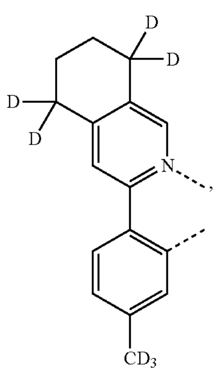
L$_{B212}$
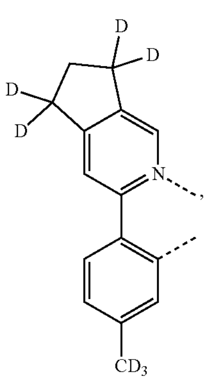
-continued
L$_{B222}$
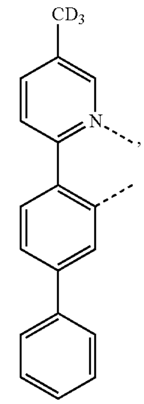
L$_{B224}$
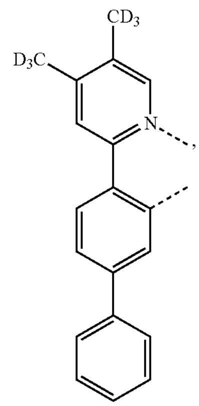
L$_{B225}$
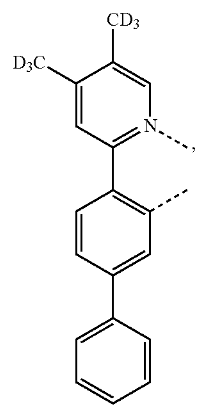
L$_{B227}$
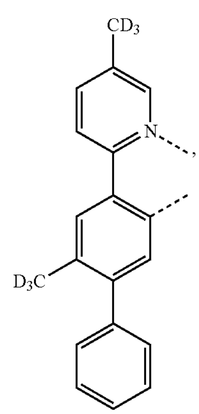

-continued
$L_{B229}$
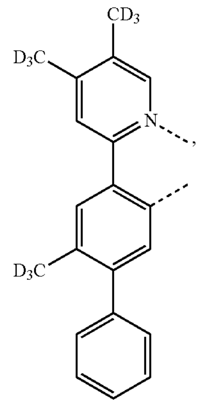
$L_{B231}$
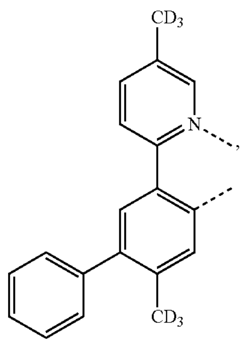
$L_{B233}$
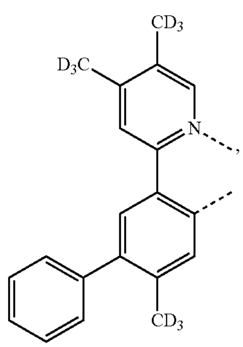
$L_{B240}$
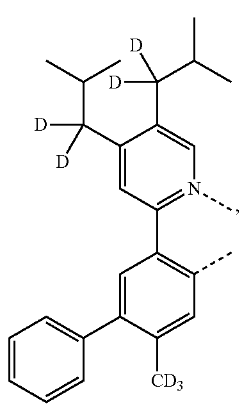
-continued
$L_{B242}$
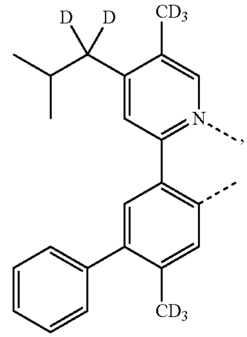
$L_{B244}$
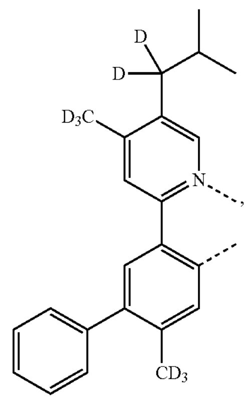
$L_{B246}$
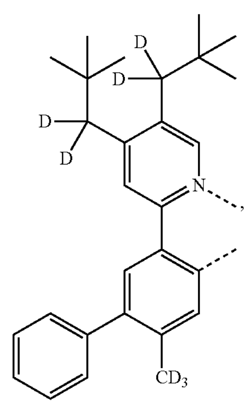
$L_{B248}$
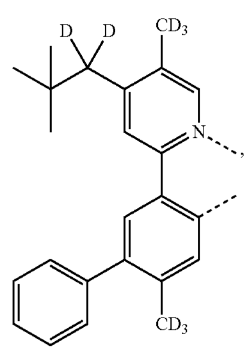

-continued $L_{B250}$

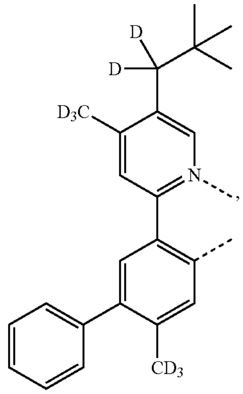

$L_{B252}$

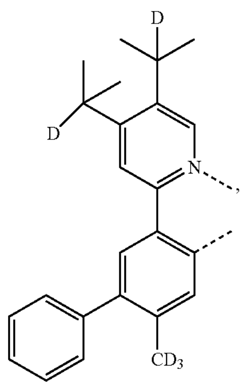

$L_{B254}$

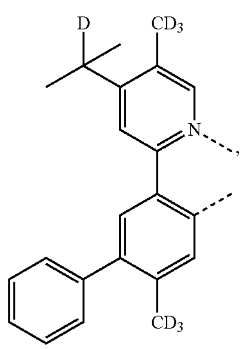

$L_{B256}$

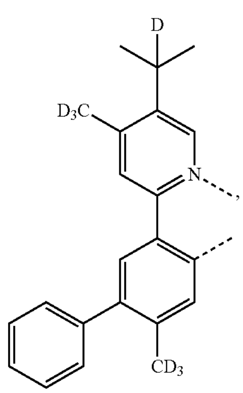

-continued $L_{B258}$

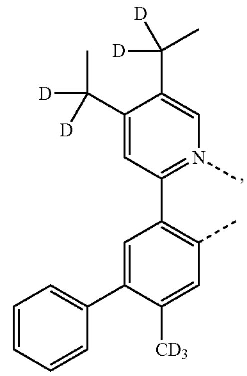

$L_{B260}$

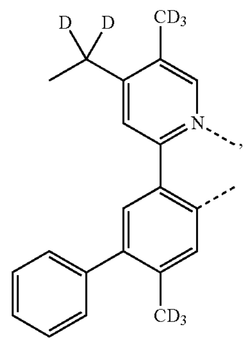

and $L_{B262}$

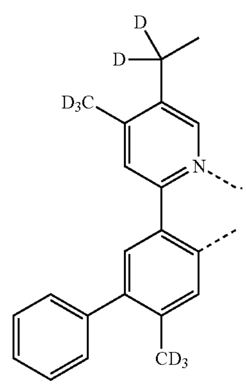

7. The compound of claim 1, wherein the compound is selected from the group consisting of compounds II-94 to II-111, II-114 to II-131, II-134 to II-158, II-161 to II-185, II-187 to II-204, II-207 to II-224, II-227 to II-251, II-254 to II-278, II-280 to II-297, II-300 to II-317, II-320 to II-344, II-347 to II-371, II-373 to II-390, II-393 to II-410, II-413 to II-437, II-440 to II-464, II-559 to II-576, II-579 to II-596, II-599 to III-623, II-626 to II-650, II-652 to II-669, II-672 to II-689, II-692 to II-716, II-719 to II-743, II-745 to II-762, II-765 to II-782, II-785 to II-809, II-812 to 1-836, II-838 to II-855, II-858 to II-875, 1-878 to II-902, II-905 to II-929, 1-931 to II-948, II-951 to II-968, II-971 to II-995, II-998 to II-1022, II-1024 to II-1041, II-1044 to II-1061, II-1064 to II-1088, II-1091 to II-1115, II-1210 to II-1227, II-1230 to II-1247, II-1250 to II-1274, 1-1277 to II-1301, II-1303 to II-1320, II-1323 to II-1340, II-1343 to II-1367, II-1370 to II-1394 that are based on Formula II

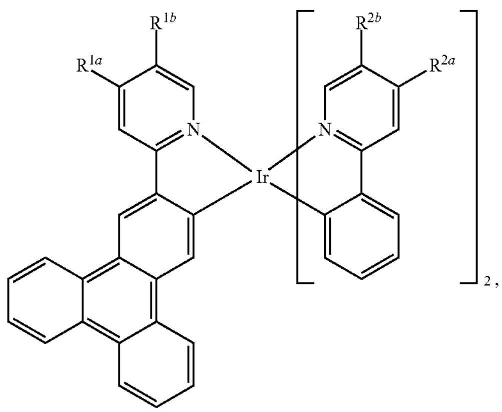

compounds III-94 to III-111, III-114 to III-131, III-134 to III-158, III-161 to III-185, III-187 to III-204, III-207 to III-224, III-227 to III-251, III-254 to III-278, III-280 to III-297, III-300 to III-317, III-320 to III-344, III-347 to III-371, III-373 to III-390, III-393 to III-410, III-413 to III-437, III-440 to III-464, III-559 to III-576, III-579 to III-596, III-599 to III-623, III-626 to III-650, III-652 to III-669, III-672 to III-689, III-692 to III-716, III-719 to III-743, III-745 to III-762, III-765 to III-782, III-785 to III-809, III-812 to III-836, III-838 to III-855, III-858 to III-875, III-878 to III-902, III-905 to III-929, III-931 to III-948, III-951 to III-968, III-971 to III-995, III-998 to III-1022, III-1024 to III-1041, III-1044 to III-1061, III-1064 to III-1088, III-1091 to III-1115, III-1210 to III-1227, III-1230 to III-1247, III-1250 to III-1274, III-1277 to III-1301, III-1303 to III-1320, III-1323 to III-1340, III-1343 to III-1367, III-1370 to III-1394 that are based on Formula III

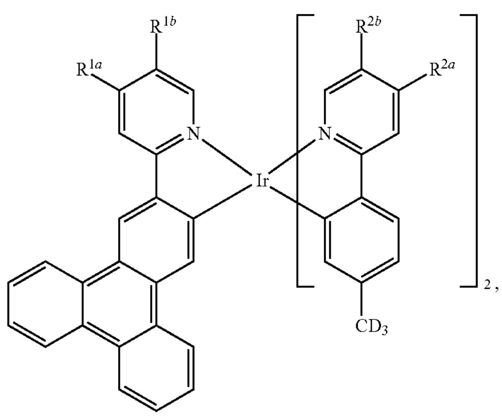

compounds IV-94 to IV-11, IV-114 to IV-131, IV-134 to IV-158, IV-161 to IV-185, IV-187 to IV-204, IV-207 to IV-224, IV-227 to IV-251, IV-254 to IV-278, IV-280 to IV-297, IV-300 to IV-317, IV-320 to IV-344, IV-347 to IV-371, IV-373 to IV-390, IV-393 to IV-410, IV-413 to IV-437, IV-440 to IV-464, IV-559 to IV-576, IV-579 to IV-596, IV-599 to IV-623, IV-626 to IV-650, IV-652 to IV-669, IV-672 to IV-689, IV-692 to IV-716, IV-719 to IV-743, IV-745 to IV-762, IV-765 to IV-782, IV-785 to IV-809, IV-812 to IV-836, IV-838 to IV-855, IV-858 to IV-875, IV-878 to IV-902, IV-905 to IV-929, IV-931 to IV-948, IV-951 to IV-968, IV-971 to IV-995, IV-998 to IV-1022, IV-1024 to IV-1041, IV-1044 to IV-1061, IV-1064 to IV-1088, IV-1091 to IV-1115, IV-1210 to IV-1227, IV-1230 to IV-1247, IV-1250 to IV-1274, IV-1277 to IV-1301, IV-1303 to IV-1320, IV-1323 to IV-1340, IV-1343 to IV-1367, IV-1370 to IV-1394 that are based on Formula IV

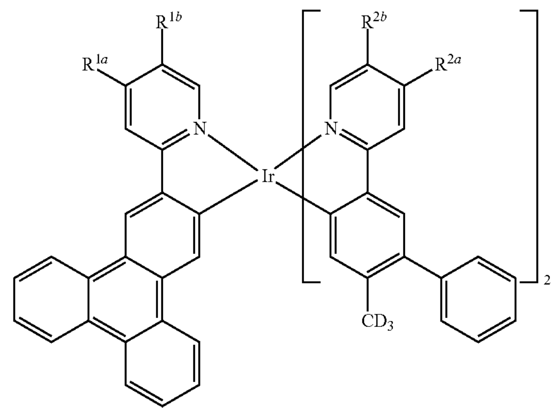

compounds V-94 to V-111, V-114 to V-131, V-134 to V-158, V-161 to V-185, V-187 to V-204, V-207 to V-224, V-227 to V-251, V-254 to V-278, V-280 to V-297, V-300 to V-317, V-320 to V-344, V-347 to V-371, V-373 to V-390, V-393 to V-410, V-413 to V-437, V-440 to V-464, V-559 to V-576, V-579 to V-596, V-599 to V-623, V-626 to V-650, V-652 to V-669, V-672 to V-689, V-692 to V-716, V-719 to V-743, V-745 to V-762, V-765 to V-782, V-785 to V-809, V-812 to V-836, V-838 to V-855, V-858 to V-875, V-878 to V-902, V-905 to V-929, V-931 to V-948, V-951 to V-968, V-971 to V-995, V-998 to V-1022, V-1024 to V-1041, V-1044 to V-1061, V-1064 to V-1088, V-1091 to V-1115, V-1210 to V-1227, V-1230 to V-1247, V-1250 to V-1274, V-1277 to V-1301, V-1303 to V-1320, V-1323 to V-1340, V-1343 to V-1367, V-1370 to V-1394 that are based on Formula V

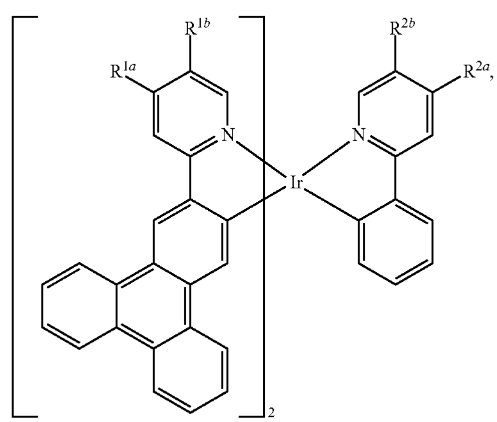

compounds VI-94 to VI-111, VI-114 to VI-131, VI-134 to VI-158, VI-161 to VI-185, VI-187 to VI-204, VI-207 to VI-224, VI-227 to VI-251, VI-254 to VI-278, VI-280 to VI-297, VI-300 to VI-317, VI-320 to VI-344, VI-347 to VI-371, VI-373 to VI-390, VI-393 to VI-410, VI-413 to VI-437, VI-440 to VI-464, VI-559 to VI-576, VI-579 to VI-596, VI-599 to VI-623, VI-626 to VI-650, VI-652 to VI-669, VI-672 to VI-689, VI-692 to VI-716, VI-719 to VI-743, VI-745 to VI-762, VI-765 to VI-782, VI-785 to VI-809, VI-812 to VI-836, VI-838 to VI-855, VI-858 to VI-875, VI-878 to VI-902, VI-905 to VI-929, VI-931 to VI-948, VI-951 to VI-968, VI-971 to VI-995, VI-998 to VI-1022, VI-1024 to VI-1041, VI-1044 to VI-1061, VI-1064 to VI-1088, VI-1091 to VI-1115, VI-1210 to VI-1227, VI-1230 to VI-1247, VI-1250 to VI-1274, VI-1277 to VI-1301, VI-1303 to VI-1320, VI-1323 to VI-1340, VI-1343 to VI-1367, VI-1370 to VI-1394 that are based on Formula VI

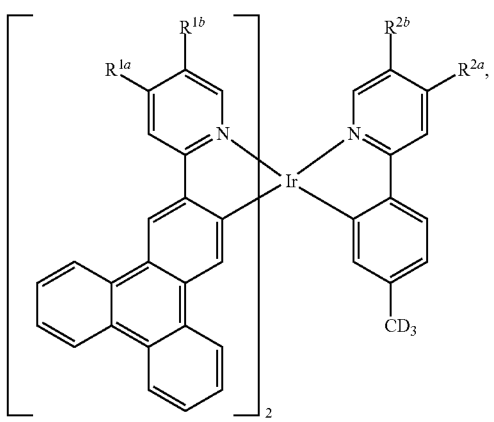

compounds VII-94 to VII-111, VII-114 to VII-131, VII-134 to VII-158, VII-161 to VII-185, VII-187 to VII-204, VII-207 to VII-224, VII-227 to VII-251, VII-254 to VII-278, VII-280 to VII-297, VII-300 to VII-317, VII-320 to VII-344, VII-347 to VII-371, VII-373 to VII-390, VII-393 to VII-410, VII-413 to VII-437, VII-440 to VII-464, VII-559 to VII-576, VII-579 to VII-596, VII-599 to VII-623, VII-626 to VII-650, VII-652 to VII-669, VII-672 to VII-689, VII-692 to VII-716, VII-719 to VII-743, VII-745 to VII-762, VII-765 to VII-782, VII-785 to VII-809, VII-812 to VII-836, VII-838 to VII-855, VII-858 to VII-875, VII-878 to VII-902, VII-905 to VII-929, VII-931 to VII-948, VII-951 to VII-968, VII-971 to VII-995, VII-998 to VII-1022, VII-1024 to VII-1041, VII-1044 to VII-1061, VII-1064 to VII-1088, VII-1091 to VII-1115, VII-1210 to VII-1227, VII-1230 to VII-1247, VII-1250 to VII-1274, VII-1277 to VII-1301, VII-1303 to VII-1320, VII-1323 to VII-1340, VII-1343 to VII-1367, VII-1370 to VII-1394 that are based on Formula VII

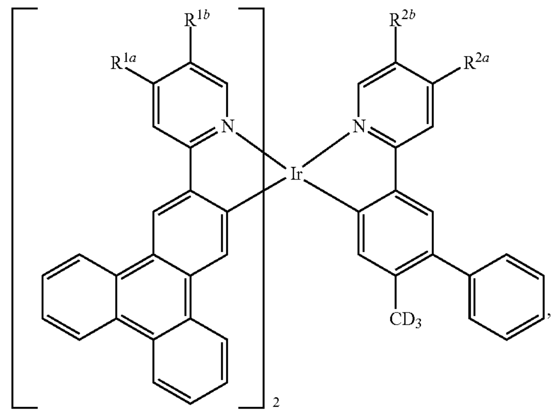

compounds VIII-94 to VIII-111, VIII-114 to VIII-131, VIII-134 to VIII-158, VIII-161 to VIII-185, VIII-187 to VIII-204, VIII-207 to VIII-224, VIII-227 to VIII-251, VIII-254 to VIII-278, VIII-280 to VIII-297, VIII-300 to VIII-317, VIII-320 to VIII-344, VIII-347 to VIII-371, VIII-373 to VIII-390, VIII-393 to VIII-410, VIII-413 to VIII-437, VIII-440 to VIII-464, VIII-559 to VIII-576, VIII-579 to VIII-596, VIII-599 to VIII-623, VIII-626 to VIII-650, VIII-652 to VIII-669, VIII-672 to VIII-689, VIII-692 to VIII-716, VIII-719 to VIII-743, VIII-745 to VIII-762, VIII-765 to VIII-782, VIII-785 to VIII-809, VIII-812 to VIII-836, VIII-838 to VIII-855, VIII-858 to VIII-875, VIII-878 to VIII-902, VIII-905 to VIII-929, VIII-931 to VIII-948, VIII-951 to VIII-968, VIII-971 to VIII-995, VIII-998 to VIII-1022, VIII-1024 to VIII-1041, VIII-1044 to VIII-1061, VIII-1064 to VIII-1088, VIII-1091 to VIII-1115, VIII-1210 to VIII-1227, VIII-1230 to VIII-1247, VIII-1250 to VIII-1274, VIII-1277 to VIII-1301, VIII-1303 to VIII-1320, VIII-1323 to VIII-1340, VIII-1343 to VIII-1367, VIII-1370 to VIII-1394 that are based on Formula VIII

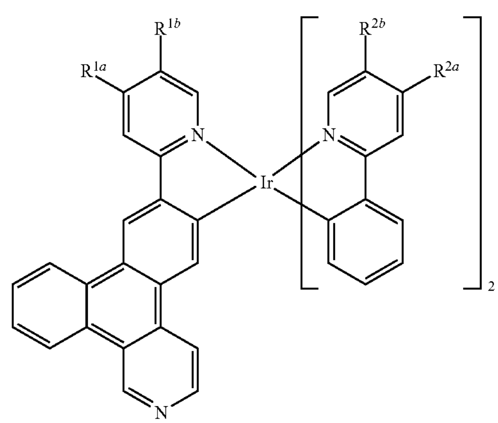

compounds IX-94 to IX-111, IX-114 to IX-131, IX-134 to IX-158, IX-161 to IX-185, IX-187 to IX-204, IX-207 to IX-224, IX-227 to IX-251, IX-254 to IX-278, IX-280 to IX-297, IX-300 to IX-317, IX-320 to IX-344, IX-347 to IX-371, IX-373 to IX-390, IX-393 to IX-410, IX-413 to IX-437, IX-440 to IX-464, IX-559 to IX-576, IX-579 to IX-596, IX-599 to IX-623, IX-626 to IX-650, IX-652 to IX-669, IX-672 to IX-689, IX-692 to IX-716, IX-719 to IX-743, IX-745 to IX-762, IX-765 to IX-782, IX-785 to IX-809, IX-812 to IX-836, IX-838 to IX-855, IX-858 to IX-875, IX-878 to IX-902, IX-905 to IX-929, IX-931 to IX-948, IX-951 to IX-968, IX-971 to IX-995, IX-998 to IX-1022, IX-1024 to IX-1041, IX-1044 to IX-1061, IX-1064 to IX-1088, IX-1091 to IX-1115, IX-1210 to IX-1227, IX-1230 to IX-1247, IX-1250 to IX-1274, IX-1277 to IX-1301, IX-1303 to IX-1320, IX-1323 to IX-1340, IX-1343 to IX-1367, IX-1370 to IX-1394 that are based on Formula IX

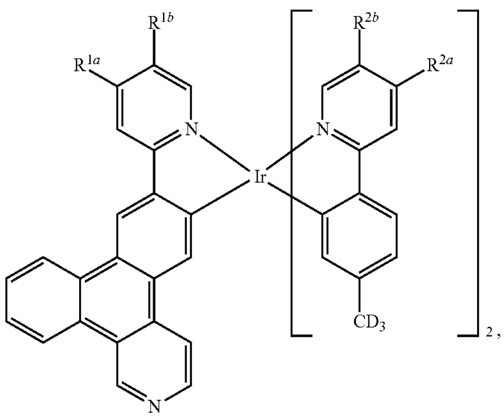

compounds X-94 to X-111, X-114 to X-131, X-134 to X-158, X-161 to X-185, X-187 to X-204, X-207 to X-224, X-227 to X-251, X-254 to X-278, X-280 to X-297, X-300 to X-317, X-320 to X-344, X-347 to X-371, X-373 to X-390, X-393 to X-410, X-413 to X-437, X-440 to X-464, X-559 to X-576, X-579 to X-596, X-599 to X-623, X-626 to X-650, X-652 to X-669, X-672 to X-689, X-692 to X-716, X-719 to X-743, X-745 to X-762, X-765 to X-782, X-785 to X-809, X-812 to X-836, X-838 to X-855, X-858 to X-875, X-878 to X-902, X-905 to X-929, X-931 to X-948, X-951 to X-968, X-971 to X-995, X-998 to X-1022, X-1024 to X-1041, X-1044 to X-1061, X-1064 to X-1088, X-1091 to X-1115, X-1210 to X-1227, X-1230 to X-1247, X-1250 to X-1274, X-1277 to X-1301, X-1303 to X-1320, X-1323 to X-1340, X-1343 to X-1367, X-1370 to X-1394 that are based on Formula X

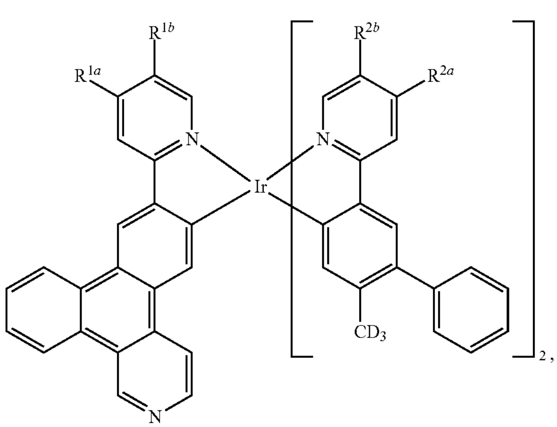

compounds XI-94 to XI-111, XI-114 to XI-131, XI-134 to XI-158, XI-161 to XI-185, XI-187 to XI-204, XI-207 to XI-224, XI-227 to XI-251, XI-254 to XI-278, XI-280 to XI-297, XI-300 to XI-317, XI-320 to XI-344, XI-347 to XI-371, XI-373 to XI-390, XI-393 to XI-410, XI-413 to XI-437, XI-440 to XI-464, XI-559 to XI-576, XI-579 to XI-596, XI-599 to XI-623, XI-626 to XI-650, XI-652 to XI-669, XI-672 to XI-689, XI-692 to XI-716, XI-719 to XI-743, XI-745 to XI-762, XI-765 to XI-782, XI-785 to XI-809, XI-812 to XI-836, XI-838 to XI-855, XI-858 to XI-875, XI-878 to XI-902, XI-905 to XI-929, XI-931 to XI-948, XI-951 to XI-968, XI-971 to XI-995, XI-998 to XI-1022, XI-1024 to XI-1041, XI-1044 to XI-1061, XI-1064 to XI-1088, XI-1091 to XI-1115, XI-1210 to XI-1227, XI-1230 to XI-1247, XI-1250 to XI-1274, XI-1277 to XI-1301, XI-1303 to XI-1320, XI-1323 to XI-1340, XI-1343 to XI-1367, XI-1370 to XI-1394 that are based on Formula XI

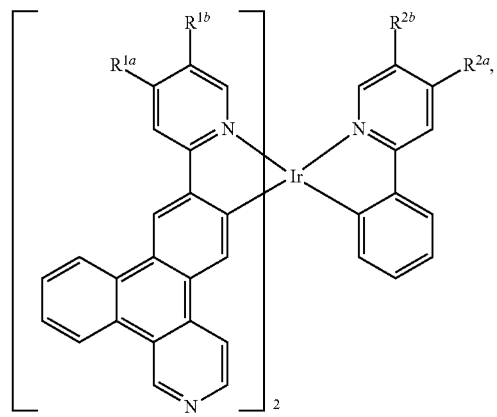

compounds XII-94 to XII-111, XII-114 to XII-131, XII-134 to XII-158, XII-161 to XII-185, XII-187 to XII-204, XII-207 to XII-224, XII-227 to XII-251, XII-254 to XII-278, XII-280 to XII-297, XII-300 to XII-317, XII-320 to XII-344, XII-347 to XII-371, XII-373 to XII-390, XII-393 to XII-410, XII-413 to XII-437, XII-440 to XII-464, XII-559 to XII-576, XII-579 to XII-596, XII-599 to XII-623, XII-626 to XII-650, XII-652 to XII-669, XII-672 to XII-689, XII-692 to XII-716, XII-719 to XII-743, XII-745 to XII-762, XII-765 to XII-782, XII-785 to XII-809, XII-812 to XII-836, XII-838 to XII-855, XII-858 to XII-875, XII-878 to XII-902, XII-905 to XII-929, XII-931 to XII-948, XII-951 to XII-968, XII-971 to XII-995, XII-998 to XII-1022, XII-1024 to XII-1041, XII-1044 to XII-1061, XII-1064 to XII-1088, XII-1091 to XII-1115, XII-1210 to XII-1227, XII-1230 to XII-1247, XII-1250 to XII-1274, XII-1277 to XII-1301, XII-1303 to XII-1320, XII-1323 to XII-1340, XII-1343 to XII-1367, XII-1370 to XII-1394 that are based on Formula XII

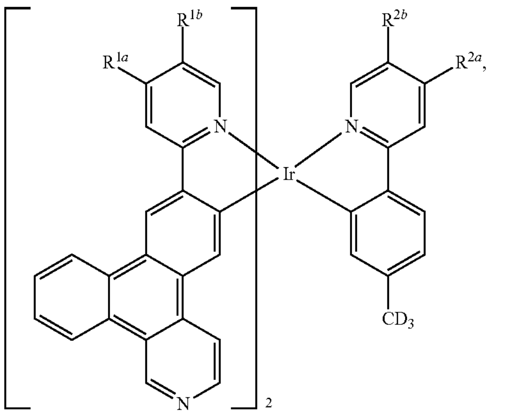

compounds XIII-94 to XIII-111, XIII-114 to XIII-131, XIII-134 to XIII-158, XIII-161 to XIII-185, XIII-187 to XIII-204, XIII-207 to XIII-224, XIII-227 to XIII-251, XIII-254 to XIII-278, XIII-280 to XIII-297, XIII-300 to XIII-317, XIII-320 to XIII-344, XIII-347 to XIII-371, XIII-373 to XIII-390, XIII-393 to XIII-410, XIII-413 to XIII-437, XIII-440 to XIII-464, XIII-559 to XIII-576, XIII-579 to XIII-596, XIII-599 to XIII-623, XIII-626 to XIII-650, XIII-652 to XIII-669, XIII-672 to XIII-689, XIII-692 to XIII-716, XIII-719 to XIII-743, XIII-745 to XIII-762, XIII-765 to XIII-782, XIII-785 to XIII-809, XIII-812 to XIII-836, XIII-838 to XIII-855, XIII-858 to XIII-875, XIII-878 to XIII-902, XIII-905 to XIII-929, XIII-931 to XIII-948, XIII-951 to XIII-968, XIII-971 to XIII-995, XIII-998 to XIII-1022, XIII-1024 to XIII-1041, XIII-1044 to XIII-1061, XIII-1064 to XIII-1088 XIII-1091 to XIII-1115, XIII-1210 to XIII-1227, XIII-1230 to XIII-1247, XIII-1250 to XIII-1274, XIII-1277 to XIII-1301, XIII-1303 to XIII-1320, XIII-1323 to XIII-1340, XIII-1343 to XIII-1367, XIII-1370 to XIII-1394 that are based on Formula XIII

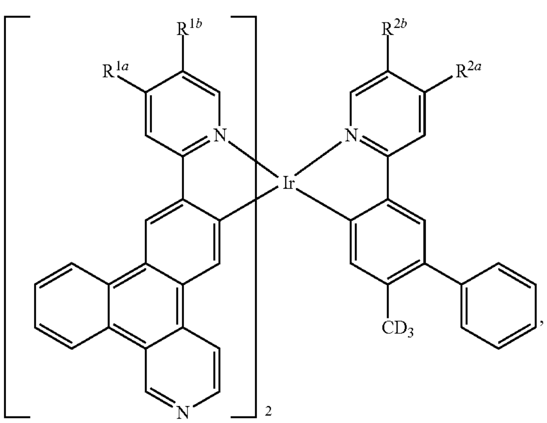

compounds XIV-94 to XIV-111, XIV-114 to XIV-131, XIV-134 to XIV-158, XIV-161 to XIV-185, XIV-187 to XIV-204, XIV-207 to XIV-224, XIV-227 to XIV-251, XIV-254 to XIV-278, XIV-280 to XIV-297, XIV-300 to XIV-317, XIV-320 to XIV-344, XIV-347 to XIV-371, XIV-373 to XIV-390, XIV-393 to XIV-410, XIV-413 to XIV-437, XIV-440 to XIV-464, XIV-559 to XIV-576, XIV-579 to XIV-596, XIV-599 to XIV-623, XIV-626 to XIV-650, XIV-652 to XIV-669, XIV-672 to XIV-689, XIV-692 to XIV-716, XIV-719 to XIV-743, XIV-745 to XIV-762, XIV-765 to XIV-782, XIV-785 to XIV-809, XIV-812 to XIV-836, XIV-838 to XIV-855, XIV-858 to XIV-875, XIV-878 to XIV-902, XIV-905 to XIV-929, XIV-931 to XIV-948, XIV-951 to XIV-968, XIV-971 to XIV-995, XIV-998 to XIV-1022, XIV-1024 to XIV-1041, XIV-1044 to XIV-1061, XIV-1064 to XIV-1088, XIV-1091 to XIV-1115, XIV-1210 to XIV-1227, XIV-1230 to XIV-1247, XIV-1250 to XIV-1274, XIV-1277 to XIV-1301, XIV-1303 to XIV-1320, XIV-1323 to XIV-1340, XIV-1343 to XIV-1367, XIV-1370 to XIV-1394 that are based on Formula XIV

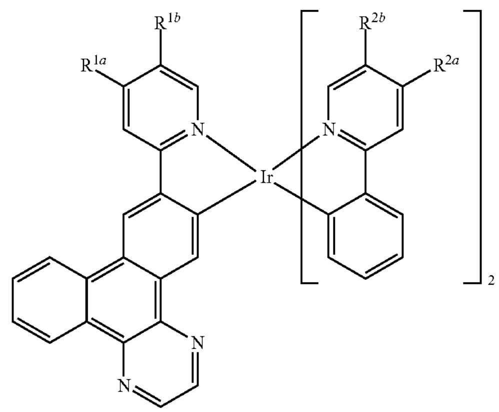

compounds XV-94 to XV-111 XV-114 to XV-131 XV-134 to XV-158, XV-161 to XV-185, XV-187 to XV-204, XV-207 to XV-224, XV-227 to XV-251, XV-254 to XV-278, XV-280 to XV-297, XV-300 to XV-317, XV-320 to XV-344, XV-347 to XV-371, XV-373 to XV-390, XV-393 to XV-410, XV-413 to XV-437, XV-440 to XV-464, XV-559 to XV-576, XV-579 to XV-596, XV-599 to XV-623, XV-626 to XV-650, XV-652 to XV-669, XV-672 to XV-689, XV-692 to XV-716, XV-719 to XV-743, XV-745 to XV-762, XV-765 to XV-782, XV-785 to XV-809, XV-812 to XV-836, XV-838 to XV-855, XV-858 to XV-875, XV-878 to XV-902, XV-905 to XV-929, XV-931 to XV-948, XV-951 to XV-968, XV-971 to XV-995, XV-998 to XV-1022, XV-1024 to XV-1041, XV-1044 to XV-1061, XV-1064 to XV-1088, XV-1091 to XV-1115, XV-1210 to XV-1227, XV-1230 to XV-1247, XV-1250 to XV-1274, XV-1277 to XV-1301, XV-1303 to XV-1320, XV-1323 to XV-1340, XV-1343 to XV-1367, XV-1370 to XV-1394 that are based on Formula XV

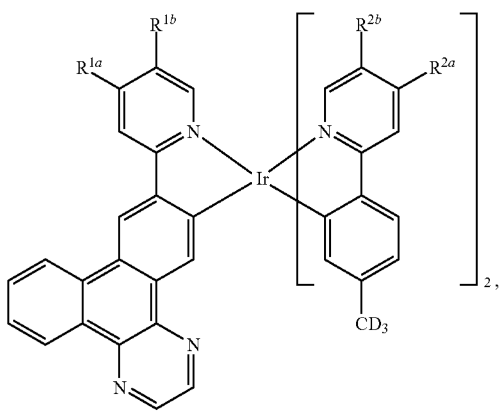

compounds XVI-94 to XVI-111, XVI-114 to XVI-131, XVI-134 to XVI-158, XVI-161 to XVI-185, XVI-187 to XVI-204, XVI-207 to XVI-224, XVI-227 to XVI-251, XVI-254 to XVI-278, XVI-280 to XVI-297, XVI-300 to XVI-317, XVI-320 to XVI-344, XVI-347 to XVI-371, XVI-373 to XVI-390, XVI-393 to XVI-410, XVI-413 to XVI-437, XVI-440 to XVI-464, XVI-559 to XVI-576, XVI-579 to XVI-596, XVI-599 to XVI-623, XVI-626 to XVI-650, XVI-652 to XVI-669, XVI-672 to XVI-689, XVI-692 to XVI-716, XVI-719 to XVI-743, XVI-745 to XVI-762, XVI-765 to XVI-782, XVI-785 to XVI-809, XVI-812 to XVI-836, XVI-838 to XVI-855, XVI-858 to XVI-875, XVI-878 to XVI-902, XVI-905 to XVI-929, XVI-931 to XVI-948, XVI-951 to XVI-968, XVI-971 to XVI-995, XVI-998 to XVI-1022, XVI-1024 to XVI-1041, XVI-1044 to XVI-1061, XVI-1064 to XVI-1088, XVI-1091 to XVI-1115, XVI-1210 to XVI-1227, XVI-1230 to XVI-1247, XVI-1250 to XVI-1274, XVI-1277 to XVI-1301, XVI-1303 to XVI-1320, XVI-1323 to XVI-1340, XVI-1343 to XVI-1367, XVI-1370 to XVI-1394 that are based on Formula XVI

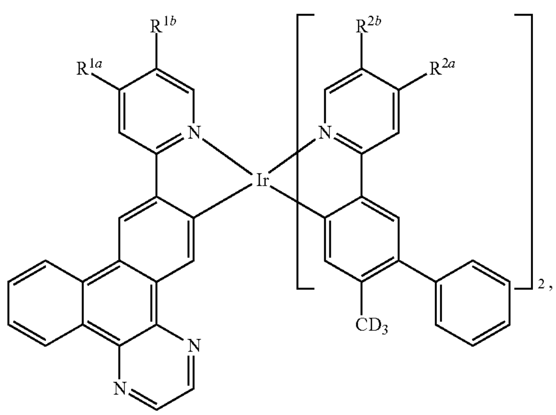

compounds XVII-94 to XVII-111, XVII-114 to XVII-131, XVII-134 to XVII-158, XVII-161 to XVII-185, XVII-187 to XVII-204, XVII-207 to XVII-224, XVII-227 to XVII-251, XVII-254 to XVII-278, XVII-280 to XVII-297, XVII-300 to XVII-317, XVII-320 to XVII-344, XVII-347 to XVII-371, XVII-373 to XVII-390, XVII-393 to XVII-410, XVII-413 to XVII-437, XVII-440 to XVII-464, XVII-559 to XVII-576, XVII-579 to XVII-596, XVII-599 to XVII-623, XVII-626 to XVII-650, XVII-652 to XVII-669, XVII-672 to XVII-689, XVII-692 to XVII-716, XVII-719 to XVII-743, XVII-745 to XVII-762, XVII-765 to XVII-782, XVII-785 to XVII-809, XVII-812 to XVII-836, XVII-838 to XVII-855, XVII-858 to XVII-875, XVII-878 to XVII-902, XVII-905 to XVII-929, XVII-931 to XVII-948, XVII-951 to XVII-968, XVII-971 to XVII-995, XVII-998 to XVII-1022, XVII-1024 to XVII-1041, XVII-1044 to XVII-1061, XVII-1064 to XVII-1088, XVII-1091 to XVII-1115, XVII-1210 to XVII-1227, XVII-1230 to XVII-1247, XVII-1250 to XVII-1274, XVII-1277 to XVII-1301, XVII-1303 to XVII-1320, XVII-1323 to XVII-1340, XVII-1343 to XVII-1367, XVII-1370 to XVII-1394 that are based on Formula XVII

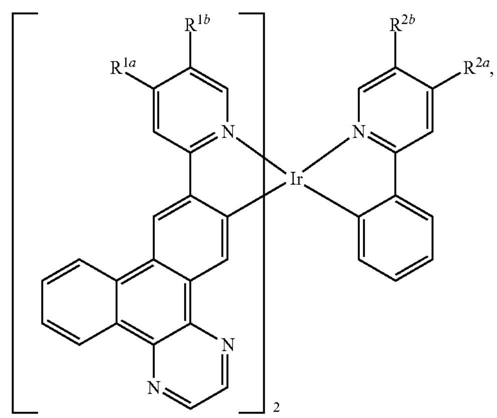

compounds XVIII-94 to XVIII-111, XVIII-114 to XVIII-131, XVIII-134 to XVIII-158, XVIII-161 to XVIII-185, XVIII-187 to XVIII-204, XVIII-207 to XVIII-224, XVIII-227 to XVIII-251, XVIII-254 to XVIII-278, XVIII-280 to XVIII-297, XVIII-300 to XVIII-317, XVIII-320 to XVIII-344, XVIII-347 to XVIII-371, XVIII-373 to XVIII-390, XVIII-393 to XVIII-410, XVIII-413 to XVIII-437, XVIII-440 to XVIII-464, XVIII-559 to XVIII-576, XVIII-579 to XVIII-596, XVIII-599 to XVIII-623, XVIII-626 to XVIII-650, XVIII-652 to XVIII-669, XVIII-672 to XVIII-689, XVIII-692 to XVIII-716, XVIII-719 to XVIII-743, XVIII-745 to XVIII-762, XVIII-765 to XVIII-782, XVIII-785 to XVIII-809, XVIII-812 to XVIII-836, XVIII-838 to XVIII-855, XVIII-858 to XVIII-875, XVIII-878 to XVIII-902, XVIII-905 to XVIII-929, XVIII-931 to XVIII-948, XVIII-951 to XVIII-968, XVIII-971 to XVIII-995, XVIII-998 to XVIII-1022, XVIII-1024 to XVIII-1041, XVIII-1044 to XVIII-1061, XVIII-1064 to XVIII-1088, XVIII-1091 to XVIII-1115, XVIII-1210 to XVIII-1227, XVIII-1230 to XVIII-1247, XVIII-1250 to XVIII-1274, XVIII-1277 to XVIII-1301, XVIII-1303 to XVIII-1320, XVIII-1323 to XVIII-1340, XVIII-1343 to XVIII-1367, XVIII-1370 to XVIII-1394 that are based on Formula XVIII

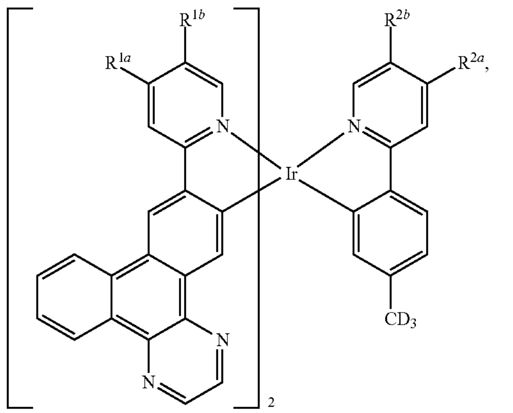

and compounds XIX-94 to XIX-111, XIX-114 to XIX-131, XIX-134 to XIX-158, XIX-161 to XIX-185, XIX-187 to XIX-204, XIX-207 to XIX-224, XIX-227 to XIX-251, XIX-254 to XIX-278, XIX-280 to XIX-297, XIX-300 to XIX-317, XIX-320 to XIX-344, XIX-347 to XIX-371, XIX-373 to XIX-390, XIX-393 to XIX-410, XIX-413 to XIX-437, XIX-440 to XIX-464, XIX-559 to XIX-576, XIX-579 to XIX-596, XIX-599 to XIX-623, XIX-626 to XIX-650, XIX-652 to XIX-669, XIX-672 to XIX-689, XIX-692 to XIX-716, XIX-719 to XIX-743, XIX-745 to XIX-762, XIX-765 to XIX-782, XIX-785 to XIX-809, XIX-812 to XIX-836, XIX-838 to XIX-855, XIX-858 to XIX-875, XIX-878 to XIX-902, XIX-905 to XIX-929, XIX-931 to XIX-948, XIX-951 to XIX-968, XIX-971 to XIX-995, XIX-998 to XIX-1022, XIX-1024 to XIX-1041, XIX-1044 to XIX-1061, XIX-1064 to XIX-1088, XIX-1091 to XIX-1115, XIX-1210 to XIX-1227, XIX-1230 to XIX-1247, XIX-1250 to XIX-1274, XIX-1277 to XIX-1301, XIX-1303 to XIX-1320, XIX-1323 to XIX-1340, XIX-1343 to XIX-1367, XIX-1370 to XIX-1394 that are based on Formula XIX

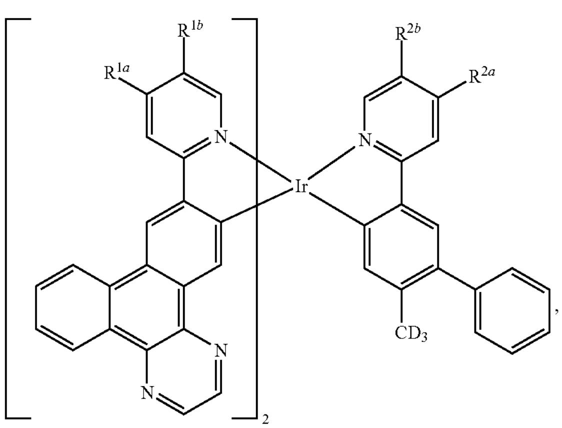

wherein for each compound II-94 to II-111, II-114 to II-131, II-134 to II-158, II-161 to II-185, II-187 to II-204, II-207 to II-224, II-227 to II-251, II-254 to II-278, II-280 to II-297, II-300 to II-317, II-320 to II-344, II-347 to II-371, II-373 to II-390, II-393 to II-410, II-413 to II-437, II-440 to II-464, II-559 to II-576, II-579 to II-596, II-599 to II-623, II-626 to II-650, II-652 to II-669, II-672 to II-689, II-692 to II-716, II-719 to II-743, II-745 to II-762, II-765 to II-782, II-785 to II-809, II-812 to II-836, II-838 to II-855, II-858 to II-875, II-878 to II-902, II-905 to II-929, II-931 to II-948, II-951 to II-968, II-971 to II-995, II-998 to II-1022, II-1024 to II-1041, II-1044 to II-1061, II-1064 to II-1088, II-1091 to II-1115, II-1210 to II-1227, II-1230 to II-1247, II-1250 to II-1274, II-1277 to II-1301, II-1303 to II-1320, II-1323 to II-1340, II-1343 to II-1367, II-1370 to II-1394, III-94 to III-111, III-114 to III-131, III-134 to III-158, III-161 to III-185, III-187 to III-204, III-207 to III-224, III-227 to III-251, III-254 to III-278, III-280 to III-297, III-300 to III-317, III-320 to III-344, III-347 to III-371, III-373 to III-390, III-393 to III-410, III-413 to III-437, III-440 to III-464, III-559 to III-576, II-579 to III-596, III-599 to III-623, III-626 to III-650, III-652 to III-669, III-672 to III-689, III-692 to III-716, II-719 to III-743, III-745 to III-762, III-765 to III-782, III-785 to III-809, III-812 to III-836, III-838 to III-855, III-858 to III-875, III-878 to III-902, II-905 to III-929, III-931 to III-948, III-951 to II-968, III-971 to III-995, III-998 to III-1022, III-1024 to III-1041, III-1044 to III-1061, III-1064 to III-1088, III-1091 to III-1115, III-1210 to III-1227, III-1230 to III-1247, III-1250 to III-1274, III-1277 to III-1301, III-1303 to III-1320, III-1323 to III-1340, III-1343 to III-1367, III-1370 to III-1394, IV-94 to IV-111, IV-114 to IV-131, IV-134 to IV-158, IV-161 to IV-185, IV-187 to IV-204, IV-207 to IV-224, IV-227 to IV-251, IV-254 to IV-278, IV-280 to IV-297, IV-300 to IV-317, IV-320 to IV-344, IV-347 to IV-371, IV-373 to IV-390, IV-393 to IV-410, IV-413 to IV-437, IV-440 to IV-464, IV-559 to IV-576, IV-579 to IV-596, IV-599 to IV-623, IV-626 to IV-650, IV-652 to IV-669, IV-672 to IV-689, IV-692 to IV-716, IV-719 to IV-743, IV-745 to IV-762, IV-765 to IV-782, IV-785 to IV-809, IV-812 to IV-836, IV-838 to IV-855, IV-858 to IV-875, IV-878 to IV-902, IV-905 to IV-929, IV-931 to IV-948, IV-951 to IV-968, IV-971 to IV-995, IV-998 to IV-1022, IV-1024 to IV-1041, IV-1044 to IV-1061, IV-1064 to IV-1088, IV-1091 to IV-1115, IV-1210 to IV-1227, IV-1230 to IV-1247, IV-1250 to IV-1274, IV-1277 to IV-1301, IV-1303 to IV-1320, IV-1323 to IV-1340, IV-1343 to IV-1367, IV-1370 to IV-1394, V-94 to V-111, V-114 to V-131, V-134 to V-158, V-161 to V-185, V-187 to V-204, V-207 to V-224, V-227 to V-251, V-254 to V-278, V-280 to V-297, V-300 to V-317, V-320 to V-344, V-347 to V-371, V-373 to V-390, V-393 to V-410, V-413 to V-437, V-440 to V-464, V-559 to V-576, V-579 to V-596, V-599 to V-623, V-626 to V-650, V-652 to V-669, V-672 to V-689, V-692 to V-716, V-719 to V-743, V-745 to V-762, V-765 to V-782, V-785 to V-809, V-812 to V-836, V-838 to V-855, V-858 to V-875, V-878 to V-902, V-905 to V-929, V-931 to V-948, V-951 to V-968, V-971 to V-995, V-998 to V-1022, V-1024 to V-1041 V-1044 to V-1061, V-1064 to V-1088, V-1091 to V-1115, V-1210 to V-1227, V-1230 to V-1247, V-1250 to V-1274, V-1277 to V-1301, V-1303 to V-1320, V-1323 to V-1340, V-1343 to V-1367, V-1370 to V-1394, VI-94 to VI-111, VI-114 to VI-131, VI-134 to VI-158, VI-161 to VI-185, VI-187 to VI-204, VI-207 to VI-224, VI-227 to VI-251, VI-254 to VI-278, VI-280 to VI-297, VI-300 to VI-317, VI-320 to VI-344, VI-347 to VI-371, VI-373 to VI-390, VI-393 to VI-410, VI-413 to VI-437, VI-440 to VI-464, VI-559 to VI-576, VI-579 to VI-596, VI-599 to VI-623, VI-626 to VI-650, VI-652 to VI-669, VI-672 to VI-689, VI-692 to VI-716, VI-719 to VI-743, VI-745 to VI-762, VI-765 to VI-782, VI-785 to VI-809, VI-812 to VI-836, VI-838 to VI-855, VI-858 to VI-875, VI-878 to VI-902, VI-905 to VI-929, VI-931 to VI-948, VI-951 to VI-968, VI-971 to VI-995, VI-998 to VI-1022, VI-1024 to VI-1041, VI-1044 to VI-1061, VI-1064 to VI-1088, VI-1091 to VI-1115, VI-1210 to VI-1227, VI-1230 to VI-1247, VI-1250 to VI-1274, VI-1277 to VI-1301, VI-1303 to VI-1320, VI-1323 to VI-1340, VI-1343 to VI-1367, VI-1370 to VI-1394, VII-94 to VII-111, VII-114 to VII-131, VII-134 to VII-158, VII-161 to VII-185, VII-187 to VII-204, VII-207 to VII-224, VII-227 to VII-251, VII-254 to VII-278, VII-280 to VII-297, VII-300 to VII-317, VII-320 to VII-344, VII-347 to VII-371, VII-373 to VII-390, VII-393 to VII-410, VII-413 to VII-437, VII-440 to VII-464, VII-559 to VII-576, VII-579 to VII-596, VII-599 to VII-623, VII-626 to VII-650, VII-652 to VII-669, VII-672 to VII-689, VII-692 to VII-716, VII-719 to VII-743, VII-745 to VII-762, VII-765 to VII-782, VII-785 to VII-809, VII-812 to VII-836, VII-838 to VII-855, VII-858 to VII-875, VII-878 to VII-902, VII-905 to VII-929, VII-931 to VII-948, VII-951 to VII-968, VII-971 to VII-995, VII-998 to VII-1022, VII-1024 to VII-1041, VII-1044 to VII-1061, VII-1064 to VII-1088, VII-1091 to VII-1115, VII-1210 to VII-1227, VII-1230 to VII-1247, VII-1250 to VII-1274, VII-1277 to VII-1301, VII-1303 to VII-1320, VII-1323 to VII-1340, VII-1343 to VII-1367, VII-1370 to VII-1394, VIII-94 to VIII-111, VIII-114 to VIII-131, VIII-134 to VIII-158, VIII-161 to VIII-185, VIII-187 to VIII-204, VIII-207 to VIII-224, VIII-227 to VIII-251, VIII-254 to VIII-278, VIII-280 to VIII-297, VIII-300 to VIII-317, VIII-320 to VIII-344, VIII-347 to VIII-371, VIII-373 to VIII-390, VIII-393 to VIII-410, VIII-413 to VIII-437, VIII-440 to VIII-464, VIII-559 to VIII-576, VIII-579 to VIII-596, VIII-599 to VIII-623, VIII-626 to VIII-650, VIII-652 to VIII-669, VIII-672 to VIII-689, VIII-692 to VIII-716, VIII-719 to VIII-743, VIII-745 to VIII-762, VIII-765 to VIII-782, VIII-785 to VIII-809, VIII-812 to VIII-836, VIII-838 to VIII-855, VIII-858 to VIII-875, VIII-878 to VIII-902, VIII-905 to VIII-929, VIII-931 to VIII-948, VIII-951 to VIII-968, VIII-971 to VIII-995, VIII-998 to VIII-1022, VIII-1024 to VIII-1041, VIII-1044 to VIII-1061, VIII-1064 to VIII-1088, VIII-1091 to VIII-1115, VIII-1210 to VIII-1227, VIII-1230 to VIII-1247, VIII-1250 to VIII-1274, VIII-1277 to VIII-1301, VIII-1303 to VIII-1320, VIII-1323 to VIII-1340, VIII-1343 to VIII-1367, VIII-1370 to VIII-1394, IX-94 to IX-111, IX-114 to IX-131, IX-134 to IX-158, IX-161 to IX-185, IX-187 to IX-204, IX-207 to IX-224, IX-227 to IX-251, IX-254 to IX-278, IX-280 to IX-297, IX-300 to IX-317, IX-320 to IX-344, IX-347 to IX-371, IX-373 to IX-390, IX-393 to IX-410, IX-413 to IX-437, IX-440 to IX-464, IX-559 to IX-576, IX-579 to IX-596, IX-599 to IX-623, IX-626 to IX-650, IX-652 to IX-669, IX-672 to IX-689, IX-692 to IX-716, IX-719 to IX-743, IX-745 to IX-762, IX-765 to IX-782, IX-785 to IX-809, IX-812 to IX-836, IX-838 to IX-855, IX-858 to IX-875, IX-878 to IX-902, IX-905 to IX-929, IX-931 to IX-948, IX-951 to IX-968, IX-971 to IX-995, IX-998 to IX-1022, IX-1024 to IX-1041, IX-1044 to IX-1061, IX-1064 to IX-1088, IX-1091 to IX-1115, IX-1210 to IX-1227, IX-1230 to IX-1247, IX-1250 to IX-1274, IX-1277 to IX-1301, IX-1303 to IX-1320, IX-1323 to IX-1340, IX-1343 to IX-1367, IX-1370 to IX-1394, X-94 to X-111, X-114 to X-131, X-134 to X-158, X-161 to X-185, X-187 to X-204, X-207 to X-224, X-227 to X-251, X-254 to X-278, X-280 to X-297, X-300 to X-317, X-320 to X-344, X-347 to X-371, X-373 to X-390, X-393 to X-410, X-413 to X-437, X-440 to X-464, X-559 to X-576, X-579 to X-596, X-599 to X-623, X-626 to X-650, X-652 to X-669, X-672 to X-689, X-692 to X-716, X-719 to X-743, X-745 to X-762, X-765 to X-782, X-785 to X-809, X-812 to X-836, X-838 to X-855, X-858 to X-875, X-878 to X-902, X-905 to X-929, X-931 to X-948, X-951 to X-968, X-971 to X-995, X-998 to X-1022, X-1024 to X-1041, X-1044 to X-1061, X-1064 to X-1088, X-1091 to X-1115, X-1210 to X-1227, X-1230 to X-1247, X-1250 to X-1274, X-1277 to X-1301, X-1303 to X-1320, X-1323 to X-1340, X-1343 to X-1367, X-1370 to X-1394, XI-94 to XI-111, XI-114 to XI-131, XI-134 to XI-158, XI-161 to XI-185, XI-187 to XI-204, XI-207 to XI-224, XI-227 to XI-251, XI-254 to XI-278, XI-280 to XI-297, XI-300 to XI-317, XI-320 to XI-344, XI-347 to XI-371, XI-373 to XI-390, XI-393 to XI-410, XI-413 to XI-437, XI-440 to XI-464, XI-559 to XI-576, XI-579 to XI-596, XI-599 to XI-623, XI-626 to XI-650, XI-652 to XI-669, XI-672 to XI-689, XI-692 to XI-716, XI-719 to XI-743, XI-745 to XI-762, XI-765 to XI-782, XI-785 to XI-809, XI-812 to XI-836, XI-838 to XI-855, XI-858 to XI-875, XI-878 to XI-902, XI-905 to XI-929, XI-931 to XI-948, XI-951 to XI-968, XI-971 to XI-995, XI-998 to XI-1022, XI-1024 to XI-1041, XI-1044 to XI-1061, XI-1064 to XI-1088, XI-1091 to XI-1115, XI-1210 to XI-1227, XI-1230 to XI-1247, XI-1250 to XI-12743 XI-1277 to XI-1301, XI-1303 to XI-1320, XI-1323 to XI-1340, XI-1343 to XI-1367, XI-1370 to XI-1394, XII-94 to XII-111, XII-114 to XII-131, XII-134 to XII-158, XII-161 to XII-185, XII-187 to XII-204, XII-207 to XII-224, XII-227 to XII-251, XII-254 to XII-278, XII-280 to XII-297, XII-300 to XII-317, XII-320 to XII-344, XII-347 to XII-371, XII-373 to XII-390, XII-393 to XII-410, XII-413 to XII-437, XII-440 to XII-464, XII-559 to XII-576, XII-579 to XII-596, XII-599 to XII-623, XII-626 to XII-650, XII-652 to XII-669, XII-672 to XII-689, XII-692 to XII-716, XII-719 to XII-743, XII-745 to XII-762, XII-765 to XII-782, XII-785 to XII-809, XII-812 to XII-836, XII-838 to XII-855, XII-858 to XII-875, XII-878 to XII-902, XII-905 to XII-929, XII-931 to XII-948, XII-951 to XII-968, XII-971 to XII-995, XII-998 to XII-1022, XII-1024 to XII-1041, XII-1044 to XII-1061, XII-1064 to XII-1088, XII-1091 to XII-1115, XII-1210 to XII-1227, XII-1230 to XII-1247, XII-1250 to XII-1274, XII-1277 to XII-1301, XII-1303 to XII-1320, XII-1323 to XII-1340, XII-1343 to XII-1367, XII-1370 to XII-1394, XIII-94 to XIII-111, XIII-114 to XIII-131, XIII-134 to XIII-158, XIII-161 to XIII-185, XIII-187 to XIII-204, XIII-207 to XIII-224, XIII-227 to XIII-251, XIII-254 to XIII-278, XIII-280 to XIII-297, XIII-300 to XIII-317, XIII-320 to XIII-344, XIII-347 to XIII-371, XIII-373 to XIII-390, XIII-393 to XIII-410, XIII-413 to XIII-437, XIII-440 to XIII-464, XIII-559 to XIII-576, XIII-579 to XIII-596, XIII-599 to XIII-623, XIII-626 to XIII-650, XIII-652 to XIII-669, XIII-672 to XIII-689, XIII-692 to XIII-716, XIII-719 to XIII-743, XIII-745 to XIII-762, XIII-765 to XIII-782, XIII-785 to XIII-809, XIII-812 to XIII-836, XIII-838 to XIII-855, XIII-858 to XIII-875, XIII-878 to XIII-902, XIII-905 to XIII-929, XIII-931 to XIII-948, XIII-951 to XIII-968, XIII-971 to XIII-995, XIII-998 to XIII-1022, XIII-1024 to XIII-1041, XIII-1044 to XIII-1061, XIII-1064 to XIII-1088, XIII-1091 to XIII-1115, XIII-1210 to XIII-1227, XIII-1230 to XIII-1247, XIII-1250 to XIII-1274, XIII-1277 to XIII-1301, XIII-1303 to XIII-1320, XIII-1323 to XIII-1340, XIII-1343 to XIII-1367, XIII-1370 to XIII-1394, XIV-94 to XIV-111, XIV-114 to XIV-131, XIV-134 to XIV-158, XIV-161 to XIV-185, XIV-187 to XIV-204, XIV-207 to XIV-224, XIV-227 to XIV-251, XIV-254 to XIV-278, XIV-280 to XIV-297, XIV-300 to XIV-317, XIV-320 to XIV-344, XIV-347 to XIV-371, XIV-373 to XIV-390, XIV-393 to XIV-410, XIV-413 to XIV-437, XIV-440 to XIV-464, XIV-559 to XIV-576, XIV-579 to XIV-596, XIV-599 to XIV-623, XIV-626 to XIV-650, XIV-652 to XIV-669, XIV-672 to XIV-689, XIV-692 to XIV-716, XIV-719 to XIV-743, XIV-745 to XIV-762, XIV-765 to XIV-782, XIV-785 to XIV-809, XIV-812 to XIV-836, XIV-838 to XIV-855, XIV-858 to XIV-875, XIV-878 to XIV-902, XIV-905 to XIV-929, XIV-931 to XIV-948, XIV-951 to XIV-968, XIV-971 to XIV-995, XIV-998 to XIV-1022, XIV-1024 to XIV-1041, XIV-1044 to XIV-1061, XIV-1064 to XIV-1088, XIV-1091 to XIV-1115, XIV-1210 to XIV-1227, XIV-1230 to XIV-1247, XIV-1250 to XIV-1274, XIV-1277 to XIV-1301, XIV-1303 to XIV-1320, XIV-1323 to XIV-1340, XIV-1343 to XIV-1367, XIV-1370 to XIV-1394, XV-94 to XV-111, XV-114 to XV-131, XV-134 to XV-158, XV-161 to XV-185, XV-187 to XV-204, XV-207 to XV-224, XV-227 to XV-251, XV-254 to XV-278, XV-280 to XV-297, XV-300 to XV-317, XV-320 to XV-344, XV-347 to XV-371, XV-373 to XV-390, XV-393 to XV-410, XV-413 to XV-437, XV-440 to XV-464, XV-559 to XV-576, XV-579 to XV-596, XV-599 to XV-623, XV-626 to XV-650, XV-652 to XV-669, XV-672 to XV-689, XV-692 to XV-716, XV-719 to XV-743, XV-745 to XV-762, XV-765 to XV-782, XV-785 to XV-809, XV-812 to XV-836, XV-838 to XV-855, XV-858 to XV-875, XV-878 to XV-902, XV-905 to XV-929, XV-931 to XV-948, XV-951 to XV-968, XV-971 to XV-995, XV-998 to XV-1022, XV-1024 to XV-1041, XV-1044 to XV-1061, XV-1064 to XV-1088, XV-1091 to XV-1115, XV-1210 to XV-1227, XV-1230 to XV-1247, XV-1250 to XV-1274, XV-1277 to XV-1301, XV-1303 to XV-1320, XV-1323 to XV-1340, XV-1343 to XV-1367, XV-1370 to XV-1394, XVI-94 to XVI-111, XVI-114 to XVI-131, XVI-134 to XVI-158, XVI-161 to XVI-185, XVI-187 to XVI-204, XVI-207 to XVI-224, XVI-227 to XVI-251, XVI-254 to XVI-278, XVI-280 to XVI-297, XVI-300 to XVI-317, XVI-320 to XVI-344, XVI-347 to XVI-371, XVI-373 to XVI-390, XVI-393 to XVI-410, XVI-413 to XVI-437, XVI-440 to XVI-464, XVI-559 to XVI-576, XVI-579 to XVI-596, XVI-599 to XVI-623, XVI-626 to XVI-650, XVI-652 to XVI-669, XVI-672 to XVI-689, XVI-692 to XVI-716, XVI-719 to XVI-743, XVI-745 to XVI-762, XVI-765 to XVI-782, XVI-785 to XVI-809, XVI-812 to XVI-836, XVI-838 to XVI-855, XVI-858 to XVI-875, XVI-878 to XVI-902, XVI-905 to XVI-929, XVI-931 to XVI-948, XVI-951 to XVI-968, XVI-971 to XVI-995, XVI-998 to XVI-1022, XVI-1024 to XVI-1041, XVI-1044 to XVI-1061, XVI-1064 to XVI-1088, XVI-1091 to XVI-1115, XVI-1210 to XVI-1227, XVI-1230 to XVI-1247, XVI-1250 to XVI-1274, XVI-1277 to XVI-1301, XVI-1303 to XVI-1320, XVI-1323 to XVI-1340, XVI-1343 to XVI-1367, XVI-1370 to XVI-1394, XVII-94 to XVII-111, XVII-114 to XVII-131, XVII-134 to XVII-158, XVII-161 to XVII-185, XVII-187 to XVII-204, XVII-207 to XVII-224, XVII-227 to XVII-251, XVII-254 to XVII-278, XVII-280 to XVII-297, XVII-300 to XVII-317, XVII-320 to XVII-344, XVII-347 to XVII-371, XVII-373 to XVII-390, XVII-393 to XVII-410, XVII-413 to XVII-437, XVII-440 to XVII-464, XVII-559 to XVII-576, XVII-579 to XVII-596, XVII-599 to XVII-623, XVII-626 to XVII-650, XVII-652 to XVII-669, XVII-672 to XVII-689, XVII-692 to XVII-716, XVII-719 to XVII-743, XVII-745 to XVII-762, XVII-765 to XVII-782, XVII-785 to XVII-809, XVII-812 to XVII-836, XVII-838 to XVII-855, XVII-858 to XVII-875, XVII-878 to XVII-902, XVII-905 to XVII-929, XVII-931 to XVII-948, XVII-951 to XVII-968, XVII-971 to XVII-995, XVII-998 to XVII-1022, XVII-1024 to XVII-1041, XVII-1044 to XVII-1061, XVII-1064 to XVII-1088, XVII-1091 to XVII-1115, XVII-1210 to XVII-1227, XVII-1230 to XVII-1247, XVII-1250 to XVII-1274, XVII-1277 to XVII-1301, XVII-1303 to XVII-1320, XVII-1323 to XVII-1340, XVII-1343 to XVII-1367, XVII-1370 to XVII-1394, XVIII-94 to XVIII-111, XVIII-114 to XVIII-131, XVIII-134 to XVIII-158, XVIII-161 to XVIII-185, XVIII-187 to XVIII-204, XVIII-207 to XVIII-224, XVIII-227 to XVIII-251, XVIII-254 to XVIII-278, XVIII-280 to XVIII-297, XVIII-300 to XVIII-317, XVIII-320 to XVIII-344, XVIII-347 to XVIII-371, XVIII-373 to XVIII-390, XVIII-393 to XVIII-410, XVIII-413 to XVIII-437, XVIII-440 to XVIII-464, XVIII-559 to XVIII-576, XVIII-579 to XVIII-596, XVIII-599 to XVIII-623, XVIII-626 to XVIII-650, XVIII-652 to XVIII-669, XVIII-672 to XVIII-689, XVIII-692 to XVIII-716, XVIII-719 to XVIII-743, XVIII-745 to XVIII-762, XVIII-765 to XVIII-782, XVIII-785 to XVIII-809, XVIII-812 to XVIII-836, XVIII-838 to XVIII-855, XVIII-858 to XVIII-875, XVIII-878 to XVIII-902, XVIII-905 to XVIII-929, XVIII-931 to XVIII-948, XVIII-951 to XVIII-968, XVIII-971 to XVIII-995, XVIII-998 to XVIII-1022, XVIII-1024 to XVIII-1041, XVIII-1044 to XVIII-1061, XVIII-1064 to XVIII-1088, XVIII-1091 to XVIII-1115, XVIII-1210 to XVIII-1227, XVIII-1230 to XVIII-1247, XVIII-1250 to XVIII-1274, XVIII-1277 to XVIII-1301, XVIII-1303 to XVIII-1320, XVIII-1323 to XVIII-1340, XVIII-1343 to XVIII-1367, XVIII-1370 to XVIII-1394, XIX-94 to XIX-111, XIX-114 to XIX-131, XIX-134 to XIX-158, XIX-161 to XIX-185, XIX-187 to XIX-204, XIX-207 to XIX-224, XIX-227 to XIX-251, XIX-254 to XIX-278, XIX-280 to XIX-297, XIX-300 to XIX-317, XIX-320 to XIX-344, XIX-347 to XIX-371, XIX-373 to XIX-390, XIX-393 to XIX-410, XIX-413 to XIX-437, XIX-440 to XIX-464, XIX-559 to XIX-576, XIX-579 to XIX-596, XIX-599 to XIX-623, XIX-626 to XIX-650, XIX-652 to XIX-669, XIX-672 to XIX-689, XIX-692 to XIX-716, XIX-719 to XIX-743, XIX-745 to XIX-762, XIX-765 to XIX-782, XIX-785 to XIX-809, XIX-812 to XIX-836, XIX-838 to XIX-855, XIX-858 to XIX-875, XIX-878 to XIX-902, XIX-905 to XIX-929, XIX-931 to XIX-948, XIX-951 to XIX-968, XIX-971 to XIX-995, XIX-998 to XIX-1022, XIX-1024 to XIX-1041, XIX-1044 to XIX-1061, XIX-1064 to XIX-1088, XIX-1091 to XIX-1115, XIX-1210 to XIX-1227, XIX-1230 to XIX-1247, XIX-1250 to XIX-1274, XIX-1277 to XIX-1301, XIX-1303 to XIX-1320, XIX-1323 to XIX-1340, XIX-1343 to XIX-1367, XIX-1370 to XIX-1394, $R^{1a}$, $R^{1b}$, $R^{2a}$, and $R^{2b}$ in each compound are defined as provided in the following table in which m is II to XIX:

| Compound # | $R^{1a}$ | $R^{1b}$ | $R^{2a}$ | $R^{2b}$ |
|---|---|---|---|---|
| m-94 | $R^{A1}$ | H | H | $CD_3$ |
| m-95 | $R^{A2}$ | H | H | $CD_3$ |
| m-96 | $R^{A3}$ | H | H | $CD_3$ |
| m-97 | $R^{A4}$ | H | H | $CD_3$ |
| m-98 | $R^{A5}$ | H | H | $CD_3$ |
| m-99 | $R^{A6}$ | H | H | $CD_3$ |
| m-100 | $R^{A7}$ | H | H | $CD_3$ |
| m-101 | $R^{A8}$ | H | H | $CD_3$ |
| m-102 | $R^{A9}$ | H | H | $CD_3$ |
| m-103 | $R^{A10}$ | H | H | $CD_3$ |
| m-104 | $R^{A11}$ | H | H | $CD_3$ |
| m-105 | $R^{A12}$ | H | H | $CD_3$ |
| m-106 | $R^{A13}$ | H | H | $CD_3$ |
| m-107 | $R^{A14}$ | H | H | $CD_3$ |
| m-108 | $R^{A15}$ | H | H | $CD_3$ |
| m-109 | $R^{A16}$ | H | H | $CD_3$ |
| m-110 | $R^{A17}$ | H | H | $CD_3$ |
| m-111 | $R^{A18}$ | H | H | $CD_3$ |
| m-114 | $R^{A21}$ | H | H | $CD_3$ |
| m-115 | $R^{A22}$ | H | H | $CD_3$ |
| m-116 | $R^{A23}$ | H | H | $CD_3$ |
| m-117 | $R^{A24}$ | H | H | $CD_3$ |
| m-118 | $R^{A25}$ | H | H | $CD_3$ |
| m-119 | $R^{A26}$ | H | H | $CD_3$ |
| m-120 | $R^{A27}$ | H | H | $CD_3$ |
| m-121 | $R^{A28}$ | H | H | $CD_3$ |
| m-122 | $R^{A29}$ | H | H | $CD_3$ |
| m-123 | $R^{A30}$ | H | H | $CD_3$ |
| m-124 | $R^{A31}$ | H | H | $CD_3$ |
| m-125 | $R^{A32}$ | H | H | $CD_3$ |
| m-126 | $R^{A33}$ | H | H | $CD_3$ |
| m-127 | $R^{A34}$ | H | H | $CD_3$ |
| m-128 | $R^{A35}$ | H | H | $CD_3$ |
| m-129 | $R^{A36}$ | H | H | $CD_3$ |
| m-130 | $R^{A37}$ | H | H | $CD_3$ |
| m-131 | $R^{A38}$ | H | H | $CD_3$ |
| m-134 | $R^{A41}$ | H | H | $CD_3$ |
| m-135 | $R^{A42}$ | H | H | $CD_3$ |
| m-136 | $R^{A43}$ | H | H | $CD_3$ |
| m-137 | $R^{A44}$ | H | H | $CD_3$ |
| m-138 | $R^{A45}$ | H | H | $CD_3$ |
| m-139 | $R^{A46}$ | H | H | $CD_3$ |
| m-140 | $R^{A47}$ | H | H | $CD_3$ |
| m-141 | $R^{A48}$ | H | H | $CD_3$ |
| m-142 | $R^{A49}$ | H | H | $CD_3$ |
| m-143 | $R^{A50}$ | H | H | $CD_3$ |
| m-144 | $R^{A51}$ | H | H | $CD_3$ |
| m-145 | $R^{A52}$ | H | H | $CD_3$ |
| m-146 | $R^{A53}$ | H | H | $CD_3$ |
| m-147 | $R^{A54}$ | H | H | $CD_3$ |
| m-148 | $R^{A55}$ | H | H | $CD_3$ |
| m-149 | $R^{A56}$ | H | H | $CD_3$ |
| m-150 | $R^{A57}$ | H | H | $CD_3$ |
| m-151 | $R^{A58}$ | H | H | $CD_3$ |
| m-152 | $R^{A59}$ | H | H | $CD_3$ |
| m-153 | $R^{A60}$ | H | H | $CD_3$ |
| m-154 | $R^{A61}$ | H | H | $CD_3$ |
| m-155 | $R^{A62}$ | H | H | $CD_3$ |
| m-156 | $R^{A63}$ | H | H | $CD_3$ |
| m-157 | $R^{A64}$ | H | H | $CD_3$ |
| m-158 | $R^{A65}$ | H | H | $CD_3$ |
| m-161 | $R^{A68}$ | H | H | $CD_3$ |
| m-162 | $R^{A69}$ | H | H | $CD_3$ |
| m-163 | $R^{A70}$ | H | H | $CD_3$ |
| m-164 | $R^{A71}$ | H | H | $CD_3$ |
| m-165 | $R^{A72}$ | H | H | $CD_3$ |
| m-166 | $R^{A73}$ | H | H | $CD_3$ |
| m-167 | $R^{A74}$ | H | H | $CD_3$ |
| m-168 | $R^{A75}$ | H | H | $CD_3$ |
| m-169 | $R^{A76}$ | H | H | $CD_3$ |
| m-170 | $R^{A77}$ | H | H | $CD_3$ |
| m-171 | $R^{A78}$ | H | H | $CD_3$ |
| m-172 | $R^{A79}$ | H | H | $CD_3$ |
| m-173 | $R^{A80}$ | H | H | $CD_3$ |
| m-174 | $R^{A81}$ | H | H | $CD_3$ |
| m-175 | $R^{A82}$ | H | H | $CD_3$ |
| m-176 | $R^{A83}$ | H | H | $CD_3$ |
| m-177 | $R^{A84}$ | H | H | $CD_3$ |
| m-178 | $R^{A85}$ | H | H | $CD_3$ |
| m-179 | $R^{A86}$ | H | H | $CD_3$ |
| m-180 | $R^{A87}$ | H | H | $CD_3$ |
| m-181 | $R^{A88}$ | H | H | $CD_3$ |
| m-182 | $R^{A89}$ | H | H | $CD_3$ |
| m-183 | $R^{A90}$ | H | H | $CD_3$ |
| m-184 | $R^{A91}$ | H | H | $CD_3$ |
| m-185 | $R^{A92}$ | H | H | $CD_3$ |
| m-187 | $R^{A1}$ | H | $CD_3$ | $CD_3$ |
| m-188 | $R^{A2}$ | H | $CD_3$ | $CD_3$ |
| m-189 | $R^{A3}$ | H | $CD_3$ | $CD_3$ |
| m-190 | $R^{A4}$ | H | $CD_3$ | $CD_3$ |
| m-191 | $R^{A5}$ | H | $CD_3$ | $CD_3$ |
| m-192 | $R^{A6}$ | H | $CD_3$ | $CD_3$ |
| m-193 | $R^{A7}$ | H | $CD_3$ | $CD_3$ |
| m-194 | $R^{A8}$ | H | $CD_3$ | $CD_3$ |
| m-195 | $R^{A9}$ | H | $CD_3$ | $CD_3$ |
| m-196 | $R^{A10}$ | H | $CD_3$ | $CD_3$ |
| m-197 | $R^{A11}$ | H | $CD_3$ | $CD_3$ |
| m-198 | $R^{A12}$ | H | $CD_3$ | $CD_3$ |
| m-199 | $R^{A13}$ | H | $CD_3$ | $CD_3$ |
| m-200 | $R^{A14}$ | H | $CD_3$ | $CD_3$ |
| m-201 | $R^{A15}$ | H | $CD_3$ | $CD_3$ |
| m-202 | $R^{A16}$ | H | $CD_3$ | $CD_3$ |
| m-203 | $R^{A17}$ | H | $CD_3$ | $CD_3$ |
| m-204 | $R^{A18}$ | H | $CD_3$ | $CD_3$ |
| m-207 | $R^{A21}$ | H | $CD_3$ | $CD_3$ |
| m-208 | $R^{A22}$ | H | $CD_3$ | $CD_3$ |
| m-209 | $R^{A23}$ | H | $CD_3$ | $CD_3$ |
| m-210 | $R^{A24}$ | H | $CD_3$ | $CD_3$ |
| m-211 | $R^{A25}$ | H | $CD_3$ | $CD_3$ |
| m-212 | $R^{A26}$ | H | $CD_3$ | $CD_3$ |
| m-213 | $R^{A27}$ | H | $CD_3$ | $CD_3$ |
| m-214 | $R^{A28}$ | H | $CD_3$ | $CD_3$ |
| m-215 | $R^{A29}$ | H | $CD_3$ | $CD_3$ |
| m-216 | $R^{A30}$ | H | $CD_3$ | $CD_3$ |
| m-217 | $R^{A31}$ | H | $CD_3$ | $CD_3$ |
| m-218 | $R^{A32}$ | H | $CD_3$ | $CD_3$ |
| m-219 | $R^{A33}$ | H | $CD_3$ | $CD_3$ |
| m-220 | $R^{A34}$ | H | $CD_3$ | $CD_3$ |
| m-221 | $R^{A35}$ | H | $CD_3$ | $CD_3$ |
| m-222 | $R^{A36}$ | H | $CD_3$ | $CD_3$ |
| m-223 | $R^{A37}$ | H | $CD_3$ | $CD_3$ |
| m-224 | $R^{A38}$ | H | $CD_3$ | $CD_3$ |
| m-227 | $R^{A41}$ | H | $CD_3$ | $CD_3$ |
| m-228 | $R^{A42}$ | H | $CD_3$ | $CD_3$ |
| m-229 | $R^{A43}$ | H | $CD_3$ | $CD_3$ |
| m-230 | $R^{A44}$ | H | $CD_3$ | $CD_3$ |
| m-231 | $R^{A45}$ | H | $CD_3$ | $CD_3$ |
| m-232 | $R^{A46}$ | H | $CD_3$ | $CD_3$ |
| m-233 | $R^{A47}$ | H | $CD_3$ | $CD_3$ |
| m-234 | $R^{A48}$ | H | $CD_3$ | $CD_3$ |
| m-235 | $R^{A49}$ | H | $CD_3$ | $CD_3$ |
| m-236 | $R^{A50}$ | H | $CD_3$ | $CD_3$ |
| m-237 | $R^{A51}$ | H | $CD_3$ | $CD_3$ |
| m-238 | $R^{A52}$ | H | $CD_3$ | $CD_3$ |
| m-239 | $R^{A53}$ | H | $CD_3$ | $CD_3$ |
| m-240 | $R^{A54}$ | H | $CD_3$ | $CD_3$ |
| m-241 | $R^{A55}$ | H | $CD_3$ | $CD_3$ |
| m-242 | $R^{A56}$ | H | $CD_3$ | $CD_3$ |
| m-243 | $R^{A57}$ | H | $CD_3$ | $CD_3$ |
| m-244 | $R^{A58}$ | H | $CD_3$ | $CD_3$ |
| m-245 | $R^{A59}$ | H | $CD_3$ | $CD_3$ |
| m-246 | $R^{A60}$ | H | $CD_3$ | $CD_3$ |
| m-247 | $R^{A61}$ | H | $CD_3$ | $CD_3$ |
| m-248 | $R^{A62}$ | H | $CD_3$ | $CD_3$ |
| m-249 | $R^{A63}$ | H | $CD_3$ | $CD_3$ |
| m-250 | $R^{A64}$ | H | $CD_3$ | $CD_3$ |
| m-251 | $R^{A65}$ | H | $CD_3$ | $CD_3$ |
| m-254 | $R^{A68}$ | H | $CD_3$ | $CD_3$ |
| m-255 | $R^{A69}$ | H | $CD_3$ | $CD_3$ |

| Compound # | $R^{1a}$ | $R^{1b}$ | $R^{2a}$ | $R^{2b}$ |
|---|---|---|---|---|
| m-256 | $R^{A70}$ | H | $CD_3$ | $CD_3$ |
| m-257 | $R^{A71}$ | H | $CD_3$ | $CD_3$ |
| m-258 | $R^{A72}$ | H | $CD_3$ | $CD_3$ |
| m-259 | $R^{A73}$ | H | $CD_3$ | $CD_3$ |
| m-260 | $R^{A74}$ | H | $CD_3$ | $CD_3$ |
| m-261 | $R^{A75}$ | H | $CD_3$ | $CD_3$ |
| m-262 | $R^{A76}$ | H | $CD_3$ | $CD_3$ |
| m-263 | $R^{A77}$ | H | $CD_3$ | $CD_3$ |
| m-264 | $R^{A78}$ | H | $CD_3$ | $CD_3$ |
| m-265 | $R^{A79}$ | H | $CD_3$ | $CD_3$ |
| m-266 | $R^{A80}$ | H | $CD_3$ | $CD_3$ |
| m-267 | $R^{A81}$ | H | $CD_3$ | $CD_3$ |
| m-268 | $R^{A82}$ | H | $CD_3$ | $CD_3$ |
| m-269 | $R^{A83}$ | H | $CD_3$ | $CD_3$ |
| m-270 | $R^{A84}$ | H | $CD_3$ | $CD_3$ |
| m-271 | $R^{A85}$ | H | $CD_3$ | $CD_3$ |
| m-272 | $R^{A86}$ | H | $CD_3$ | $CD_3$ |
| m-273 | $R^{A87}$ | H | $CD_3$ | $CD_3$ |
| m-274 | $R^{A88}$ | H | $CD_3$ | $CD_3$ |
| m-275 | $R^{A89}$ | H | $CD_3$ | $CD_3$ |
| m-276 | $R^{A90}$ | H | $CD_3$ | $CD_3$ |
| m-277 | $R^{A91}$ | H | $CD_3$ | $CD_3$ |
| m-278 | $R^{A92}$ | H | $CD_3$ | $CD_3$ |
| m-280 | $R^{A1}$ | H | $CD_3$ | $CD_3$ |
| m-281 | $R^{A2}$ | H | $CD_3$ | $CD_3$ |
| m-282 | $R^{A3}$ | H | $CD_3$ | $CD_3$ |
| m-283 | $R^{A4}$ | H | $CD_3$ | $CD_3$ |
| m-284 | $R^{A5}$ | H | $CD_3$ | $CD_3$ |
| m-285 | $R^{A6}$ | H | $CD_3$ | $CD_3$ |
| m-286 | $R^{A7}$ | H | $CD_3$ | $CD_3$ |
| m-287 | $R^{A8}$ | H | $CD_3$ | $CD_3$ |
| m-288 | $R^{A9}$ | H | $CD_3$ | $CD_3$ |
| m-289 | $R^{A10}$ | H | $CD_3$ | $CD_3$ |
| m-290 | $R^{A11}$ | H | $CD_3$ | $CD_3$ |
| m-291 | $R^{A12}$ | H | $CD_3$ | $CD_3$ |
| m-292 | $R^{A13}$ | H | $CD_3$ | $CD_3$ |
| m-293 | $R^{A14}$ | H | $CD_3$ | $CD_3$ |
| m-294 | $R^{A15}$ | H | $CD_3$ | $CD_3$ |
| m-295 | $R^{A16}$ | H | $CD_3$ | $CD_3$ |
| m-296 | $R^{A17}$ | H | $CD_3$ | $CD_3$ |
| m-297 | $R^{A18}$ | H | $CD_3$ | $CD_3$ |
| m-300 | $R^{A21}$ | H | $CD_3$ | $CD_3$ |
| m-301 | $R^{A22}$ | H | $CD_3$ | $CD_3$ |
| m-302 | $R^{A23}$ | H | $CD_3$ | $CD_3$ |
| m-303 | $R^{A24}$ | H | $CD_3$ | $CD_3$ |
| m-304 | $R^{A25}$ | H | $CD_3$ | $CD_3$ |
| m-305 | $R^{A26}$ | H | $CD_3$ | $CD_3$ |
| m-306 | $R^{A27}$ | H | $CD_3$ | $CD_3$ |
| m-307 | $R^{A28}$ | H | $CD_3$ | $CD_3$ |
| m-308 | $R^{A29}$ | H | $CD_3$ | $CD_3$ |
| m-309 | $R^{A30}$ | H | $CD_3$ | $CD_3$ |
| m-310 | $R^{A31}$ | H | $CD_3$ | $CD_3$ |
| m-311 | $R^{A32}$ | H | $CD_3$ | $CD_3$ |
| m-312 | $R^{A33}$ | H | $CD_3$ | $CD_3$ |
| m-313 | $R^{A34}$ | H | $CD_3$ | $CD_3$ |
| m-314 | $R^{A35}$ | H | $CD_3$ | $CD_3$ |
| m-315 | $R^{A36}$ | H | $CD_3$ | $CD_3$ |
| m-316 | $R^{A37}$ | H | $CD_3$ | $CD_3$ |
| m-317 | $R^{A38}$ | H | $CD_3$ | $CD_3$ |
| m-320 | $R^{A41}$ | H | $CD_3$ | $CD_3$ |
| m-321 | $R^{A42}$ | H | $CD_3$ | $CD_3$ |
| m-322 | $R^{A43}$ | H | $CD_3$ | $CD_3$ |
| m-323 | $R^{A44}$ | H | $CD_3$ | $CD_3$ |
| m-324 | $R^{A45}$ | H | $CD_3$ | $CD_3$ |
| m-325 | $R^{A46}$ | H | $CD_3$ | $CD_3$ |
| m-326 | $R^{A47}$ | H | $CD_3$ | $CD_3$ |
| m-327 | $R^{A48}$ | H | $CD_3$ | $CD_3$ |
| m-328 | $R^{A49}$ | H | $CD_3$ | $CD_3$ |
| m-329 | $R^{A50}$ | H | $CD_3$ | $CD_3$ |
| m-330 | $R^{A51}$ | H | $CD_3$ | $CD_3$ |
| m-331 | $R^{A52}$ | H | $CD_3$ | $CD_3$ |
| m-332 | $R^{A53}$ | H | $CD_3$ | $CD_3$ |
| m-333 | $R^{A54}$ | H | $CD_3$ | $CD_3$ |
| m-334 | $R^{A55}$ | H | $CD_3$ | $CD_3$ |
| m-335 | $R^{A56}$ | H | $CD_3$ | $CD_3$ |
| m-336 | $R^{A57}$ | H | $CD_3$ | $CD_3$ |
| m-337 | $R^{A58}$ | H | $CD_3$ | $CD_3$ |

| Compound # | $R^{1a}$ | $R^{1b}$ | $R^{2a}$ | $R^{2b}$ |
|---|---|---|---|---|
| m-338 | $R^{A59}$ | H | $CD_3$ | $CD_3$ |
| m-339 | $R^{A60}$ | H | $CD_3$ | $CD_3$ |
| m-340 | $R^{A61}$ | H | $CD_3$ | $CD_3$ |
| m-341 | $R^{A62}$ | H | $CD_3$ | $CD_3$ |
| m-342 | $R^{A63}$ | H | $CD_3$ | $CD_3$ |
| m-343 | $R^{A64}$ | H | $CD_3$ | $CD_3$ |
| m-344 | $R^{A65}$ | H | $CD_3$ | $CD_3$ |
| m-347 | $R^{A68}$ | H | $CD_3$ | $CD_3$ |
| m-348 | $R^{A69}$ | H | $CD_3$ | $CD_3$ |
| m-349 | $R^{A70}$ | H | $CD_3$ | $CD_3$ |
| m-350 | $R^{A71}$ | H | $CD_3$ | $CD_3$ |
| m-351 | $R^{A72}$ | H | $CD_3$ | $CD_3$ |
| m-352 | $R^{A73}$ | H | $CD_3$ | $CD_3$ |
| m-353 | $R^{A74}$ | H | $CD_3$ | $CD_3$ |
| m-354 | $R^{A75}$ | H | $CD_3$ | $CD_3$ |
| m-355 | $R^{A76}$ | H | $CD_3$ | $CD_3$ |
| m-356 | $R^{A77}$ | H | $CD_3$ | $CD_3$ |
| m-357 | $R^{A78}$ | H | $CD_3$ | $CD_3$ |
| m-358 | $R^{A79}$ | H | $CD_3$ | $CD_3$ |
| m-359 | $R^{A80}$ | H | $CD_3$ | $CD_3$ |
| m-360 | $R^{A81}$ | H | $CD_3$ | $CD_3$ |
| m-361 | $R^{A82}$ | H | $CD_3$ | $CD_3$ |
| m-362 | $R^{A83}$ | H | $CD_3$ | $CD_3$ |
| m-363 | $R^{A84}$ | H | $CD_3$ | $CD_3$ |
| m-364 | $R^{A85}$ | H | $CD_3$ | $CD_3$ |
| m-365 | $R^{A86}$ | H | $CD_3$ | $CD_3$ |
| m-366 | $R^{A87}$ | H | $CD_3$ | $CD_3$ |
| m-367 | $R^{A88}$ | H | $CD_3$ | $CD_3$ |
| m-368 | $R^{A89}$ | H | $CD_3$ | $CD_3$ |
| m-369 | $R^{A90}$ | H | $CD_3$ | $CD_3$ |
| m-370 | $R^{A91}$ | H | $CD_3$ | $CD_3$ |
| m-371 | $R^{A92}$ | H | $CD_3$ | $CD_3$ |
| m-373 | $R^{A1}$ | $CD_3$ | $CD_3$ | $CD_3$ |
| m-374 | $R^{A2}$ | $CD_3$ | $CD_3$ | $CD_3$ |
| m-375 | $R^{A3}$ | $CD_3$ | $CD_3$ | $CD_3$ |
| m-376 | $R^{A4}$ | $CD_3$ | $CD_3$ | $CD_3$ |
| m-377 | $R^{A5}$ | $CD_3$ | $CD_3$ | $CD_3$ |
| m-378 | $R^{A6}$ | $CD_3$ | $CD_3$ | $CD_3$ |
| m-379 | $R^{A7}$ | $CD_3$ | $CD_3$ | $CD_3$ |
| m-380 | $R^{A8}$ | $CD_3$ | $CD_3$ | $CD_3$ |
| m-381 | $R^{A9}$ | $CD_3$ | $CD_3$ | $CD_3$ |
| m-382 | $R^{A10}$ | $CD_3$ | $CD_3$ | $CD_3$ |
| m-383 | $R^{A11}$ | $CD_3$ | $CD_3$ | $CD_3$ |
| m-384 | $R^{A12}$ | $CD_3$ | $CD_3$ | $CD_3$ |
| m-385 | $R^{A13}$ | $CD_3$ | $CD_3$ | $CD_3$ |
| m-386 | $R^{A14}$ | $CD_3$ | $CD_3$ | $CD_3$ |
| m-387 | $R^{A15}$ | $CD_3$ | $CD_3$ | $CD_3$ |
| m-388 | $R^{A16}$ | $CD_3$ | $CD_3$ | $CD_3$ |
| m-389 | $R^{A17}$ | $CD_3$ | $CD_3$ | $CD_3$ |
| m-390 | $R^{A18}$ | $CD_3$ | $CD_3$ | $CD_3$ |
| m-393 | $R^{A21}$ | $CD_3$ | $CD_3$ | $CD_3$ |
| m-394 | $R^{A22}$ | $CD_3$ | $CD_3$ | $CD_3$ |
| m-395 | $R^{A23}$ | $CD_3$ | $CD_3$ | $CD_3$ |
| m-396 | $R^{A24}$ | $CD_3$ | $CD_3$ | $CD_3$ |
| m-397 | $R^{A25}$ | $CD_3$ | $CD_3$ | $CD_3$ |
| m-398 | $R^{A26}$ | $CD_3$ | $CD_3$ | $CD_3$ |
| m-399 | $R^{A27}$ | $CD_3$ | $CD_3$ | $CD_3$ |
| m-400 | $R^{A28}$ | $CD_3$ | $CD_3$ | $CD_3$ |
| m-401 | $R^{A29}$ | $CD_3$ | $CD_3$ | $CD_3$ |
| m-402 | $R^{A30}$ | $CD_3$ | $CD_3$ | $CD_3$ |
| m-403 | $R^{A31}$ | $CD_3$ | $CD_3$ | $CD_3$ |
| m-404 | $R^{A32}$ | $CD_3$ | $CD_3$ | $CD_3$ |
| m-405 | $R^{A33}$ | $CD_3$ | $CD_3$ | $CD_3$ |
| m-406 | $R^{A34}$ | $CD_3$ | $CD_3$ | $CD_3$ |
| m-407 | $R^{A35}$ | $CD_3$ | $CD_3$ | $CD_3$ |
| m-408 | $R^{A36}$ | $CD_3$ | $CD_3$ | $CD_3$ |
| m-409 | $R^{A37}$ | $CD_3$ | $CD_3$ | $CD_3$ |
| m-410 | $R^{A38}$ | $CD_3$ | $CD_3$ | $CD_3$ |
| m-413 | $R^{A41}$ | $CD_3$ | $CD_3$ | $CD_3$ |
| m-414 | $R^{A42}$ | $CD_3$ | $CD_3$ | $CD_3$ |
| m-415 | $R^{A43}$ | $CD_3$ | $CD_3$ | $CD_3$ |
| m-416 | $R^{A44}$ | $CD_3$ | $CD_3$ | $CD_3$ |
| m-417 | $R^{A45}$ | $CD_3$ | $CD_3$ | $CD_3$ |
| m-418 | $R^{A46}$ | $CD_3$ | $CD_3$ | $CD_3$ |
| m-419 | $R^{A47}$ | $CD_3$ | $CD_3$ | $CD_3$ |
| m-420 | $R^{A48}$ | $CD_3$ | $CD_3$ | $CD_3$ |
| m-421 | $R^{A49}$ | $CD_3$ | $CD_3$ | $CD_3$ |

-continued

| Compound # | $R^{1a}$ | $R^{1b}$ | $R^{2a}$ | $R^{2b}$ |
|---|---|---|---|---|
| m-422 | $R^{A450}$ | $CD_3$ | $CD_3$ | $CD_3$ |
| m-423 | $R^{A451}$ | $CD_3$ | $CD_3$ | $CD_3$ |
| m-424 | $R^{A452}$ | $CD_3$ | $CD_3$ | $CD_3$ |
| m-425 | $R^{A453}$ | $CD_3$ | $CD_3$ | $CD_3$ |
| m-426 | $R^{A454}$ | $CD_3$ | $CD_3$ | $CD_3$ |
| m-427 | $R^{A455}$ | $CD_3$ | $CD_3$ | $CD_3$ |
| m-428 | $R^{A456}$ | $CD_3$ | $CD_3$ | $CD_3$ |
| m-429 | $R^{A457}$ | $CD_3$ | $CD_3$ | $CD_3$ |
| m-430 | $R^{A458}$ | $CD_3$ | $CD_3$ | $CD_3$ |
| m-431 | $R^{A459}$ | $CD_3$ | $CD_3$ | $CD_3$ |
| m-432 | $R^{A460}$ | $CD_3$ | $CD_3$ | $CD_3$ |
| m-433 | $R^{A461}$ | $CD_3$ | $CD_3$ | $CD_3$ |
| m-434 | $R^{A462}$ | $CD_3$ | $CD_3$ | $CD_3$ |
| m-435 | $R^{A463}$ | $CD_3$ | $CD_3$ | $CD_3$ |
| m-436 | $R^{A464}$ | $CD_3$ | $CD_3$ | $CD_3$ |
| m-437 | $R^{A465}$ | $CD_3$ | $CD_3$ | $CD_3$ |
| m-440 | $R^{A468}$ | $CD_3$ | $CD_3$ | $CD_3$ |
| m-441 | $R^{A469}$ | $CD_3$ | $CD_3$ | $CD_3$ |
| m-442 | $R^{A470}$ | $CD_3$ | $CD_3$ | $CD_3$ |
| m-443 | $R^{A471}$ | $CD_3$ | $CD_3$ | $CD_3$ |
| m-444 | $R^{A472}$ | $CD_3$ | $CD_3$ | $CD_3$ |
| m-445 | $R^{A473}$ | $CD_3$ | $CD_3$ | $CD_3$ |
| m-446 | $R^{A474}$ | $CD_3$ | $CD_3$ | $CD_3$ |
| m-447 | $R^{A475}$ | $CD_3$ | $CD_3$ | $CD_3$ |
| m-448 | $R^{A476}$ | $CD_3$ | $CD_3$ | $CD_3$ |
| m-449 | $R^{A477}$ | $CD_3$ | $CD_3$ | $CD_3$ |
| m-450 | $R^{A478}$ | $CD_3$ | $CD_3$ | $CD_3$ |
| m-451 | $R^{A479}$ | $CD_3$ | $CD_3$ | $CD_3$ |
| m-452 | $R^{A480}$ | $CD_3$ | $CD_3$ | $CD_3$ |
| m-453 | $R^{A481}$ | $CD_3$ | $CD_3$ | $CD_3$ |
| m-454 | $R^{A482}$ | $CD_3$ | $CD_3$ | $CD_3$ |
| m-455 | $R^{A483}$ | $CD_3$ | $CD_3$ | $CD_3$ |
| m-456 | $R^{A484}$ | $CD_3$ | $CD_3$ | $CD_3$ |
| m-457 | $R^{A485}$ | $CD_3$ | $CD_3$ | $CD_3$ |
| m-458 | $R^{A486}$ | $CD_3$ | $CD_3$ | $CD_3$ |
| m-459 | $R^{A487}$ | $CD_3$ | $CD_3$ | $CD_3$ |
| m-460 | $R^{A488}$ | $CD_3$ | $CD_3$ | $CD_3$ |
| m-461 | $R^{A489}$ | $CD_3$ | $CD_3$ | $CD_3$ |
| m-462 | $R^{A490}$ | $CD_3$ | $CD_3$ | $CD_3$ |
| m-463 | $R^{A491}$ | $CD_3$ | $CD_3$ | $CD_3$ |
| m-464 | $R^{A492}$ | $CD_3$ | $CD_3$ | $CD_3$ |
| m-559 | $R^{A1}$ | $CD_3$ | H | $CD_3$ |
| m-560 | $R^{A2}$ | $CD_3$ | H | $CD_3$ |
| m-561 | $R^{A3}$ | $CD_3$ | H | $CD_3$ |
| m-562 | $R^{A4}$ | $CD_3$ | H | $CD_3$ |
| m-563 | $R^{A5}$ | $CD_3$ | H | $CD_3$ |
| m-564 | $R^{A6}$ | $CD_3$ | H | $CD_3$ |
| m-565 | $R^{A7}$ | $CD_3$ | H | $CD_3$ |
| m-566 | $R^{A8}$ | $CD_3$ | H | $CD_3$ |
| m-567 | $R^{A9}$ | $CD_3$ | H | $CD_3$ |
| m-568 | $R^{A10}$ | $CD_3$ | H | $CD_3$ |
| m-569 | $R^{A11}$ | $CD_3$ | H | $CD_3$ |
| m-570 | $R^{A12}$ | $CD_3$ | H | $CD_3$ |
| m-571 | $R^{A13}$ | $CD_3$ | H | $CD_3$ |
| m-572 | $R^{A14}$ | $CD_3$ | H | $CD_3$ |
| m-573 | $R^{A15}$ | $CD_3$ | H | $CD_3$ |
| m-574 | $R^{A16}$ | $CD_3$ | H | $CD_3$ |
| m-575 | $R^{A17}$ | $CD_3$ | H | $CD_3$ |
| m-576 | $R^{A18}$ | $CD_3$ | H | $CD_3$ |
| m-579 | $R^{A21}$ | $CD_3$ | H | $CD_3$ |
| m-580 | $R^{A22}$ | $CD_3$ | H | $CD_3$ |
| m-581 | $R^{A23}$ | $CD_3$ | H | $CD_3$ |
| m-582 | $R^{A24}$ | $CD_3$ | H | $CD_3$ |
| m-583 | $R^{A25}$ | $CD_3$ | H | $CD_3$ |
| m-584 | $R^{A26}$ | $CD_3$ | H | $CD_3$ |
| m-585 | $R^{A27}$ | $CD_3$ | H | $CD_3$ |
| m-586 | $R^{A28}$ | $CD_3$ | H | $CD_3$ |
| m-587 | $R^{A29}$ | $CD_3$ | H | $CD_3$ |
| m-588 | $R^{A30}$ | $CD_3$ | H | $CD_3$ |
| m-589 | $R^{A31}$ | $CD_3$ | H | $CD_3$ |
| m-590 | $R^{A32}$ | $CD_3$ | H | $CD_3$ |
| m-591 | $R^{A33}$ | $CD_3$ | H | $CD_3$ |
| m-592 | $R^{A34}$ | $CD_3$ | H | $CD_3$ |
| m-593 | $R^{A35}$ | $CD_3$ | H | $CD_3$ |
| m-594 | $R^{A36}$ | $CD_3$ | H | $CD_3$ |
| m-595 | $R^{A37}$ | $CD_3$ | H | $CD_3$ |
| m-596 | $R^{A38}$ | $CD_3$ | H | $CD_3$ |

-continued

| Compound # | $R^{1a}$ | $R^{1b}$ | $R^{2a}$ | $R^{2b}$ |
|---|---|---|---|---|
| m-599 | $R^{A441}$ | $CD_3$ | H | $CD_3$ |
| m-600 | $R^{A442}$ | $CD_3$ | H | $CD_3$ |
| m-601 | $R^{A443}$ | $CD_3$ | H | $CD_3$ |
| m-602 | $R^{A444}$ | $CD_3$ | H | $CD_3$ |
| m-603 | $R^{A445}$ | $CD_3$ | H | $CD_3$ |
| m-604 | $R^{A446}$ | $CD_3$ | H | $CD_3$ |
| m-605 | $R^{A447}$ | $CD_3$ | H | $CD_3$ |
| m-606 | $R^{A448}$ | $CD_3$ | H | $CD_3$ |
| m-607 | $R^{A449}$ | $CD_3$ | H | $CD_3$ |
| m-608 | $R^{A450}$ | $CD_3$ | H | $CD_3$ |
| m-609 | $R^{A451}$ | $CD_3$ | H | $CD_3$ |
| m-610 | $R^{A452}$ | $CD_3$ | H | $CD_3$ |
| m-611 | $R^{A453}$ | $CD_3$ | H | $CD_3$ |
| m-612 | $R^{A454}$ | $CD_3$ | H | $CD_3$ |
| m-613 | $R^{A455}$ | $CD_3$ | H | $CD_3$ |
| m-614 | $R^{A456}$ | $CD_3$ | H | $CD_3$ |
| m-615 | $R^{A457}$ | $CD_3$ | H | $CD_3$ |
| m-616 | $R^{A458}$ | $CD_3$ | H | $CD_3$ |
| m-617 | $R^{A459}$ | $CD_3$ | H | $CD_3$ |
| m-618 | $R^{A460}$ | $CD_3$ | H | $CD_3$ |
| m-619 | $R^{A461}$ | $CD_3$ | H | $CD_3$ |
| m-620 | $R^{A462}$ | $CD_3$ | H | $CD_3$ |
| m-621 | $R^{A463}$ | $CD_3$ | H | $CD_3$ |
| m-622 | $R^{A464}$ | $CD_3$ | H | $CD_3$ |
| m-623 | $R^{A465}$ | $CD_3$ | H | $CD_3$ |
| m-626 | $R^{A468}$ | $CD_3$ | H | $CD_3$ |
| m-627 | $R^{A469}$ | $CD_3$ | H | $CD_3$ |
| m-628 | $R^{A470}$ | $CD_3$ | H | $CD_3$ |
| m-629 | $R^{A471}$ | $CD_3$ | H | $CD_3$ |
| m-630 | $R^{A472}$ | $CD_3$ | H | $CD_3$ |
| m-631 | $R^{A473}$ | $CD_3$ | H | $CD_3$ |
| m-632 | $R^{A474}$ | $CD_3$ | H | $CD_3$ |
| m-633 | $R^{A475}$ | $CD_3$ | H | $CD_3$ |
| m-634 | $R^{A476}$ | $CD_3$ | H | $CD_3$ |
| m-635 | $R^{A477}$ | $CD_3$ | H | $CD_3$ |
| m-636 | $R^{A478}$ | $CD_3$ | H | $CD_3$ |
| m-637 | $R^{A479}$ | $CD_3$ | H | $CD_3$ |
| m-638 | $R^{A480}$ | $CD_3$ | H | $CD_3$ |
| m-639 | $R^{A481}$ | $CD_3$ | H | $CD_3$ |
| m-640 | $R^{A482}$ | $CD_3$ | H | $CD_3$ |
| m-641 | $R^{A483}$ | $CD_3$ | H | $CD_3$ |
| m-642 | $R^{A484}$ | $CD_3$ | H | $CD_3$ |
| m-643 | $R^{A485}$ | $CD_3$ | H | $CD_3$ |
| m-644 | $R^{A486}$ | $CD_3$ | H | $CD_3$ |
| m-645 | $R^{A487}$ | $CD_3$ | H | $CD_3$ |
| m-646 | $R^{A488}$ | $CD_3$ | H | $CD_3$ |
| m-647 | $R^{A489}$ | $CD_3$ | H | $CD_3$ |
| m-648 | $R^{A490}$ | $CD_3$ | H | $CD_3$ |
| m-649 | $R^{A491}$ | $CD_3$ | H | $CD_3$ |
| m-650 | $R^{A492}$ | $CD_3$ | H | $CD_3$ |
| m-652 | $CD_3$ | $R^{A1}$ | H | $R^{A494}$ |
| m-653 | $CD_3$ | $R^{A2}$ | H | $R^{A494}$ |
| m-654 | $CD_3$ | $R^{A3}$ | H | $R^{A494}$ |
| m-655 | $CD_3$ | $R^{A4}$ | H | $R^{A494}$ |
| m-656 | $CD_3$ | $R^{A5}$ | H | $R^{A494}$ |
| m-657 | $CD_3$ | $R^{A6}$ | H | $R^{A494}$ |
| m-658 | $CD_3$ | $R^{A7}$ | H | $R^{A494}$ |
| m-659 | $CD_3$ | $R^{A8}$ | H | $R^{A494}$ |
| m-660 | $CD_3$ | $R^{A9}$ | H | $R^{A494}$ |
| m-661 | $CD_3$ | $R^{A10}$ | H | $R^{A494}$ |
| m-662 | $CD_3$ | $R^{A11}$ | H | $R^{A494}$ |
| m-663 | $CD_3$ | $R^{A12}$ | H | $R^{A494}$ |
| m-664 | $CD_3$ | $R^{A13}$ | H | $R^{A494}$ |
| m-665 | $CD_3$ | $R^{A14}$ | H | $R^{A494}$ |
| m-666 | $CD_3$ | $R^{A15}$ | H | $R^{A494}$ |
| m-667 | $CD_3$ | $R^{A16}$ | H | $R^{A494}$ |
| m-668 | $CD_3$ | $R^{A17}$ | H | $R^{A494}$ |
| m-669 | $CD_3$ | $R^{A18}$ | H | $R^{A494}$ |
| m-672 | $CD_3$ | $R^{A21}$ | H | $R^{A494}$ |
| m-673 | $CD_3$ | $R^{A22}$ | H | $R^{A494}$ |
| m-674 | $CD_3$ | $R^{A23}$ | H | $R^{A494}$ |
| m-675 | $CD_3$ | $R^{A24}$ | H | $R^{A494}$ |
| m-676 | $CD_3$ | $R^{A25}$ | H | $R^{A494}$ |
| m-677 | $CD_3$ | $R^{A26}$ | H | $R^{A494}$ |
| m-678 | $CD_3$ | $R^{A27}$ | H | $R^{A494}$ |
| m-679 | $CD_3$ | $R^{A28}$ | H | $R^{A494}$ |
| m-680 | $CD_3$ | $R^{A29}$ | H | $R^{A494}$ |

-continued

| Compound # | $R^{1a}$ | $R^{1b}$ | $R^{2a}$ | $R^{2b}$ |
|---|---|---|---|---|
| m-681 | $CD_3$ | $R^{A30}$ | H | $R^{A94}$ |
| m-682 | $CD_3$ | $R^{A31}$ | H | $R^{A94}$ |
| m-683 | $CD_3$ | $R^{A32}$ | H | $R^{A94}$ |
| m-684 | $CD_3$ | $R^{A33}$ | H | $R^{A94}$ |
| m-685 | $CD_3$ | $R^{A34}$ | H | $R^{A94}$ |
| m-686 | $CD_3$ | $R^{A35}$ | H | $R^{A94}$ |
| m-687 | $CD_3$ | $R^{A36}$ | H | $R^{A94}$ |
| m-688 | $CD_3$ | $R^{A37}$ | H | $R^{A94}$ |
| m-689 | $CD_3$ | $R^{A38}$ | H | $R^{A94}$ |
| m-692 | $CD_3$ | $R^{A41}$ | H | $R^{A94}$ |
| m-693 | $CD_3$ | $R^{A42}$ | H | $R^{A94}$ |
| m-694 | $CD_3$ | $R^{A43}$ | H | $R^{A94}$ |
| m-695 | $CD_3$ | $R^{A44}$ | H | $R^{A94}$ |
| m-696 | $CD_3$ | $R^{A45}$ | H | $R^{A94}$ |
| m-697 | $CD_3$ | $R^{A46}$ | H | $R^{A94}$ |
| m-698 | $CD_3$ | $R^{A47}$ | H | $R^{A94}$ |
| m-699 | $CD_3$ | $R^{A48}$ | H | $R^{A94}$ |
| m-700 | $CD_3$ | $R^{A49}$ | H | $R^{A94}$ |
| m-701 | $CD_3$ | $R^{A50}$ | H | $R^{A94}$ |
| m-702 | $CD_3$ | $R^{A51}$ | H | $R^{A94}$ |
| m-703 | $CD_3$ | $R^{A52}$ | H | $R^{A94}$ |
| m-704 | $CD_3$ | $R^{A53}$ | H | $R^{A94}$ |
| m-705 | $CD_3$ | $R^{A54}$ | H | $R^{A94}$ |
| m-706 | $CD_3$ | $R^{A55}$ | H | $R^{A94}$ |
| m-707 | $CD_3$ | $R^{A56}$ | H | $R^{A94}$ |
| m-708 | $CD_3$ | $R^{A57}$ | H | $R^{A94}$ |
| m-709 | $CD_3$ | $R^{A58}$ | H | $R^{A94}$ |
| m-710 | $CD_3$ | $R^{A59}$ | H | $R^{A94}$ |
| m-711 | $CD_3$ | $R^{A60}$ | H | $R^{A94}$ |
| m-712 | $CD_3$ | $R^{A61}$ | H | $R^{A94}$ |
| m-713 | $CD_3$ | $R^{A62}$ | H | $R^{A94}$ |
| m-714 | $CD_3$ | $R^{A63}$ | H | $R^{A94}$ |
| m-715 | $CD_3$ | $R^{A64}$ | H | $R^{A94}$ |
| m-716 | $CD_3$ | $R^{A65}$ | H | $R^{A94}$ |
| m-719 | $CD_3$ | $R^{A68}$ | H | $R^{A94}$ |
| m-720 | $CD_3$ | $R^{A69}$ | H | $R^{A94}$ |
| m-721 | $CD_3$ | $R^{A70}$ | H | $R^{A94}$ |
| m-722 | $CD_3$ | $R^{A71}$ | H | $R^{A94}$ |
| m-723 | $CD_3$ | $R^{A72}$ | H | $R^{A94}$ |
| m-724 | $CD_3$ | $R^{A73}$ | H | $R^{A94}$ |
| m-725 | $CD_3$ | $R^{A74}$ | H | $R^{A94}$ |
| m-726 | $CD_3$ | $R^{A75}$ | H | $R^{A94}$ |
| m-727 | $CD_3$ | $R^{A76}$ | H | $R^{A94}$ |
| m-728 | $CD_3$ | $R^{A77}$ | H | $R^{A94}$ |
| m-729 | $CD_3$ | $R^{A78}$ | H | $R^{A94}$ |
| m-730 | $CD_3$ | $R^{A79}$ | H | $R^{A94}$ |
| m-731 | $CD_3$ | $R^{A80}$ | H | $R^{A94}$ |
| m-732 | $CD_3$ | $R^{A81}$ | H | $R^{A94}$ |
| m-733 | $CD_3$ | $R^{A82}$ | H | $R^{A94}$ |
| m-734 | $CD_3$ | $R^{A83}$ | H | $R^{A94}$ |
| m-735 | $CD_3$ | $R^{A84}$ | H | $R^{A94}$ |
| m-736 | $CD_3$ | $R^{A85}$ | H | $R^{A94}$ |
| m-737 | $CD_3$ | $R^{A86}$ | H | $R^{A94}$ |
| m-738 | $CD_3$ | $R^{A87}$ | H | $R^{A94}$ |
| m-739 | $CD_3$ | $R^{A88}$ | H | $R^{A94}$ |
| m-740 | $CD_3$ | $R^{A89}$ | H | $R^{A94}$ |
| m-741 | $CD_3$ | $R^{A90}$ | H | $R^{A94}$ |
| m-742 | $CD_3$ | $R^{A91}$ | H | $R^{A94}$ |
| m-743 | $CD_3$ | $R^{A92}$ | H | $R^{A94}$ |
| m-745 | $R^{A1}$ | H | H | $R^{A94}$ |
| m-746 | $R^{A2}$ | H | H | $R^{A94}$ |
| m-747 | $R^{A3}$ | H | H | $R^{A94}$ |
| m-748 | $R^{A4}$ | H | H | $R^{A94}$ |
| m-749 | $R^{A5}$ | H | H | $R^{A94}$ |
| m-750 | $R^{A6}$ | H | H | $R^{A94}$ |
| m-751 | $R^{A7}$ | H | H | $R^{A94}$ |
| m-752 | $R^{A8}$ | H | H | $R^{A94}$ |
| m-753 | $R^{A9}$ | H | H | $R^{A94}$ |
| m-754 | $R^{A10}$ | H | H | $R^{A94}$ |
| m-755 | $R^{A11}$ | H | H | $R^{A94}$ |
| m-756 | $R^{A12}$ | H | H | $R^{A94}$ |
| m-757 | $R^{A13}$ | H | H | $R^{A94}$ |
| m-758 | $R^{A14}$ | H | H | $R^{A94}$ |
| m-759 | $R^{A15}$ | H | H | $R^{A94}$ |
| m-760 | $R^{A16}$ | H | H | $R^{A94}$ |
| m-761 | $R^{A17}$ | H | H | $R^{A94}$ |
| m-762 | $R^{A18}$ | H | H | $R^{A94}$ |

-continued

| Compound # | $R^{1a}$ | $R^{1b}$ | $R^{2a}$ | $R^{2b}$ |
|---|---|---|---|---|
| m-765 | $R^{A21}$ | H | H | $R^{A94}$ |
| m-766 | $R^{A22}$ | H | H | $R^{A94}$ |
| m-767 | $R^{A23}$ | H | H | $R^{A94}$ |
| m-768 | $R^{A24}$ | H | H | $R^{A94}$ |
| m-769 | $R^{A25}$ | H | H | $R^{A94}$ |
| m-770 | $R^{A26}$ | H | H | $R^{A94}$ |
| m-771 | $R^{A27}$ | H | H | $R^{A94}$ |
| m-772 | $R^{A28}$ | H | H | $R^{A94}$ |
| m-773 | $R^{A29}$ | H | H | $R^{A94}$ |
| m-774 | $R^{A30}$ | H | H | $R^{A94}$ |
| m-775 | $R^{A31}$ | H | H | $R^{A94}$ |
| m-776 | $R^{A32}$ | H | H | $R^{A94}$ |
| m-777 | $R^{A33}$ | H | H | $R^{A94}$ |
| m-778 | $R^{A34}$ | H | H | $R^{A94}$ |
| m-779 | $R^{A35}$ | H | H | $R^{A94}$ |
| m-780 | $R^{A36}$ | H | H | $R^{A94}$ |
| m-781 | $R^{A37}$ | H | H | $R^{A94}$ |
| m-782 | $R^{A38}$ | H | H | $R^{A94}$ |
| m-785 | $R^{A41}$ | H | H | $R^{A94}$ |
| m-786 | $R^{A42}$ | H | H | $R^{A94}$ |
| m-787 | $R^{A43}$ | H | H | $R^{A94}$ |
| m-788 | $R^{A44}$ | H | H | $R^{A94}$ |
| m-789 | $R^{A45}$ | H | H | $R^{A94}$ |
| m-790 | $R^{A46}$ | H | H | $R^{A94}$ |
| m-791 | $R^{A47}$ | H | H | $R^{A94}$ |
| m-792 | $R^{A48}$ | H | H | $R^{A94}$ |
| m-793 | $R^{A49}$ | H | H | $R^{A94}$ |
| m-794 | $R^{A50}$ | H | H | $R^{A94}$ |
| m-795 | $R^{A51}$ | H | H | $R^{A94}$ |
| m-796 | $R^{A52}$ | H | H | $R^{A94}$ |
| m-797 | $R^{A53}$ | H | H | $R^{A94}$ |
| m-798 | $R^{A54}$ | H | H | $R^{A94}$ |
| m-799 | $R^{A55}$ | H | H | $R^{A94}$ |
| m-800 | $R^{A56}$ | H | H | $R^{A94}$ |
| m-801 | $R^{A57}$ | H | H | $R^{A94}$ |
| m-802 | $R^{A58}$ | H | H | $R^{A94}$ |
| m-803 | $R^{A59}$ | H | H | $R^{A94}$ |
| m-804 | $R^{A60}$ | H | H | $R^{A94}$ |
| m-805 | $R^{A61}$ | H | H | $R^{A94}$ |
| m-806 | $R^{A62}$ | H | H | $R^{A94}$ |
| m-807 | $R^{A63}$ | H | H | $R^{A94}$ |
| m-808 | $R^{A64}$ | H | H | $R^{A94}$ |
| m-809 | $R^{A65}$ | H | H | $R^{A94}$ |
| m-812 | $R^{A68}$ | H | H | $R^{A94}$ |
| m-813 | $R^{A69}$ | H | H | $R^{A94}$ |
| m-814 | $R^{A70}$ | H | H | $R^{A94}$ |
| m-815 | $R^{A71}$ | H | H | $R^{A94}$ |
| m-816 | $R^{A72}$ | H | H | $R^{A94}$ |
| m-817 | $R^{A73}$ | H | H | $R^{A94}$ |
| m-818 | $R^{A74}$ | H | H | $R^{A94}$ |
| m-819 | $R^{A75}$ | H | H | $R^{A94}$ |
| m-820 | $R^{A76}$ | H | H | $R^{A94}$ |
| m-821 | $R^{A77}$ | H | H | $R^{A94}$ |
| m-822 | $R^{A78}$ | H | H | $R^{A94}$ |
| m-823 | $R^{A79}$ | H | H | $R^{A94}$ |
| m-824 | $R^{A80}$ | H | H | $R^{A94}$ |
| m-825 | $R^{A81}$ | H | H | $R^{A94}$ |
| m-826 | $R^{A82}$ | H | H | $R^{A94}$ |
| m-827 | $R^{A83}$ | H | H | $R^{A94}$ |
| m-828 | $R^{A84}$ | H | H | $R^{A94}$ |
| m-829 | $R^{A85}$ | H | H | $R^{A94}$ |
| m-830 | $R^{A86}$ | H | H | $R^{A94}$ |
| m-831 | $R^{A87}$ | H | H | $R^{A94}$ |
| m-832 | $R^{A88}$ | H | H | $R^{A94}$ |
| m-833 | $R^{A89}$ | H | H | $R^{A94}$ |
| m-834 | $R^{A90}$ | H | H | $R^{A94}$ |
| m-835 | $R^{A91}$ | H | H | $R^{A94}$ |
| m-836 | $R^{A92}$ | H | H | $R^{A94}$ |
| m-838 | $R^{A1}$ | H | $R^{A94}$ | $R^{A94}$ |
| m-839 | $R^{A2}$ | H | $R^{A94}$ | $R^{A94}$ |
| m-840 | $R^{A3}$ | H | $R^{A94}$ | $R^{A94}$ |
| m-841 | $R^{A4}$ | H | $R^{A94}$ | $R^{A94}$ |
| m-842 | $R^{A5}$ | H | $R^{A94}$ | $R^{A94}$ |
| m-843 | $R^{A6}$ | H | $R^{A94}$ | $R^{A94}$ |
| m-844 | $R^{A7}$ | H | $R^{A94}$ | $R^{A94}$ |
| m-845 | $R^{A8}$ | H | $R^{A94}$ | $R^{A94}$ |
| m-846 | $R^{A9}$ | H | $R^{A94}$ | $R^{A94}$ |

-continued

| Compound # | $R^{1a}$ | $R^{1b}$ | $R^{2a}$ | $R^{2b}$ |
|---|---|---|---|---|
| m-847 | $R^{A10}$ | H | $R^{A94}$ | $R^{A94}$ |
| m-848 | $R^{A11}$ | H | $R^{A94}$ | $R^{A94}$ |
| m-849 | $R^{A12}$ | H | $R^{A94}$ | $R^{A94}$ |
| m-850 | $R^{A13}$ | H | $R^{A94}$ | $R^{A94}$ |
| m-851 | $R^{A14}$ | H | $R^{A94}$ | $R^{A94}$ |
| m-852 | $R^{A15}$ | H | $R^{A94}$ | $R^{A94}$ |
| m-853 | $R^{A16}$ | H | $R^{A94}$ | $R^{A94}$ |
| m-854 | $R^{A17}$ | H | $R^{A94}$ | $R^{A94}$ |
| m-855 | $R^{A18}$ | H | $R^{A94}$ | $R^{A94}$ |
| m-858 | $R^{A21}$ | H | $R^{A94}$ | $R^{A94}$ |
| m-859 | $R^{A22}$ | H | $R^{A94}$ | $R^{A94}$ |
| m-860 | $R^{A23}$ | H | $R^{A94}$ | $R^{A94}$ |
| m-861 | $R^{A24}$ | H | $R^{A94}$ | $R^{A94}$ |
| m-862 | $R^{A25}$ | H | $R^{A94}$ | $R^{A94}$ |
| m-863 | $R^{A26}$ | H | $R^{A94}$ | $R^{A94}$ |
| m-864 | $R^{A27}$ | H | $R^{A94}$ | $R^{A94}$ |
| m-865 | $R^{A28}$ | H | $R^{A94}$ | $R^{A94}$ |
| m-866 | $R^{A29}$ | H | $R^{A94}$ | $R^{A94}$ |
| m-867 | $R^{A30}$ | H | $R^{A94}$ | $R^{A94}$ |
| m-868 | $R^{A31}$ | H | $R^{A94}$ | $R^{A94}$ |
| m-869 | $R^{A32}$ | H | $R^{A94}$ | $R^{A94}$ |
| m-870 | $R^{A33}$ | H | $R^{A94}$ | $R^{A94}$ |
| m-871 | $R^{A34}$ | H | $R^{A94}$ | $R^{A94}$ |
| m-872 | $R^{A35}$ | H | $R^{A94}$ | $R^{A94}$ |
| m-873 | $R^{A36}$ | H | $R^{A94}$ | $R^{A94}$ |
| m-874 | $R^{A37}$ | H | $R^{A94}$ | $R^{A94}$ |
| m-875 | $R^{A38}$ | H | $R^{A94}$ | $R^{A94}$ |
| m-878 | $R^{A41}$ | H | $R^{A94}$ | $R^{A94}$ |
| m-879 | $R^{A42}$ | H | $R^{A94}$ | $R^{A94}$ |
| m-880 | $R^{A43}$ | H | $R^{A94}$ | $R^{A94}$ |
| m-881 | $R^{A44}$ | H | $R^{A94}$ | $R^{A94}$ |
| m-882 | $R^{A45}$ | H | $R^{A94}$ | $R^{A94}$ |
| m-883 | $R^{A46}$ | H | $R^{A94}$ | $R^{A94}$ |
| m-884 | $R^{A47}$ | H | $R^{A94}$ | $R^{A94}$ |
| m-885 | $R^{A48}$ | H | $R^{A94}$ | $R^{A94}$ |
| m-886 | $R^{A49}$ | H | $R^{A94}$ | $R^{A94}$ |
| m-887 | $R^{A50}$ | H | $R^{A94}$ | $R^{A94}$ |
| m-888 | $R^{A51}$ | H | $R^{A94}$ | $R^{A94}$ |
| m-889 | $R^{A52}$ | H | $R^{A94}$ | $R^{A94}$ |
| m-890 | $R^{A53}$ | H | $R^{A94}$ | $R^{A94}$ |
| m-891 | $R^{A54}$ | H | $R^{A94}$ | $R^{A94}$ |
| m-892 | $R^{A55}$ | H | $R^{A94}$ | $R^{A94}$ |
| m-893 | $R^{A56}$ | H | $R^{A94}$ | $R^{A94}$ |
| m-894 | $R^{A57}$ | H | $R^{A94}$ | $R^{A94}$ |
| m-895 | $R^{A58}$ | H | $R^{A94}$ | $R^{A94}$ |
| m-896 | $R^{A59}$ | H | $R^{A94}$ | $R^{A94}$ |
| m-897 | $R^{A60}$ | H | $R^{A94}$ | $R^{A94}$ |
| m-898 | $R^{A61}$ | H | $R^{A94}$ | $R^{A94}$ |
| m-899 | $R^{A62}$ | H | $R^{A94}$ | $R^{A94}$ |
| m-900 | $R^{A63}$ | H | $R^{A94}$ | $R^{A94}$ |
| m-901 | $R^{A64}$ | H | $R^{A94}$ | $R^{A94}$ |
| m-902 | $R^{A65}$ | H | $R^{A94}$ | $R^{A94}$ |
| m-905 | $R^{A68}$ | H | $R^{A94}$ | $R^{A94}$ |
| m-906 | $R^{A69}$ | H | $R^{A94}$ | $R^{A94}$ |
| m-907 | $R^{A70}$ | H | $R^{A94}$ | $R^{A94}$ |
| m-908 | $R^{A71}$ | H | $R^{A94}$ | $R^{A94}$ |
| m-909 | $R^{A72}$ | H | $R^{A94}$ | $R^{A94}$ |
| m-910 | $R^{A73}$ | H | $R^{A94}$ | $R^{A94}$ |
| m-911 | $R^{A74}$ | H | $R^{A94}$ | $R^{A94}$ |
| m-912 | $R^{A75}$ | H | $R^{A94}$ | $R^{A94}$ |
| m-913 | $R^{A76}$ | H | $R^{A94}$ | $R^{A94}$ |
| m-914 | $R^{A77}$ | H | $R^{A94}$ | $R^{A94}$ |
| m-915 | $R^{A78}$ | H | $R^{A94}$ | $R^{A94}$ |
| m-916 | $R^{A79}$ | H | $R^{A94}$ | $R^{A94}$ |
| m-917 | $R^{A80}$ | H | $R^{A94}$ | $R^{A94}$ |
| m-918 | $R^{A81}$ | H | $R^{A94}$ | $R^{A94}$ |
| m-919 | $R^{A82}$ | H | $R^{A94}$ | $R^{A94}$ |
| m-920 | $R^{A83}$ | H | $R^{A94}$ | $R^{A94}$ |
| m-921 | $R^{A84}$ | H | $R^{A94}$ | $R^{A94}$ |
| m-922 | $R^{A85}$ | H | $R^{A94}$ | $R^{A94}$ |
| m-923 | $R^{A86}$ | H | $R^{A94}$ | $R^{A94}$ |
| m-924 | $R^{A87}$ | H | $R^{A94}$ | $R^{A94}$ |
| m-925 | $R^{A88}$ | H | $R^{A94}$ | $R^{A94}$ |
| m-926 | $R^{A89}$ | H | $R^{A94}$ | $R^{A94}$ |
| m-927 | $R^{A90}$ | H | $R^{A94}$ | $R^{A94}$ |
| m-928 | $R^{A91}$ | H | $R^{A94}$ | $R^{A94}$ |
| m-929 | $R^{A92}$ | H | $R^{A94}$ | $R^{A94}$ |

-continued

| Compound # | $R^{1a}$ | $R^{1b}$ | $R^{2a}$ | $R^{2b}$ |
|---|---|---|---|---|
| m-931 | $R^{A1}$ | H | $R^{A94}$ | $R^{A94}$ |
| m-932 | $R^{A2}$ | H | $R^{A94}$ | $R^{A94}$ |
| m-933 | $R^{A3}$ | H | $R^{A94}$ | $R^{A94}$ |
| m-934 | $R^{A4}$ | H | $R^{A94}$ | $R^{A94}$ |
| m-935 | $R^{A5}$ | H | $R^{A94}$ | $R^{A94}$ |
| m-936 | $R^{A6}$ | H | $R^{A94}$ | $R^{A94}$ |
| m-937 | $R^{A7}$ | H | $R^{A94}$ | $R^{A94}$ |
| m-938 | $R^{A8}$ | H | $R^{A94}$ | $R^{A94}$ |
| m-939 | $R^{A9}$ | H | $R^{A94}$ | $R^{A94}$ |
| m-940 | $R^{A10}$ | H | $R^{A94}$ | $R^{A94}$ |
| m-941 | $R^{A11}$ | H | $R^{A94}$ | $R^{A94}$ |
| m-942 | $R^{A12}$ | H | $R^{A94}$ | $R^{A94}$ |
| m-943 | $R^{A13}$ | H | $R^{A94}$ | $R^{A94}$ |
| m-944 | $R^{A14}$ | H | $R^{A94}$ | $R^{A94}$ |
| m-945 | $R^{A15}$ | H | $R^{A94}$ | $R^{A94}$ |
| m-946 | $R^{A16}$ | H | $R^{A94}$ | $R^{A94}$ |
| m-947 | $R^{A17}$ | H | $R^{A94}$ | $R^{A94}$ |
| m-948 | $R^{A18}$ | H | $R^{A94}$ | $R^{A94}$ |
| m-951 | $R^{A21}$ | H | $R^{A94}$ | $R^{A94}$ |
| m-952 | $R^{A22}$ | H | $R^{A94}$ | $R^{A94}$ |
| m-953 | $R^{A23}$ | H | $R^{A94}$ | $R^{A94}$ |
| m-954 | $R^{A24}$ | H | $R^{A94}$ | $R^{A94}$ |
| m-955 | $R^{A25}$ | H | $R^{A94}$ | $R^{A94}$ |
| m-956 | $R^{A26}$ | H | $R^{A94}$ | $R^{A94}$ |
| m-957 | $R^{A27}$ | H | $R^{A94}$ | $R^{A94}$ |
| m-958 | $R^{A28}$ | H | $R^{A94}$ | $R^{A94}$ |
| m-959 | $R^{A29}$ | H | $R^{A94}$ | $R^{A94}$ |
| m-960 | $R^{A30}$ | H | $R^{A94}$ | $R^{A94}$ |
| m-961 | $R^{A31}$ | H | $R^{A94}$ | $R^{A94}$ |
| m-962 | $R^{A32}$ | H | $R^{A94}$ | $R^{A94}$ |
| m-963 | $R^{A33}$ | H | $R^{A94}$ | $R^{A94}$ |
| m-964 | $R^{A34}$ | H | $R^{A94}$ | $R^{A94}$ |
| m-965 | $R^{A35}$ | H | $R^{A94}$ | $R^{A94}$ |
| m-966 | $R^{A36}$ | H | $R^{A94}$ | $R^{A94}$ |
| m-967 | $R^{A37}$ | H | $R^{A94}$ | $R^{A94}$ |
| m-968 | $R^{A38}$ | H | $R^{A94}$ | $R^{A94}$ |
| m-971 | $R^{A41}$ | H | $R^{A94}$ | $R^{A94}$ |
| m-972 | $R^{A42}$ | H | $R^{A94}$ | $R^{A94}$ |
| m-973 | $R^{A43}$ | H | $R^{A94}$ | $R^{A94}$ |
| m-974 | $R^{A44}$ | H | $R^{A94}$ | $R^{A94}$ |
| m-975 | $R^{A45}$ | H | $R^{A94}$ | $R^{A94}$ |
| m-976 | $R^{A46}$ | H | $R^{A94}$ | $R^{A94}$ |
| m-977 | $R^{A47}$ | H | $R^{A94}$ | $R^{A94}$ |
| m-978 | $R^{A48}$ | H | $R^{A94}$ | $R^{A94}$ |
| m-979 | $R^{A49}$ | H | $R^{A94}$ | $R^{A94}$ |
| m-980 | $R^{A50}$ | H | $R^{A94}$ | $R^{A94}$ |
| m-981 | $R^{A51}$ | H | $R^{A94}$ | $R^{A94}$ |
| m-982 | $R^{A52}$ | H | $R^{A94}$ | $R^{A94}$ |
| m-983 | $R^{A53}$ | H | $R^{A94}$ | $R^{A94}$ |
| m-984 | $R^{A54}$ | H | $R^{A94}$ | $R^{A94}$ |
| m-985 | $R^{A55}$ | H | $R^{A94}$ | $R^{A94}$ |
| m-986 | $R^{A56}$ | H | $R^{A94}$ | $R^{A94}$ |
| m-987 | $R^{A57}$ | H | $R^{A94}$ | $R^{A94}$ |
| m-988 | $R^{A58}$ | H | $R^{A94}$ | $R^{A94}$ |
| m-989 | $R^{A59}$ | H | $R^{A94}$ | $R^{A94}$ |
| m-990 | $R^{A60}$ | H | $R^{A94}$ | $R^{A94}$ |
| m-991 | $R^{A61}$ | H | $R^{A94}$ | $R^{A94}$ |
| m-992 | $R^{A62}$ | H | $R^{A94}$ | $R^{A94}$ |
| m-993 | $R^{A63}$ | H | $R^{A94}$ | $R^{A94}$ |
| m-994 | $R^{A64}$ | H | $R^{A94}$ | $R^{A94}$ |
| m-995 | $R^{A65}$ | H | $R^{A94}$ | $R^{A94}$ |
| m-998 | $R^{A68}$ | H | $R^{A94}$ | $R^{A94}$ |
| m-999 | $R^{A69}$ | H | $R^{A94}$ | $R^{A94}$ |
| m-1000 | $R^{A70}$ | H | $R^{A94}$ | $R^{A94}$ |
| m-1001 | $R^{A71}$ | H | $R^{A94}$ | $R^{A94}$ |
| m-1002 | $R^{A72}$ | H | $R^{A94}$ | $R^{A94}$ |
| m-1003 | $R^{A73}$ | H | $R^{A94}$ | $R^{A94}$ |
| m-1004 | $R^{A74}$ | H | $R^{A94}$ | $R^{A94}$ |
| m-1005 | $R^{A75}$ | H | $R^{A94}$ | $R^{A94}$ |
| m-1006 | $R^{A76}$ | H | $R^{A94}$ | $R^{A94}$ |
| m-1007 | $R^{A77}$ | H | $R^{A94}$ | $R^{A94}$ |
| m-1008 | $R^{A78}$ | H | $R^{A94}$ | $R^{A94}$ |
| m-1009 | $R^{A79}$ | H | $R^{A94}$ | $R^{A94}$ |
| m-1010 | $R^{A80}$ | H | $R^{A94}$ | $R^{A94}$ |
| m-1011 | $R^{A81}$ | H | $R^{A94}$ | $R^{A94}$ |
| m-1012 | $R^{A82}$ | H | $R^{A94}$ | $R^{A94}$ |
| m-1013 | $R^{A83}$ | H | $R^{A94}$ | $R^{A94}$ |

-continued

| Compound # | $R^{1a}$ | $R^{1b}$ | $R^{2a}$ | $R^{2b}$ |
|---|---|---|---|---|
| m-1014 | $R^{A84}$ | H | $R^{A94}$ | $R^{A94}$ |
| m-1015 | $R^{A85}$ | H | $R^{A94}$ | $R^{A94}$ |
| m-1016 | $R^{A86}$ | H | $R^{A94}$ | $R^{A94}$ |
| m-1017 | $R^{A87}$ | H | $R^{A94}$ | $R^{A94}$ |
| m-1018 | $R^{A88}$ | H | $R^{A94}$ | $R^{A94}$ |
| m-1019 | $R^{A89}$ | H | $R^{A94}$ | $R^{A94}$ |
| m-1020 | $R^{A90}$ | H | $R^{A94}$ | $R^{A94}$ |
| m-1021 | $R^{A91}$ | H | $R^{A94}$ | $R^{A94}$ |
| m-1022 | $R^{A92}$ | H | $R^{A94}$ | $R^{A94}$ |
| m-1024 | $R^{A1}$ | $R^{A94}$ | $R^{A94}$ | $R^{A94}$ |
| m-1025 | $R^{A2}$ | $R^{A94}$ | $R^{A94}$ | $R^{A94}$ |
| m-1026 | $R^{A3}$ | $R^{A94}$ | $R^{A94}$ | $R^{A94}$ |
| m-1027 | $R^{A4}$ | $R^{A94}$ | $R^{A94}$ | $R^{A94}$ |
| m-1028 | $R^{A5}$ | $R^{A94}$ | $R^{A94}$ | $R^{A94}$ |
| m-1029 | $R^{A6}$ | $R^{A94}$ | $R^{A94}$ | $R^{A94}$ |
| m-1030 | $R^{A7}$ | $R^{A94}$ | $R^{A94}$ | $R^{A94}$ |
| m-1031 | $R^{A8}$ | $R^{A94}$ | $R^{A94}$ | $R^{A94}$ |
| m-1032 | $R^{A9}$ | $R^{A94}$ | $R^{A94}$ | $R^{A94}$ |
| m-1033 | $R^{A10}$ | $R^{A94}$ | $R^{A94}$ | $R^{A94}$ |
| m-1034 | $R^{A11}$ | $R^{A94}$ | $R^{A94}$ | $R^{A94}$ |
| m-1035 | $R^{A12}$ | $R^{A94}$ | $R^{A94}$ | $R^{A94}$ |
| m-1036 | $R^{A13}$ | $R^{A94}$ | $R^{A94}$ | $R^{A94}$ |
| m-1037 | $R^{A14}$ | $R^{A94}$ | $R^{A94}$ | $R^{A94}$ |
| m-1038 | $R^{A15}$ | $R^{A94}$ | $R^{A94}$ | $R^{A94}$ |
| m-1039 | $R^{A16}$ | $R^{A94}$ | $R^{A94}$ | $R^{A94}$ |
| m-1040 | $R^{A17}$ | $R^{A94}$ | $R^{A94}$ | $R^{A94}$ |
| m-1041 | $R^{A18}$ | $R^{A94}$ | $R^{A94}$ | $R^{A94}$ |
| m-1044 | $R^{A21}$ | $R^{A94}$ | $R^{A94}$ | $R^{A94}$ |
| m-1045 | $R^{A22}$ | $R^{A94}$ | $R^{A94}$ | $R^{A94}$ |
| m-1046 | $R^{A23}$ | $R^{A94}$ | $R^{A94}$ | $R^{A94}$ |
| m-1047 | $R^{A24}$ | $R^{A94}$ | $R^{A94}$ | $R^{A94}$ |
| m-1048 | $R^{A25}$ | $R^{A94}$ | $R^{A94}$ | $R^{A94}$ |
| m-1049 | $R^{A26}$ | $R^{A94}$ | $R^{A94}$ | $R^{A94}$ |
| m-1050 | $R^{A27}$ | $R^{A94}$ | $R^{A94}$ | $R^{A94}$ |
| m-1051 | $R^{A28}$ | $R^{A94}$ | $R^{A94}$ | $R^{A94}$ |
| m-1052 | $R^{A29}$ | $R^{A94}$ | $R^{A94}$ | $R^{A94}$ |
| m-1053 | $R^{A30}$ | $R^{A94}$ | $R^{A94}$ | $R^{A94}$ |
| m-1054 | $R^{A31}$ | $R^{A94}$ | $R^{A94}$ | $R^{A94}$ |
| m-1055 | $R^{A32}$ | $R^{A94}$ | $R^{A94}$ | $R^{A94}$ |
| m-1056 | $R^{A33}$ | $R^{A94}$ | $R^{A94}$ | $R^{A94}$ |
| m-1057 | $R^{A34}$ | $R^{A94}$ | $R^{A94}$ | $R^{A94}$ |
| m-1058 | $R^{A35}$ | $R^{A94}$ | $R^{A94}$ | $R^{A94}$ |
| m-1059 | $R^{A36}$ | $R^{A94}$ | $R^{A94}$ | $R^{A94}$ |
| m-1060 | $R^{A37}$ | $R^{A94}$ | $R^{A94}$ | $R^{A94}$ |
| m-1061 | $R^{A38}$ | $R^{A94}$ | $R^{A94}$ | $R^{A94}$ |
| m-1064 | $R^{A41}$ | $R^{A94}$ | $R^{A94}$ | $R^{A94}$ |
| m-1065 | $R^{A42}$ | $R^{A94}$ | $R^{A94}$ | $R^{A94}$ |
| m-1066 | $R^{A43}$ | $R^{A94}$ | $R^{A94}$ | $R^{A94}$ |
| m-1067 | $R^{A44}$ | $R^{A94}$ | $R^{A94}$ | $R^{A94}$ |
| m-1068 | $R^{A45}$ | $R^{A94}$ | $R^{A94}$ | $R^{A94}$ |
| m-1069 | $R^{A46}$ | $R^{A94}$ | $R^{A94}$ | $R^{A94}$ |
| m-1070 | $R^{A47}$ | $R^{A94}$ | $R^{A94}$ | $R^{A94}$ |
| m-1071 | $R^{A48}$ | $R^{A94}$ | $R^{A94}$ | $R^{A94}$ |
| m-1072 | $R^{A49}$ | $R^{A94}$ | $R^{A94}$ | $R^{A94}$ |
| m-1073 | $R^{A50}$ | $R^{A94}$ | $R^{A94}$ | $R^{A94}$ |
| m-1074 | $R^{A51}$ | $R^{A94}$ | $R^{A94}$ | $R^{A94}$ |
| m-1075 | $R^{A52}$ | $R^{A94}$ | $R^{A94}$ | $R^{A94}$ |
| m-1076 | $R^{A53}$ | $R^{A94}$ | $R^{A94}$ | $R^{A94}$ |
| m-1077 | $R^{A54}$ | $R^{A94}$ | $R^{A94}$ | $R^{A94}$ |
| m-1078 | $R^{A55}$ | $R^{A94}$ | $R^{A94}$ | $R^{A94}$ |
| m-1079 | $R^{A56}$ | $R^{A94}$ | $R^{A94}$ | $R^{A94}$ |
| m-1080 | $R^{A57}$ | $R^{A94}$ | $R^{A94}$ | $R^{A94}$ |
| m-1081 | $R^{A58}$ | $R^{A94}$ | $R^{A94}$ | $R^{A94}$ |
| m-1082 | $R^{A59}$ | $R^{A94}$ | $R^{A94}$ | $R^{A94}$ |
| m-1083 | $R^{A60}$ | $R^{A94}$ | $R^{A94}$ | $R^{A94}$ |
| m-1084 | $R^{A61}$ | $R^{A94}$ | $R^{A94}$ | $R^{A94}$ |
| m-1085 | $R^{A62}$ | $R^{A94}$ | $R^{A94}$ | $R^{A94}$ |
| m-1086 | $R^{A63}$ | $R^{A94}$ | $R^{A94}$ | $R^{A94}$ |
| m-1087 | $R^{A64}$ | $R^{A94}$ | $R^{A94}$ | $R^{A94}$ |
| m-1088 | $R^{A65}$ | $R^{A94}$ | $R^{A94}$ | $R^{A94}$ |
| m-1091 | $R^{A68}$ | $R^{A94}$ | $R^{A94}$ | $R^{A94}$ |
| m-1092 | $R^{A69}$ | $R^{A94}$ | $R^{A94}$ | $R^{A94}$ |
| m-1093 | $R^{A70}$ | $R^{A94}$ | $R^{A94}$ | $R^{A94}$ |
| m-1094 | $R^{A71}$ | $R^{A94}$ | $R^{A94}$ | $R^{A94}$ |
| m-1095 | $R^{A72}$ | $R^{A94}$ | $R^{A94}$ | $R^{A94}$ |
| m-1096 | $R^{A73}$ | $R^{A94}$ | $R^{A94}$ | $R^{A94}$ |
| m-1097 | $R^{A74}$ | $R^{A94}$ | $R^{A94}$ | $R^{A94}$ |

-continued

| Compound # | $R^{1a}$ | $R^{1b}$ | $R^{2a}$ | $R^{2b}$ |
|---|---|---|---|---|
| m-1098 | $R^{A75}$ | $R^{A94}$ | $R^{A94}$ | $R^{A94}$ |
| m-1099 | $R^{A76}$ | $R^{A94}$ | $R^{A94}$ | $R^{A94}$ |
| m-1100 | $R^{A77}$ | $R^{A94}$ | $R^{A94}$ | $R^{A94}$ |
| m-1101 | $R^{A78}$ | $R^{A94}$ | $R^{A94}$ | $R^{A94}$ |
| m-1102 | $R^{A79}$ | $R^{A94}$ | $R^{A94}$ | $R^{A94}$ |
| m-1103 | $R^{A80}$ | $R^{A94}$ | $R^{A94}$ | $R^{A94}$ |
| m-1104 | $R^{A81}$ | $R^{A94}$ | $R^{A94}$ | $R^{A94}$ |
| m-1105 | $R^{A82}$ | $R^{A94}$ | $R^{A94}$ | $R^{A94}$ |
| m-1106 | $R^{A83}$ | $R^{A94}$ | $R^{A94}$ | $R^{A94}$ |
| m-1107 | $R^{A84}$ | $R^{A94}$ | $R^{A94}$ | $R^{A94}$ |
| m-1108 | $R^{A85}$ | $R^{A94}$ | $R^{A94}$ | $R^{A94}$ |
| m-1109 | $R^{A86}$ | $R^{A94}$ | $R^{A94}$ | $R^{A94}$ |
| m-1110 | $R^{A87}$ | $R^{A94}$ | $R^{A94}$ | $R^{A94}$ |
| m-1111 | $R^{A88}$ | $R^{A94}$ | $R^{A94}$ | $R^{A94}$ |
| m-1112 | $R^{A89}$ | $R^{A94}$ | $R^{A94}$ | $R^{A94}$ |
| m-1113 | $R^{A90}$ | $R^{A94}$ | $R^{A94}$ | $R^{A94}$ |
| m-1114 | $R^{A91}$ | $R^{A94}$ | $R^{A94}$ | $R^{A94}$ |
| m-1115 | $R^{A92}$ | $R^{A94}$ | $R^{A94}$ | $R^{A94}$ |
| m-1210 | $R^{A1}$ | $R^{A94}$ | H | $R^{A94}$ |
| m-1211 | $R^{A2}$ | $R^{A94}$ | H | $R^{A94}$ |
| m-1212 | $R^{A3}$ | $R^{A94}$ | H | $R^{A94}$ |
| m-1213 | $R^{A4}$ | $R^{A94}$ | H | $R^{A94}$ |
| m-1214 | $R^{A5}$ | $R^{A94}$ | H | $R^{A94}$ |
| m-1215 | $R^{A6}$ | $R^{A94}$ | H | $R^{A94}$ |
| m-1216 | $R^{A7}$ | $R^{A94}$ | H | $R^{A94}$ |
| m-1217 | $R^{A8}$ | $R^{A94}$ | H | $R^{A94}$ |
| m-1218 | $R^{A9}$ | $R^{A94}$ | H | $R^{A94}$ |
| m-1219 | $R^{A10}$ | $R^{A94}$ | H | $R^{A94}$ |
| m-1220 | $R^{A11}$ | $R^{A94}$ | H | $R^{A94}$ |
| m-1221 | $R^{A12}$ | $R^{A94}$ | H | $R^{A94}$ |
| m-1222 | $R^{A13}$ | $R^{A94}$ | H | $R^{A94}$ |
| m-1223 | $R^{A14}$ | $R^{A94}$ | H | $R^{A94}$ |
| m-1224 | $R^{A15}$ | $R^{A94}$ | H | $R^{A94}$ |
| m-1225 | $R^{A16}$ | $R^{A94}$ | H | $R^{A94}$ |
| m-1226 | $R^{A17}$ | $R^{A94}$ | H | $R^{A94}$ |
| m-1227 | $R^{A18}$ | $R^{A94}$ | H | $R^{A94}$ |
| m-1230 | $R^{A21}$ | $R^{A94}$ | H | $R^{A94}$ |
| m-1231 | $R^{A22}$ | $R^{A94}$ | H | $R^{A94}$ |
| m-1232 | $R^{A23}$ | $R^{A94}$ | H | $R^{A94}$ |
| m-1233 | $R^{A24}$ | $R^{A94}$ | H | $R^{A94}$ |
| m-1234 | $R^{A25}$ | $R^{A94}$ | H | $R^{A94}$ |
| m-1235 | $R^{A26}$ | $R^{A94}$ | H | $R^{A94}$ |
| m-1236 | $R^{A27}$ | $R^{A94}$ | H | $R^{A94}$ |
| m-1237 | $R^{A28}$ | $R^{A94}$ | H | $R^{A94}$ |
| m-1238 | $R^{A29}$ | $R^{A94}$ | H | $R^{A94}$ |
| m-1239 | $R^{A30}$ | $R^{A94}$ | H | $R^{A94}$ |
| m-1240 | $R^{A31}$ | $R^{A94}$ | H | $R^{A94}$ |
| m-1241 | $R^{A32}$ | $R^{A94}$ | H | $R^{A94}$ |
| m-1242 | $R^{A33}$ | $R^{A94}$ | H | $R^{A94}$ |
| m-1243 | $R^{A34}$ | $R^{A94}$ | H | $R^{A94}$ |
| m-1244 | $R^{A35}$ | $R^{A94}$ | H | $R^{A94}$ |
| m-1245 | $R^{A36}$ | $R^{A94}$ | H | $R^{A94}$ |
| m-1246 | $R^{A37}$ | $R^{A94}$ | H | $R^{A94}$ |
| m-1247 | $R^{A38}$ | $R^{A94}$ | H | $R^{A94}$ |
| m-1250 | $R^{A41}$ | $R^{A94}$ | H | $R^{A94}$ |
| m-1251 | $R^{A42}$ | $R^{A94}$ | H | $R^{A94}$ |
| m-1252 | $R^{A43}$ | $R^{A94}$ | H | $R^{A94}$ |
| m-1253 | $R^{A44}$ | $R^{A94}$ | H | $R^{A94}$ |
| m-1254 | $R^{A45}$ | $R^{A94}$ | H | $R^{A94}$ |
| m-1255 | $R^{A46}$ | $R^{A94}$ | H | $R^{A94}$ |
| m-1256 | $R^{A47}$ | $R^{A94}$ | H | $R^{A94}$ |
| m-1257 | $R^{A48}$ | $R^{A94}$ | H | $R^{A94}$ |
| m-1258 | $R^{A49}$ | $R^{A94}$ | H | $R^{A94}$ |
| m-1259 | $R^{A50}$ | $R^{A94}$ | H | $R^{A94}$ |
| m-1260 | $R^{A51}$ | $R^{A94}$ | H | $R^{A94}$ |
| m-1261 | $R^{A52}$ | $R^{A94}$ | H | $R^{A94}$ |
| m-1262 | $R^{A53}$ | $R^{A94}$ | H | $R^{A94}$ |
| m-1263 | $R^{A54}$ | $R^{A94}$ | H | $R^{A94}$ |
| m-1264 | $R^{A55}$ | $R^{A94}$ | H | $R^{A94}$ |
| m-1265 | $R^{A56}$ | $R^{A94}$ | H | $R^{A94}$ |
| m-1266 | $R^{A57}$ | $R^{A94}$ | H | $R^{A94}$ |
| m-1267 | $R^{A58}$ | $R^{A94}$ | H | $R^{A94}$ |
| m-1268 | $R^{A59}$ | $R^{A94}$ | H | $R^{A94}$ |
| m-1269 | $R^{A60}$ | $R^{A94}$ | H | $R^{A94}$ |
| m-1270 | $R^{A61}$ | $R^{A94}$ | H | $R^{A94}$ |
| m-1271 | $R^{A62}$ | $R^{A94}$ | H | $R^{A94}$ |
| m-1272 | $R^{A63}$ | $R^{A94}$ | H | $R^{A94}$ |

-continued

| Compound # | $R^{1a}$ | $R^{1b}$ | $R^{2a}$ | $R^{2b}$ |
|---|---|---|---|---|
| m-1273 | $R^{A464}$ | $R^{A494}$ | H | $R^{A494}$ |
| m-1274 | $R^{A465}$ | $R^{A494}$ | H | $R^{A494}$ |
| m-1277 | $R^{A468}$ | $R^{A494}$ | H | $R^{A494}$ |
| m-1278 | $R^{A469}$ | $R^{A494}$ | H | $R^{A494}$ |
| m-1279 | $R^{A470}$ | $R^{A494}$ | H | $R^{A494}$ |
| m-1280 | $R^{A471}$ | $R^{A494}$ | H | $R^{A494}$ |
| m-1281 | $R^{A472}$ | $R^{A494}$ | H | $R^{A494}$ |
| m-1282 | $R^{A473}$ | $R^{A494}$ | H | $R^{A494}$ |
| m-1283 | $R^{A474}$ | $R^{A494}$ | H | $R^{A494}$ |
| m-1284 | $R^{A475}$ | $R^{A494}$ | H | $R^{A494}$ |
| m-1285 | $R^{A476}$ | $R^{A494}$ | H | $R^{A494}$ |
| m-1286 | $R^{A477}$ | $R^{A494}$ | H | $R^{A494}$ |
| m-1287 | $R^{A478}$ | $R^{A494}$ | H | $R^{A494}$ |
| m-1288 | $R^{A479}$ | $R^{A494}$ | H | $R^{A494}$ |
| m-1289 | $R^{A480}$ | $R^{A494}$ | H | $R^{A494}$ |
| m-1290 | $R^{A481}$ | $R^{A494}$ | H | $R^{A494}$ |
| m-1291 | $R^{A482}$ | $R^{A494}$ | H | $R^{A494}$ |
| m-1292 | $R^{A483}$ | $R^{A494}$ | H | $R^{A494}$ |
| m-1293 | $R^{A484}$ | $R^{A494}$ | H | $R^{A494}$ |
| m-1294 | $R^{A485}$ | $R^{A494}$ | H | $R^{A494}$ |
| m-1295 | $R^{A486}$ | $R^{A494}$ | H | $R^{A494}$ |
| m-1296 | $R^{A487}$ | $R^{A494}$ | H | $R^{A494}$ |
| m-1297 | $R^{A488}$ | $R^{A494}$ | H | $R^{A494}$ |
| m-1298 | $R^{A489}$ | $R^{A494}$ | H | $R^{A494}$ |
| m-1299 | $R^{A490}$ | $R^{A494}$ | H | $R^{A494}$ |
| m-1300 | $R^{A491}$ | $R^{A494}$ | H | $R^{A494}$ |
| m-1301 | $R^{A492}$ | $R^{A494}$ | H | $R^{A494}$ |
| m-1303 | $R^{A41}$ | $CD_3$ | H | $R^{A494}$ |
| m-1304 | $R^{A42}$ | $CD_3$ | H | $R^{A494}$ |
| m-1305 | $R^{A43}$ | $CD_3$ | H | $R^{A494}$ |
| m-1306 | $R^{A44}$ | $CD_3$ | H | $R^{A494}$ |
| m-1307 | $R^{A45}$ | $CD_3$ | H | $R^{A494}$ |
| m-1308 | $R^{A46}$ | $CD_3$ | H | $R^{A494}$ |
| m-1309 | $R^{A47}$ | $CD_3$ | H | $R^{A494}$ |
| m-1310 | $R^{A48}$ | $CD_3$ | H | $R^{A494}$ |
| m-1311 | $R^{A49}$ | $CD_3$ | H | $R^{A494}$ |
| m-1312 | $R^{A410}$ | $CD_3$ | H | $R^{A494}$ |
| m-1313 | $R^{A411}$ | $CD_3$ | H | $R^{A494}$ |
| m-1314 | $R^{A412}$ | $CD_3$ | H | $R^{A494}$ |
| m-1315 | $R^{A413}$ | $CD_3$ | H | $R^{A494}$ |
| m-1316 | $R^{A414}$ | $CD_3$ | H | $R^{A494}$ |
| m-1317 | $R^{A415}$ | $CD_3$ | H | $R^{A494}$ |
| m-1318 | $R^{A416}$ | $CD_3$ | H | $R^{A494}$ |
| m-1319 | $R^{A417}$ | $CD_3$ | H | $R^{A494}$ |
| m-1320 | $R^{A418}$ | $CD_3$ | H | $R^{A494}$ |
| m-1323 | $R^{A421}$ | $CD_3$ | H | $R^{A494}$ |
| m-1324 | $R^{A422}$ | $CD_3$ | H | $R^{A494}$ |
| m-1325 | $R^{A423}$ | $CD_3$ | H | $R^{A494}$ |
| m-1326 | $R^{A424}$ | $CD_3$ | H | $R^{A494}$ |
| m-1327 | $R^{A425}$ | $CD_3$ | H | $R^{A494}$ |
| m-1328 | $R^{A426}$ | $CD_3$ | H | $R^{A494}$ |
| m-1329 | $R^{A427}$ | $CD_3$ | H | $R^{A494}$ |
| m-1330 | $R^{A428}$ | $CD_3$ | H | $R^{A494}$ |
| m-1331 | $R^{A429}$ | $CD_3$ | H | $R^{A494}$ |
| m-1332 | $R^{A430}$ | $CD_3$ | H | $R^{A494}$ |
| m-1333 | $R^{A431}$ | $CD_3$ | H | $R^{A494}$ |
| m-1334 | $R^{A432}$ | $CD_3$ | H | $R^{A494}$ |
| m-1335 | $R^{A433}$ | $CD_3$ | H | $R^{A494}$ |
| m-1336 | $R^{A434}$ | $CD_3$ | H | $R^{A494}$ |
| m-1337 | $R^{A435}$ | $CD_3$ | H | $R^{A494}$ |
| m-1338 | $R^{A436}$ | $CD_3$ | H | $R^{A494}$ |
| m-1339 | $R^{A437}$ | $CD_3$ | H | $R^{A494}$ |
| m-1340 | $R^{A438}$ | $CD_3$ | H | $R^{A494}$ |
| m-1343 | $R^{A441}$ | $CD_3$ | H | $R^{A494}$ |
| m-1344 | $R^{A442}$ | $CD_3$ | H | $R^{A494}$ |
| m-1345 | $R^{A443}$ | $CD_3$ | H | $R^{A494}$ |
| m-1346 | $R^{A444}$ | $CD_3$ | H | $R^{A494}$ |
| m-1347 | $R^{A445}$ | $CD_3$ | H | $R^{A494}$ |
| m-1348 | $R^{A446}$ | $CD_3$ | H | $R^{A494}$ |
| m-1349 | $R^{A447}$ | $CD_3$ | H | $R^{A494}$ |
| m-1350 | $R^{A448}$ | $CD_3$ | H | $R^{A494}$ |
| m-1351 | $R^{A449}$ | $CD_3$ | H | $R^{A494}$ |
| m-1352 | $R^{A450}$ | $CD_3$ | H | $R^{A494}$ |
| m-1353 | $R^{A451}$ | $CD_3$ | H | $R^{A494}$ |
| m-1354 | $R^{A452}$ | $CD_3$ | H | $R^{A494}$ |
| m-1355 | $R^{A453}$ | $CD_3$ | H | $R^{A494}$ |
| m-1356 | $R^{A454}$ | $CD_3$ | H | $R^{A494}$ |
| m-1357 | $R^{A455}$ | $CD_3$ | H | $R^{A494}$ |
| m-1358 | $R^{A456}$ | $CD_3$ | H | $R^{A494}$ |
| m-1359 | $R^{A457}$ | $CD_3$ | H | $R^{A494}$ |
| m-1360 | $R^{A458}$ | $CD_3$ | H | $R^{A494}$ |
| m-1361 | $R^{A459}$ | $CD_3$ | H | $R^{A494}$ |
| m-1362 | $R^{A460}$ | $CD_3$ | H | $R^{A494}$ |
| m-1363 | $R^{A461}$ | $CD_3$ | H | $R^{A494}$ |
| m-1364 | $R^{A462}$ | $CD_3$ | H | $R^{A494}$ |
| m-1365 | $R^{A463}$ | $CD_3$ | H | $R^{A494}$ |
| m-1366 | $R^{A464}$ | $CD_3$ | H | $R^{A494}$ |
| m-1367 | $R^{A465}$ | $CD_3$ | H | $R^{A494}$ |
| m-1370 | $R^{A468}$ | $CD_3$ | H | $R^{A494}$ |
| m-1371 | $R^{A469}$ | $CD_3$ | H | $R^{A494}$ |
| m-1372 | $R^{A470}$ | $CD_3$ | H | $R^{A494}$ |
| m-1373 | $R^{A471}$ | $CD_3$ | H | $R^{A494}$ |
| m-1374 | $R^{A472}$ | $CD_3$ | H | $R^{A494}$ |
| m-1375 | $R^{A473}$ | $CD_3$ | H | $R^{A494}$ |
| m-1376 | $R^{A474}$ | $CD_3$ | H | $R^{A494}$ |
| m-1377 | $R^{A475}$ | $CD_3$ | H | $R^{A494}$ |
| m-1378 | $R^{A476}$ | $CD_3$ | H | $R^{A494}$ |
| m-1379 | $R^{A477}$ | $CD_3$ | H | $R^{A494}$ |
| m-1380 | $R^{A478}$ | $CD_3$ | H | $R^{A494}$ |
| m-1381 | $R^{A479}$ | $CD_3$ | H | $R^{A494}$ |
| m-1382 | $R^{A480}$ | $CD_3$ | H | $R^{A494}$ |
| m-1383 | $R^{A481}$ | $CD_3$ | H | $R^{A494}$ |
| m-1384 | $R^{A482}$ | $CD_3$ | H | $R^{A494}$ |
| m-1385 | $R^{A483}$ | $CD_3$ | H | $R^{A494}$ |
| m-1386 | $R^{A484}$ | $CD_3$ | H | $R^{A494}$ |
| m-1387 | $R^{A485}$ | $CD_3$ | H | $R^{A494}$ |
| m-1388 | $R^{A486}$ | $CD_3$ | H | $R^{A494}$ |
| m-1389 | $R^{A487}$ | $CD_3$ | H | $R^{A494}$ |
| m-1390 | $R^{A488}$ | $CD_3$ | H | $R^{A494}$ |
| m-1391 | $R^{A489}$ | $CD_3$ | H | $R^{A494}$ |
| m-1392 | $R^{A490}$ | $CD_3$ | H | $R^{A494}$ |
| m-1393 | $R^{A491}$ | $CD_3$ | H | $R^{A494}$ |
| m-1394 | $R^{A492}$ | $CD_3$ | H | $R^{A494}$ |

wherein $R^{A41}$ to $R^{A418}$, $R^{A421}$ to $R^{A438}$, $R^{A441}$ to $R^{A465}$, $R^{A468}$ to $R^{A492}$, and $R^{A494}$ are defined as follows:

$R^{A41}$

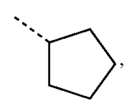

$R^{A42}$

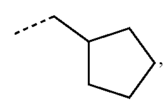

$R^{A43}$

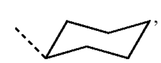

$R^{A44}$

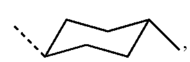

$R^{A45}$

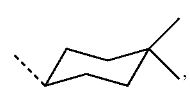

$R^{A46}$

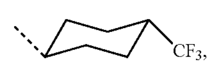

$R^{A47}$

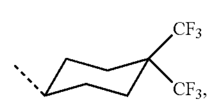

-continued
$R^{A8}$
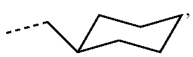
$R^{A9}$
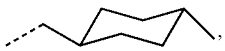
$R^{A10}$
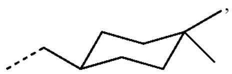
$R^{A11}$
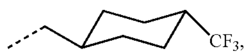
$R^{A12}$
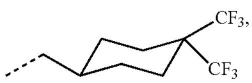
$R^{A13}$
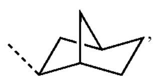
$R^{A14}$
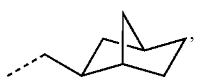
$R^{A15}$
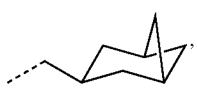
$R^{A16}$
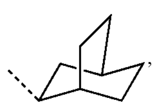
$R^{A17}$
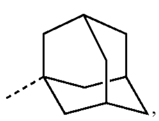
$R^{A18}$
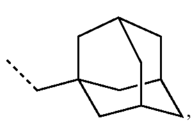
$R^{A19}$
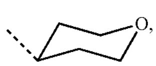
$R^{A20}$
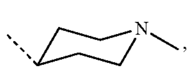
$R^{A21}$
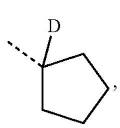
$R^{A22}$
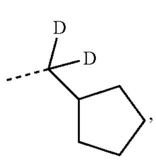
-continued
$R^{A23}$
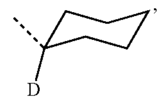
$R^{A24}$
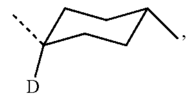
$R^{A25}$
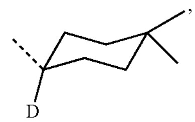
$R^{A26}$
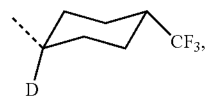
$R^{A27}$
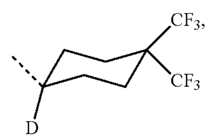
$R^{A28}$
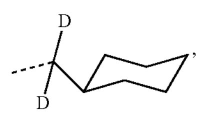
$R^{A29}$
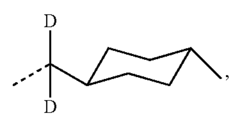
$R^{A30}$
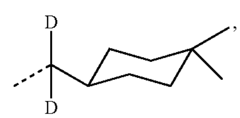
$R^{A31}$
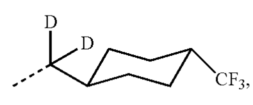
$R^{A32}$
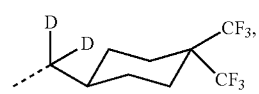
$R^{A33}$
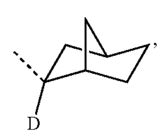
$R^{A34}$
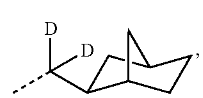
$R^{A35}$
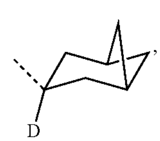

-continued
$R^{A36}$
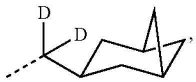
$R^{A37}$
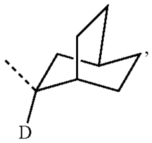
$R^{A38}$
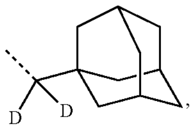
$R^{A39}$
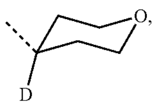
$R^{A40}$
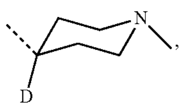
$R^{A41}$
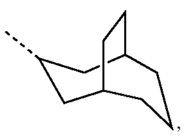
$R^{A42}$
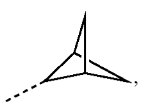
$R^{A43}$
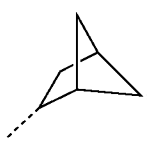
$R^{A44}$
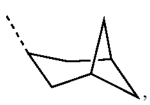
$R^{A45}$
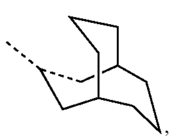
$R^{A46}$
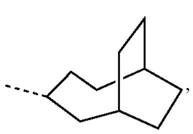
$R^{A47}$
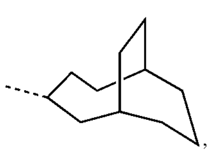
-continued
$R^{A48}$
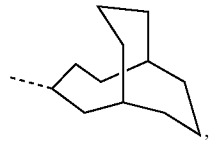
$R^{A49}$
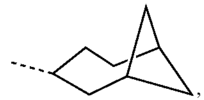
$R^{A50}$
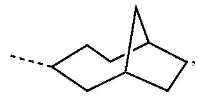
$R^{A51}$
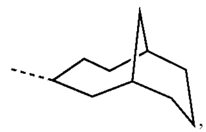
$R^{A52}$
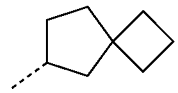
$R^{A53}$
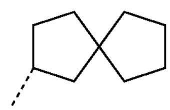
$R^{A54}$
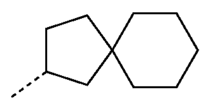
$R^{A55}$
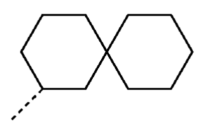
$R^{A56}$
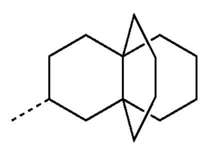
$R^{A57}$
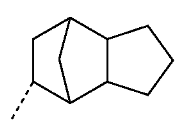
$R^{A58}$
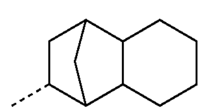
$R^{A59}$
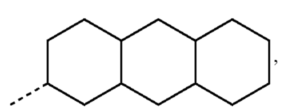

-continued
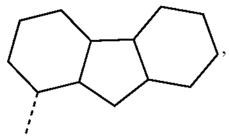
$R^{A60}$
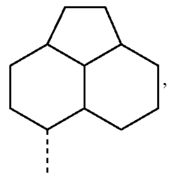
$R^{A61}$
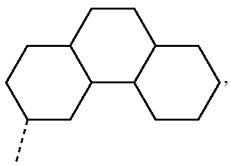
$R^{A62}$
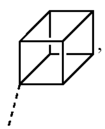
$R^{A63}$
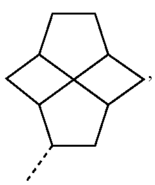
$R^{A64}$
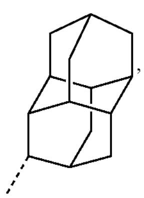
$R^{A65}$
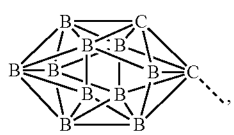
$R^{A66}$
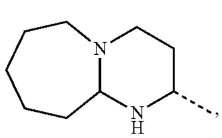
$R^{A67}$
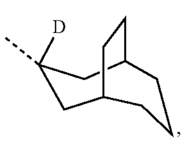
$R^{A68}$
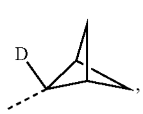
$R^{A69}$
-continued
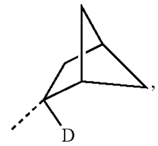
$R^{A70}$
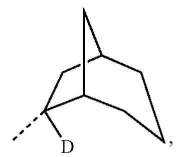
$R^{A71}$
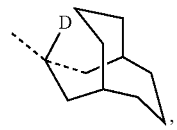
$R^{A72}$
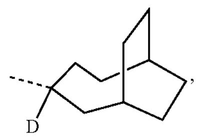
$R^{A73}$
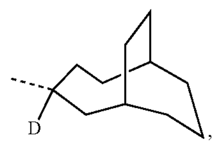
$R^{A74}$
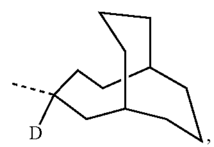
$R^{A75}$
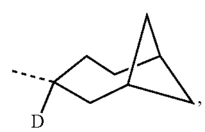
$R^{A76}$
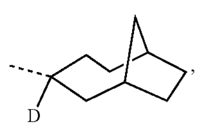
$R^{A77}$
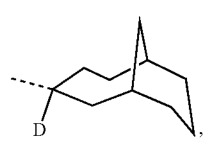
$R^{A78}$
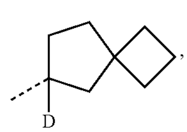
$R^{A79}$
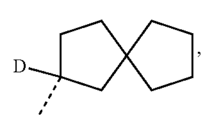
$R^{A80}$ -continued
$R^{A481}$
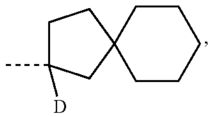
$R^{A482}$
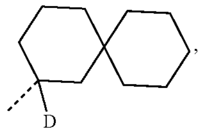
$R^{A483}$
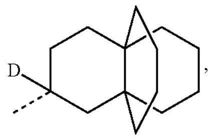
$R^{A484}$
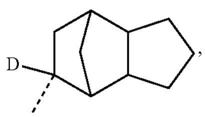
$R^{A485}$
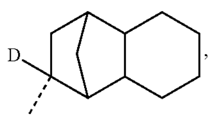
$R^{A486}$
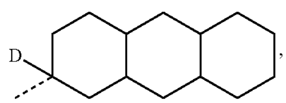
$R^{A487}$
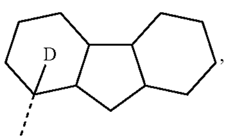
$R^{A488}$
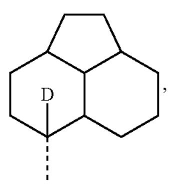
$R^{A489}$
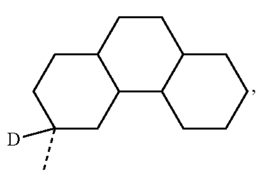
$R^{A490}$
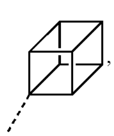
-continued
$R^{A491}$
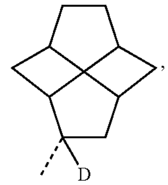
$R^{A492}$
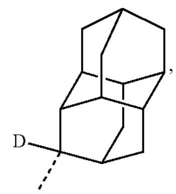
$R^{A493}$
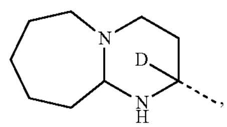
$R^{A494}$
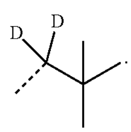
8. The compound of claim 1, wherein the compound is selected from the group consisting of:
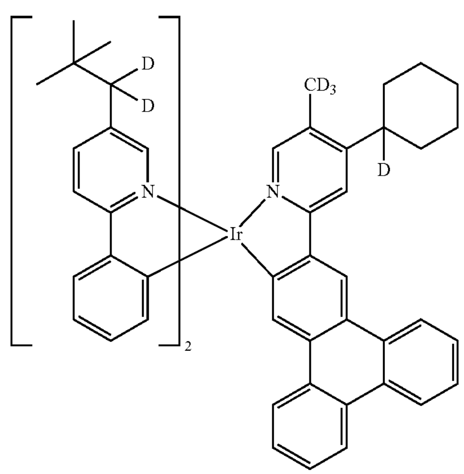

-continued
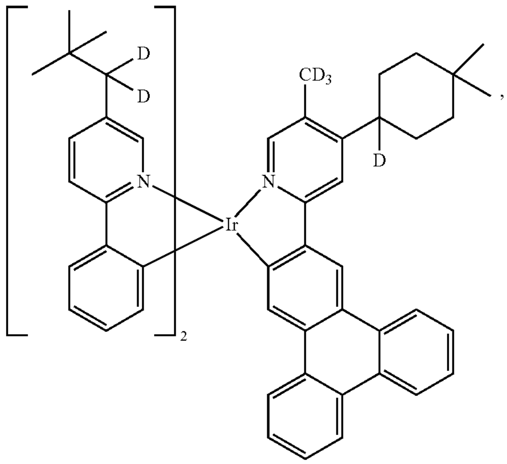
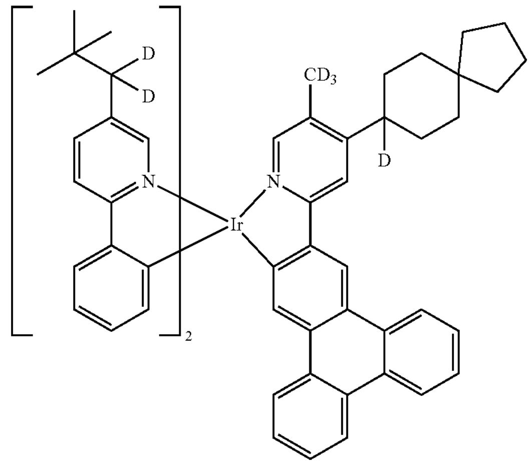
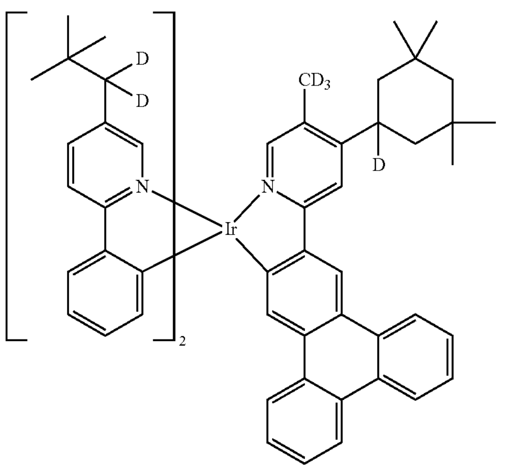
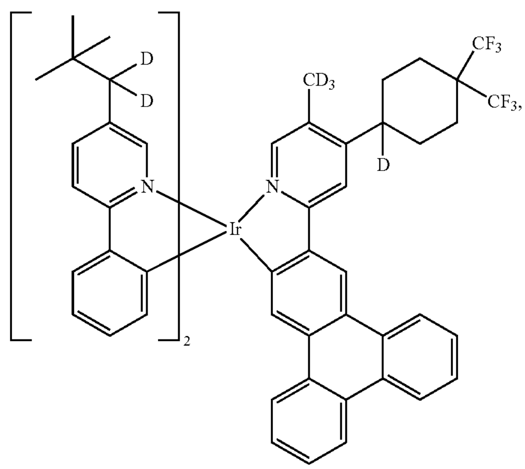
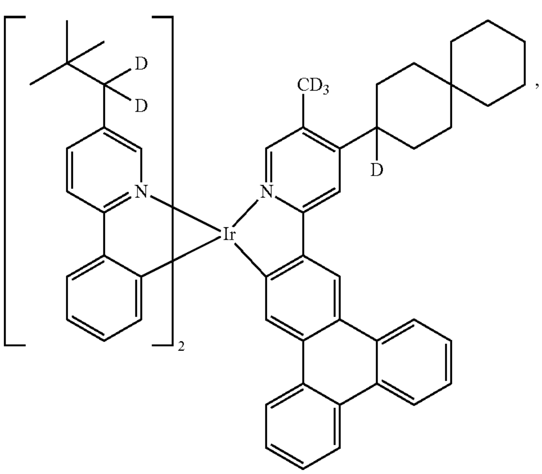
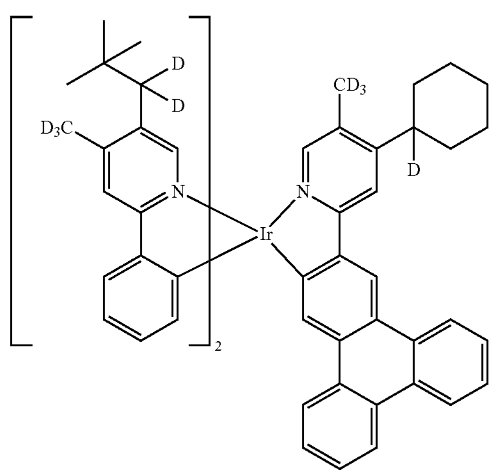

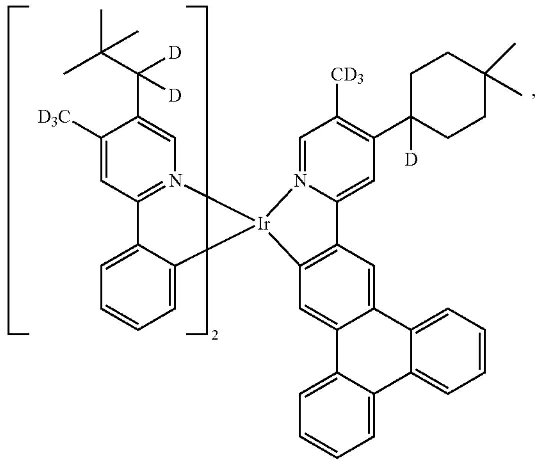
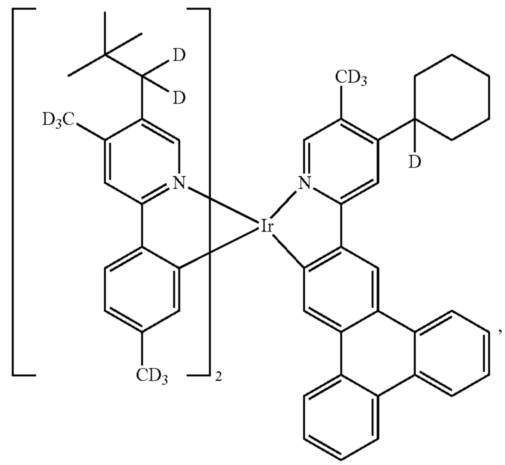
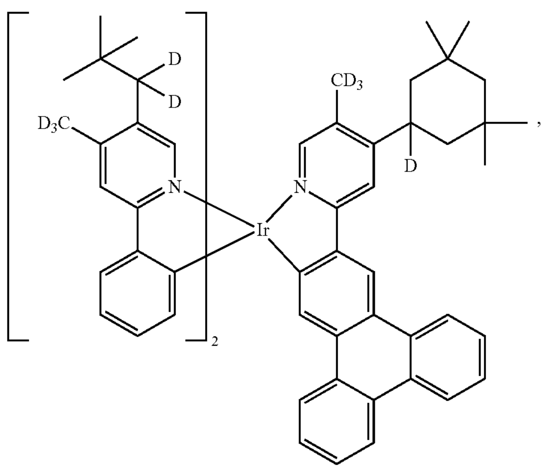
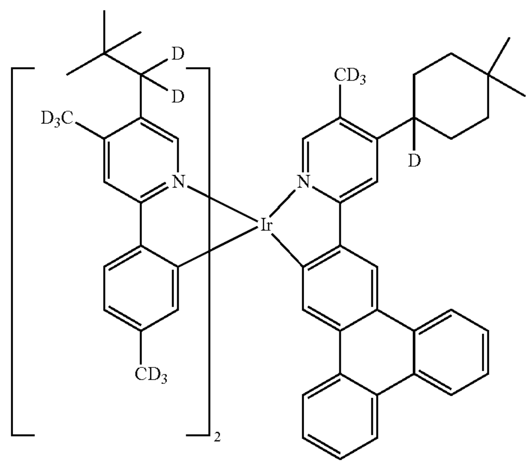
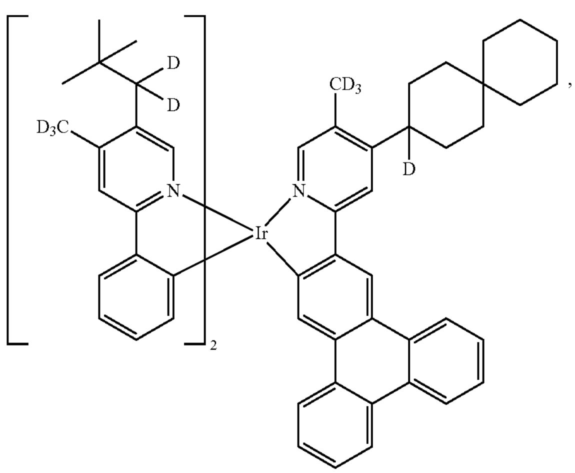
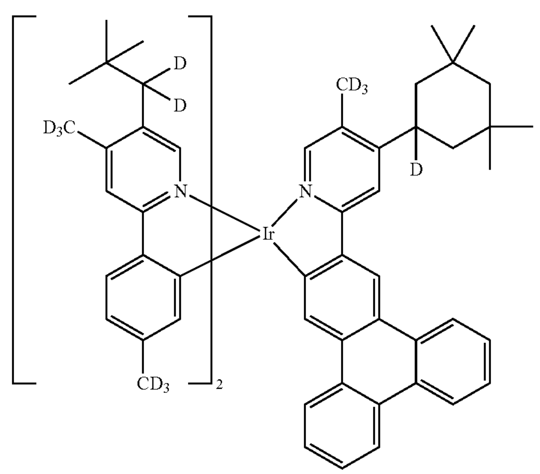

-continued
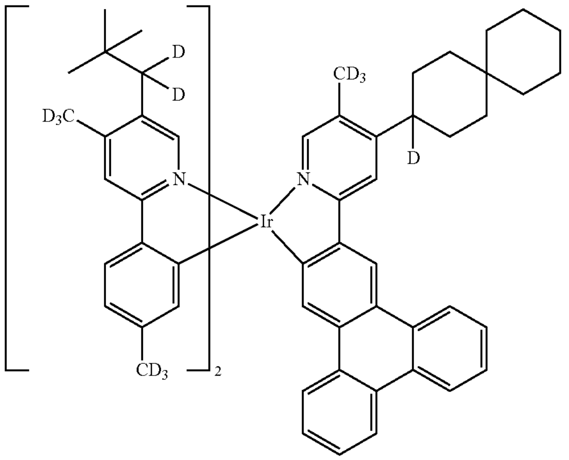
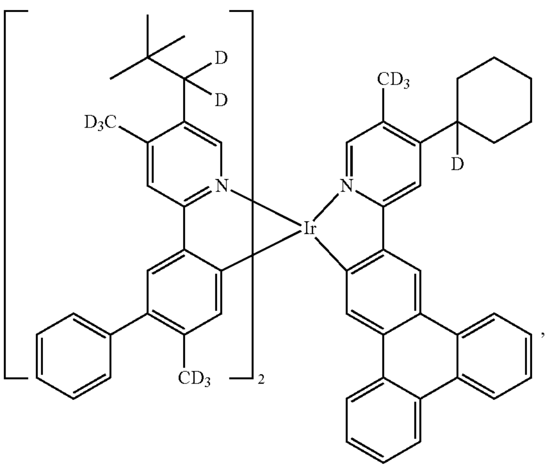
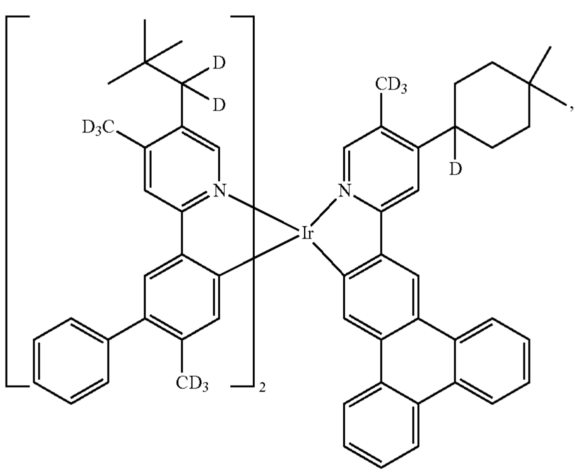
-continued
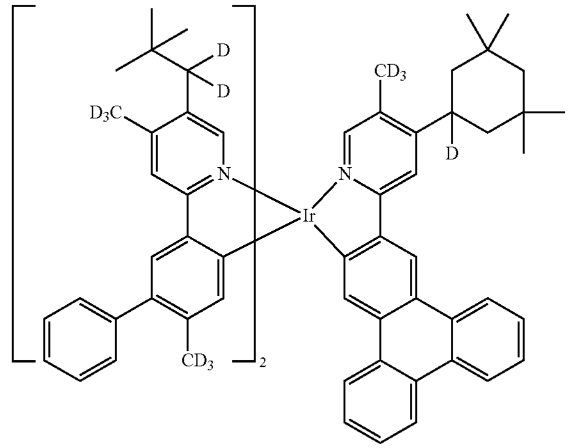
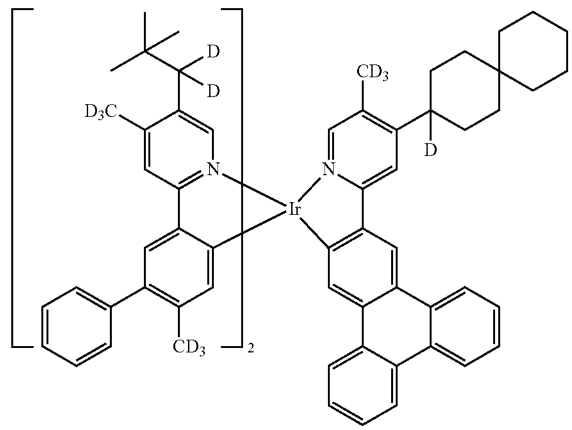
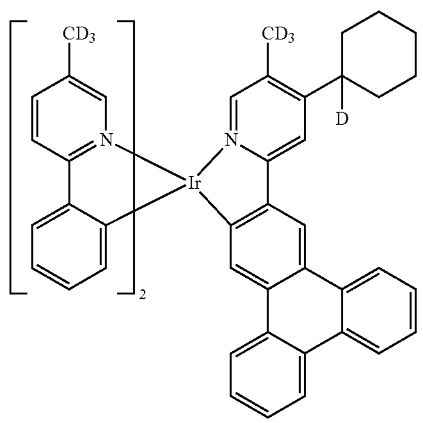
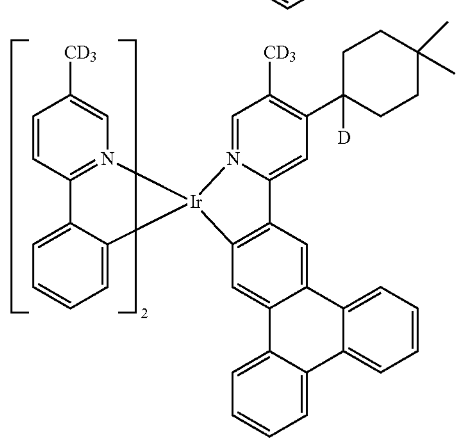

-continued
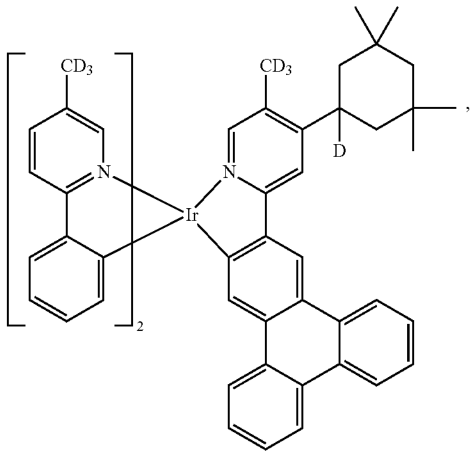
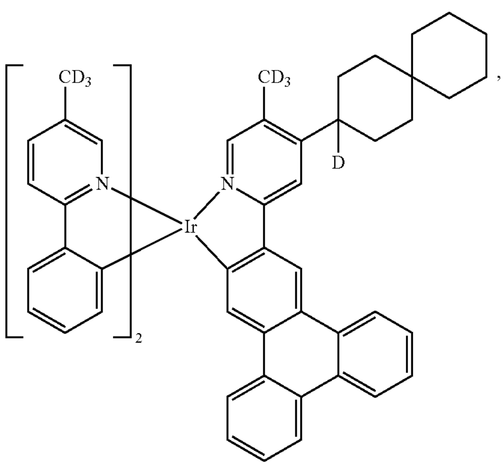
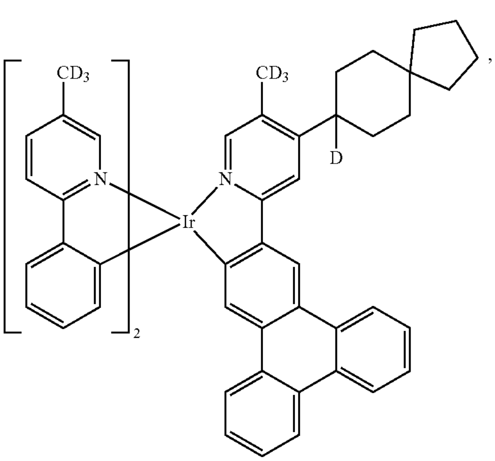
-continued
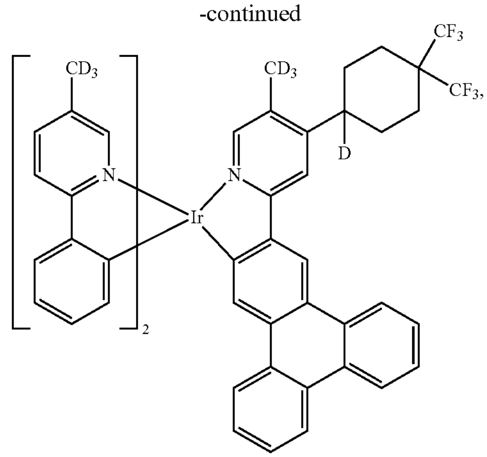
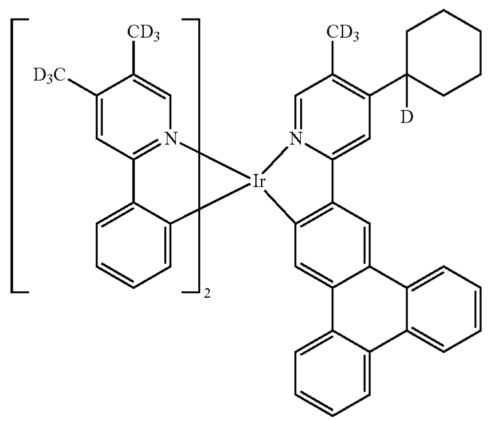
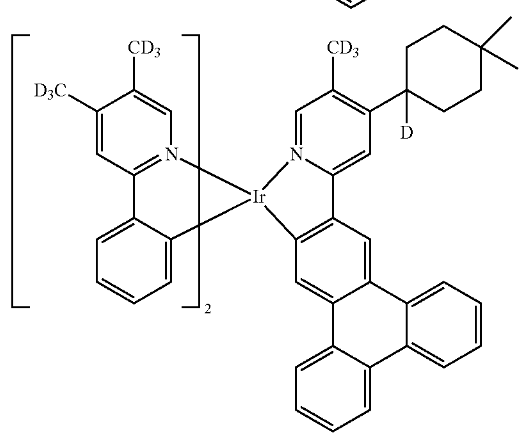
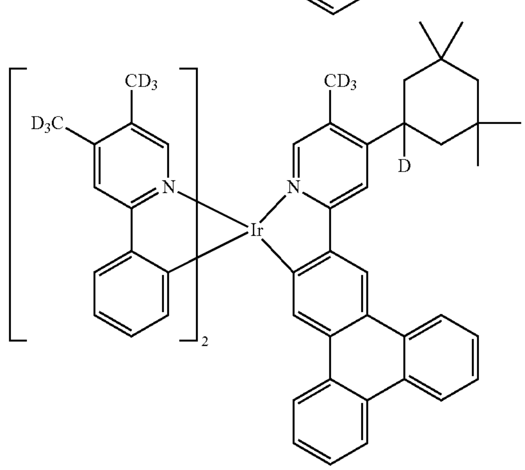

-continued
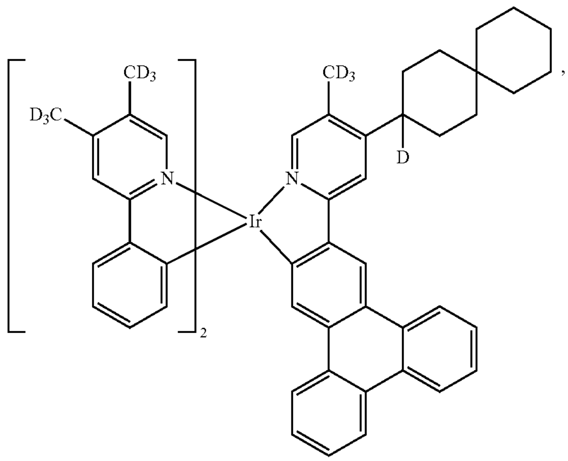
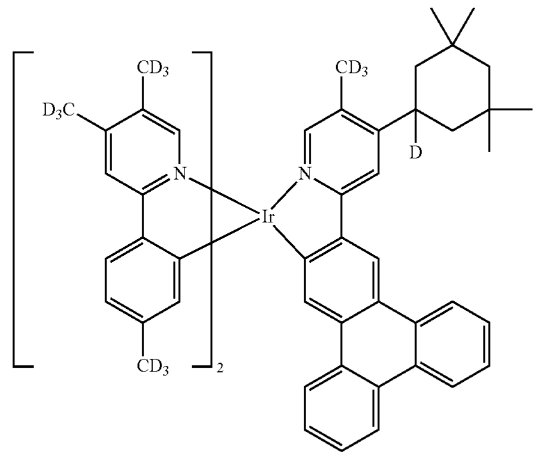
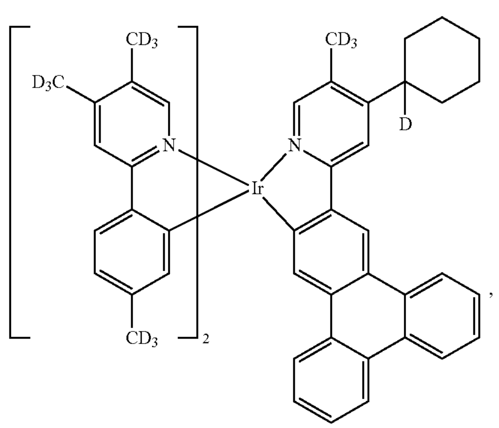
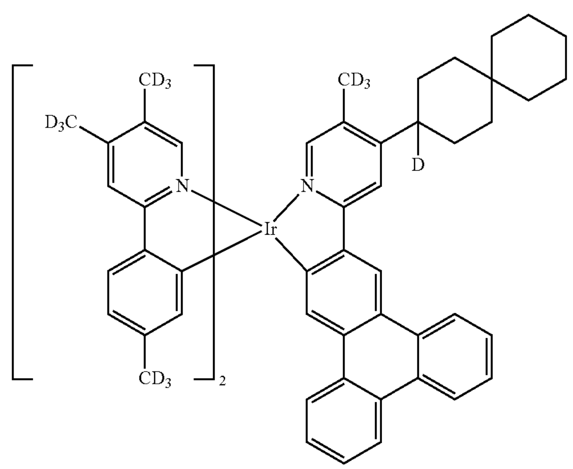
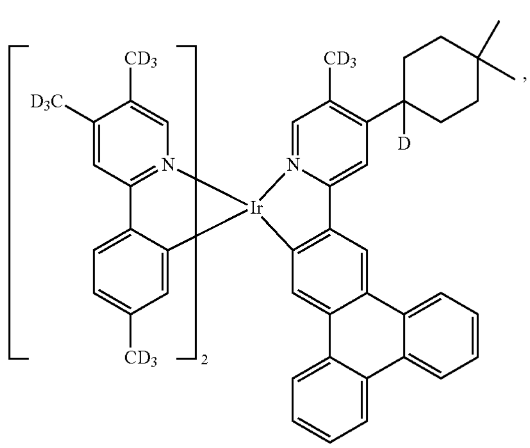
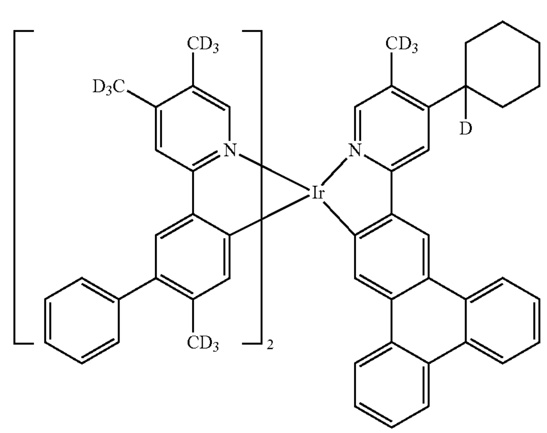

-continued

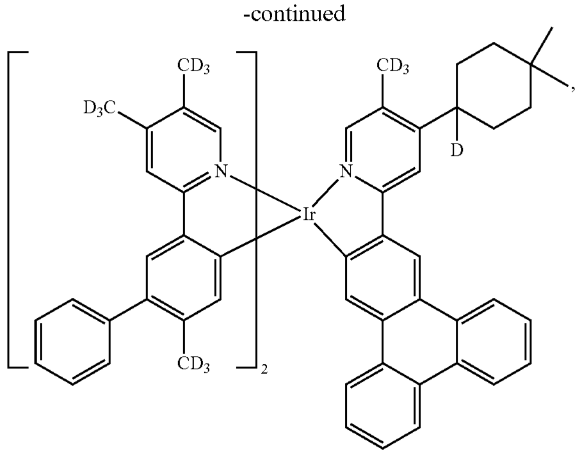

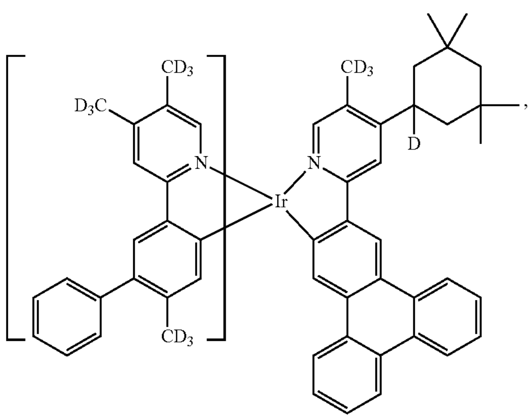

and

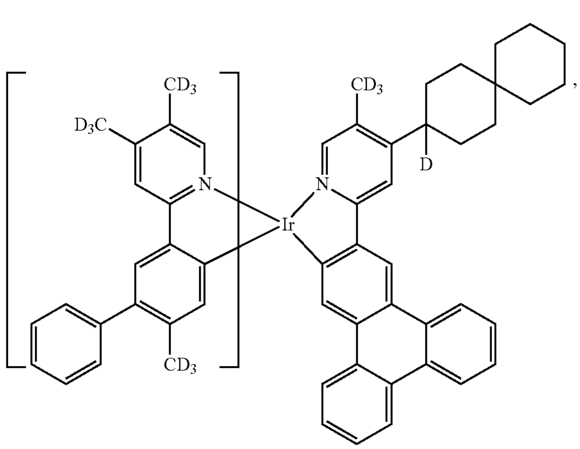

9. An organic light emitting device (OLED) comprising:

an anode;

a cathode; and an organic layer, disposed between the anode and the cathode, comprising a compound of $(L_A)_{3-n}Ir(L_B)_n$ of Formula I

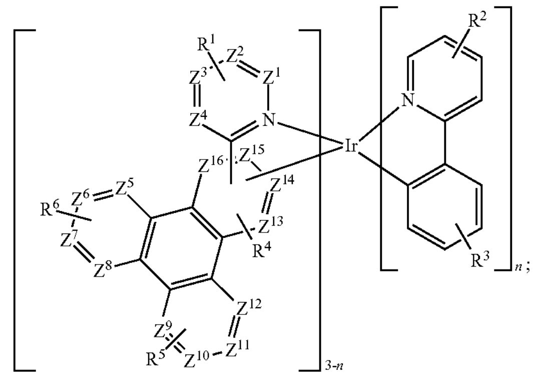

wherein n=0, 1, or 2;

wherein $Z^1$ to $Z^{16}$ are each independently C or N;

wherein any of $Z^{13}$ to $Z^{16}$ is C when it forms a bond with Ir, or when it forms a bond with the ring having $R^1$;

wherein any chelate ring comprising Ir is a 5-membered ring;

wherein $R^1$ to $R^6$ each independently represents mono to the maximum allowable substitution, or no substitution;

wherein each $R^1$ to $R^6$ is independently hydrogen or a substituent selected from the group consisting of deuterium, halogen, alkyl, cycloalkyl, heteroalkyl, heterocycloalkyl, arylalkyl, alkoxy, aryloxy, amino, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

$Z^2$ and $Z^3$ are both C and each of $Z^2$ and $Z^3$ has a substituent $R^1$ that is hydrogen, alkyl, or cycloalkyl group comprising five or more C atoms wherein the $R^1$ that is alkyl or cycloalkyl may be fully or partially deuterated;

at least one $R^1$ bonded to $Z^2$ or $Z^3$ is a cycloalkyl group comprising five or more C atoms;

the pyridine ring containing $R^2$ has at least one substituent $R^2$ that is an alkyl group;

the at least one $R^2$ that is an alkyl group bonds at carbon 4 and/or 5 of the pyridine ring and the alkyl group is fully or partially deuterated;

at least one of the following is true:

$R^2$ is an alkyl group that is partially deuterated;

the $R^1$ that is cycloalkyl contains no deuterium or is Partially deuterated.

10. The OLED of claim 9, wherein the organic layer is an emissive layer and the compound is an emissive dopant or a non-emissive dopant.

11. The OLED of claim 9, wherein the compound is a sensitizer and the OLED further comprises an acceptor; and wherein the acceptor is selected from the group consisting of fluorescent emitter, delayed fluorescence emitter, and combination thereof.

12. The OLED of claim 9, wherein the organic layer further comprises a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.
13. The OLED of claim 12, wherein the host is selected from the group consisting of:
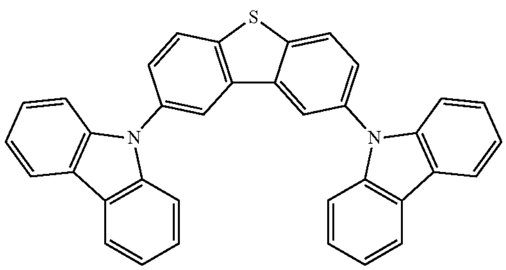
,
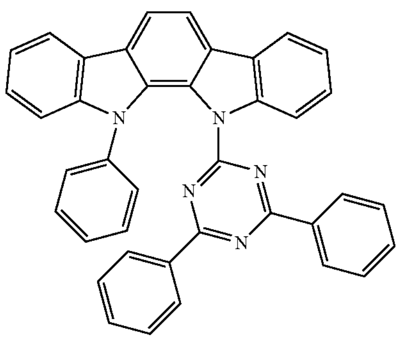
,
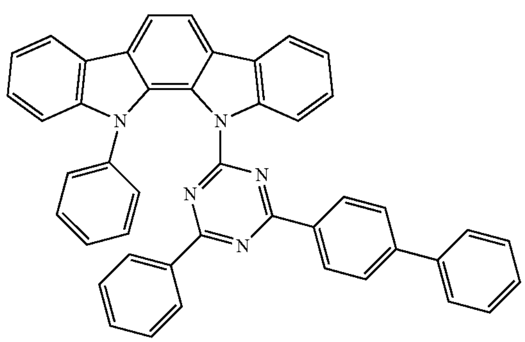
,
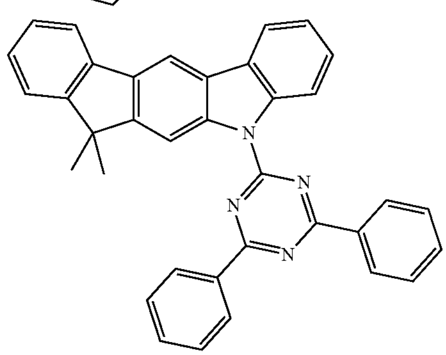
,
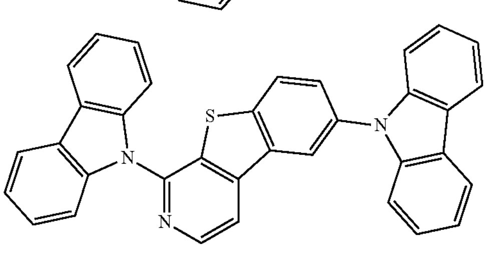
,
-continued
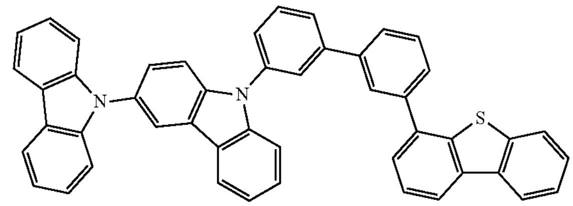
,
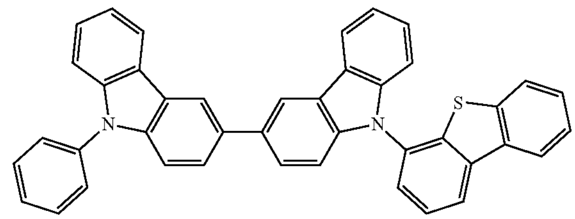
,
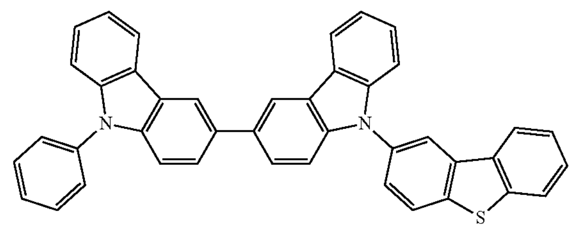
,
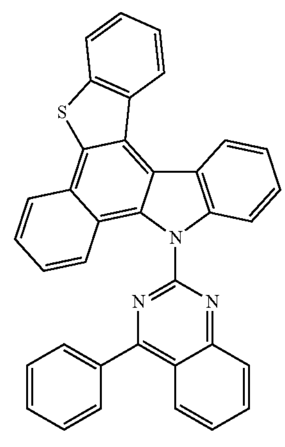
,
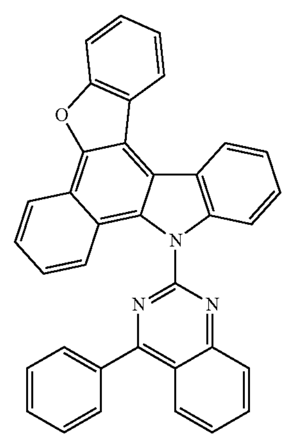
, -continued
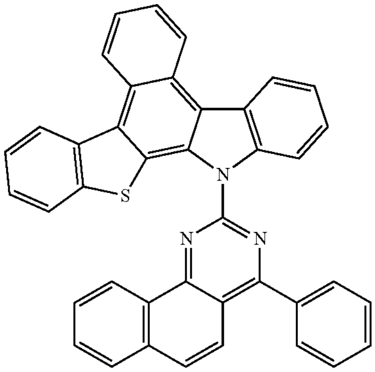
,
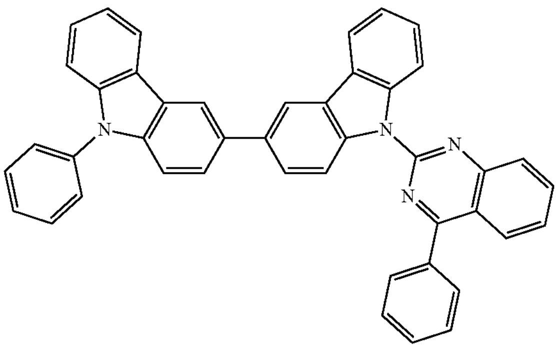
,
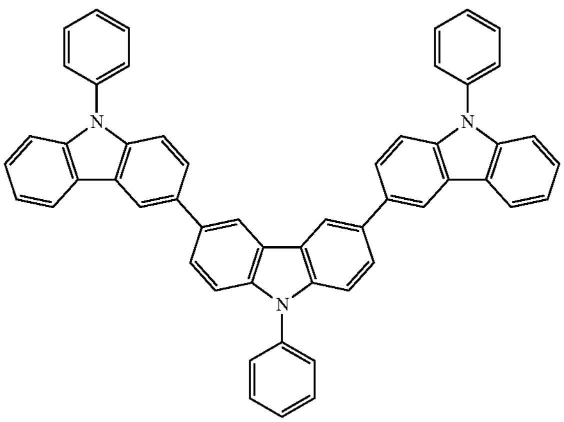
,
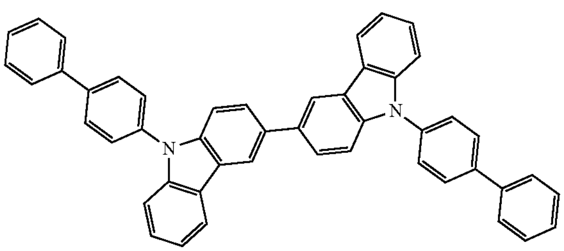
,
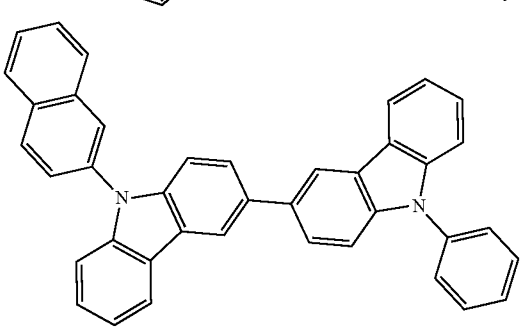
,
-continued
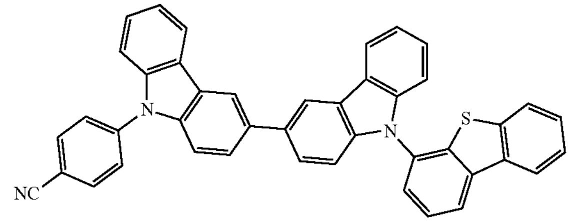
,
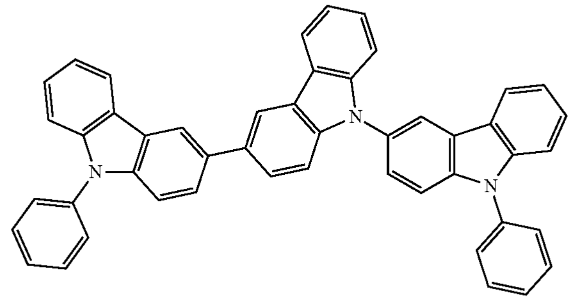
,
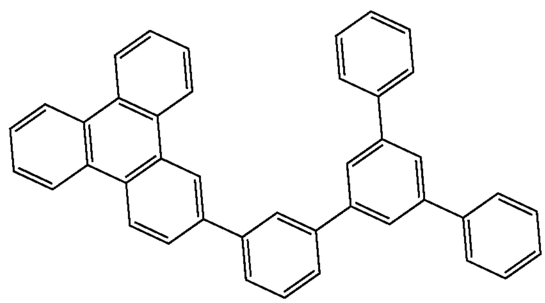
,
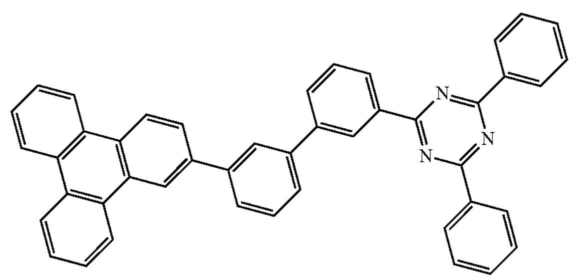
,
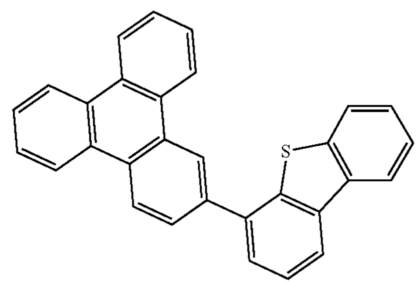
,
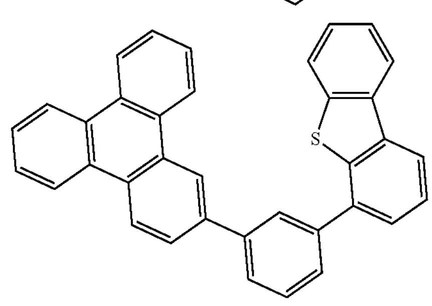
, -continued

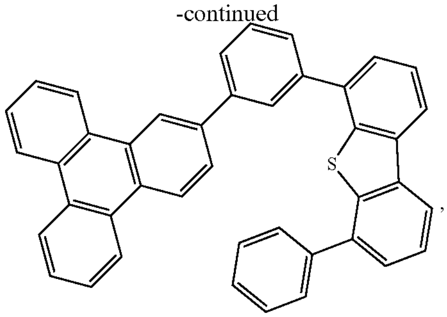

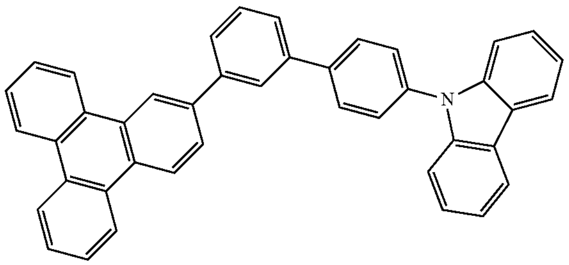

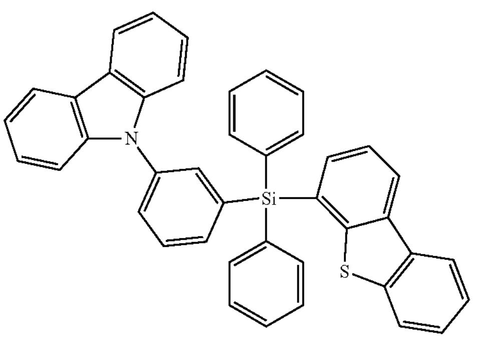

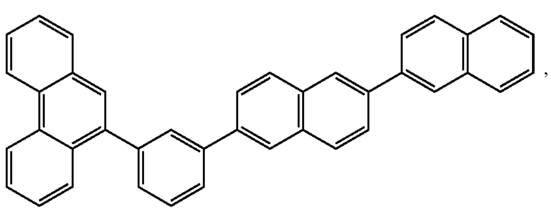

and combinations thereof.

14. A consumer product comprising an organic light-emitting device (OLED) comprising:

an anode;

a cathode; and an organic layer, disposed between the anode and the cathode, comprising a compound of $(L_A)_{3-n}Ir(L_B)_n$ of Formula I

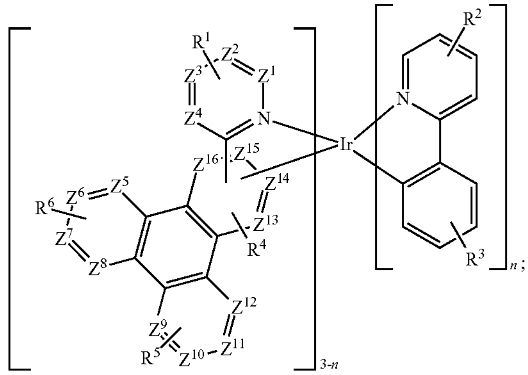

wherein n=0, 1, or 2;

wherein $Z^1$ to $Z^{16}$ are each independently C or N;

wherein any of $Z^{13}$ to $Z^{16}$ is C when it forms a bond with Ir, or when it forms a bond with the ring having $R^1$;

wherein any chelate ring comprising Ir is a 5-membered ring;

wherein $R^1$ to $R^6$ each independently represents mono to the maximum allowable substitution, or no substitution;

wherein each $R^1$ to $R^6$ is independently hydrogen or a substituent selected from the group consisting of deuterium, halogen, alkyl, cycloalkyl, heteroalkyl, heterocycloalkyl, arylalkyl, alkoxy, aryloxy, amino, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

wherein any two substituents may be joined or fused together to form a ring;

$Z^2$ and $Z^3$ are both C and each of $Z^2$ and $Z^3$ has a substituent $R^1$ that is hydrogen, alkyl, or cycloalkyl group comprising five or more C atoms wherein the $R^1$ that is alkyl or cycloalkyl may be fully or partially deuterated;

at least one $R^1$ bonded to $Z^2$ or $Z^3$ is a cycloalkyl group comprising five or more C atoms;

the pyridine ring containing $R^2$ has at least one substituent $R^2$ that is an alkyl group;

the at least one $R^2$ that is an alkyl group bonds at carbon 4 and/or 5 of the pyridine ring and the alkyl group is fully or partially deuterated;

at least one of the following is true:

$R^2$ is an alkyl group that is partially deuterated;

the $R^1$ that is cycloalkyl contains no deuterium or is partially deuterated.

15. The consumer product of claim 14, wherein the consumer product is one of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

16. A formulation comprising a compound of claim 1.

17. A chemical structure selected from the group consisting of a monomer, a polymer, a macromolecule, and a supramolecule, wherein the chemical structure comprises a compound of claim 1 or a monovalent or polyvalent variant thereof.

* * * * *